US009716095B2

(12) United States Patent
Kim

(10) Patent No.: US 9,716,095 B2
(45) Date of Patent: Jul. 25, 2017

(54) SEMICONDUCTOR MEMORY DEVICES WITH MULTI-LEVEL CONTACT STRUCTURES

(71) Applicant: Samsung Electronics Co., Ltd., Suwon-si, Gyeonggi-do (KR)

(72) Inventor: Jin-Young Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 128 days.

(21) Appl. No.: 14/534,853

(22) Filed: Nov. 6, 2014

(65) Prior Publication Data
US 2015/0214230 A1  Jul. 30, 2015

(30) Foreign Application Priority Data

Jan. 29, 2014  (KR) .................. 10-2014-0011462

(51) Int. Cl.
*H01L 21/8242*   (2006.01)
*H01L 27/108*    (2006.01)

(52) U.S. Cl.
CPC .. *H01L 27/10814* (2013.01); *H01L 27/10823* (2013.01); *H01L 27/10876* (2013.01); *H01L 27/10885* (2013.01); *H01L 27/10888* (2013.01); *H01L 27/10894* (2013.01); *H01L 2924/0002* (2013.01)

(58) Field of Classification Search
CPC .................... H01L 27/108–27/10897
See application file for complete search history.

(56) References Cited

U.S. PATENT DOCUMENTS

| 5,973,348 | A | 10/1999 | Ishibashi |
|---|---|---|---|
| 6,037,216 | A | 3/2000 | Liu et al. |
| 6,037,217 | A | 3/2000 | Linliu |
| 6,100,138 | A | 8/2000 | Tu |
| 6,124,199 | A | 9/2000 | Gambino et al. |
| 6,153,510 | A | 11/2000 | Ishibashi |
| 6,417,055 | B2 | 7/2002 | Jang et al. |
| 6,544,832 | B2 | 4/2003 | Kotecki et al. |
| 7,026,209 | B2 | 4/2006 | Wang |
| 7,119,390 | B2 | 10/2006 | Wang |
| 7,435,643 | B2 | 10/2008 | Wang |
| 8,471,305 | B2 | 6/2013 | Kim |
| 2001/0000492 | A1 | 4/2001 | Figura |
| 2002/0009866 | A1 | 1/2002 | Jang et al. |
| 2011/0121377 | A1* | 5/2011 | Jin ................... H01L 27/1085 257/301 |
| 2012/0132970 | A1* | 5/2012 | Park .................. H01L 21/76804 257/296 |

FOREIGN PATENT DOCUMENTS

| KR | 101062838 | 8/2011 |
|---|---|---|
| KR | 1020130022957 | 3/2013 |

* cited by examiner

Primary Examiner — Robert Bachner
Assistant Examiner — Molly Reida
(74) Attorney, Agent, or Firm — Ward and Smith, P.A.

(57) ABSTRACT

A semiconductor device includes a substrate having a field region disposed therein that defines an active region of the substrate, the active region comprising a pillar-shaped bit line contact region having an upper surface disposed at a higher level than an upper surface of the field region. An interlayer insulating layer is disposed on the substrate and covers the field region. A bit line is disposed in a trench in the interlayer insulating layer above the pillar-shaped bit line contact region and electrically connected thereto.

19 Claims, 138 Drawing Sheets

SEMICONDUCTOR MEMORY DEVICES WITH MULTI-LEVEL CONTACT STRUCTURES

CROSS-REFERENCE TO RELATED APPLICATION

This application claims priority under 35 U.S.C. §119 to Korean Patent Application No. 10-2014-0011462 filed on Jan. 29, 2014, the disclosure of which is hereby incorporated by reference in its entirety.

BACKGROUND

Field

The inventive subject matter relates to semiconductor devices and methods of fabricating the same and, more particularly, to semiconductor memory devices and methods of fabricating the same.

Description of Related Art

With an increase in a degree of integration of semiconductor devices, accordingly, design rules regarding elements of semiconductor devices are being decreased.

SUMMARY

Some embodiments provide semiconductor devices with increased bit line contact margin and methods of fabricating the same. The technical objectives of the inventive concept are not limited to the above disclosure; other objectives may become apparent to those of ordinary skill in the art based on the following descriptions.

Some embodiments provide a semiconductor device including a substrate having a field region disposed therein that defines an active region of the substrate, the active region including a pillar-shaped bit line contact region having an upper surface disposed at a higher level than an upper surface of the field region. An interlayer insulating layer is disposed on the substrate and covers the field region. A bit line is disposed in a trench in the interlayer insulating layer above the pillar-shaped bit line contact region and electrically connected thereto.

In some embodiments, the bit line may have an upper surface substantially coplanar with an upper surface of the interlayer insulating layer. In some embodiments, the semiconductor device may include a bit line capping layer on the bit line in the trench.

In further embodiments, the active region may further include a storage node contact region having an upper surface at a level lower than the upper surface of the bit line contact region. The semiconductor device may further include a storage node contact plug passing through the interlayer insulating layer to contact the storage node contact region. In some embodiments, the storage node contact plug may have a substantially cylindrical shape. In further embodiments, the storage node contact plug may be line-shaped.

Further embodiments provide a semiconductor device including a substrate comprising an active region having a bit line contact region and a storage node contact region, an upper surface of the bit line contact region being higher than an upper surface of the storage node contact region. A bit line is disposed above the upper surface of the bit line contact region, and electrically connected to the bit line contact region. A storage node contact plug disposed above the upper surface of the storage node contact region, and electrically connected to the storage node contact region.

In some embodiments, the semiconductor device may further comprise a contact spacer disposed between the bit line contact region and the storage node contact plug, and between the bit line and the storage node contact plug. An upper surface of the contact spacer may be coplanar with an upper surface of the storage node contact plug. In some embodiments, the semiconductor device may further comprise a bit line spacer disposed between the bit line and the contact spacer. The bit line contact region may directly contact the contact spacer. An upper surface of the bit line spacer may be coplanar with an upper surface of the contact spacer.

In some embodiments, the semiconductor device may further comprise a bit line capping layer disposed on the bit line. An upper surface of the bit line may be coplanar with an upper surface of the storage node contact plug.

In some embodiments, the bit line may directly contact the upper surface of the bit line contact region, and the storage node contact plug may directly contact the upper surface of the storage node contact region.

In some embodiments, the substrate may further include a field region defining the active region. An upper surface of the field region may be coplanar with the upper surface of the storage node contact region. In some embodiments, the semiconductor device may further comprise an interlayer insulating layer pattern disposed between the bit line and the field region.

Further embodiments provide a semiconductor device including a substrate having a field region disposed therein that defines first, second and third active regions of the substrate, the second and third active regions disposed on opposite sides of the first active region. The device further includes an interlayer insulating layer on the first, second and third active regions and the field region and a bit line disposed in a trench in the interlayer insulating layer over the first active region between the second and third active regions and electrically connected to the first active region. First and second storage node contact plugs pass through the interlayer insulating layer on opposite sides of the bit line to contact respective ones of the second and third active regions. In some embodiments, the bit line contacts the first active region at a higher level than the first and second storage node contact plugs contact storage node contact regions of the second and third active regions.

In some embodiments, the first active region may include a pillar-shaped region having an upper surface that contacts the bit line. The device may further include a third storage node contact plug passing through the interlayer insulating layer to contact a storage node contact region of the first active region at level below the upper surface of the pillar-shaped region.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
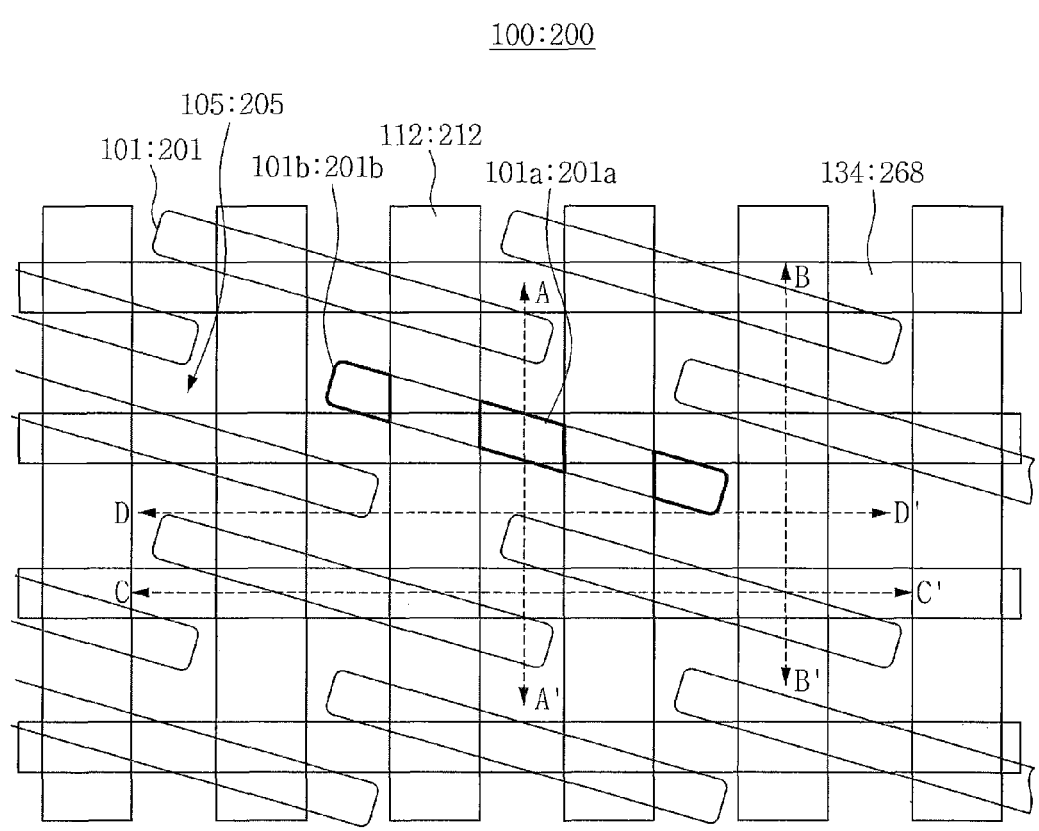
FIG. 1 illustrates a plan view showing cell regions of a semiconductor device in accordance with some embodiments.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, from manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a plan view showing cell regions of a semiconductor device in accordance with some embodiments.

Referring to FIG. 1, the semiconductor device according to the embodiments may include a substrate 100:200 having a field region 105:205 and active regions 101:201 defined by the field region 105:205, buried gates 112:212 formed on the substrate 100:200 and extending in a first direction, and bit lines 134:268 formed on the substrate 100:200 and extending in a second direction perpendicular to the first direction.

The active regions 101:201 may be formed to have a major axis and a minor axis, and may be two-dimensionally arranged along the major axis and minor axis directions. For example, each of the active regions 101:201 may have the shape of a bar whose length is longer than its width, and may be arranged in the form of islands.

The active regions 101:201 may be tilted at a predetermined angle with respect to the buried gates 112:212 and the bit lines 134:268, and one active region 101:201 may intersects two buried gates 112:212 and one bit line 134:268. Accordingly, one active region 101:201 may have two unit cell structures. In one unit cell, based on the minimum feature size, the length in the first direction may be 2F, the length in the second direction may be 4F, and thereby the area of the unit cell becomes 6F2. Here, 'F' represents a minimum feature size. The semiconductor device in accordance with various embodiments may not limited to the 6F2 cell structure, and in an implementation, may be formed in an 8F2 cell structure in which the active regions 101:201 cross the buried gate 112:212 and the bit line 134:268 at right angles. In an implementation, a suitable kind of cell structures that helps improve integration of a semiconductor device may be included.

The active regions 101:201 may include bit line contact regions 101a:201a connected with the bit lines 134:268, and storage node contact regions 101b:201b connected with cell capacitors. That is, in one active region 101:201, a region between the buried gate 112:212 and the buried gate 112:212 may be provided as the bit line contact region 101a:201a, and a region between the buried gate 112:212 and the field region 105:205 may be provided as the storage node contact region 101b:201b.

In the semiconductor device according to the embodiments, the bit line contact regions 101a:201a may be shaped as pillars. An upper surface of the bit line contact region 101a:201a may be located at a higher level than an upper surface of the field region 105:205. The upper surface of the pillar-shaped bit line contact region 101a:201a may be located at a higher level than and upper surface of the storage node contact region 101b:201b.

Figure 2A:
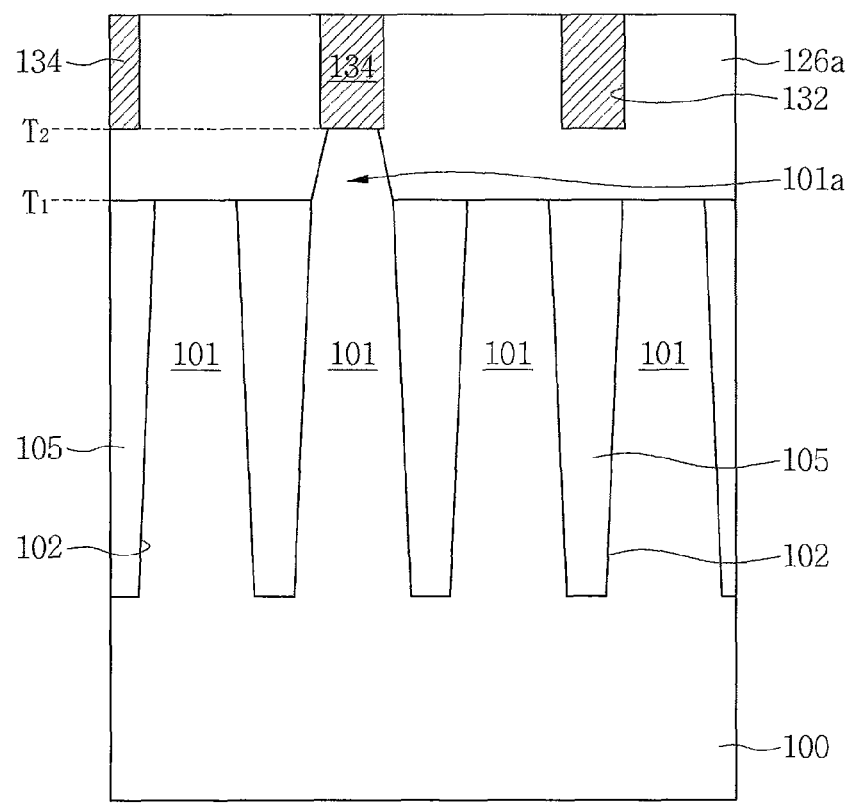
FIGS. 2A to 2D illustrate cross-sectional views showing cell regions of a semiconductor device taken along lines A-A', B-B', C-C' and D-D' shown in FIG. 1 in accordance with some embodiments.
Figure 2B:
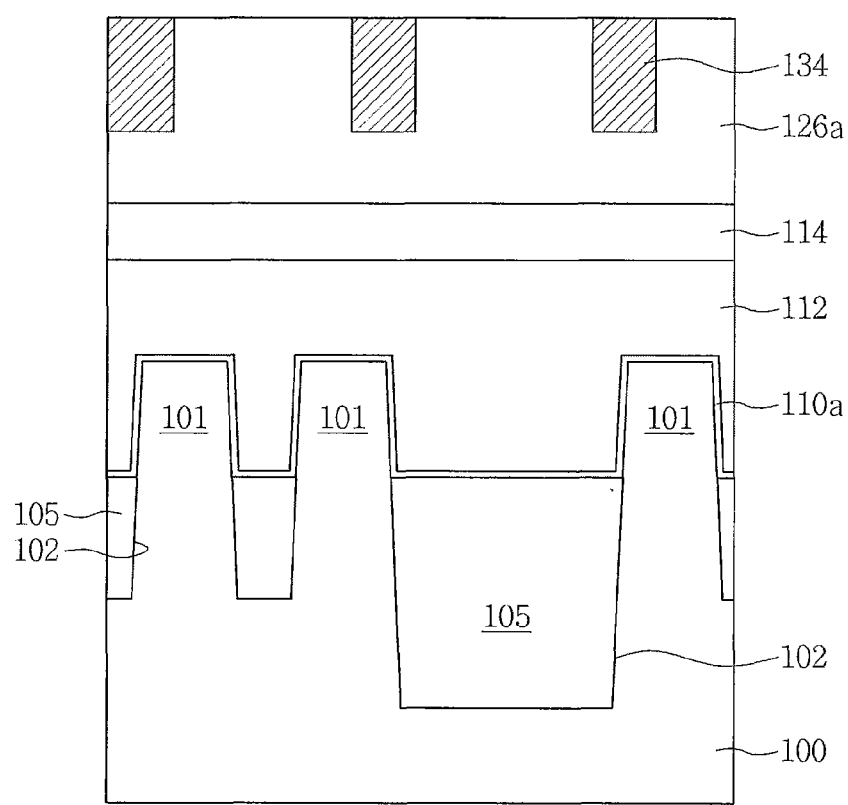
Figure 2C:
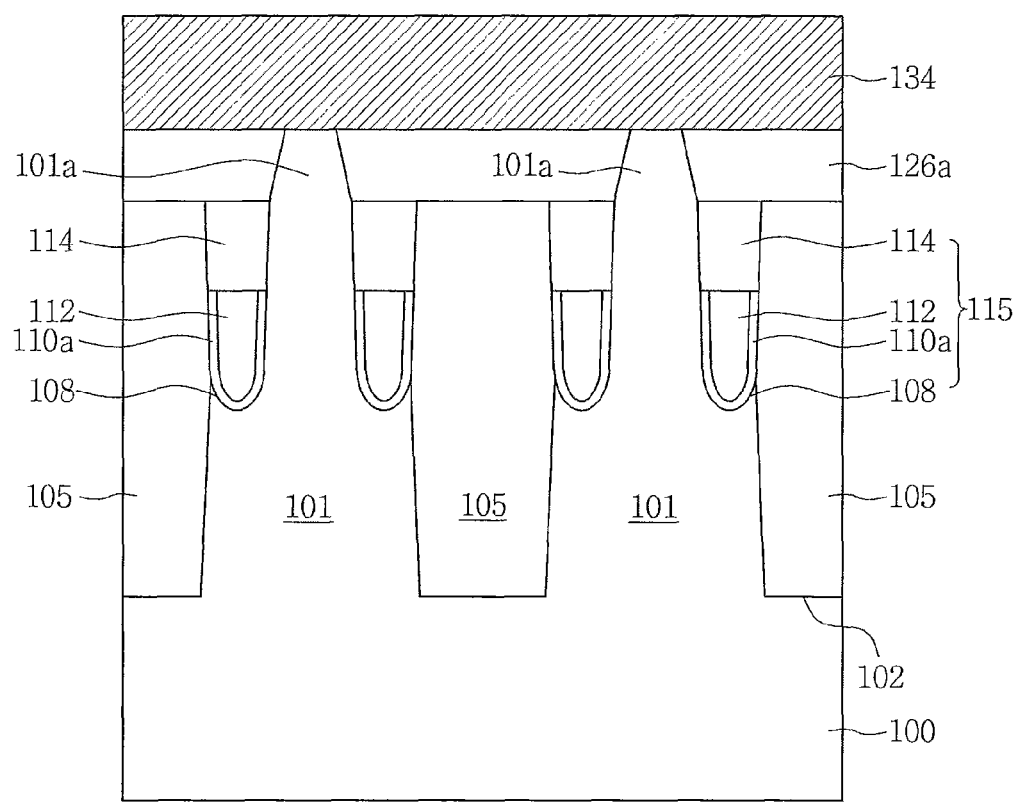
Figure 2D:
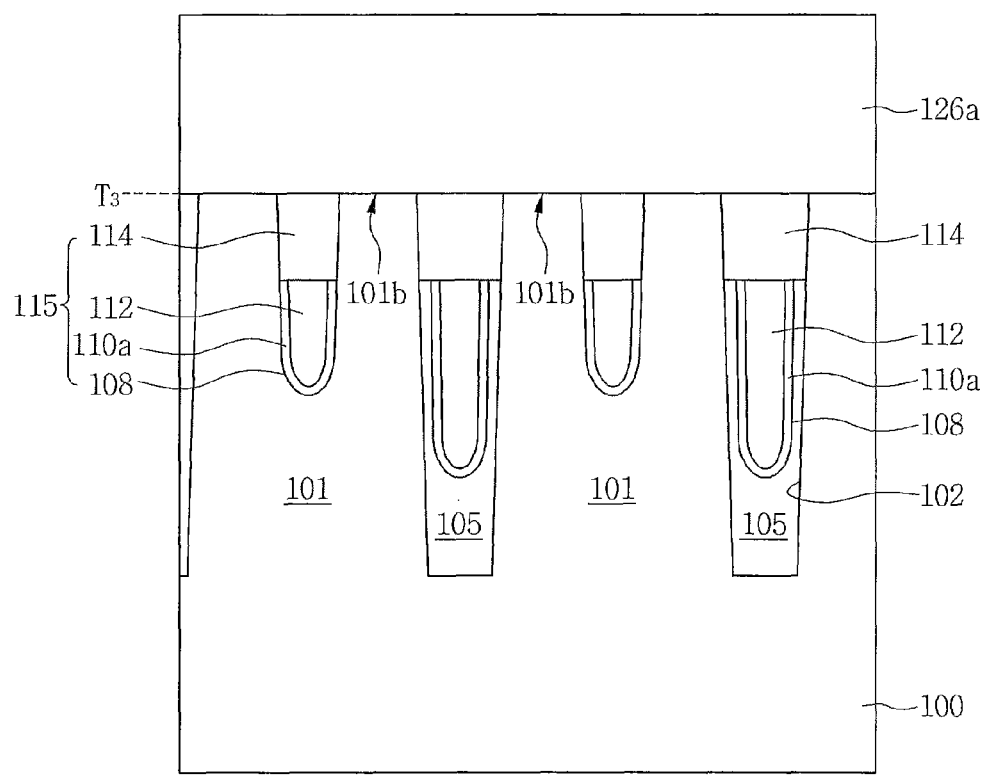
Figure 2E:
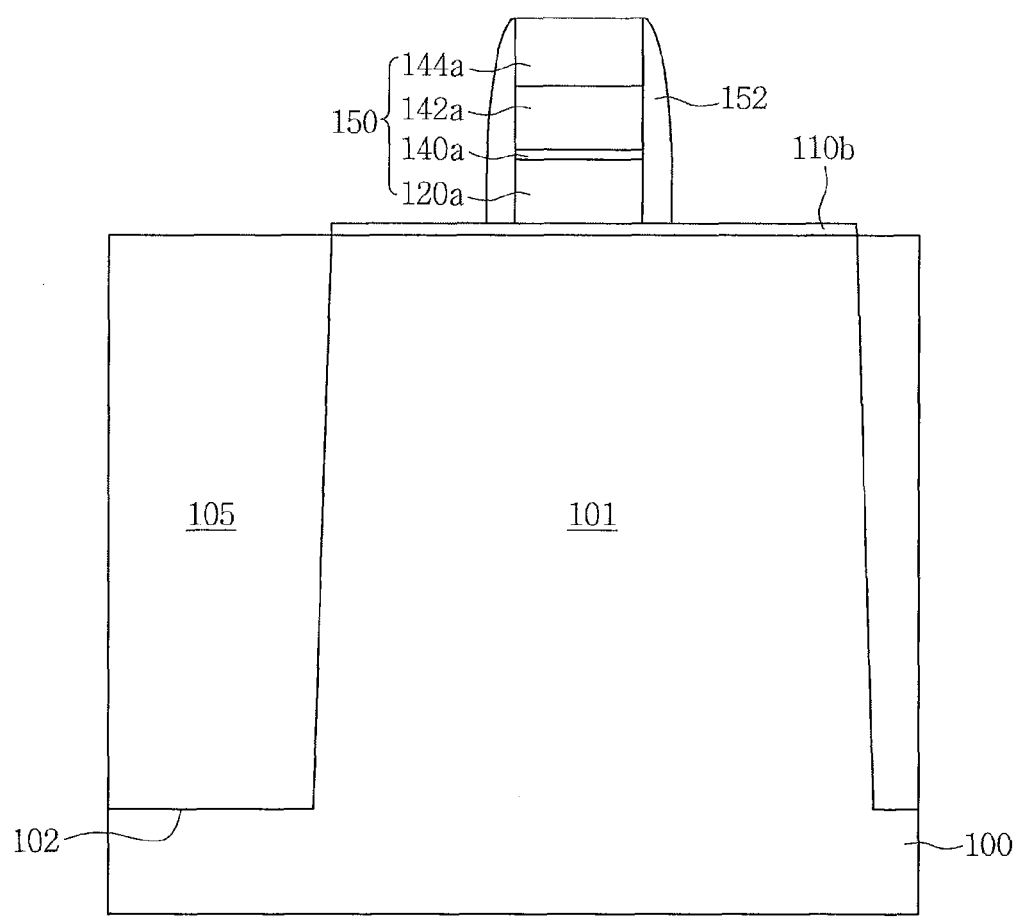
FIG. 2E illustrates a cross-sectional view showing a core/peripheral circuit region of the semiconductor device.
Figure 3A:
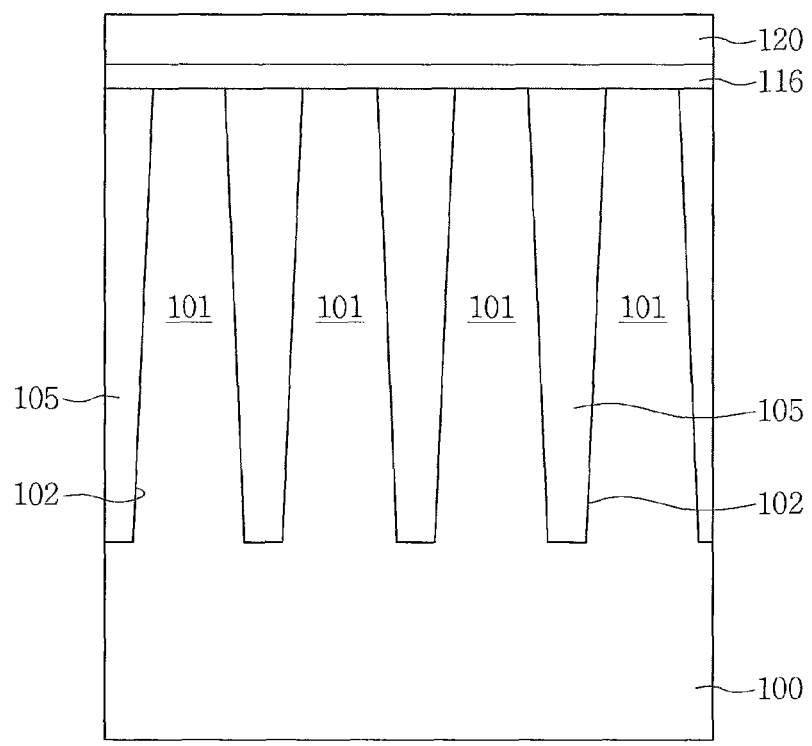
FIGS. 3A to 17E illustrate cross-sectional views of stages in a method of fabricating a semiconductor device in accordance with some embodiments.
Figure 3B:
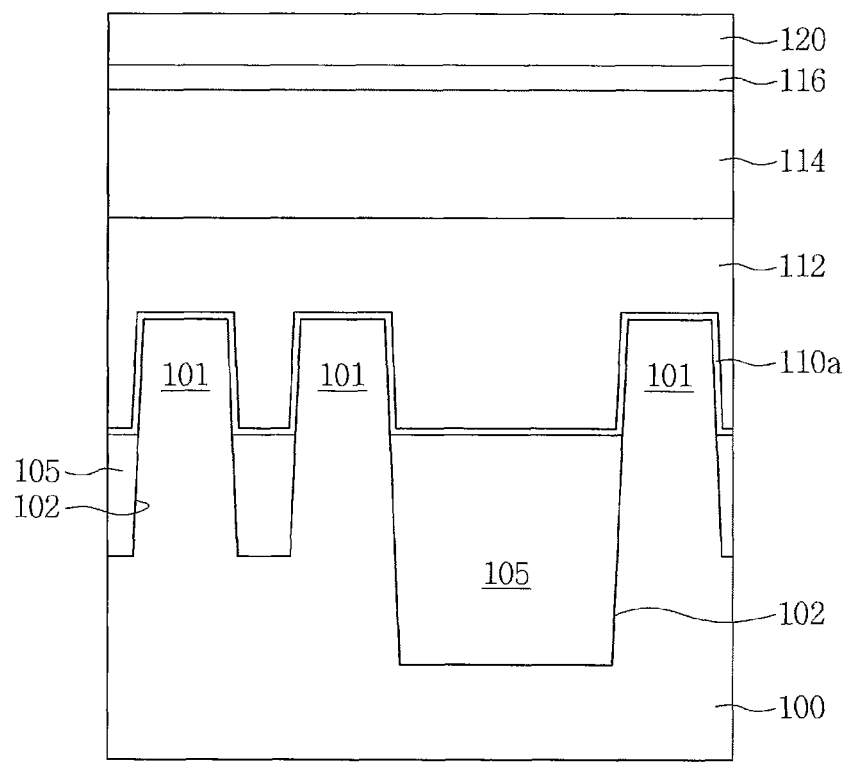
Figure 3C:
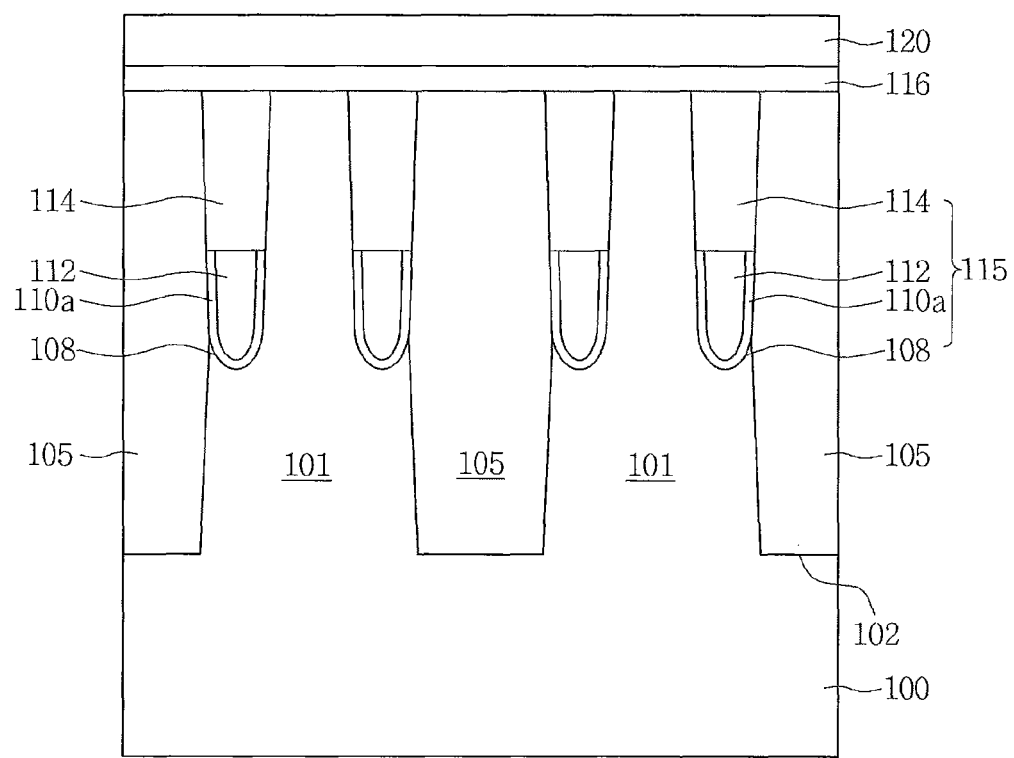
Figure 3D:
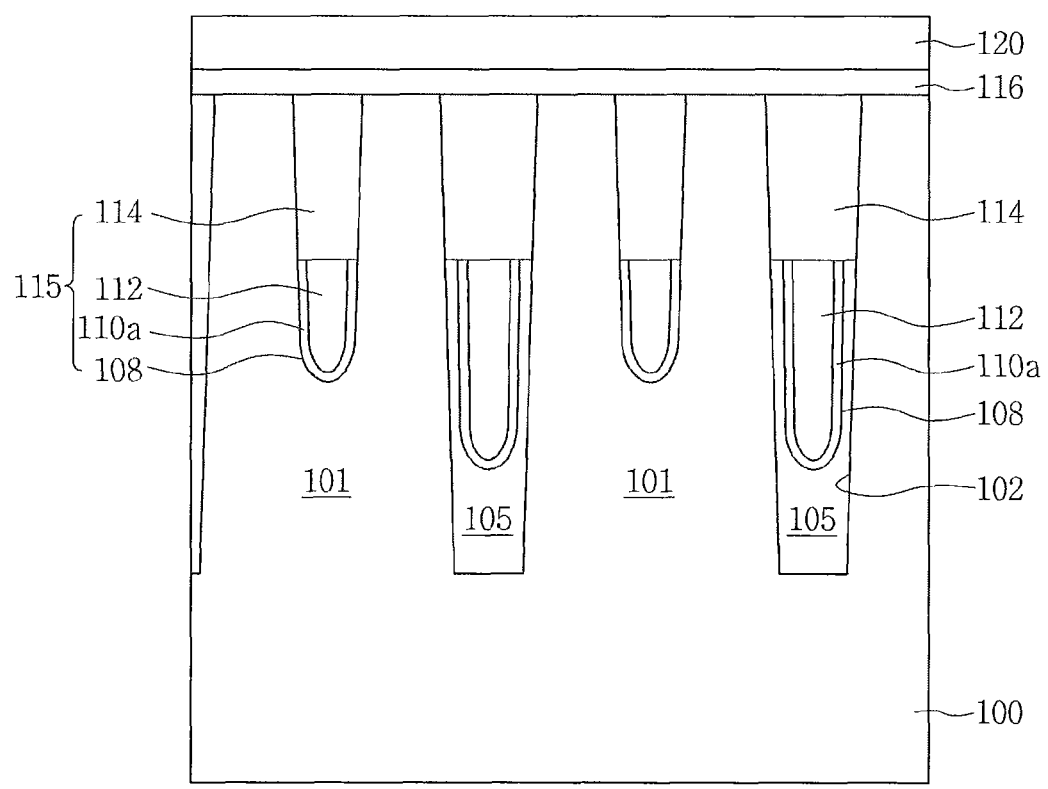
Figure 3E:
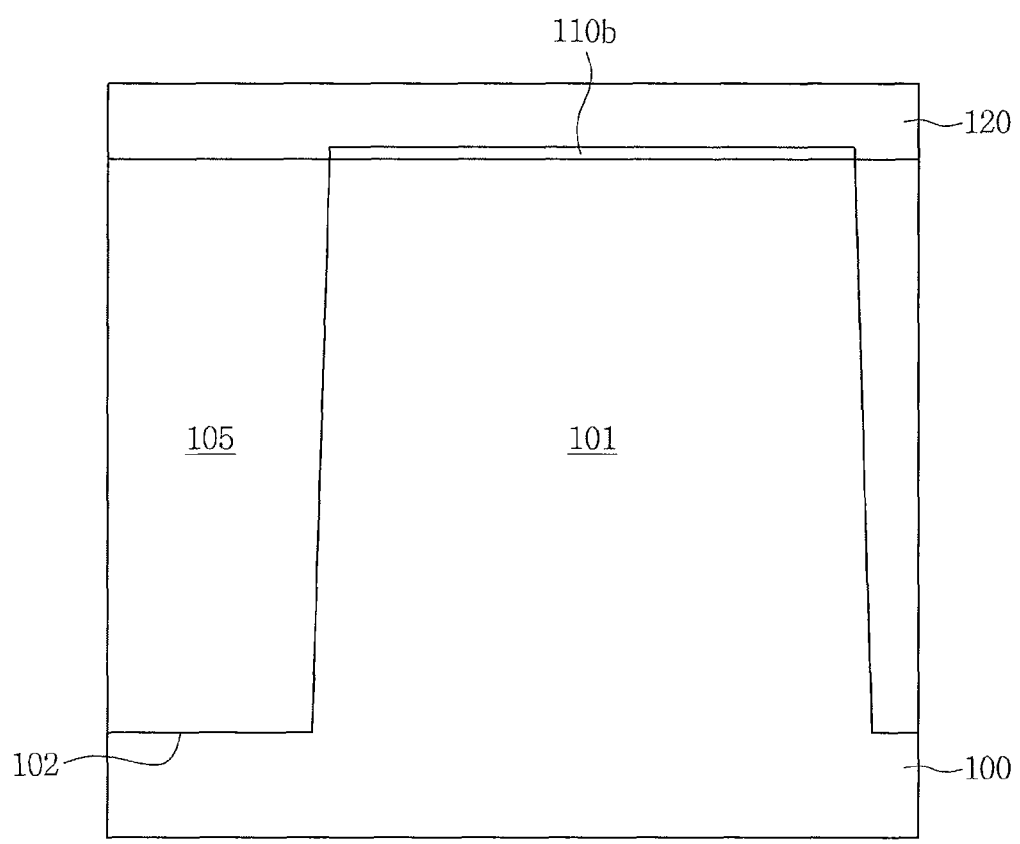
Figure 4A:
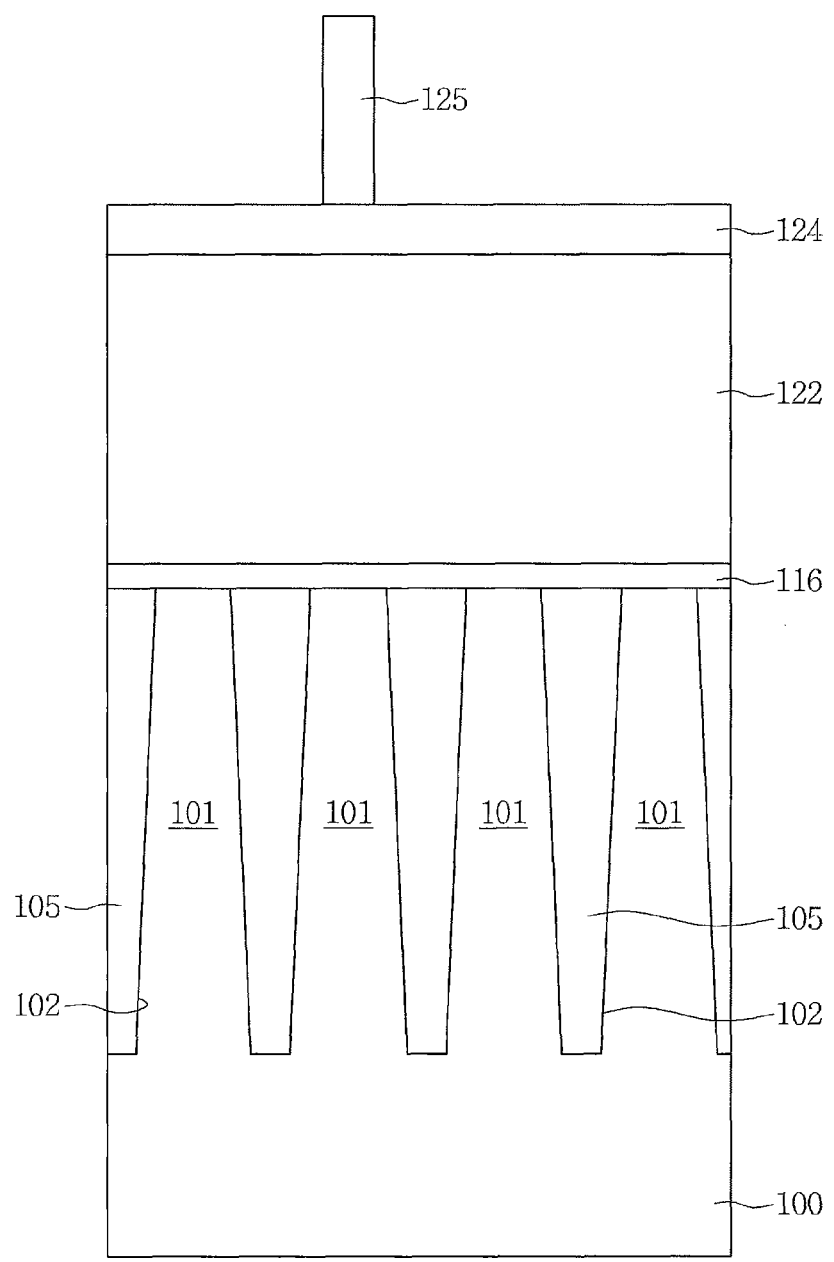
Figure 4B:
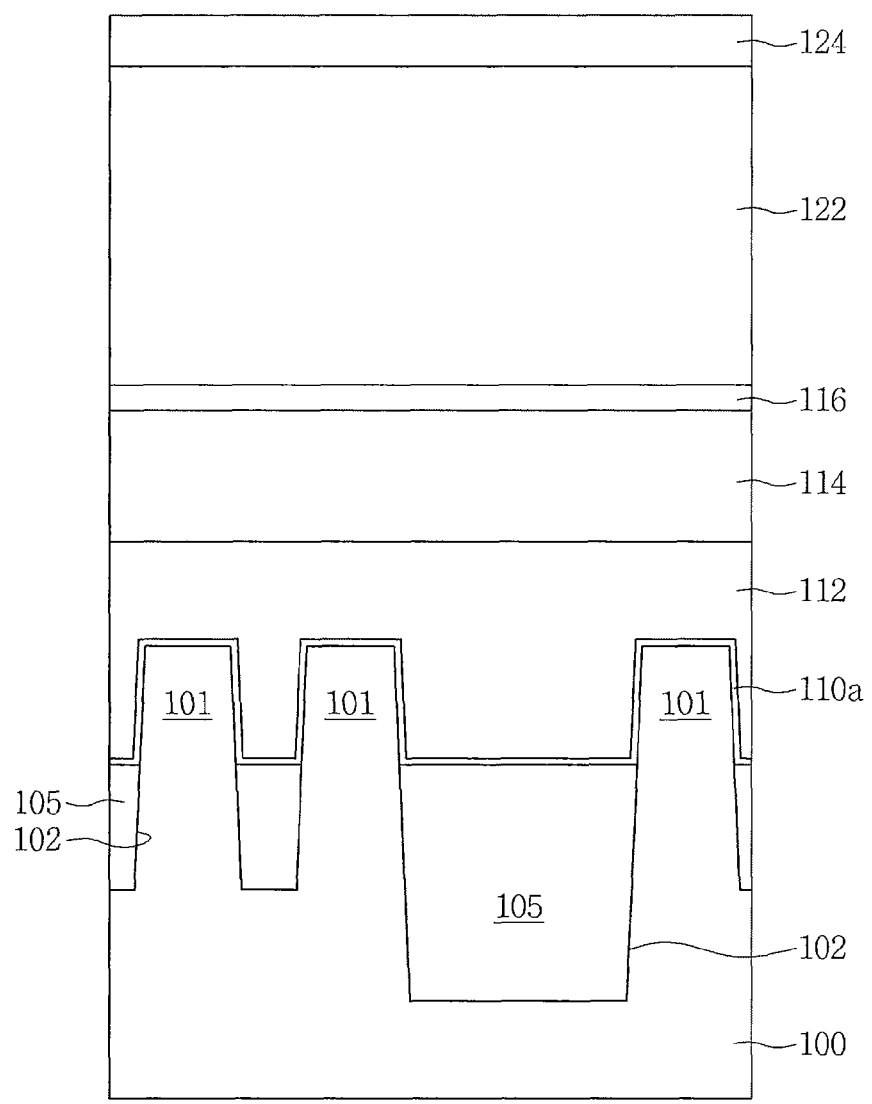
Figure 4C:
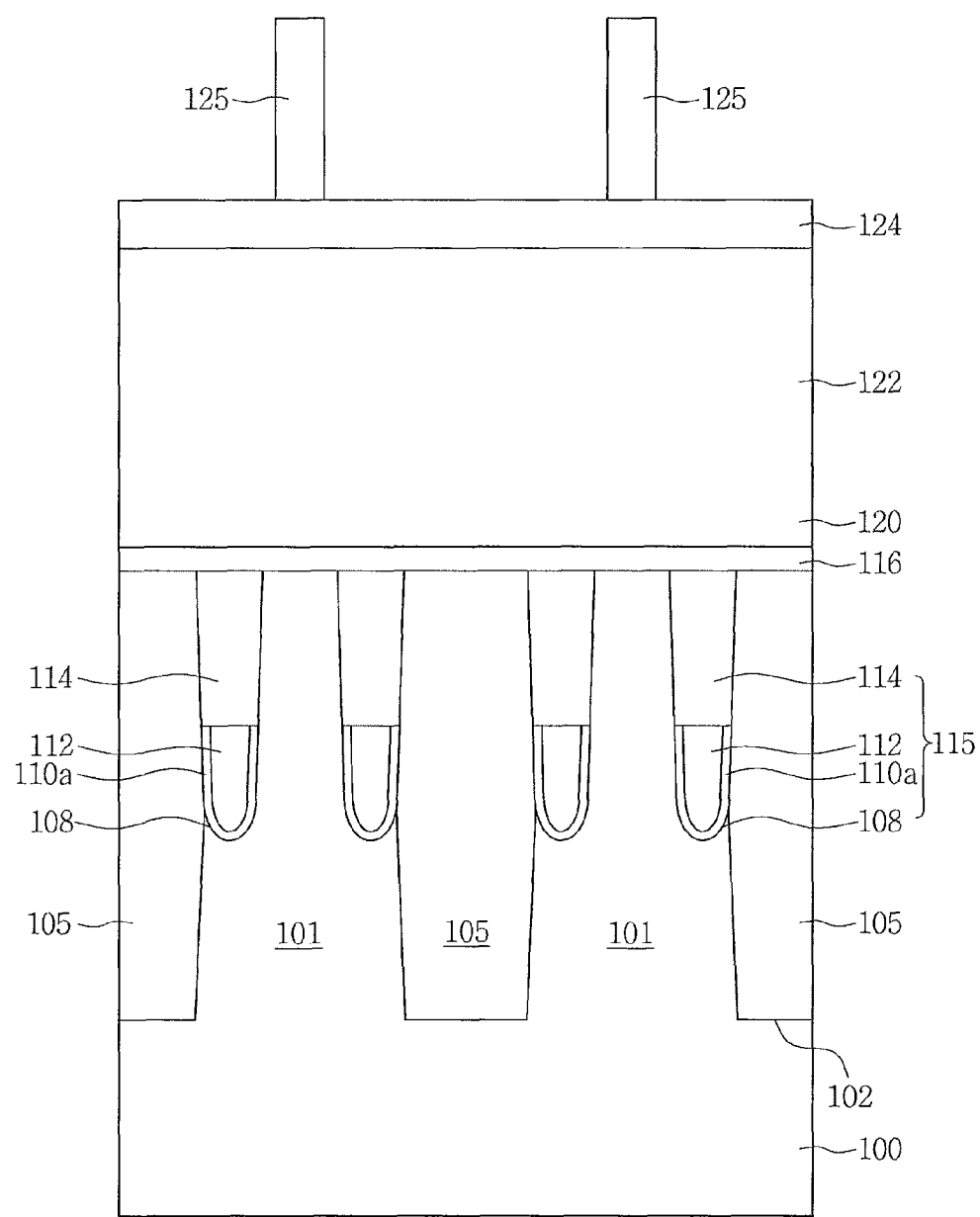
Figure 4D:
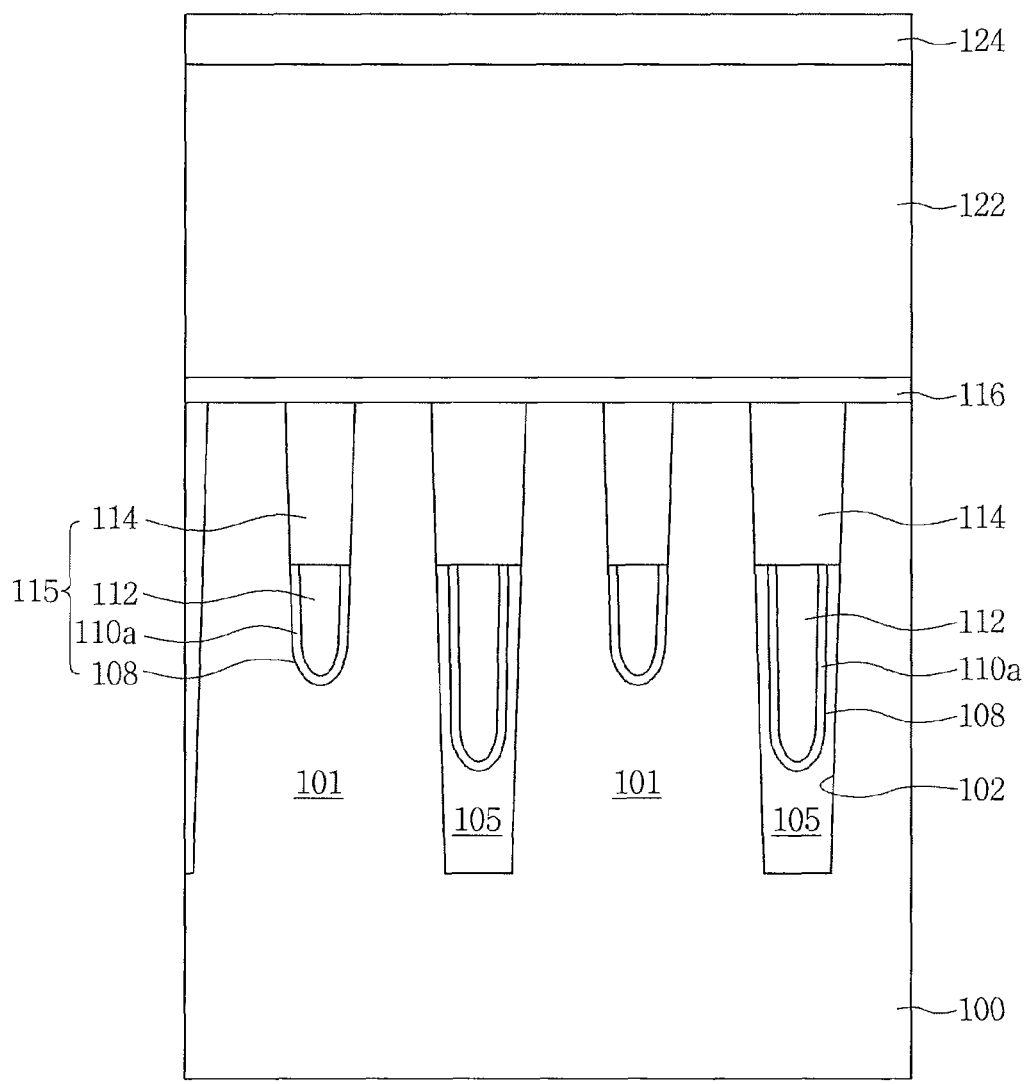
Figure 4E:
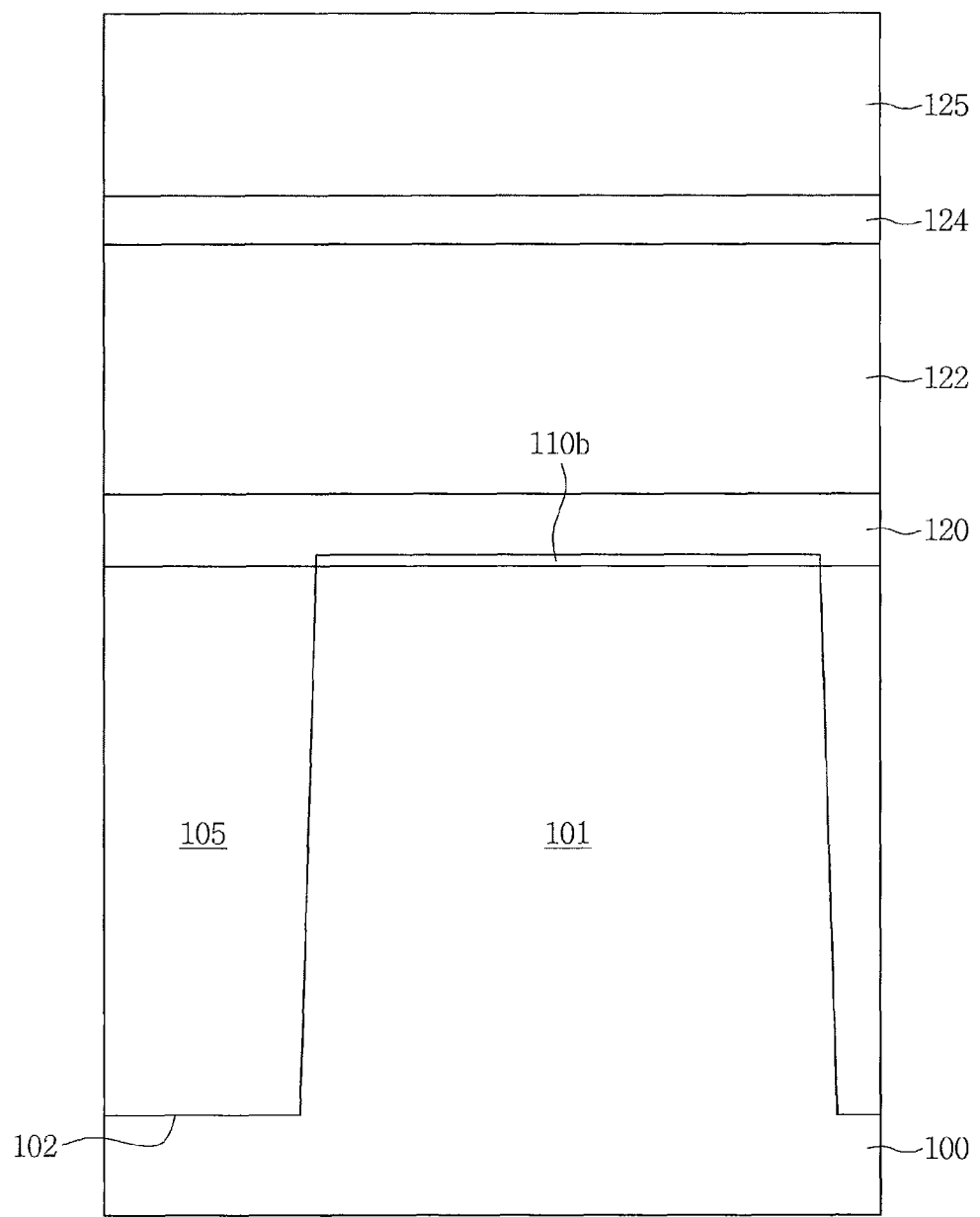
Figure 5A:
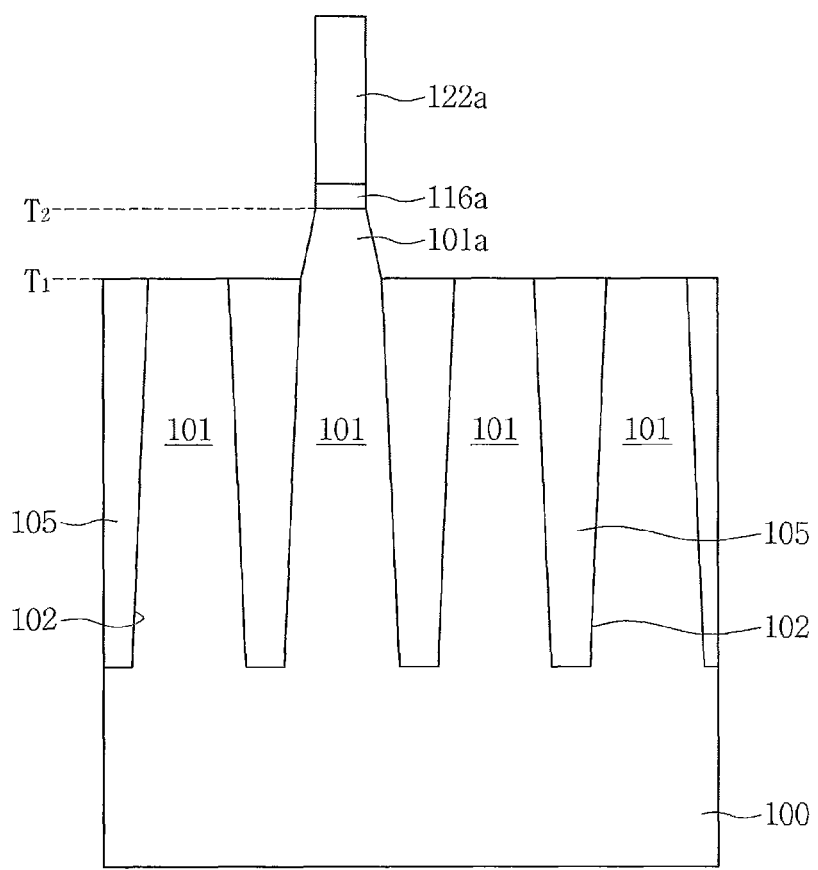
Figure 5B:
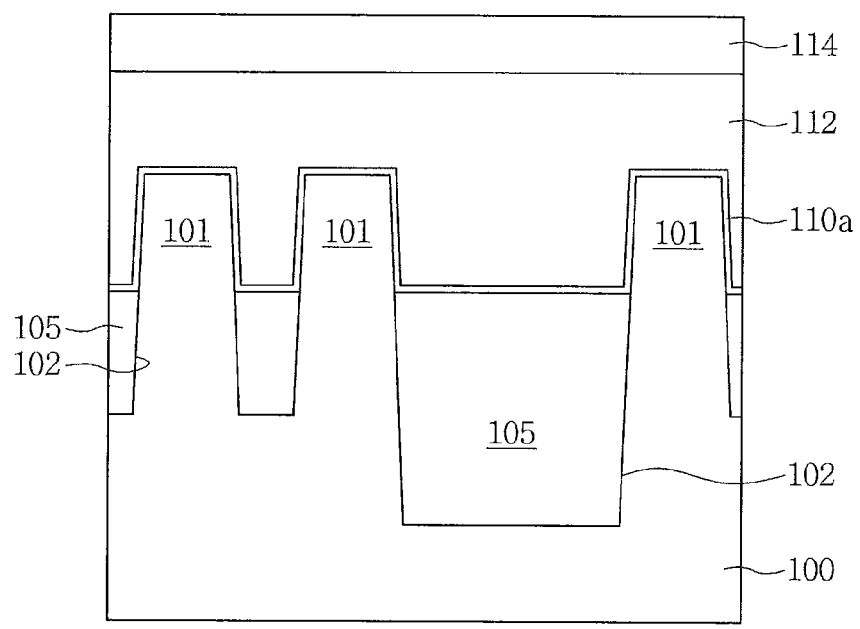
Figure 5C:
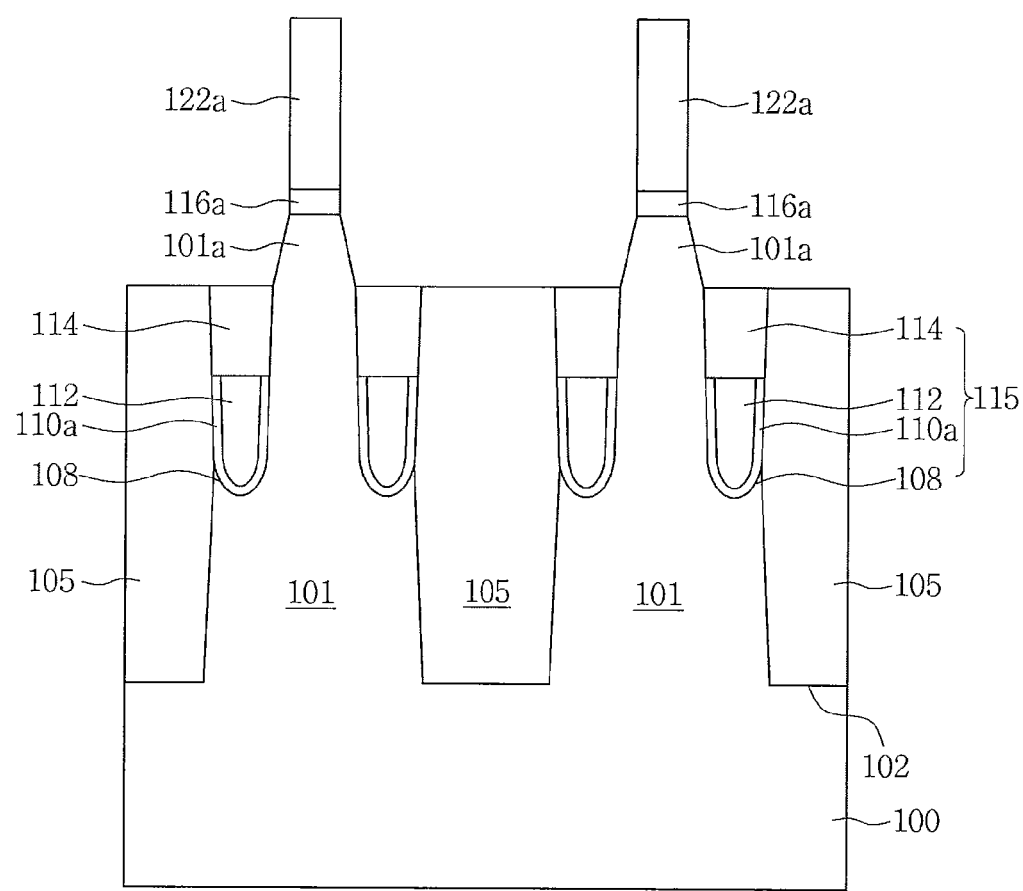
Figure 5D:
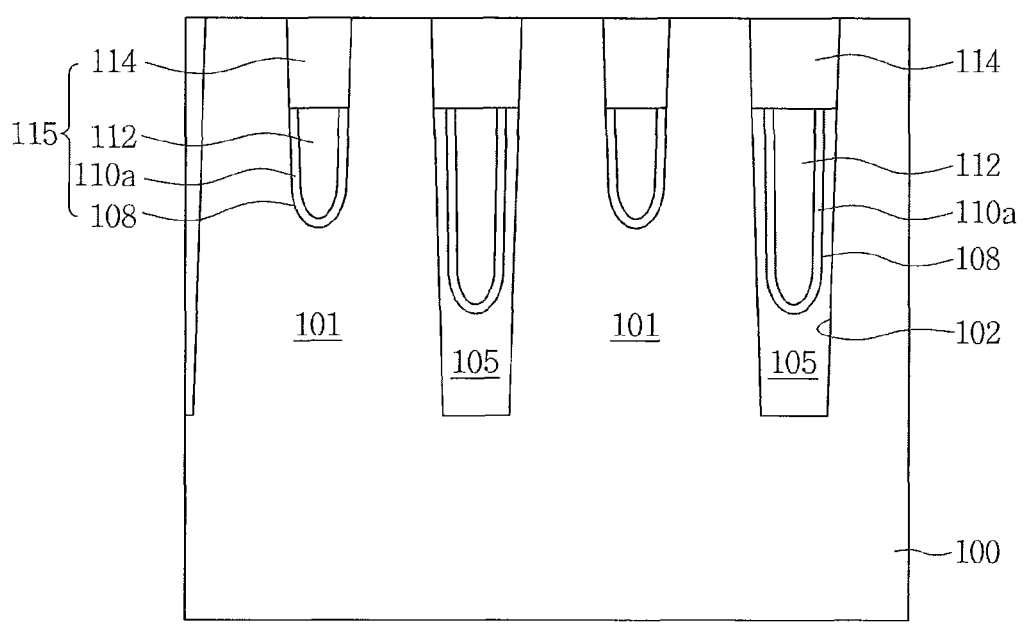
Figure 5E:
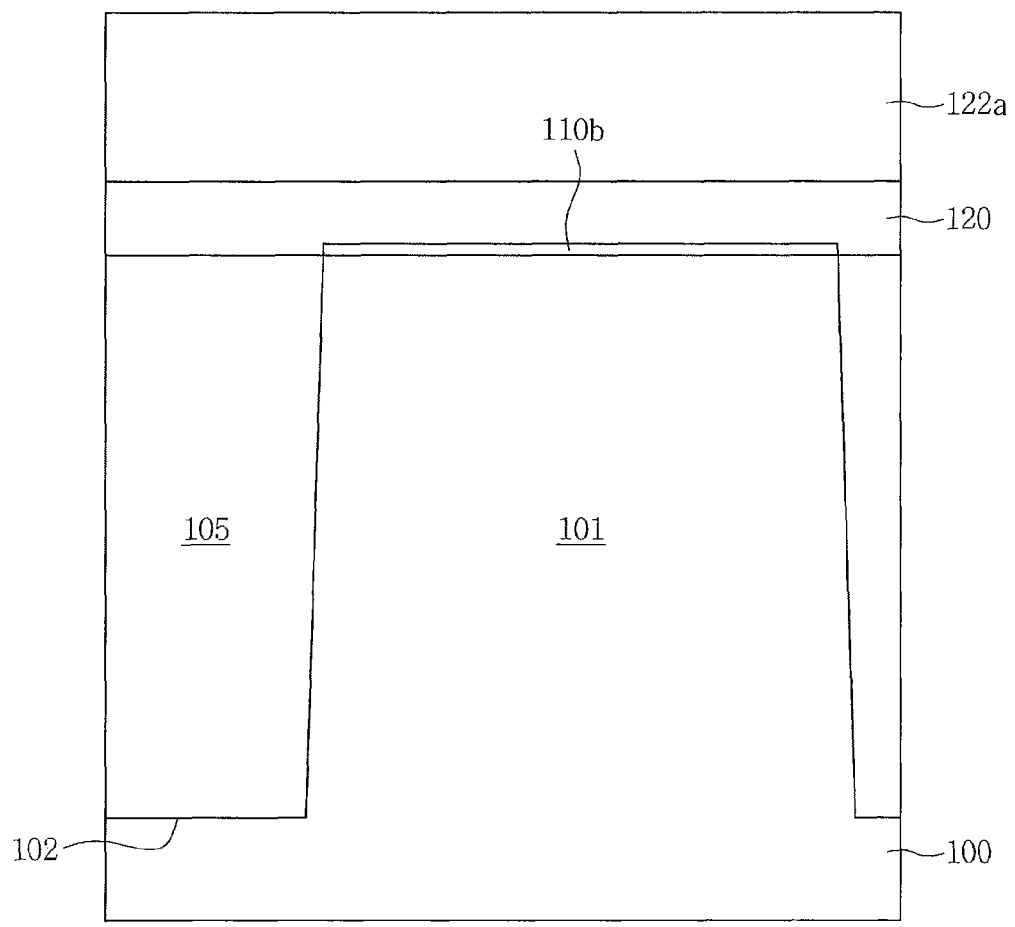
Figure 6A:
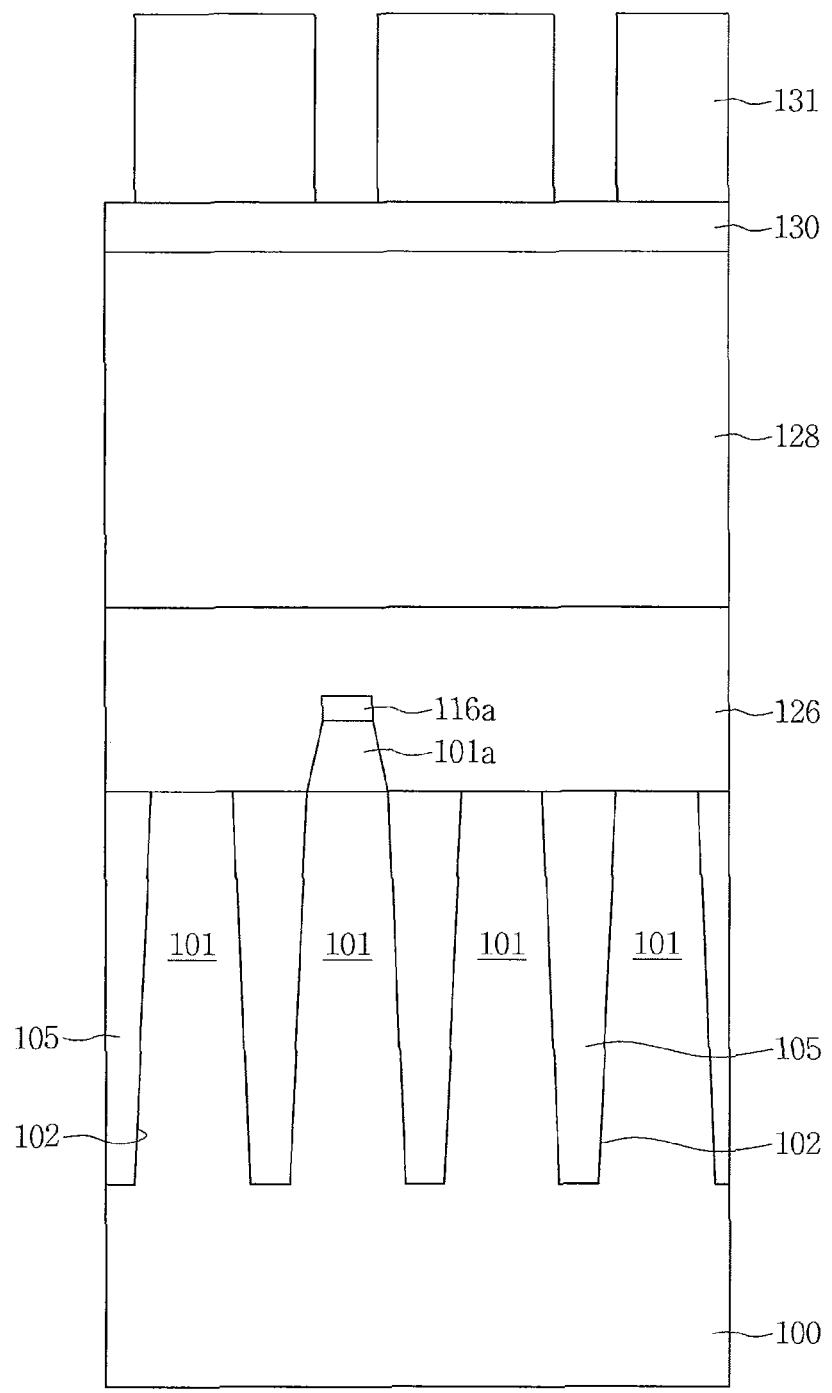
Figure 6B:
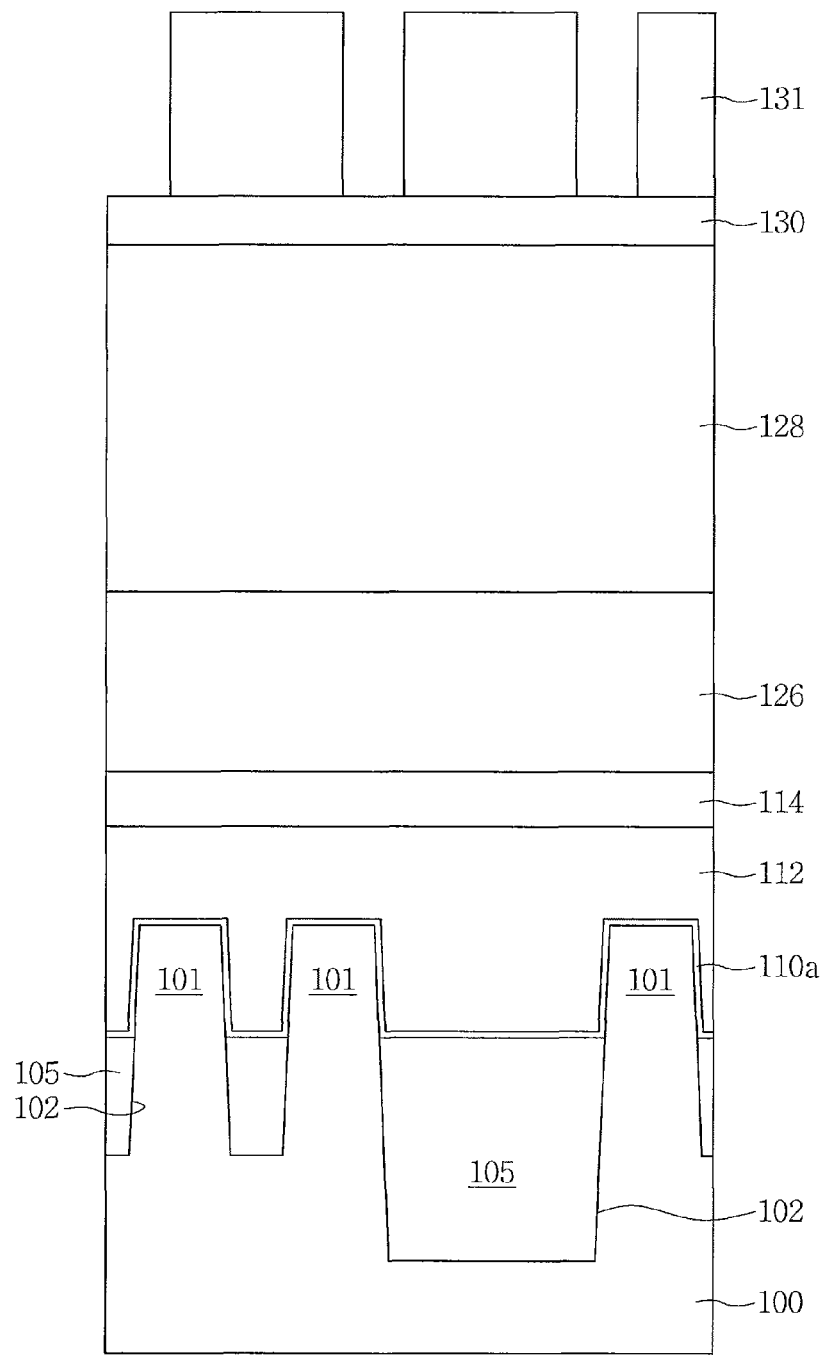
Figure 6C:
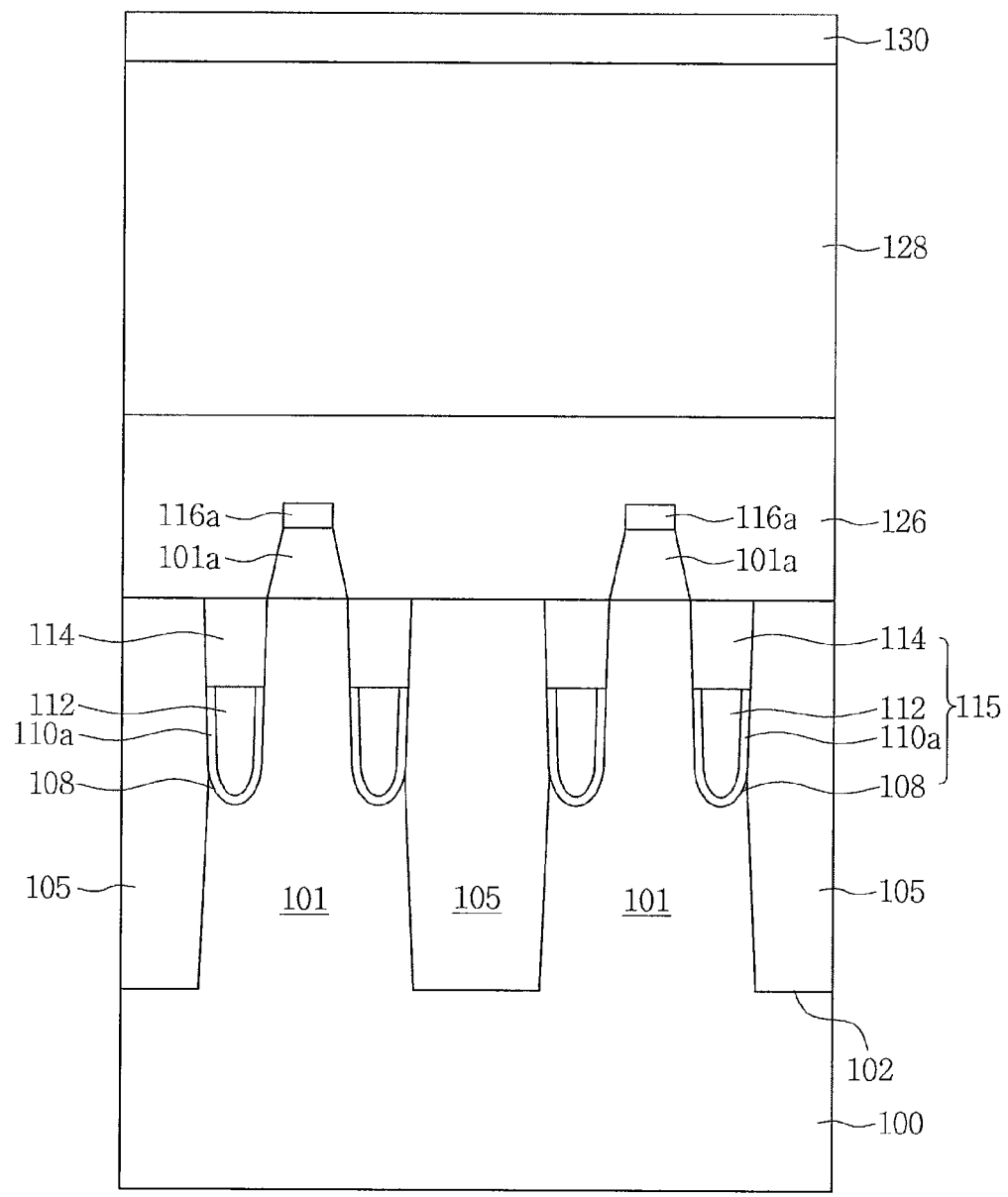
Figure 6D:
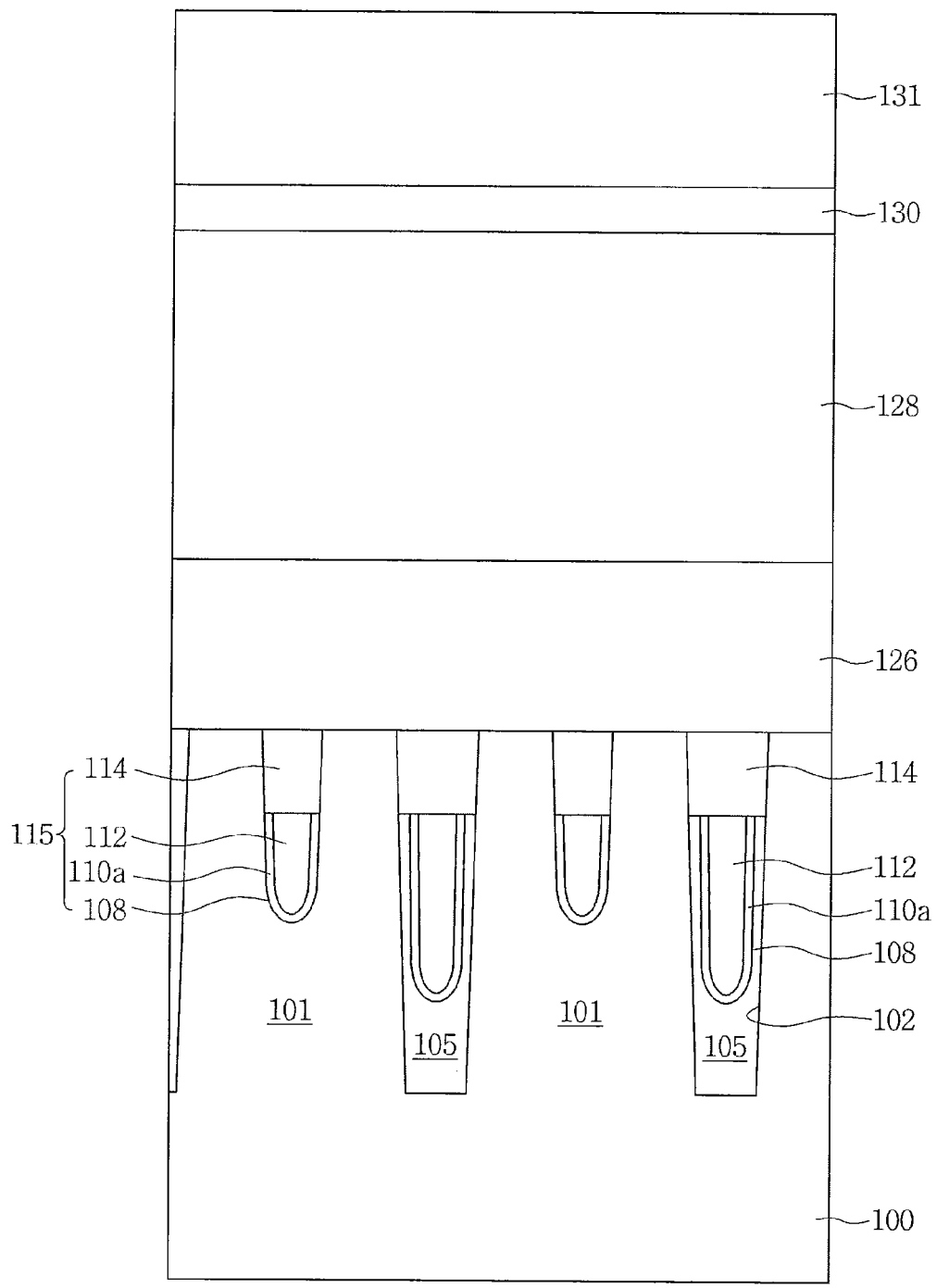
Figure 6E:
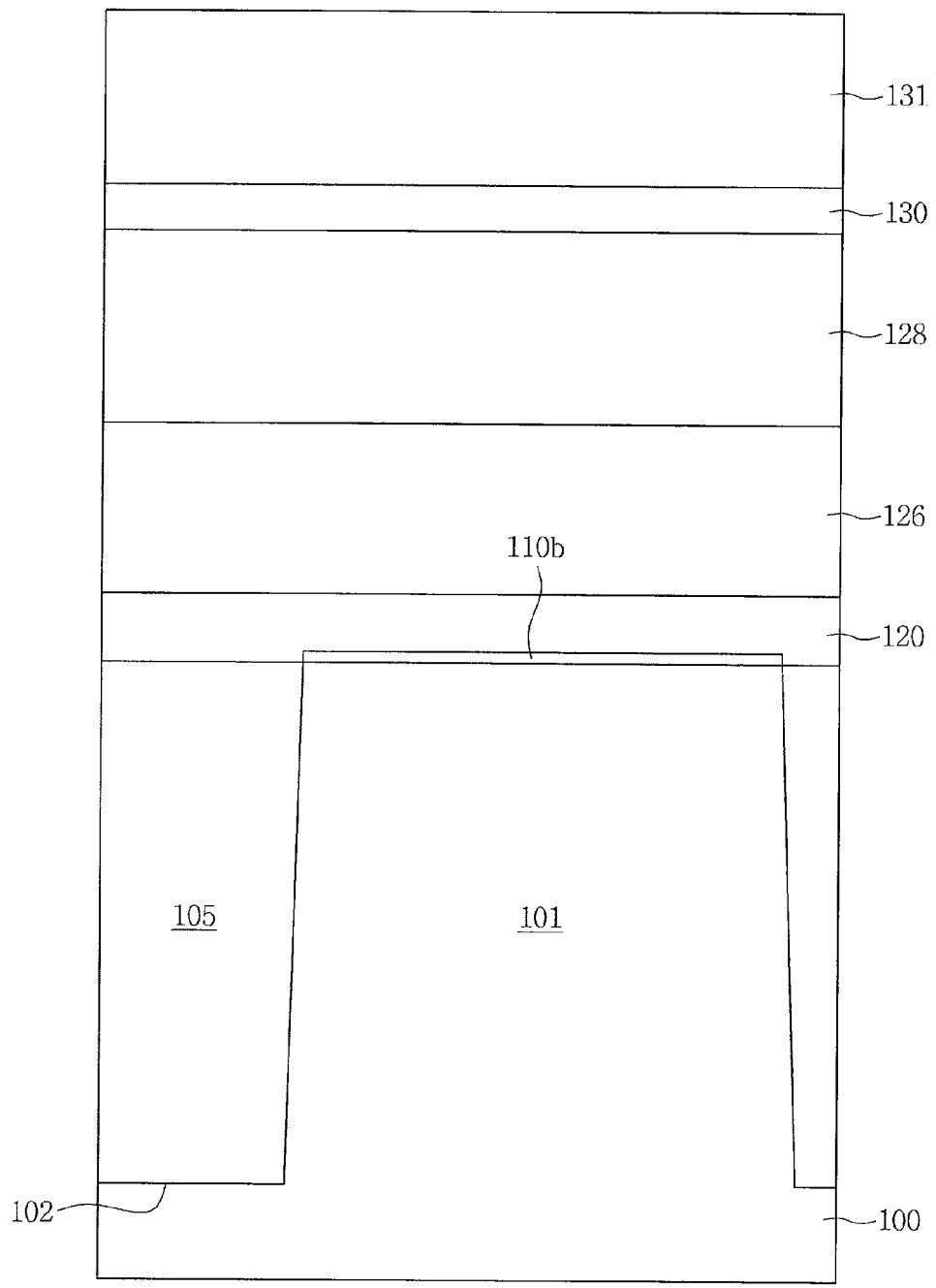
Figure 7A:
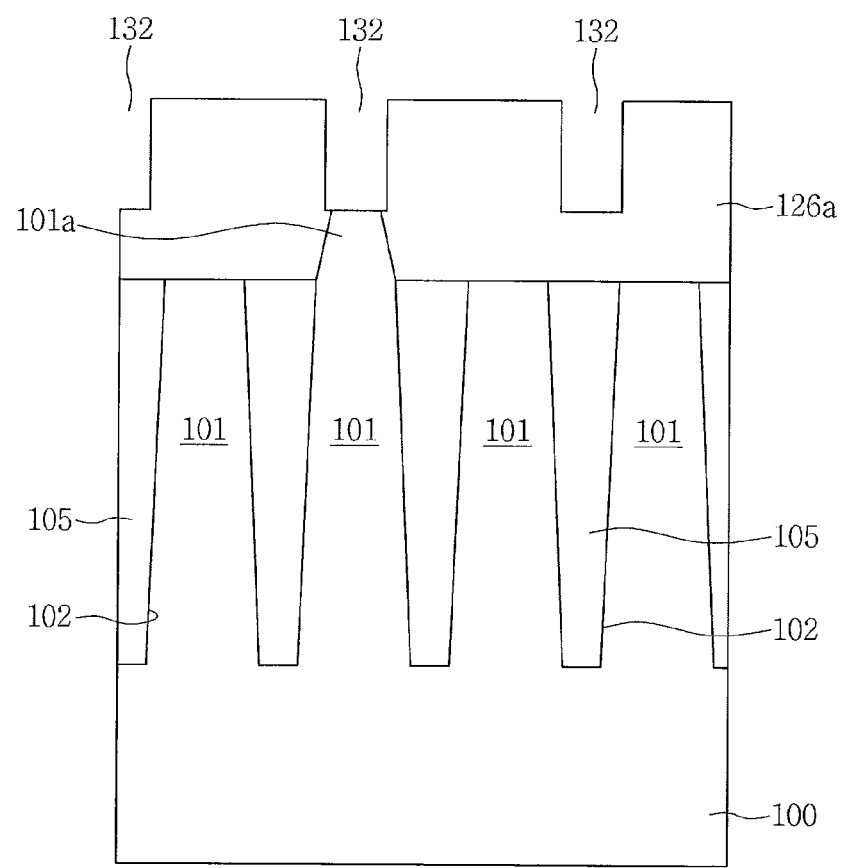
Figure 7B:
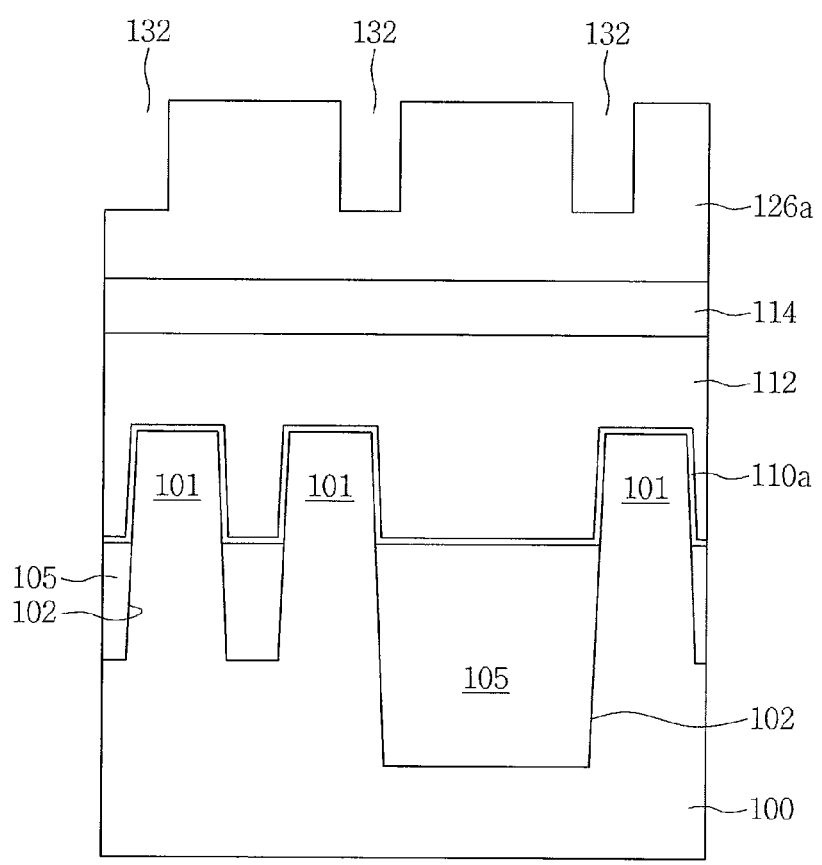
Figure 7C:
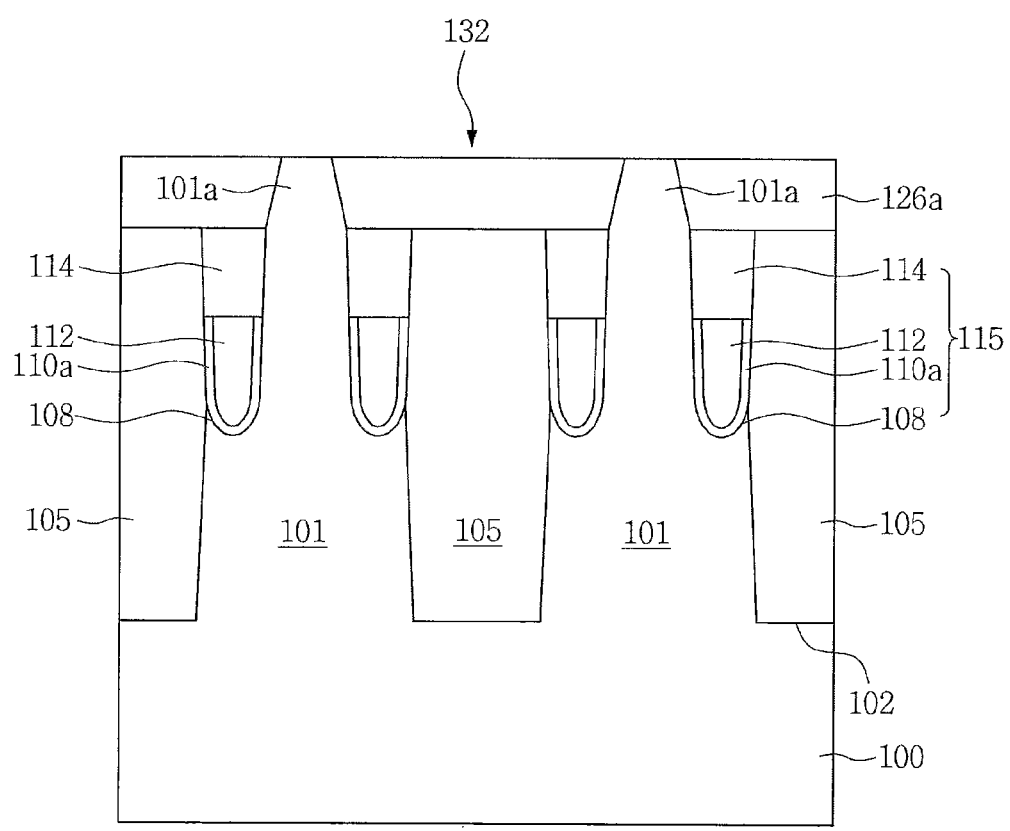
Figure 7D:
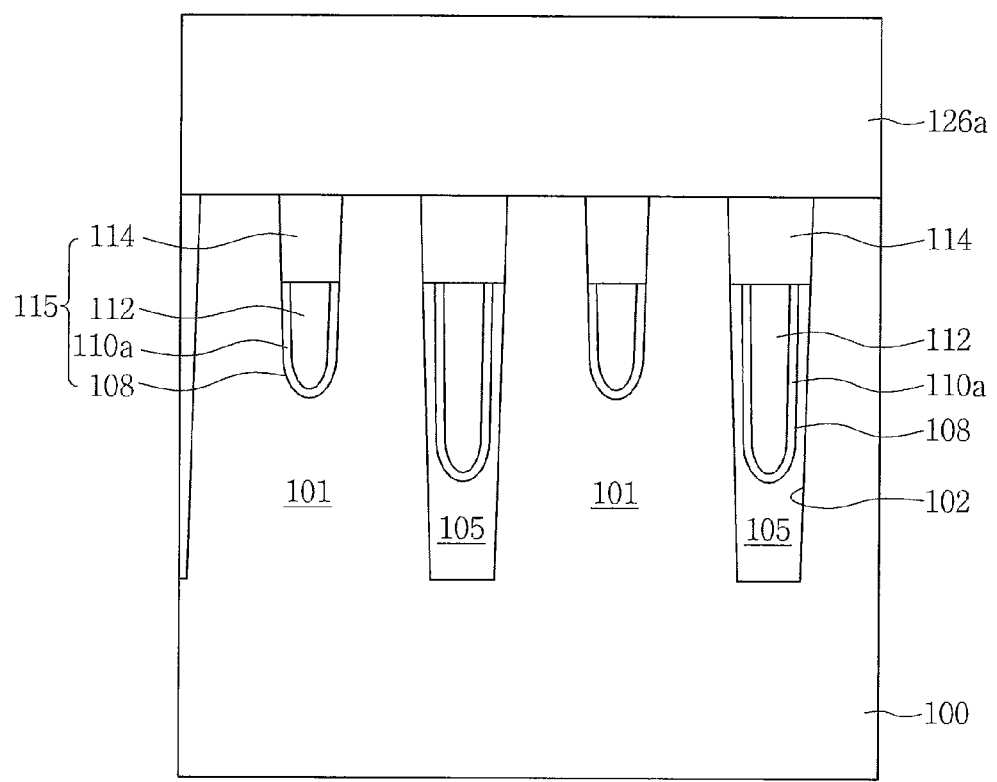
Figure 7E:
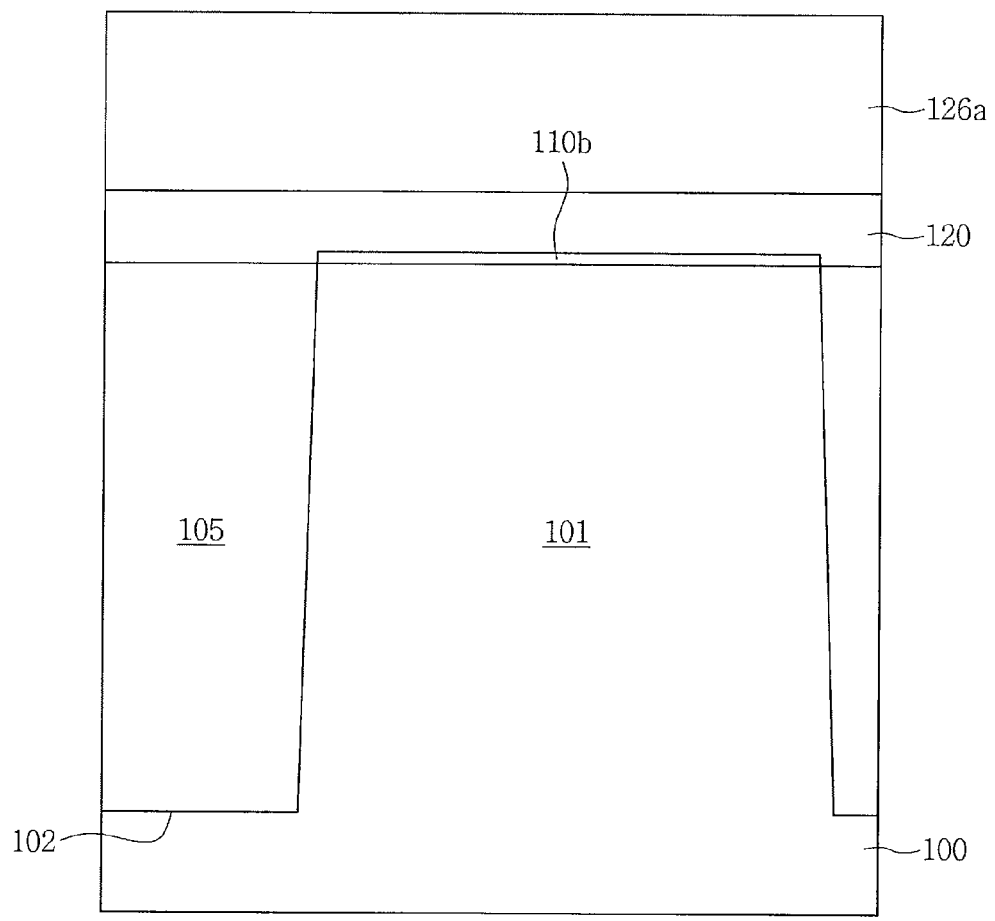
Figure 8A:
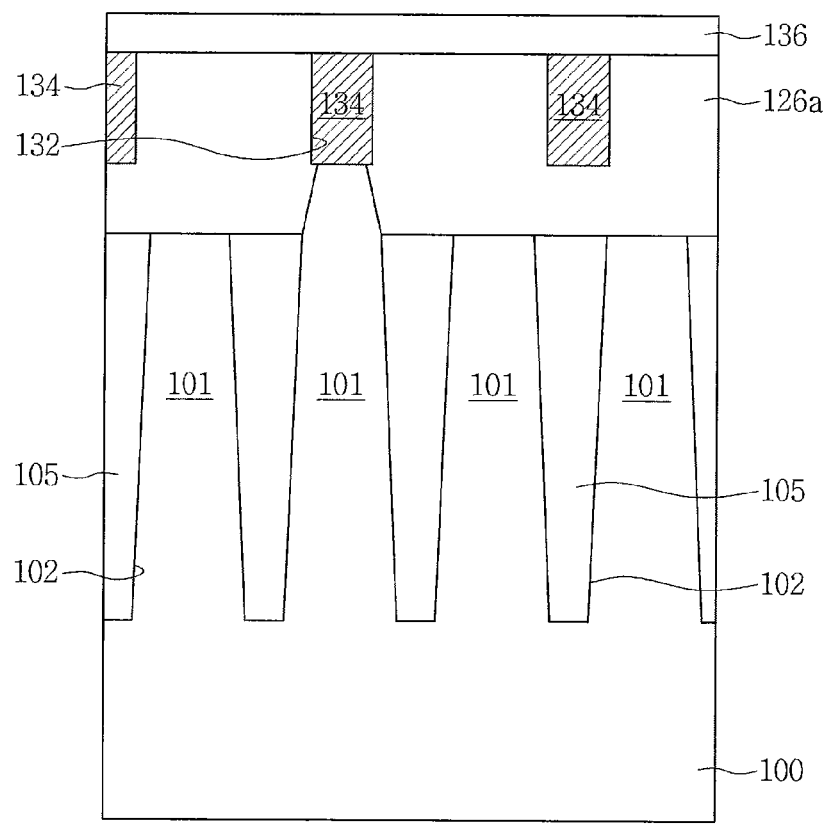
Figure 8B:
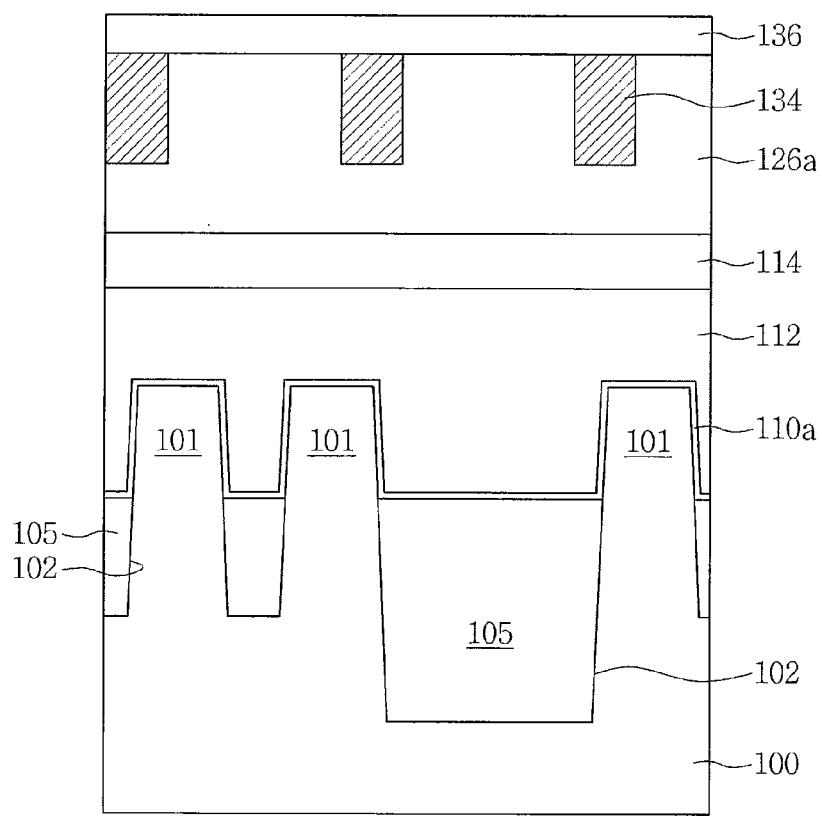
Figure 8C:
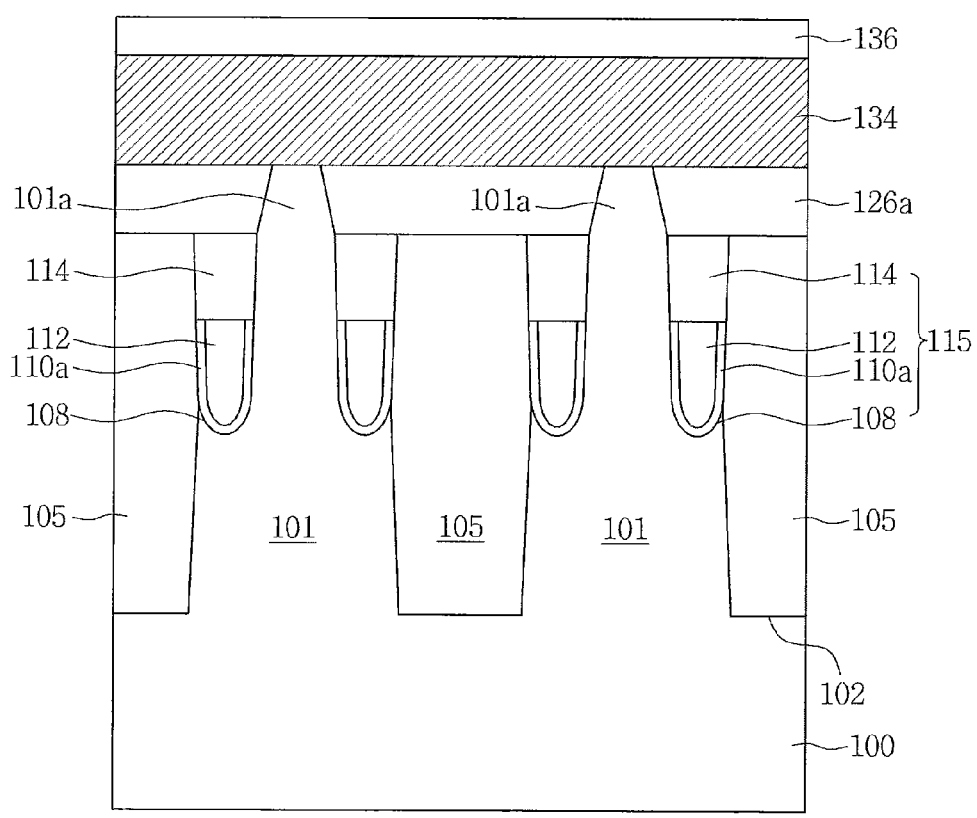
Figure 8D:
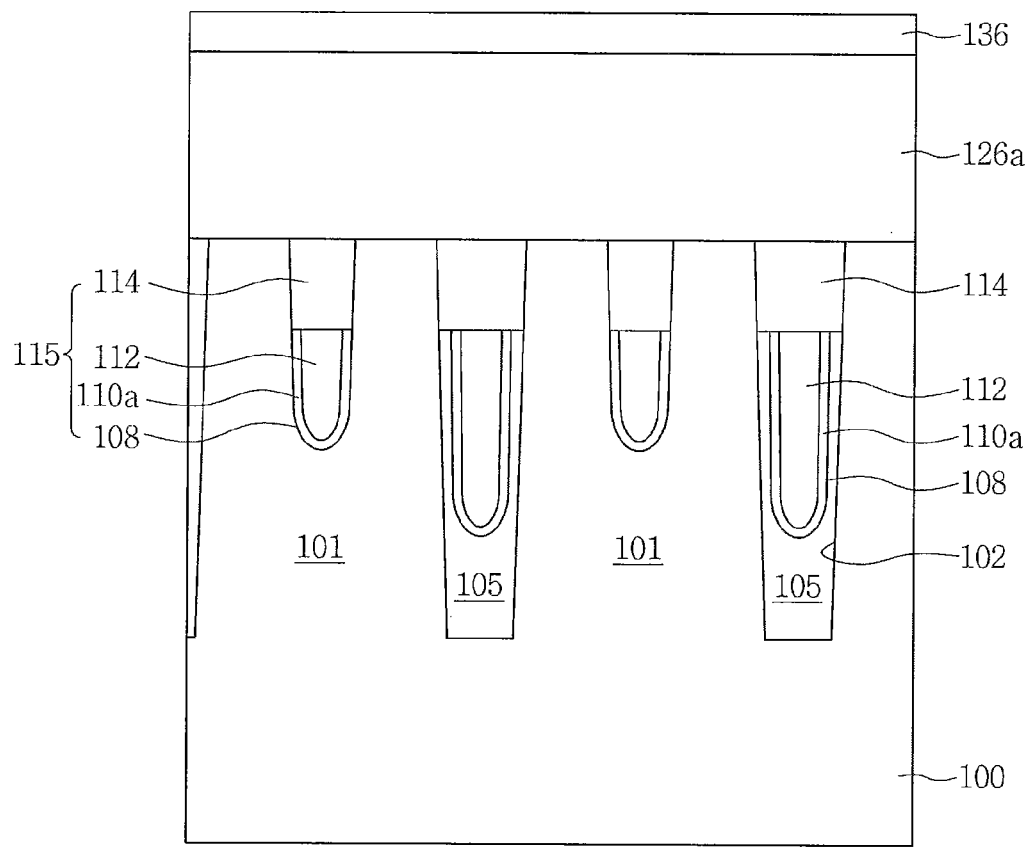
Figure 8E:
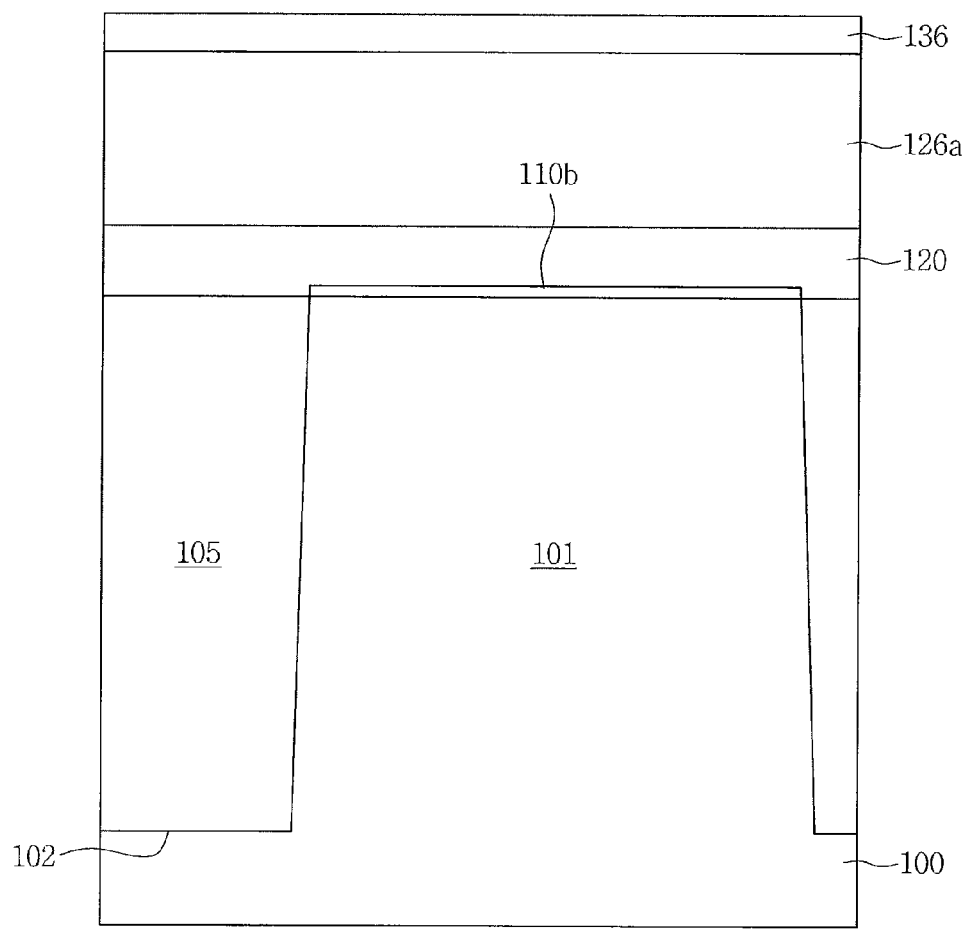
Figure 9A:
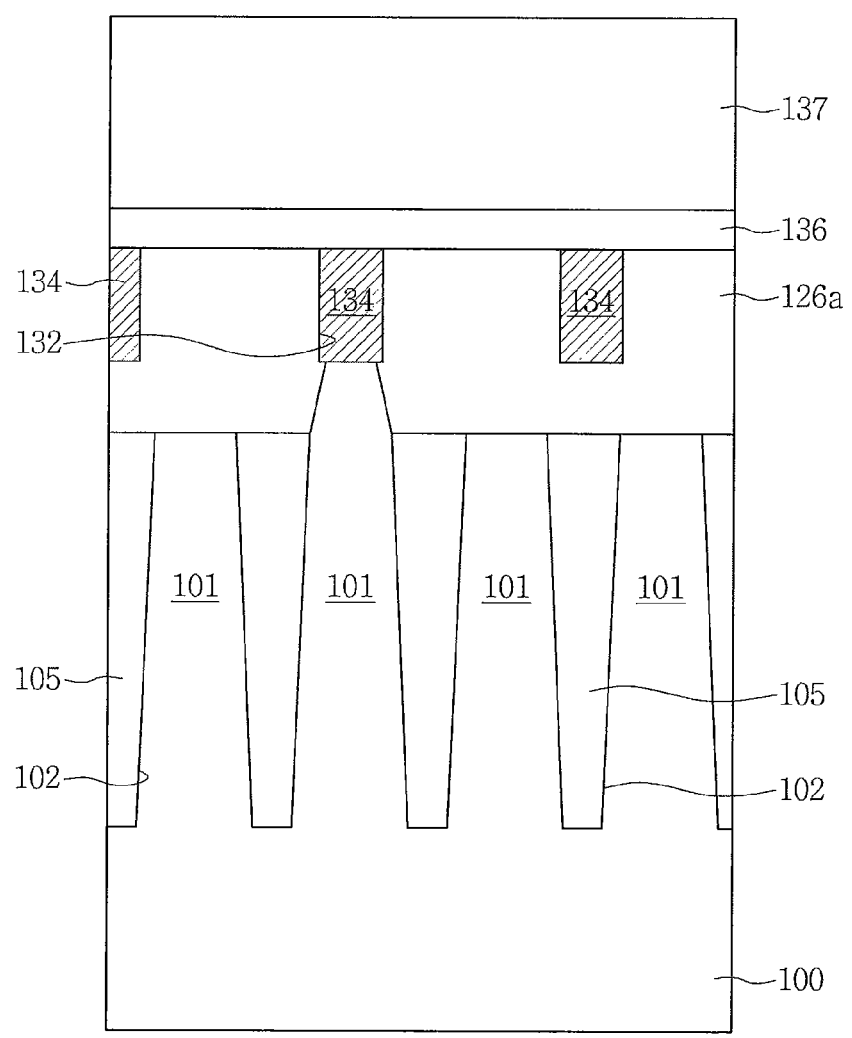
Figure 9B:
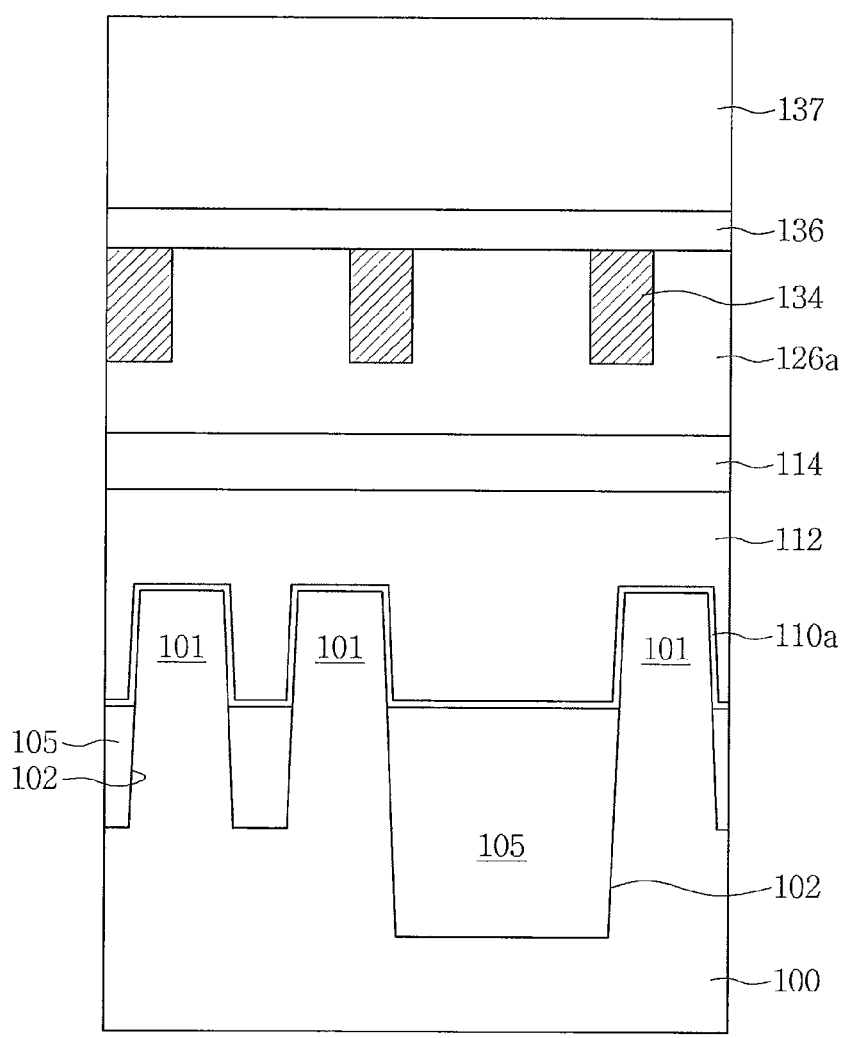
Figure 9C:
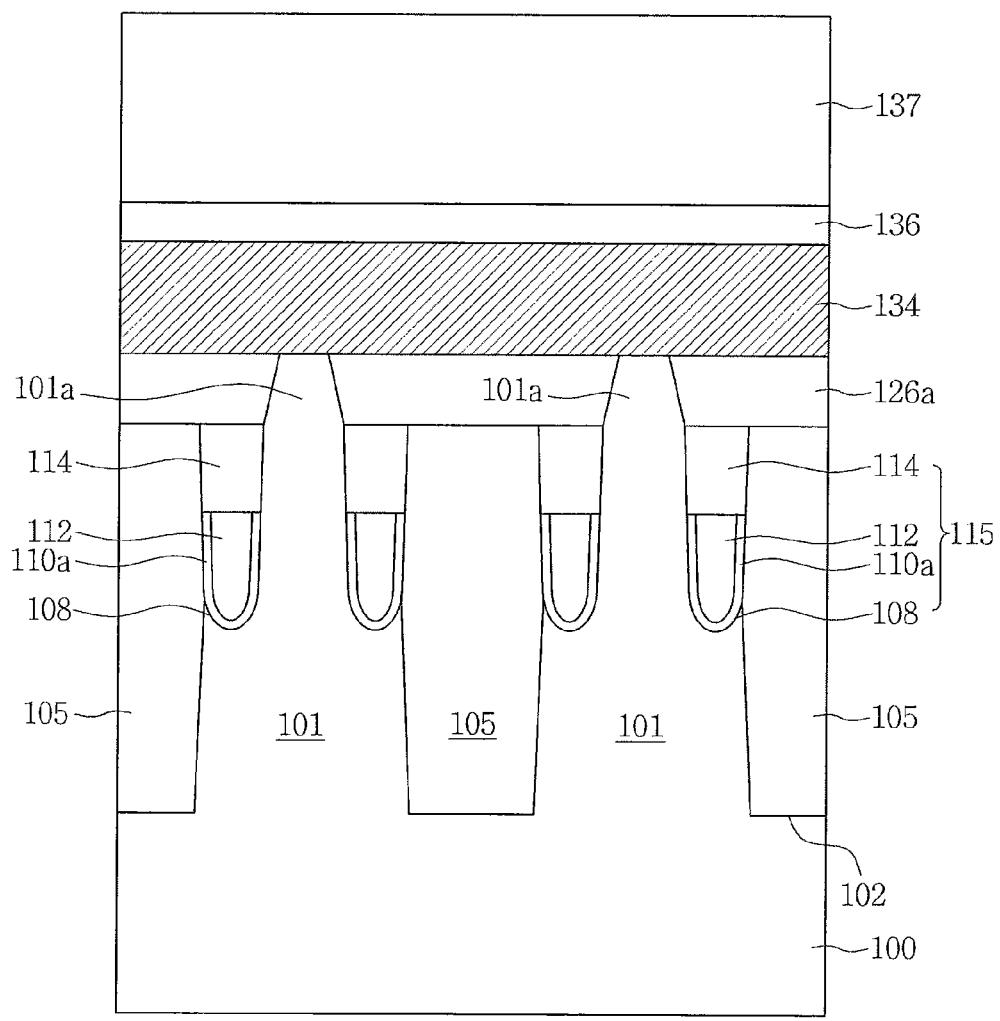
Figure 9D:
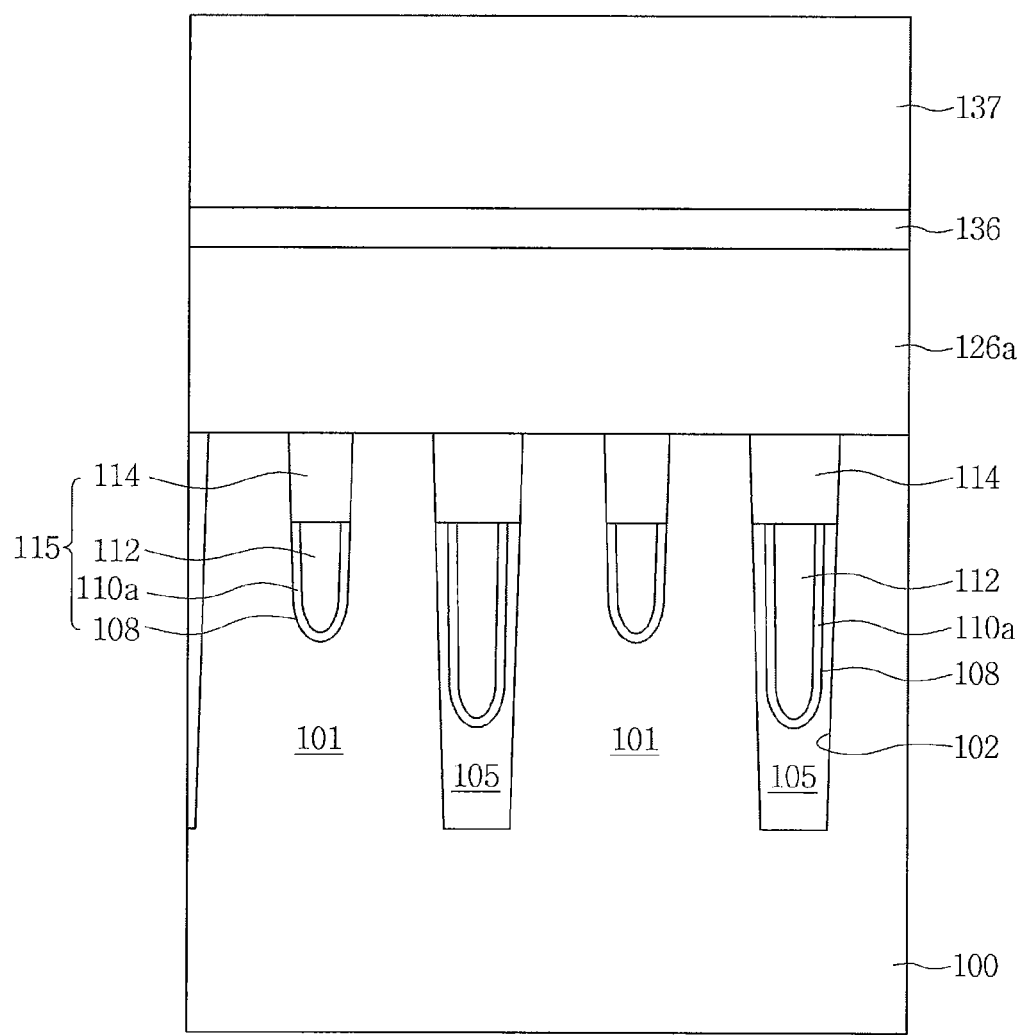
Figure 9E:
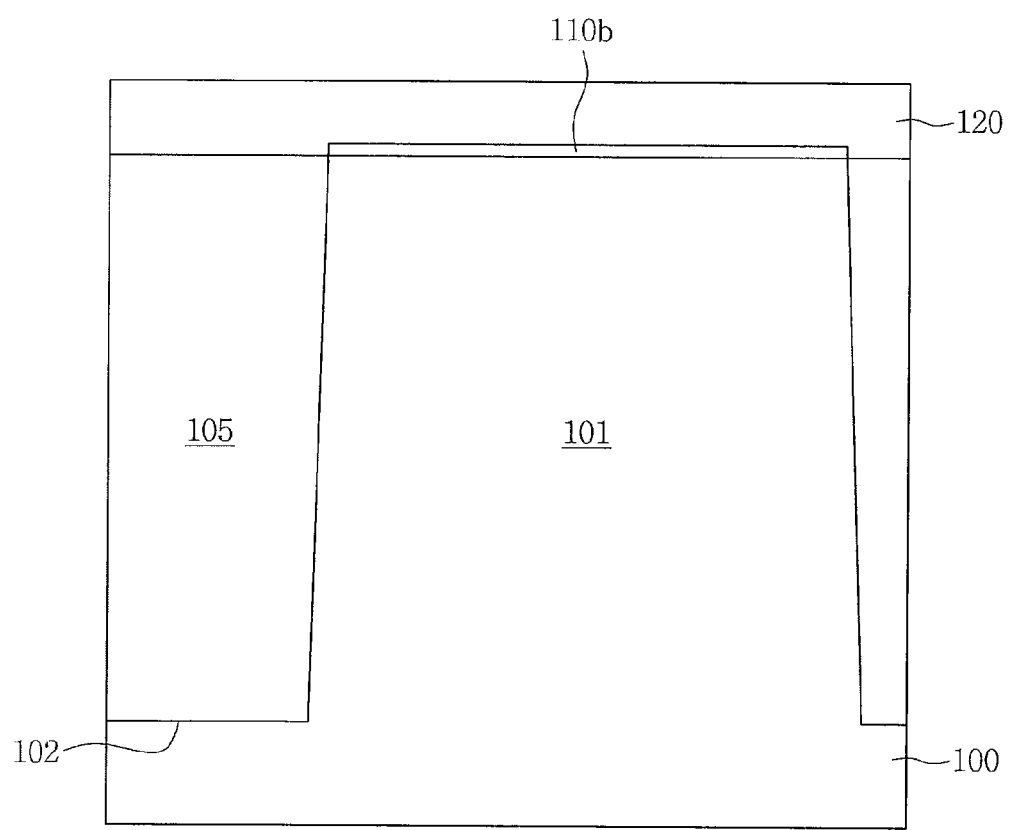
Figure 10A:
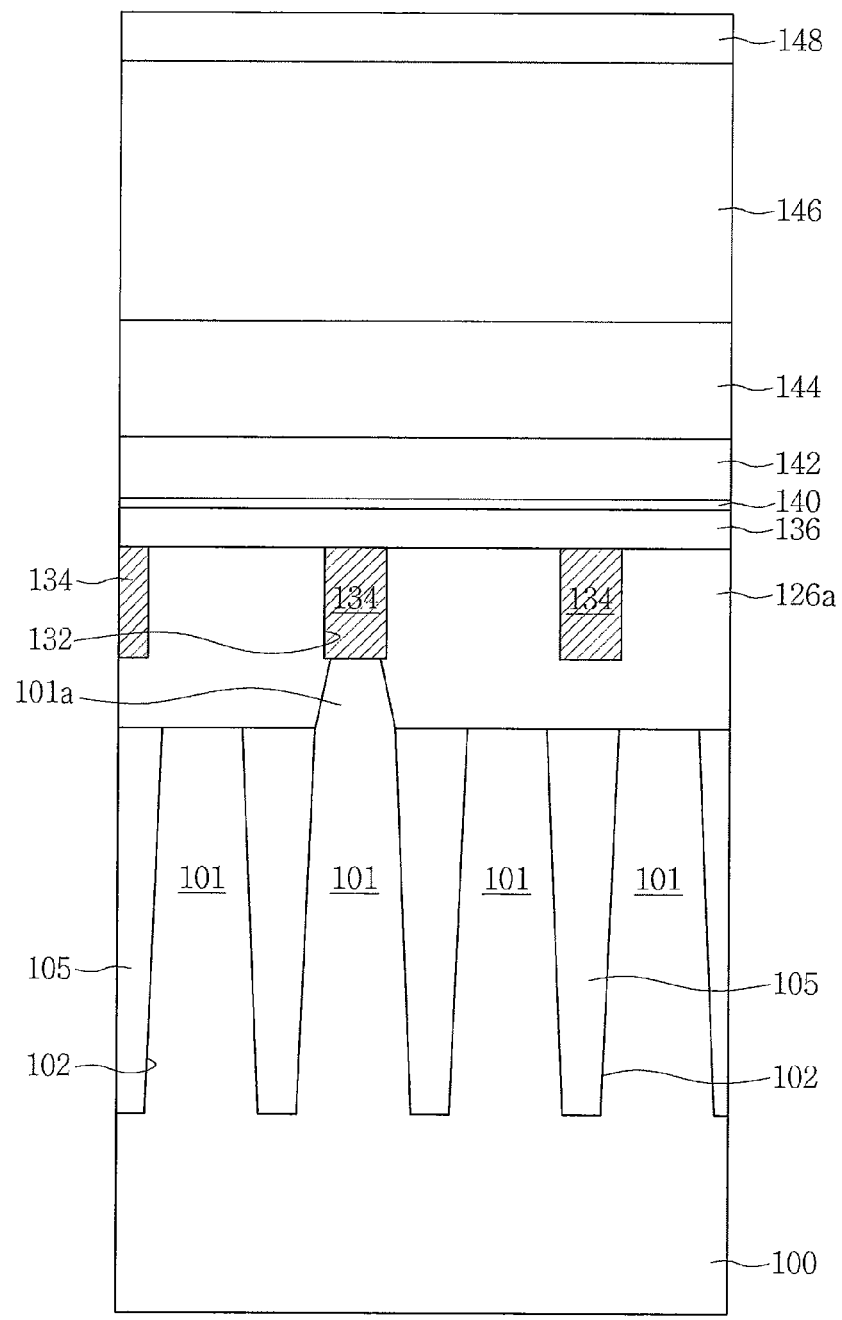
Figure 10B:
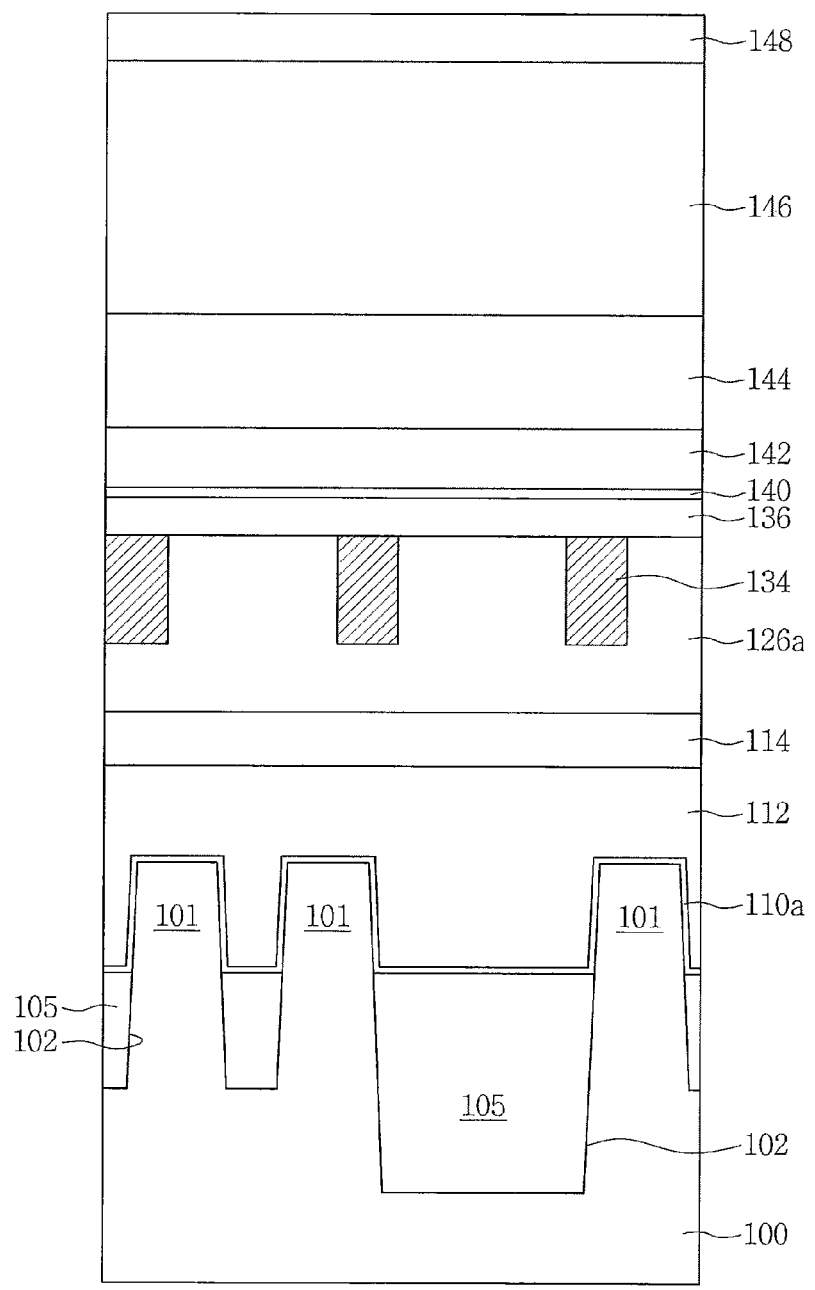
Figure 10C:
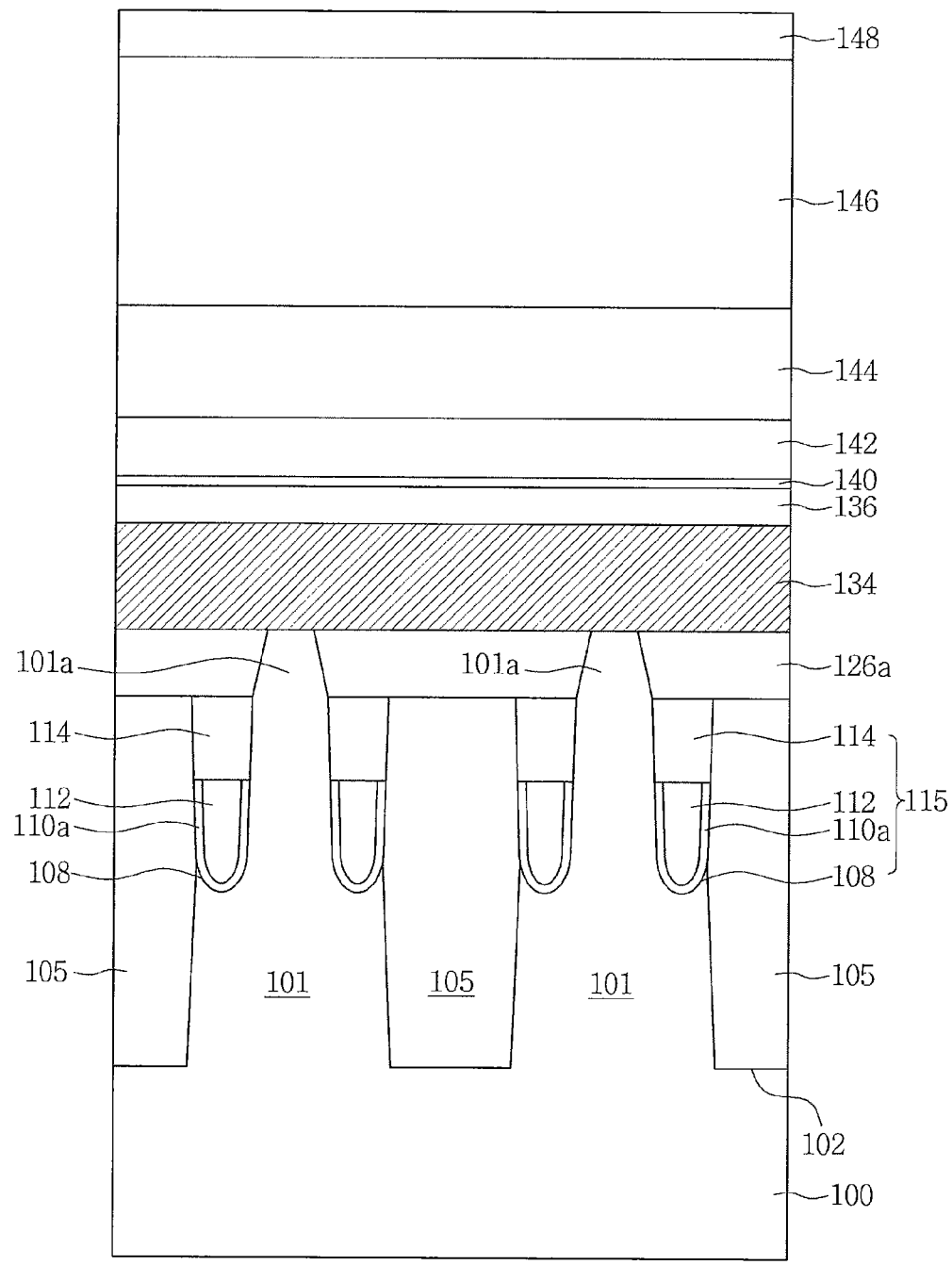
Figure 10D:
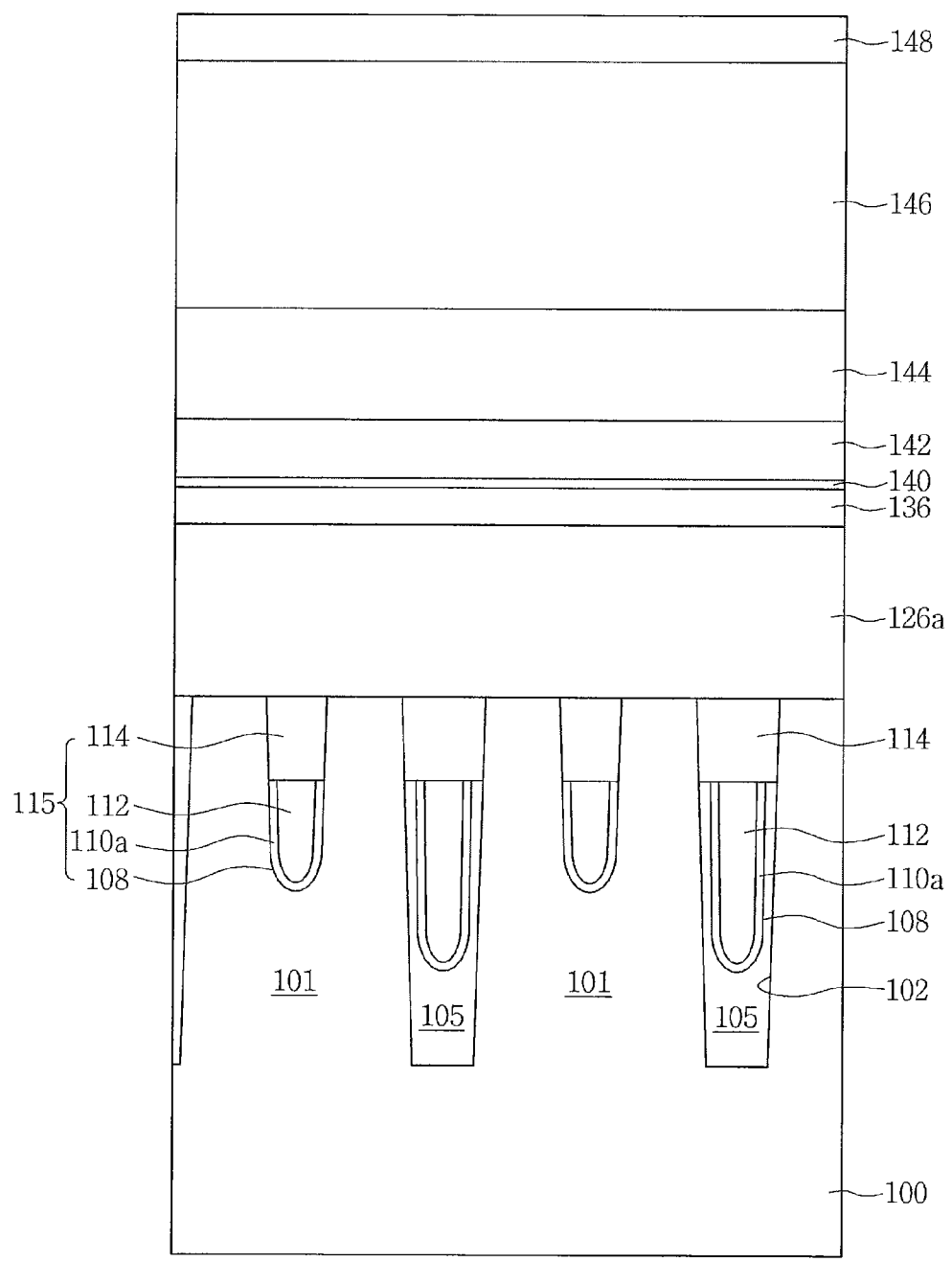
Figure 10E:
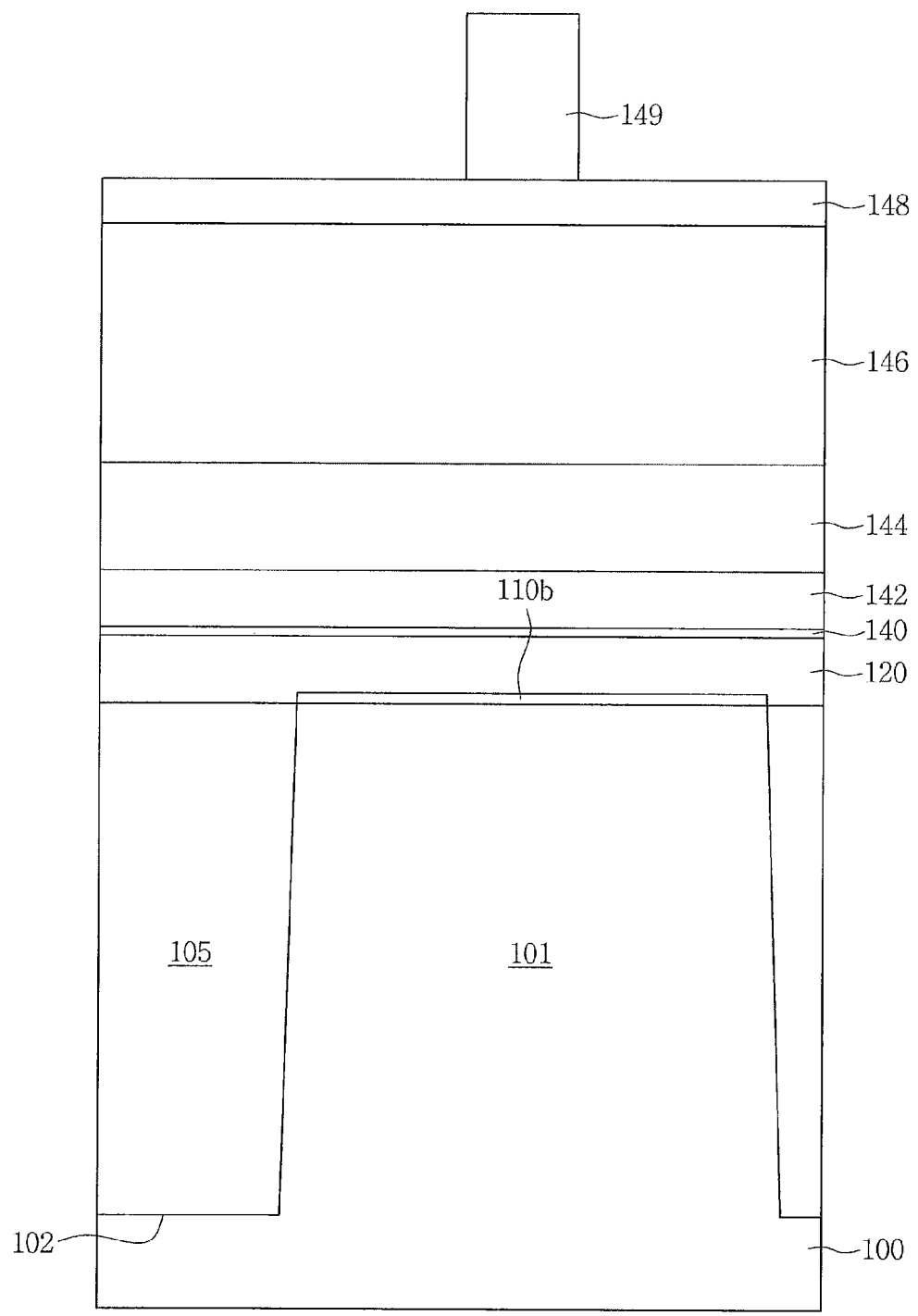
Figure 11A:
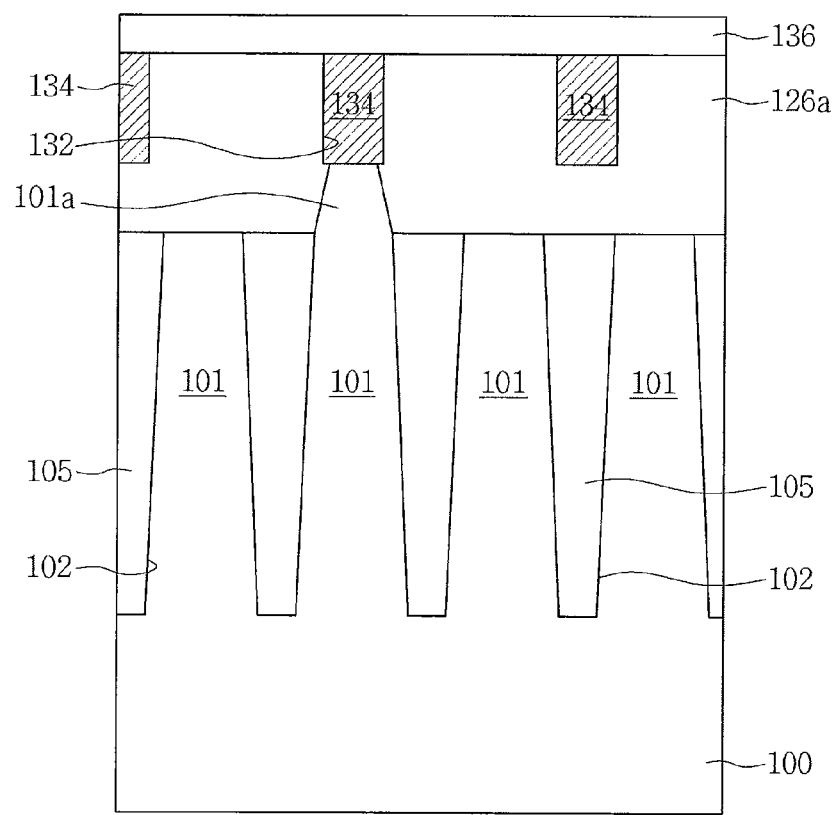
Figure 11B:
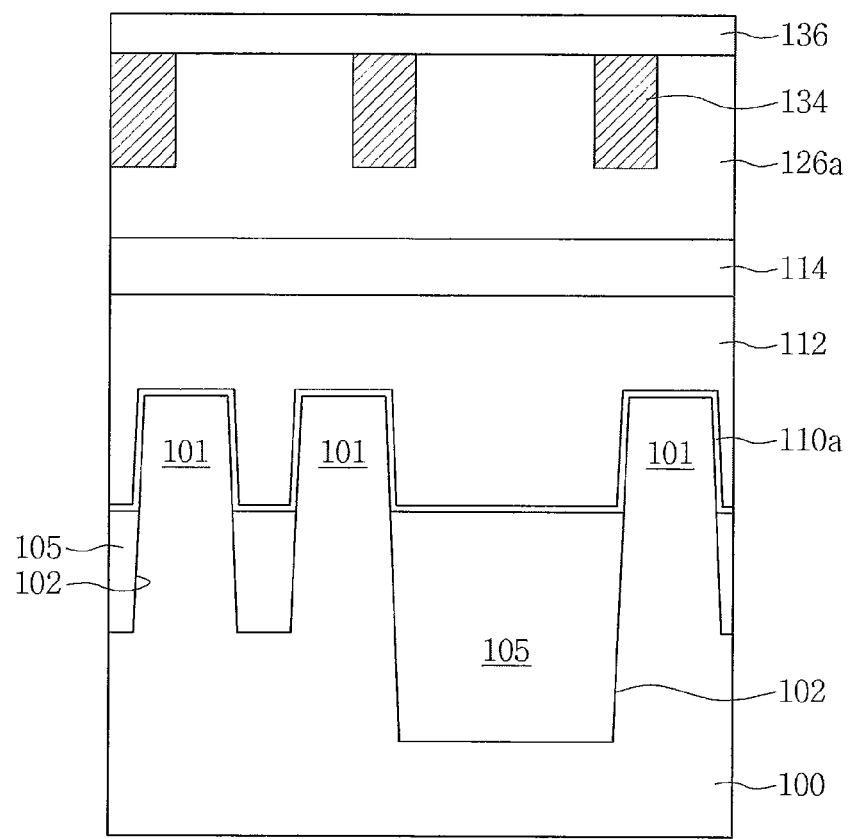
Figure 11C:
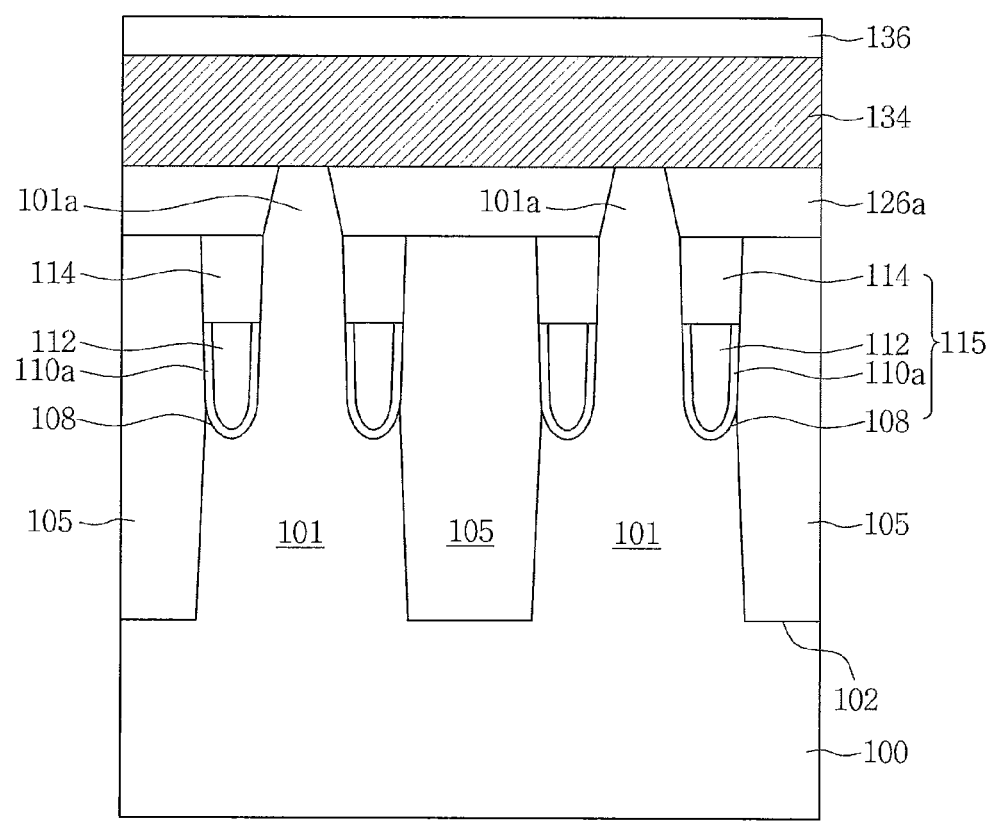
Figure 11D:
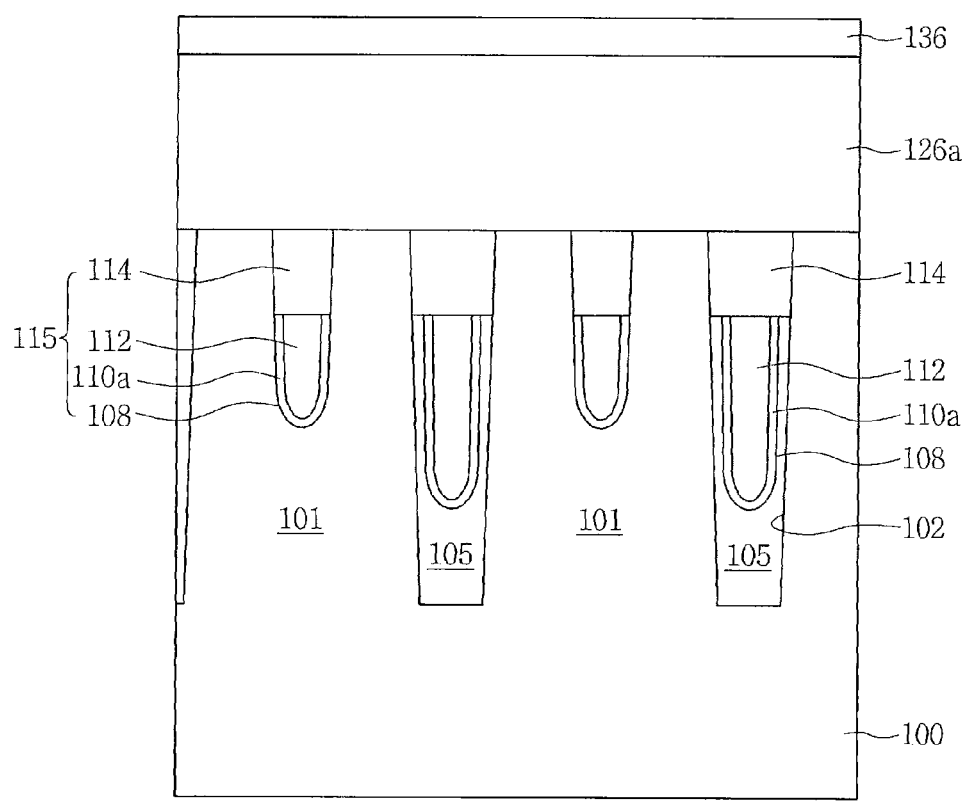
Figure 11E:
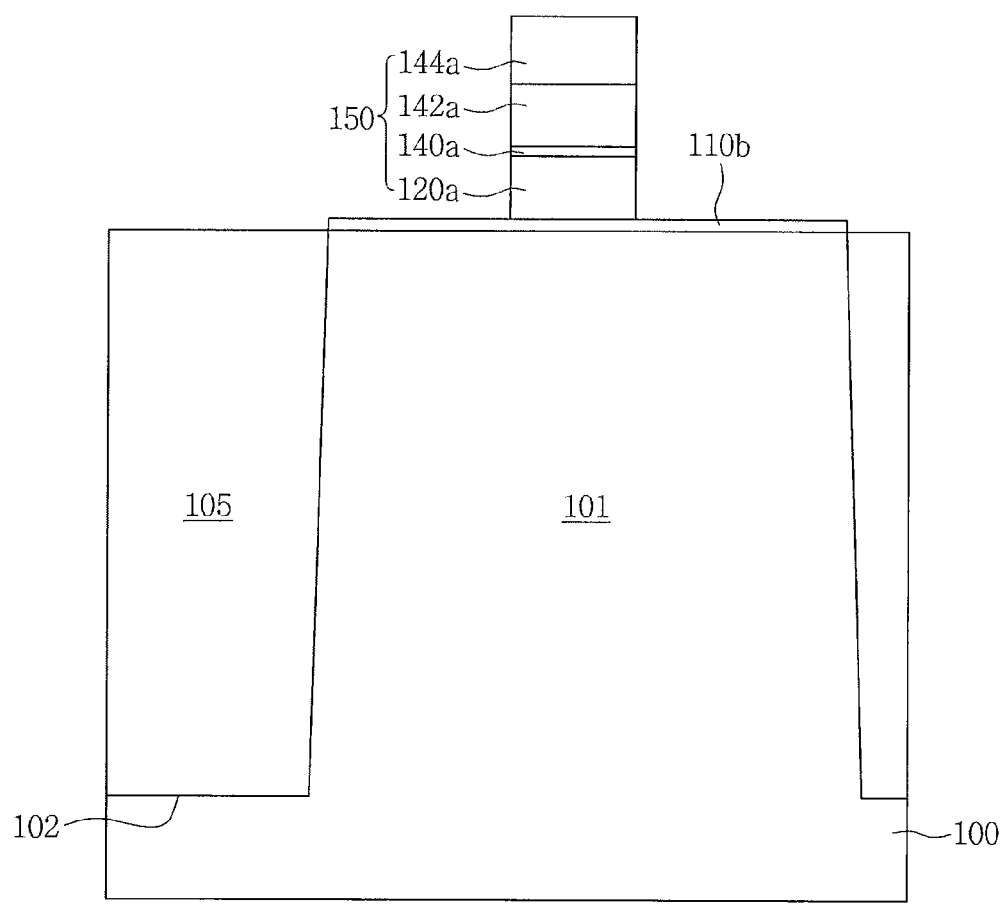
Figure 12A:
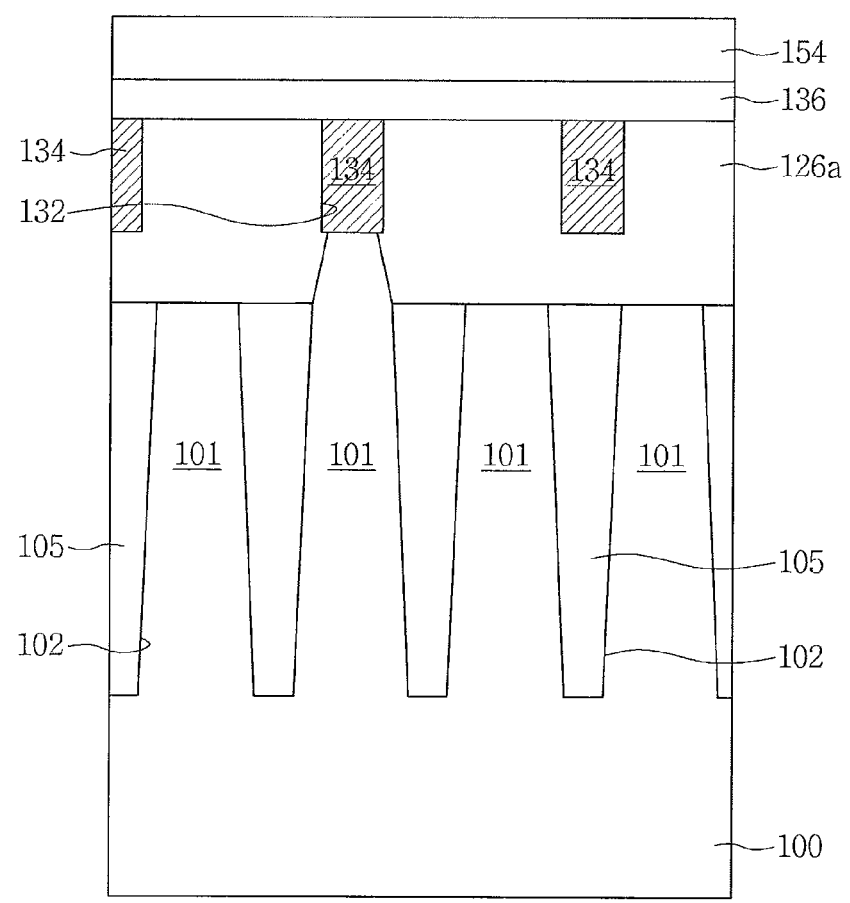
Figure 12B:
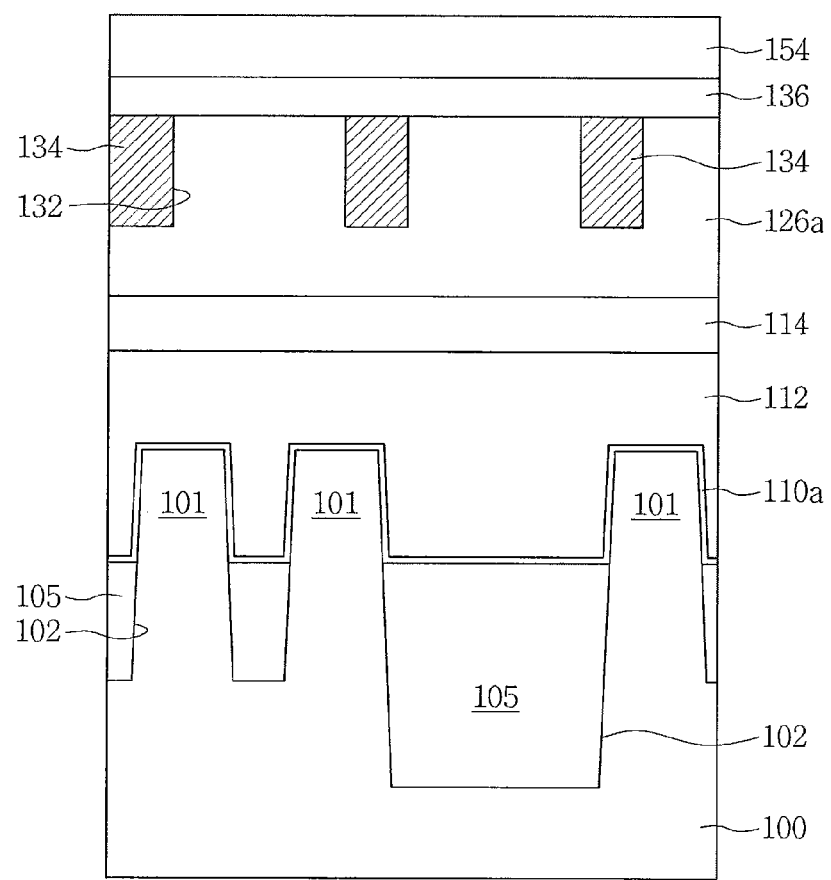
Figure 12C:
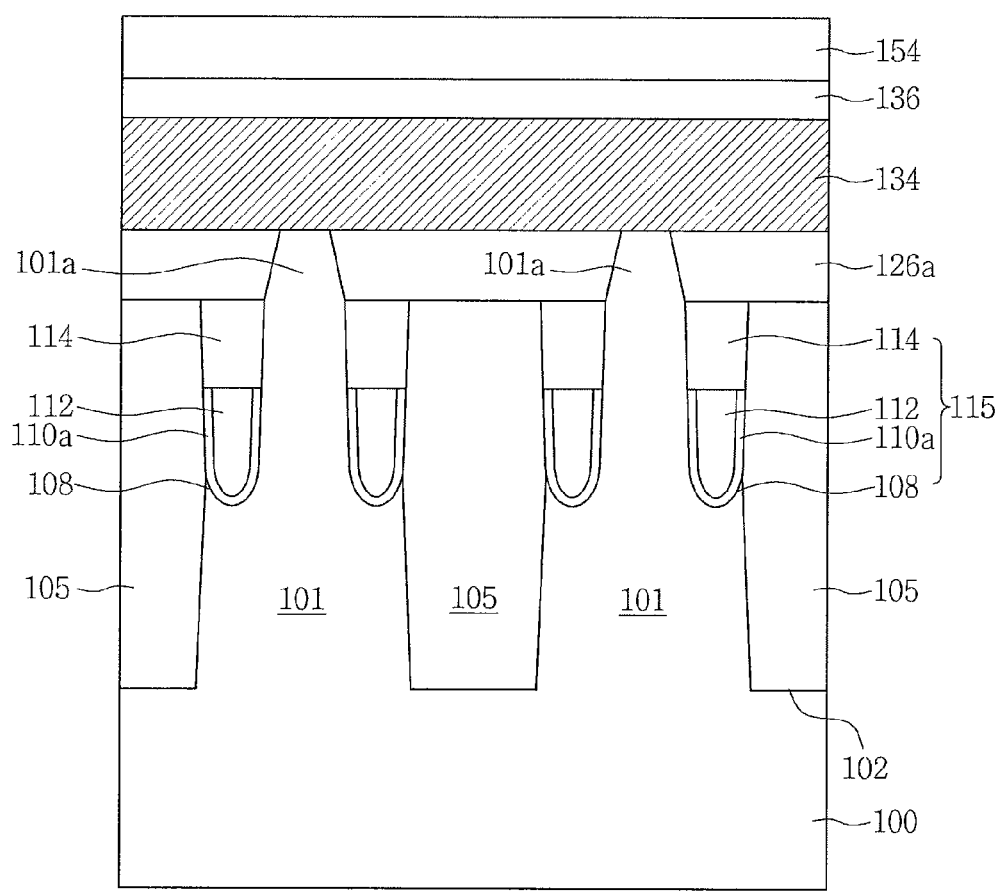
Figure 12D:
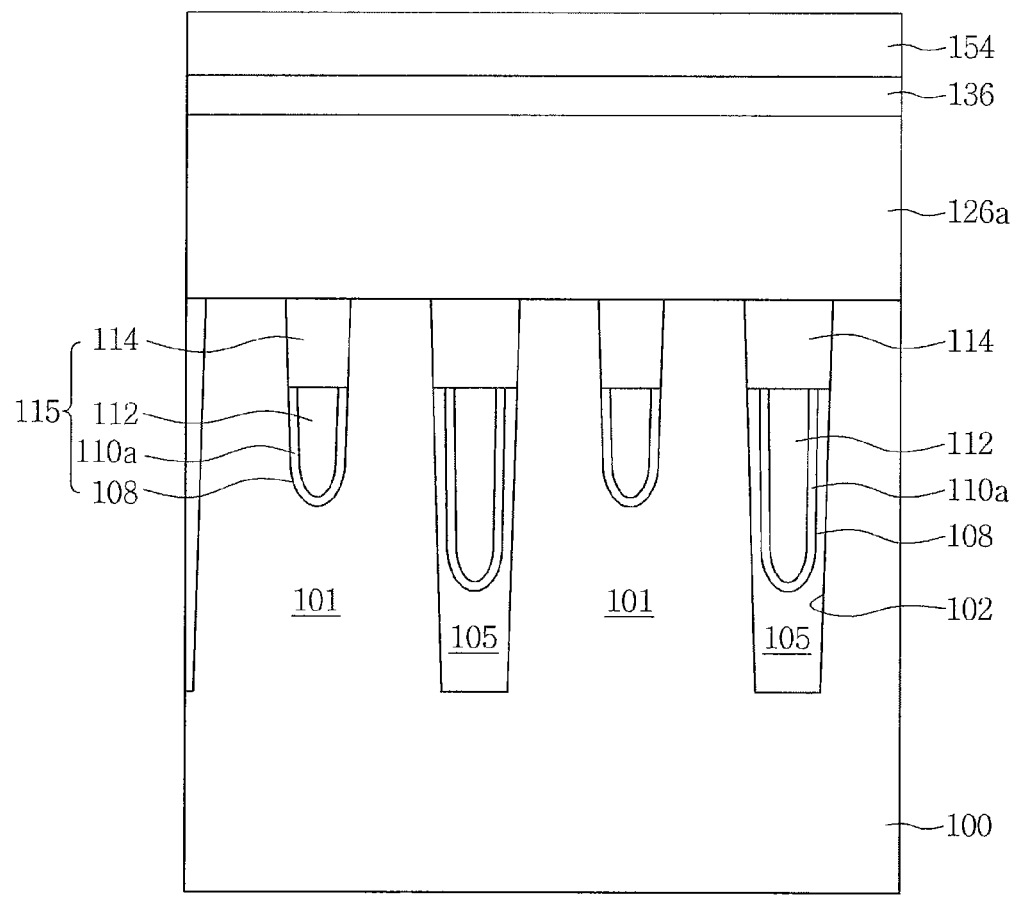
Figure 12E:
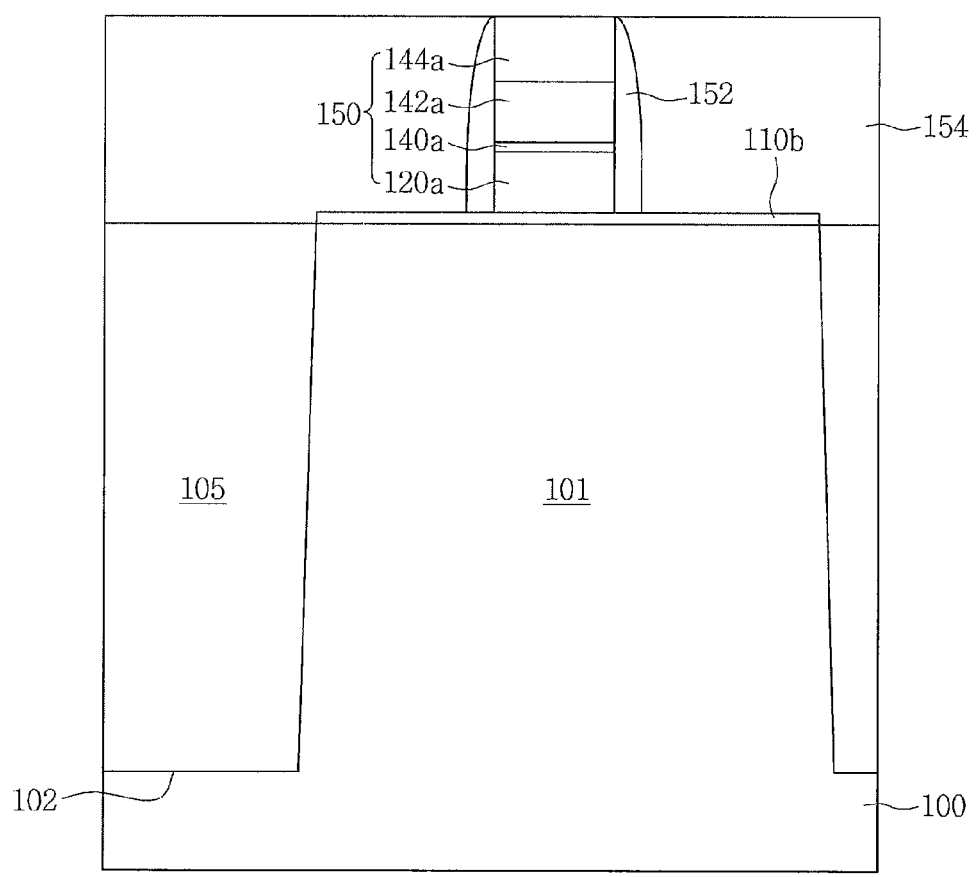
Figure 13A:
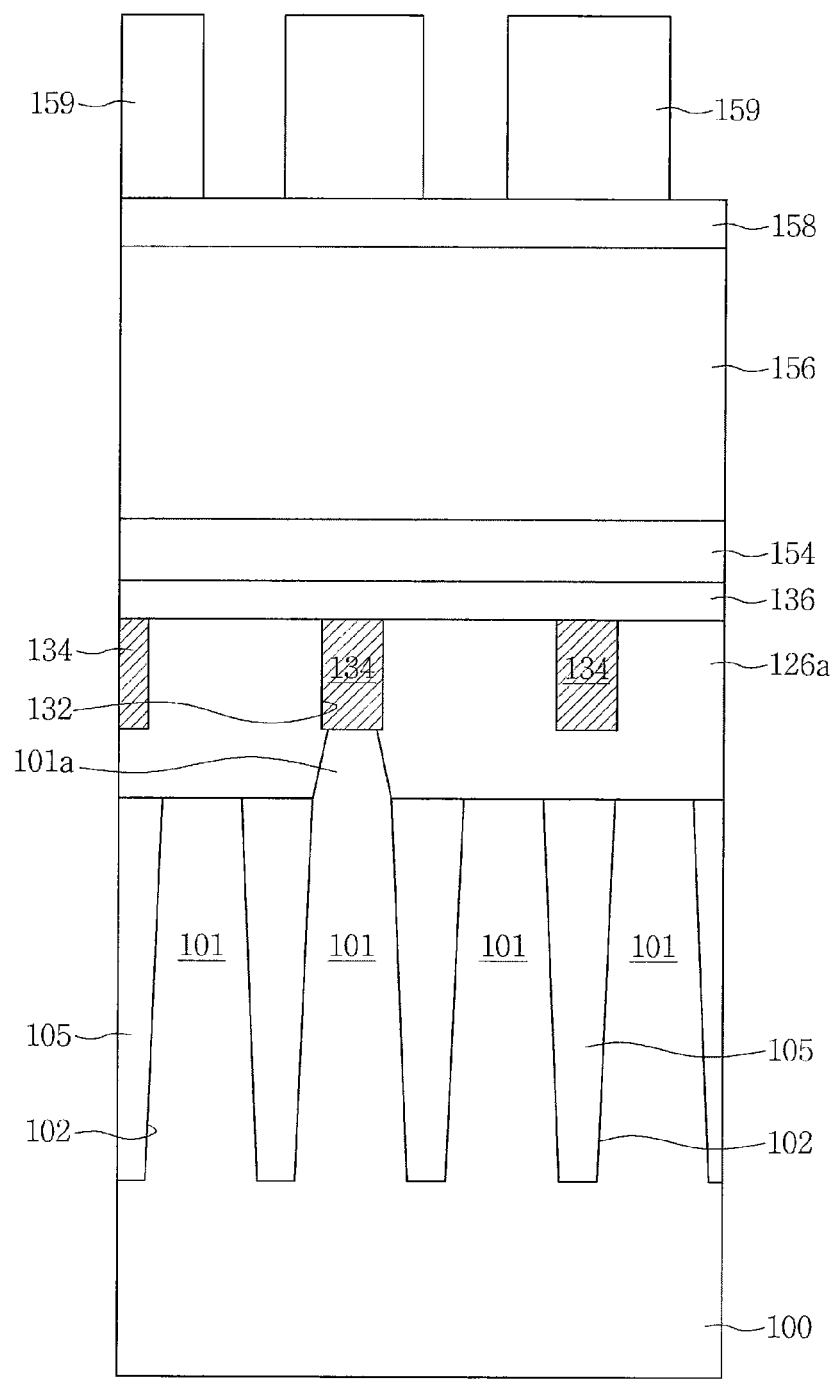
Figure 13B:
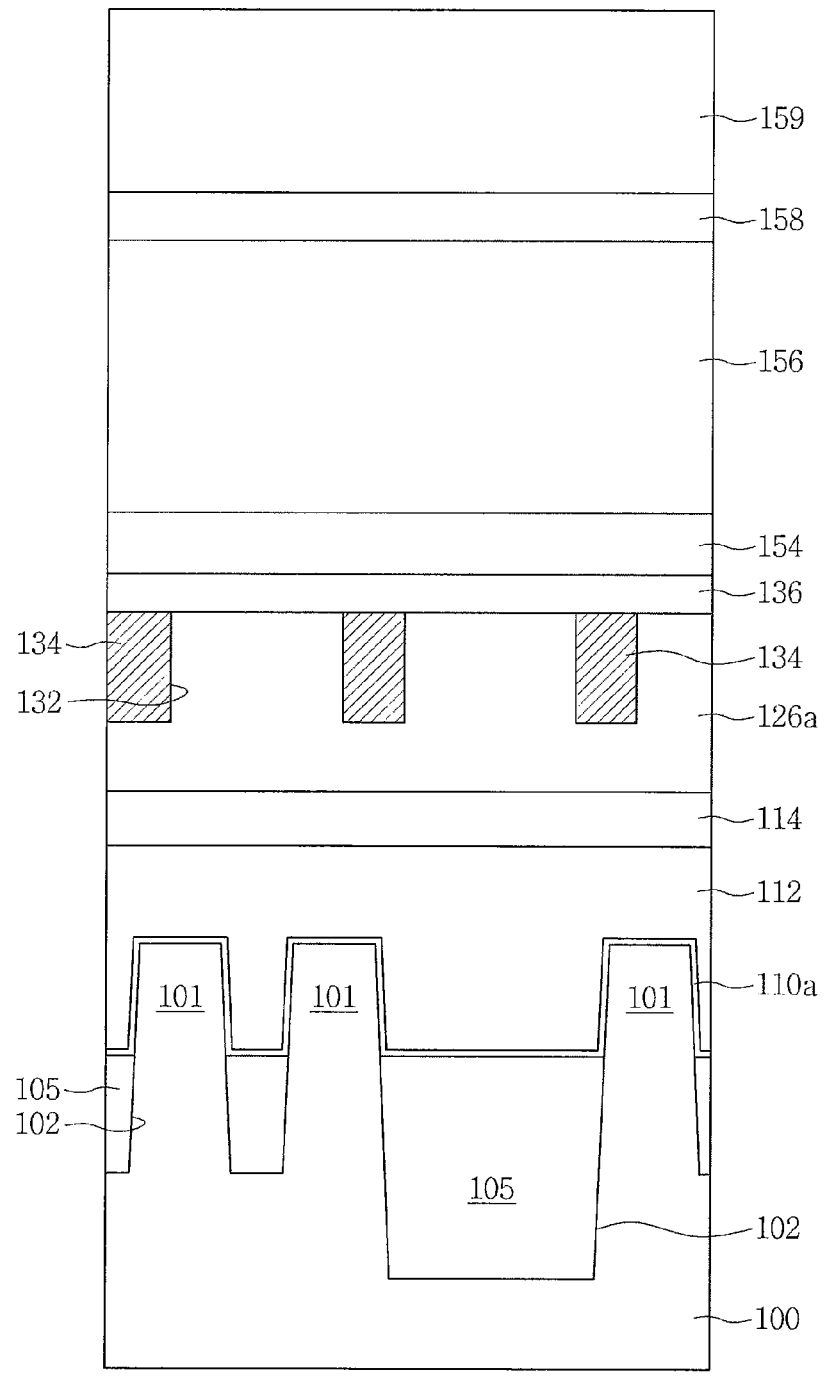
Figure 13C:
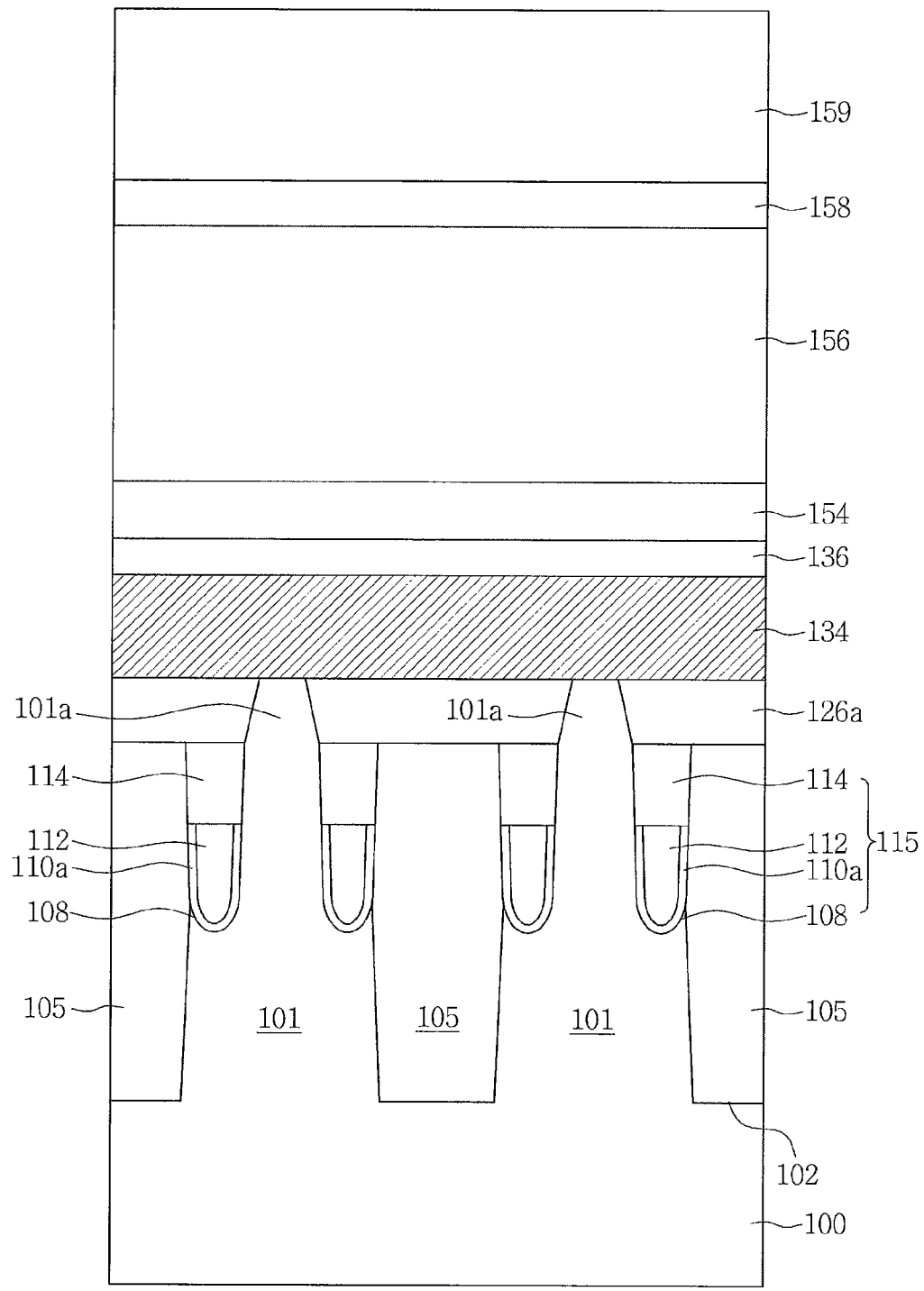
Figure 13D:
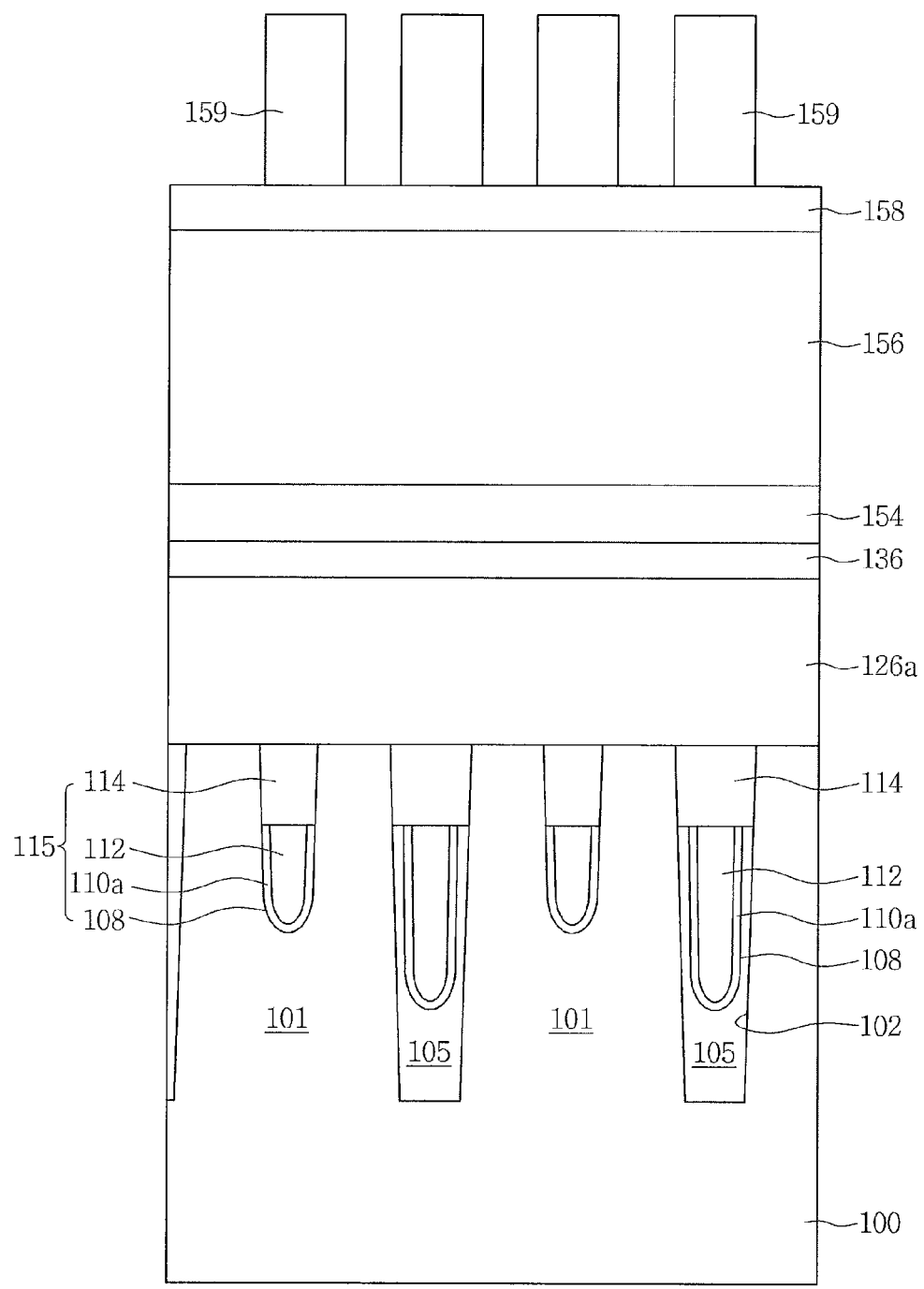
Figure 13E:
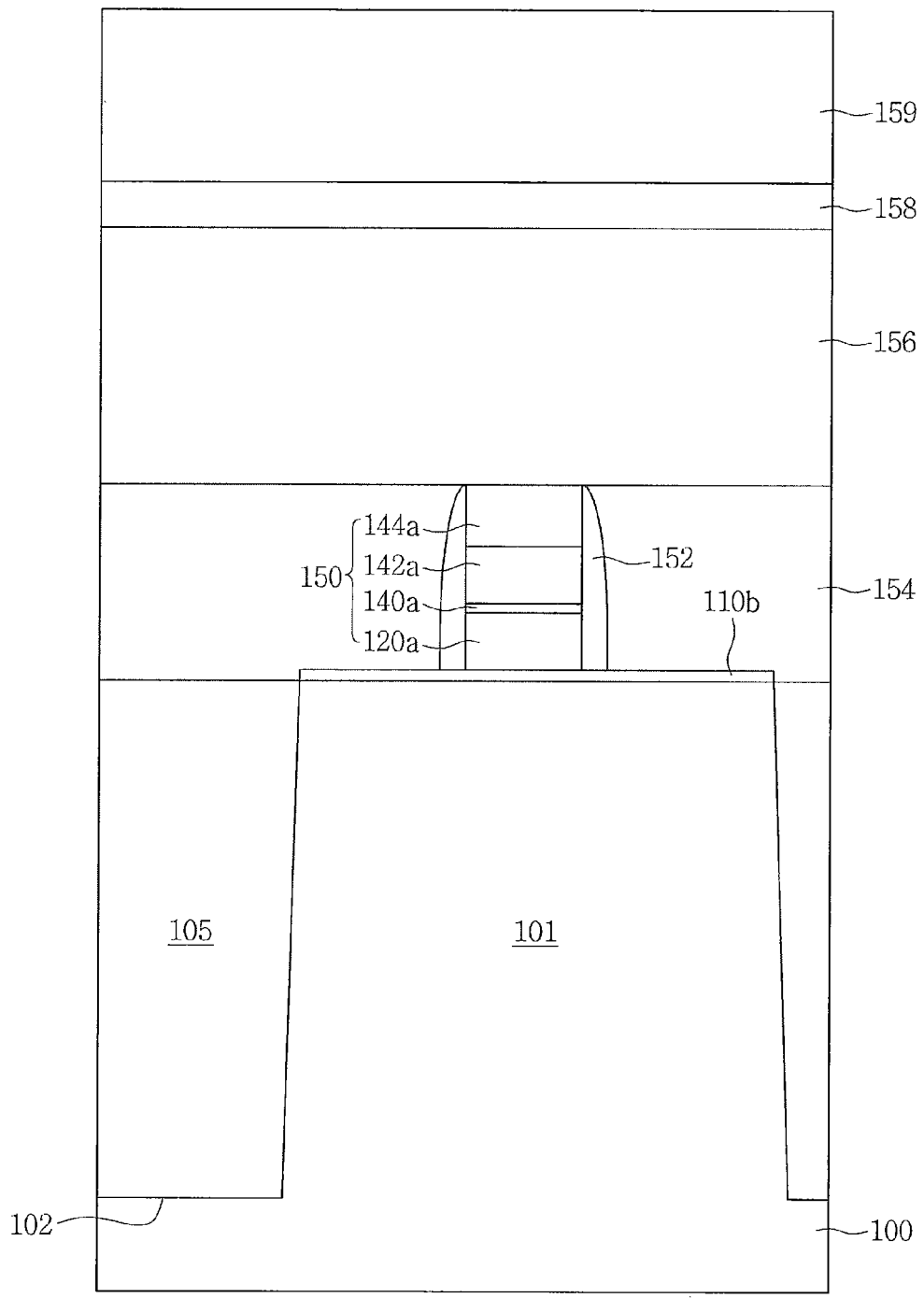
Figure 14A:
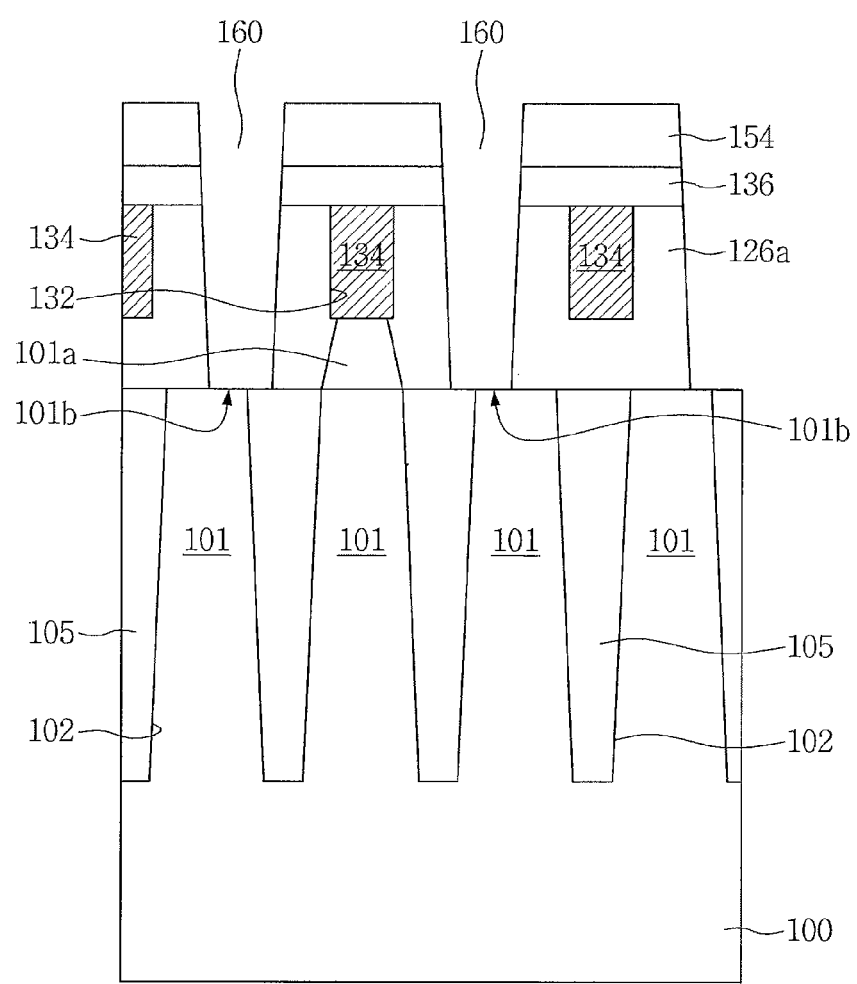
Figure 14B:
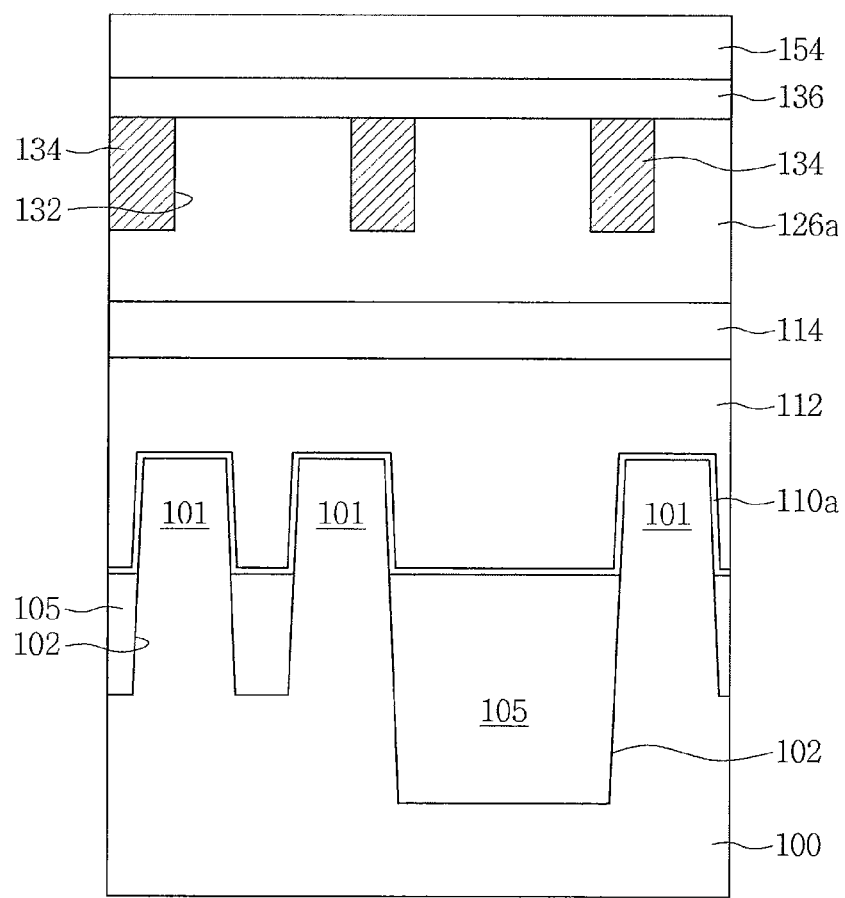
Figure 14C:
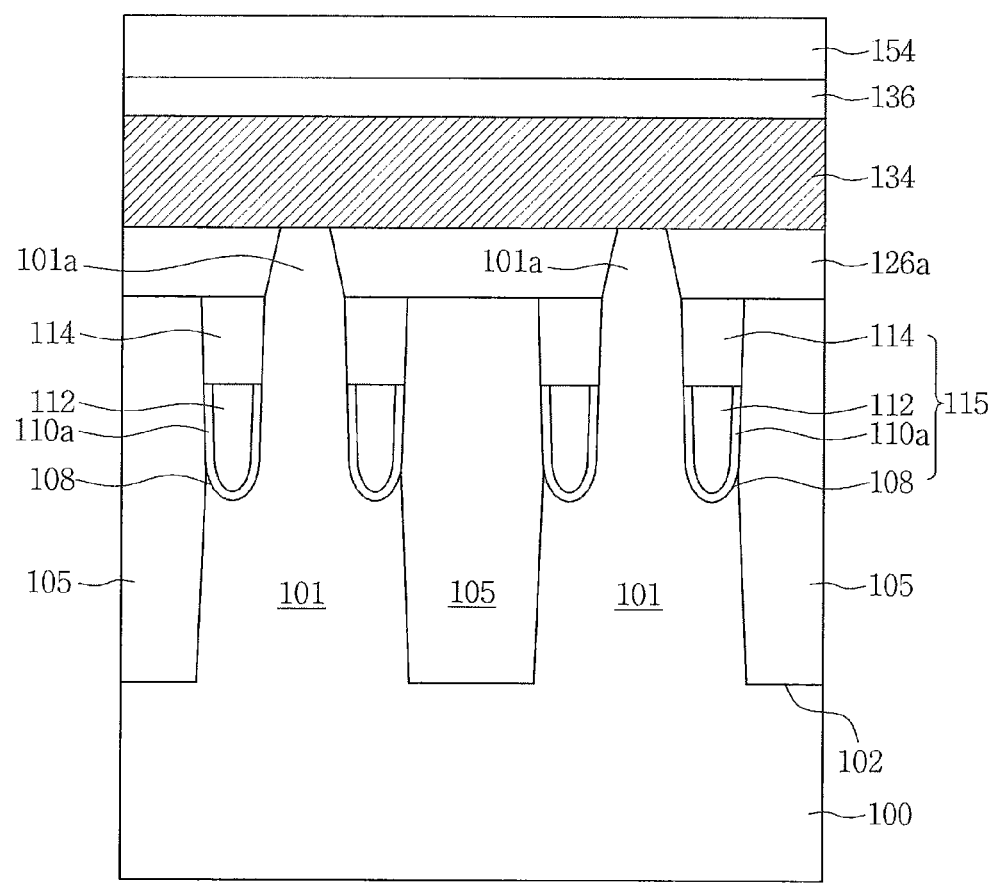
Figure 14D:
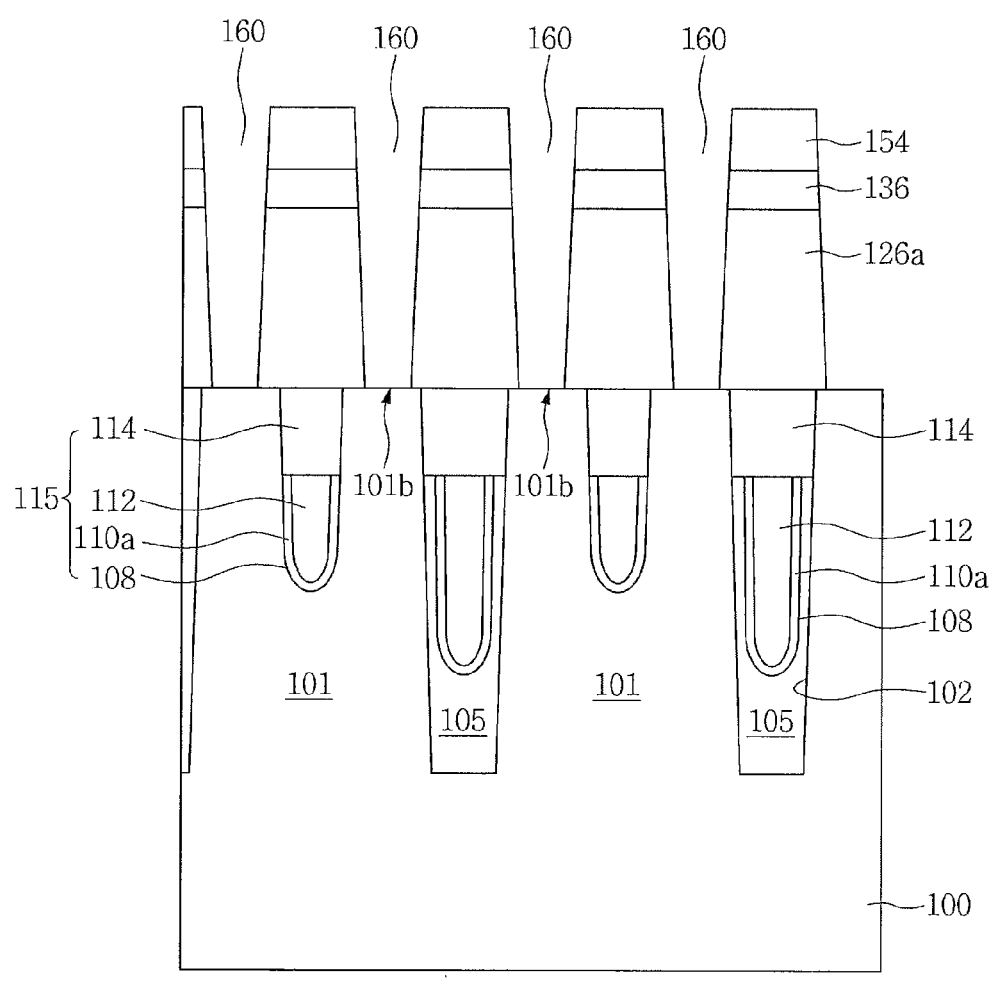
Figure 14E:
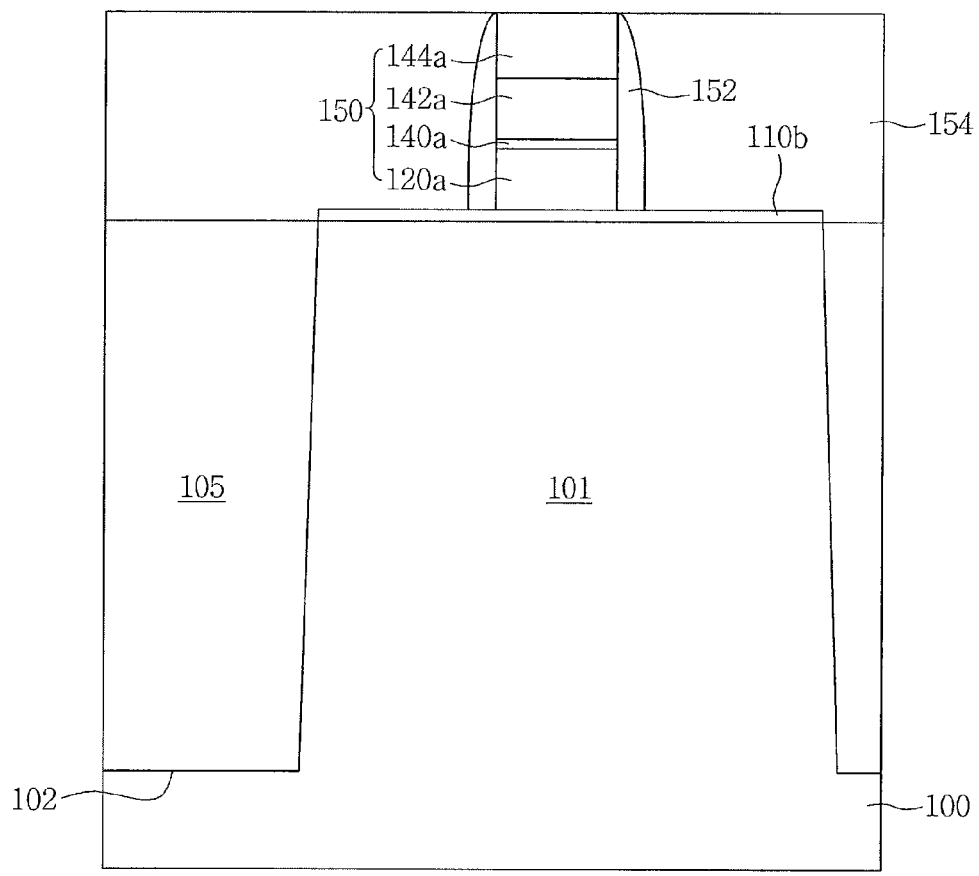
Figure 15A:
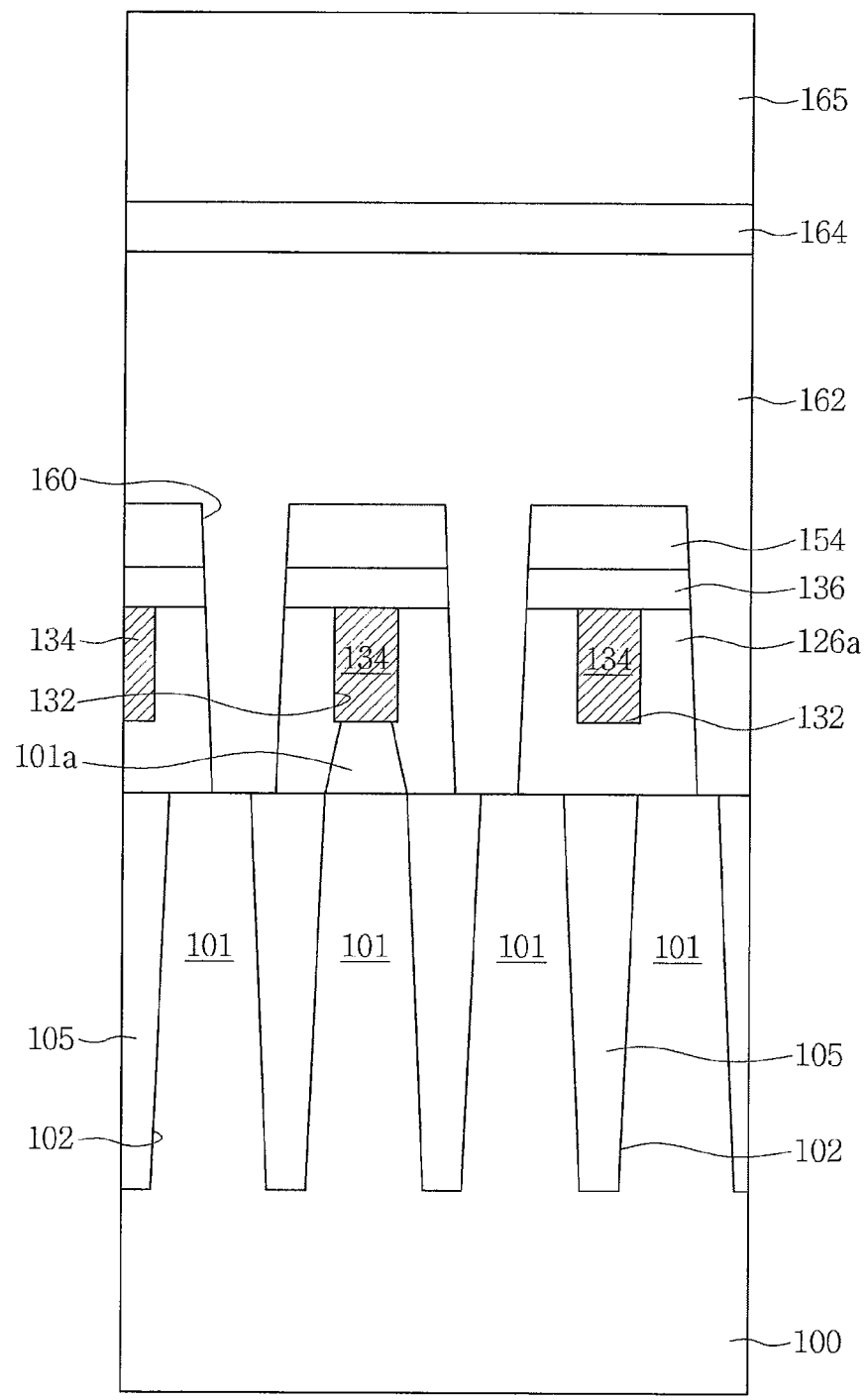
Figure 15B:
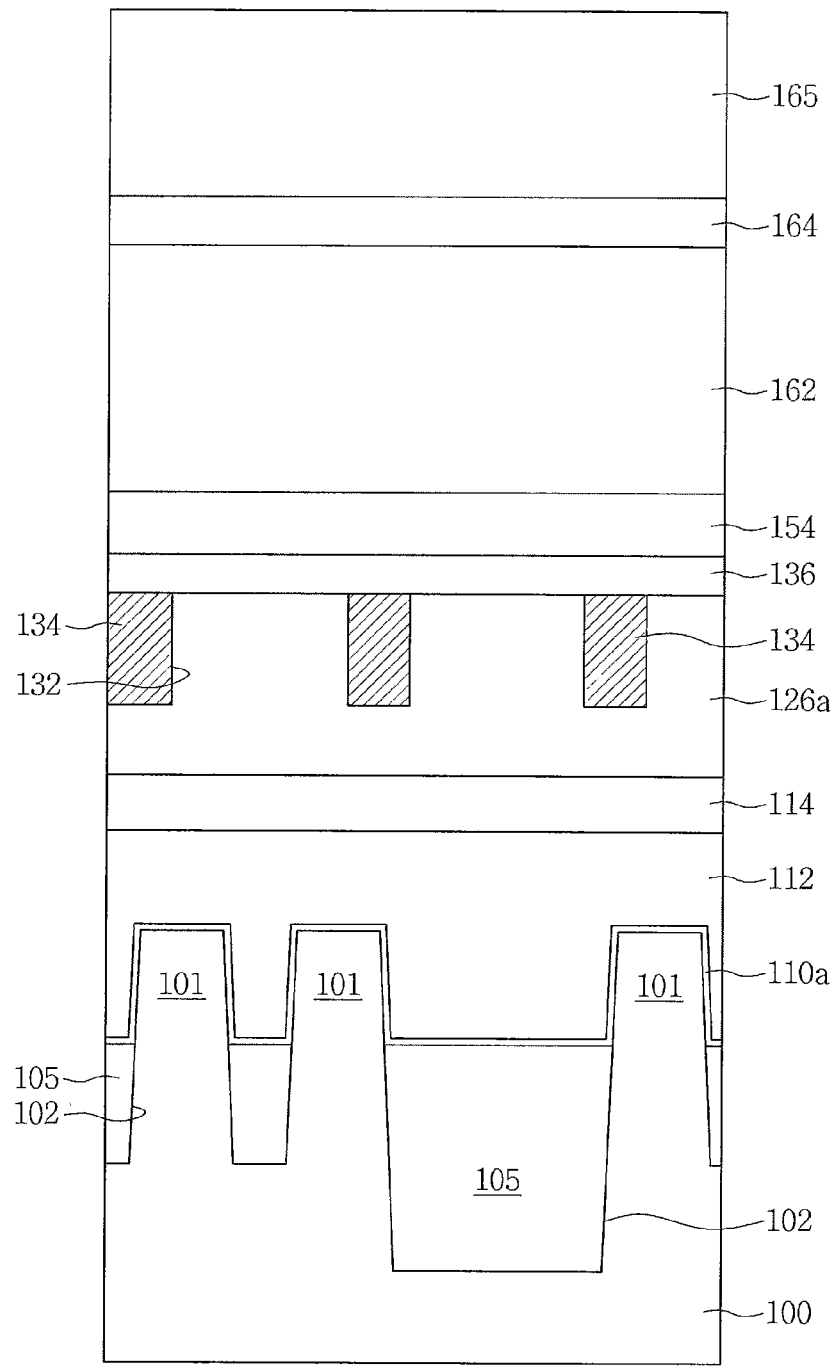
Figure 15C:
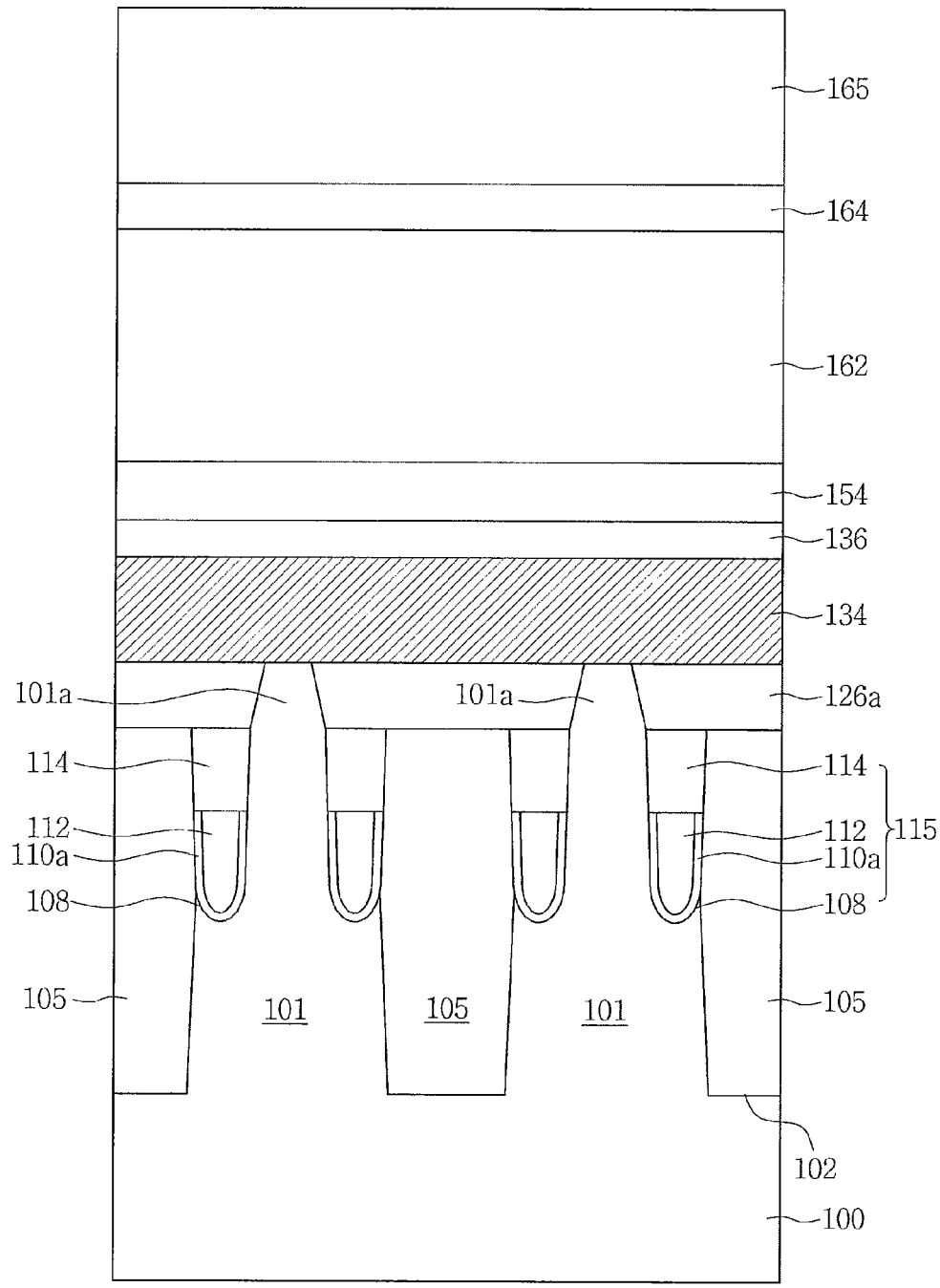
Figure 15D:
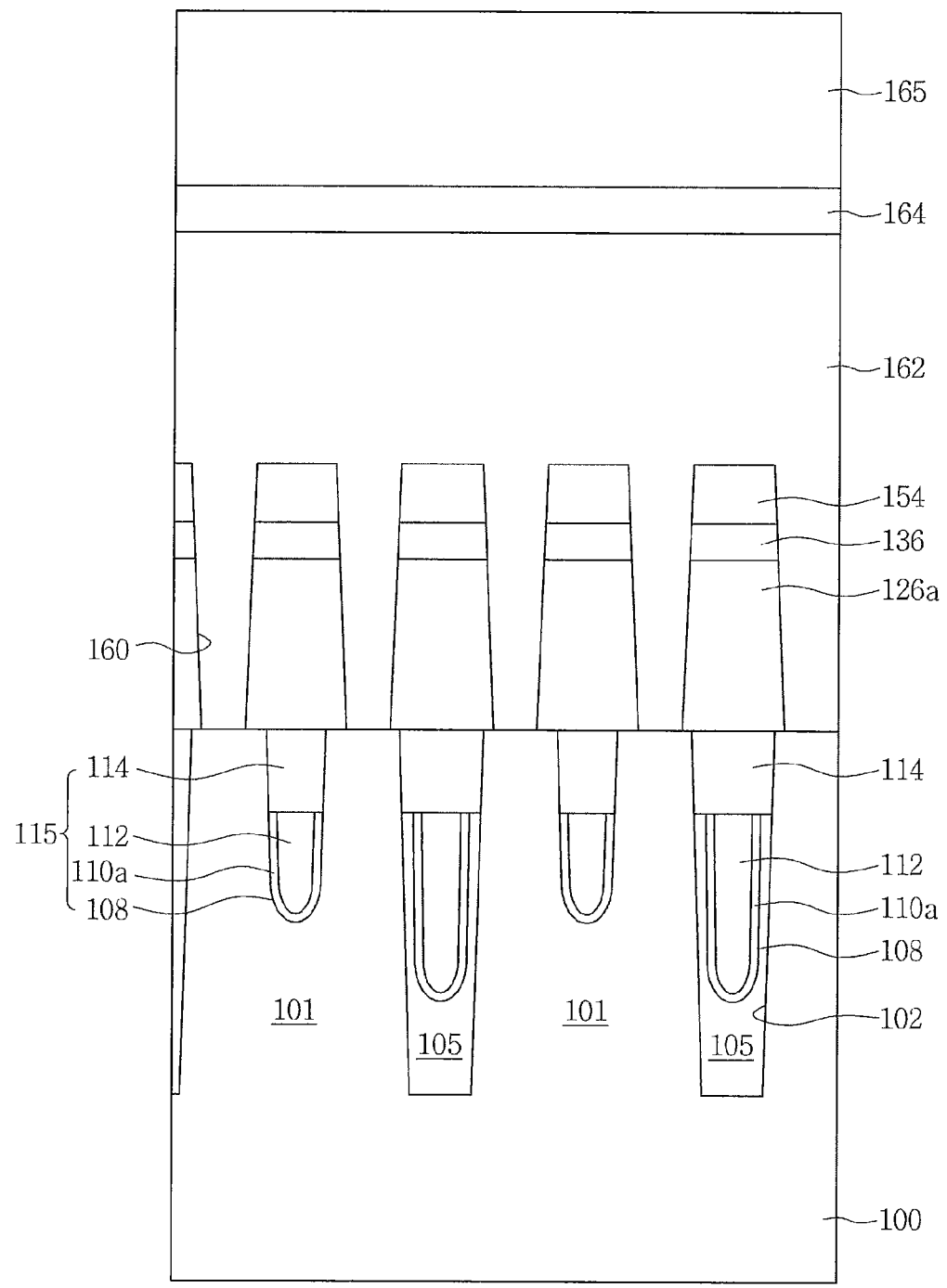
Figure 15E:
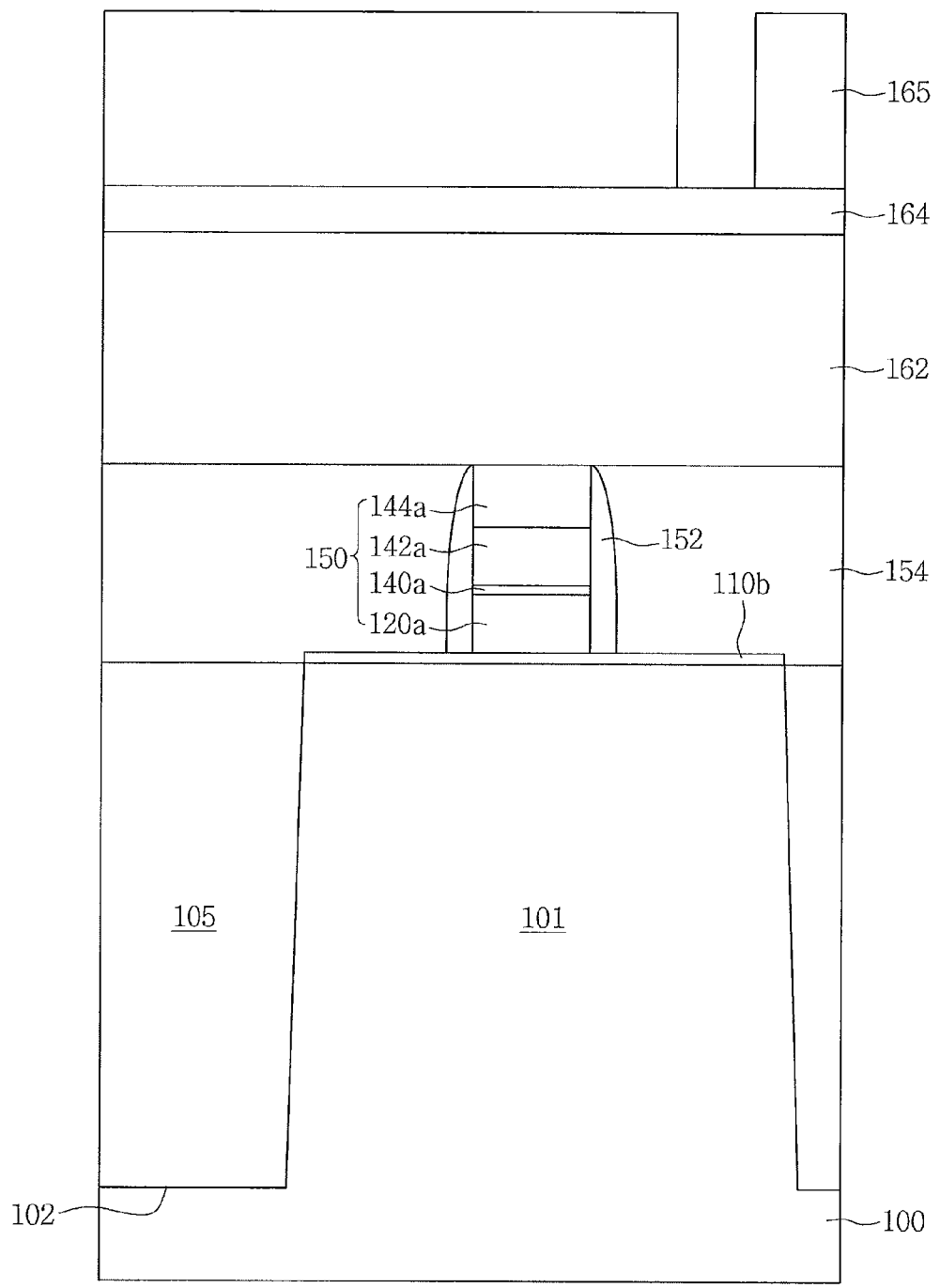
Figure 16A:
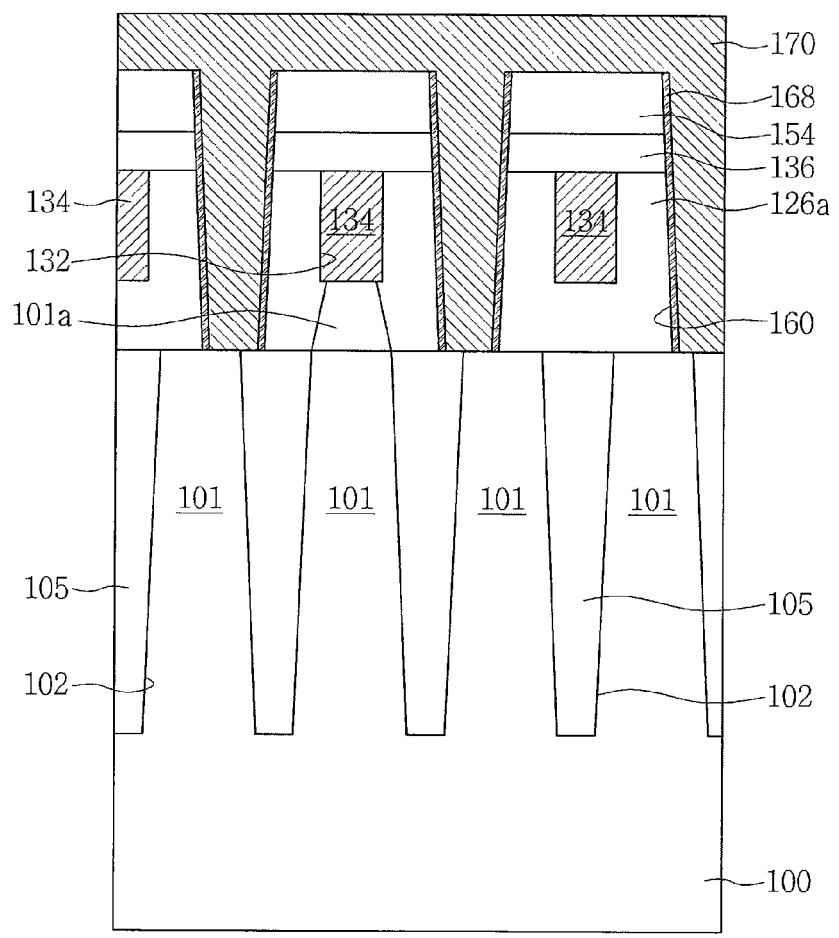
Figure 16B:
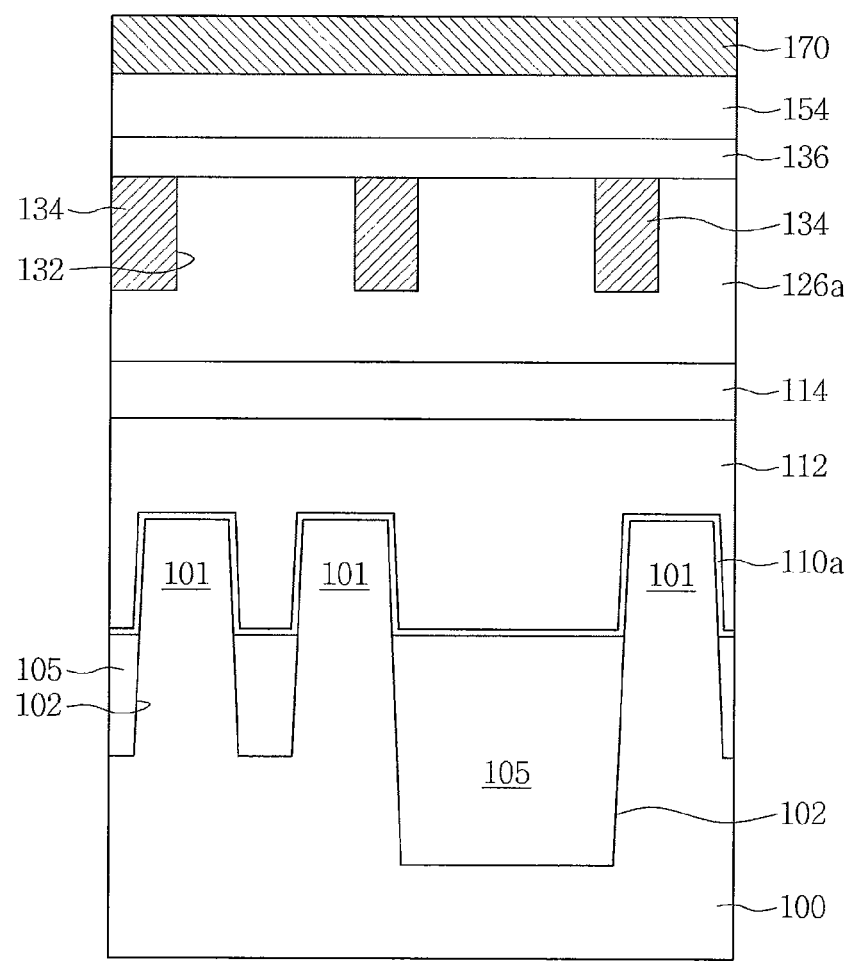
Figure 16C:
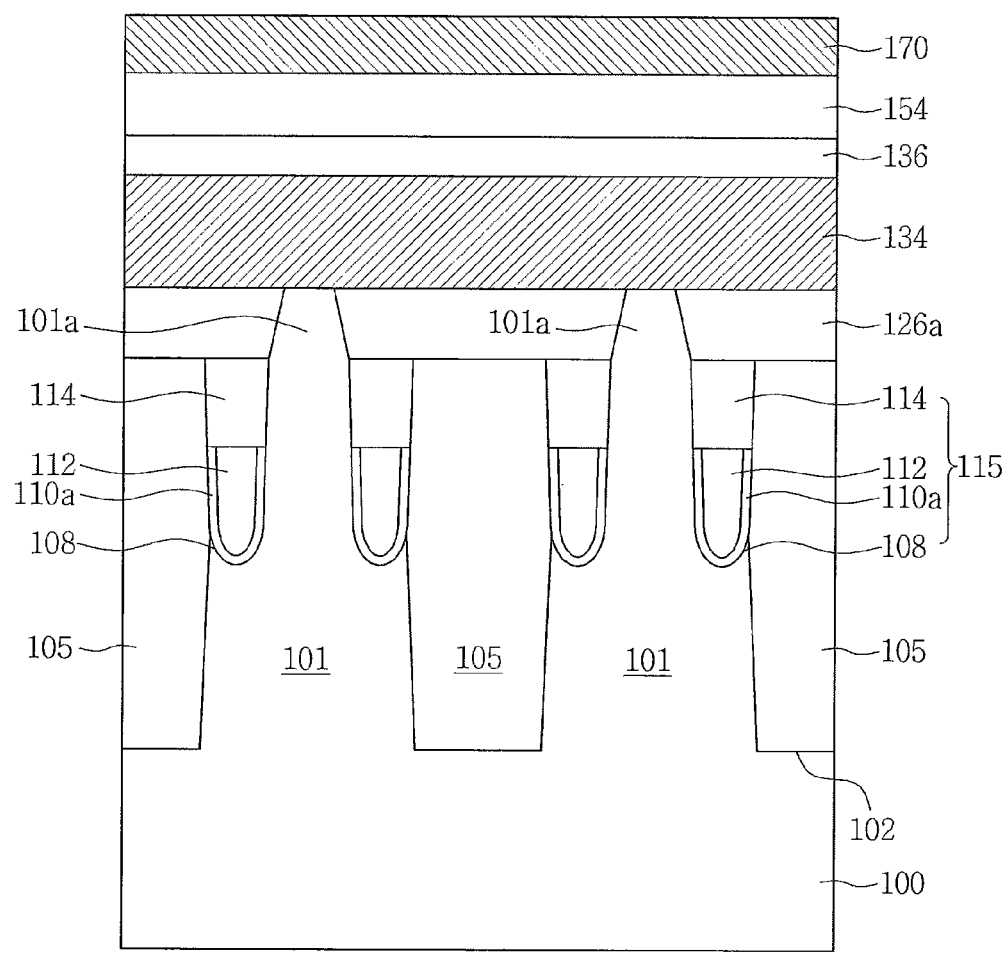
Figure 16D:
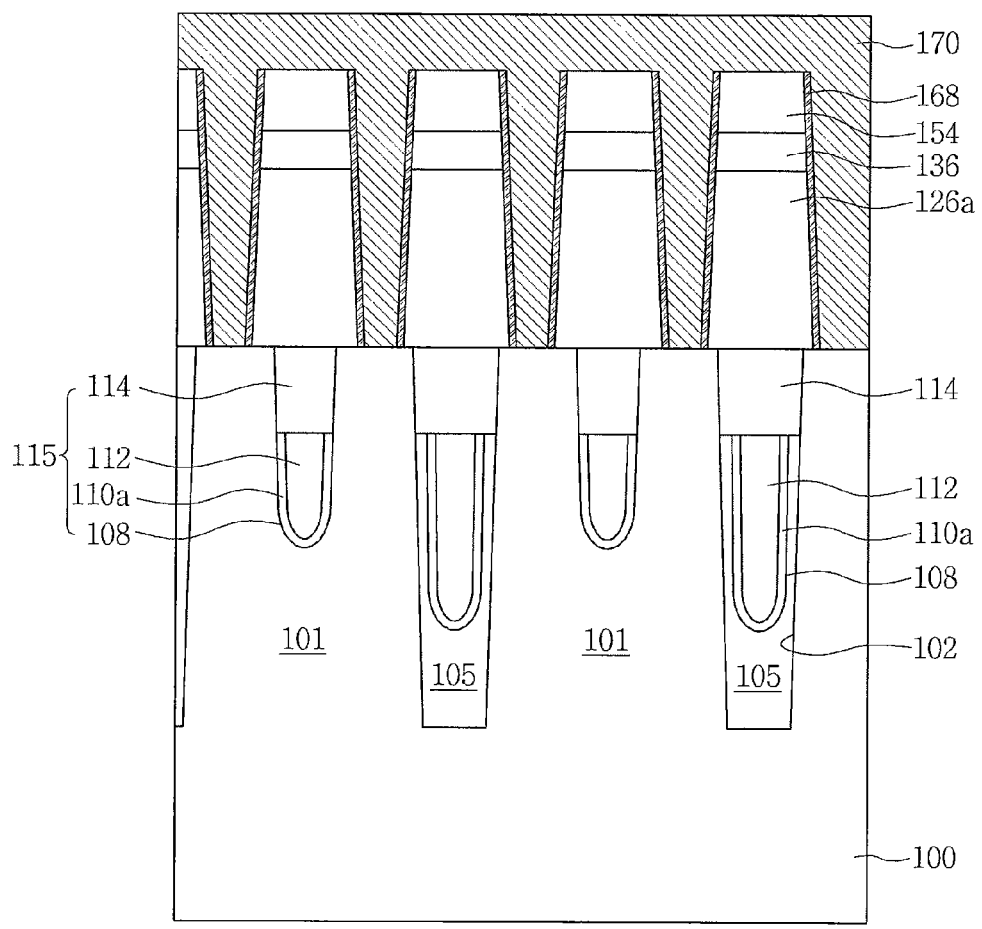
Figure 16E:
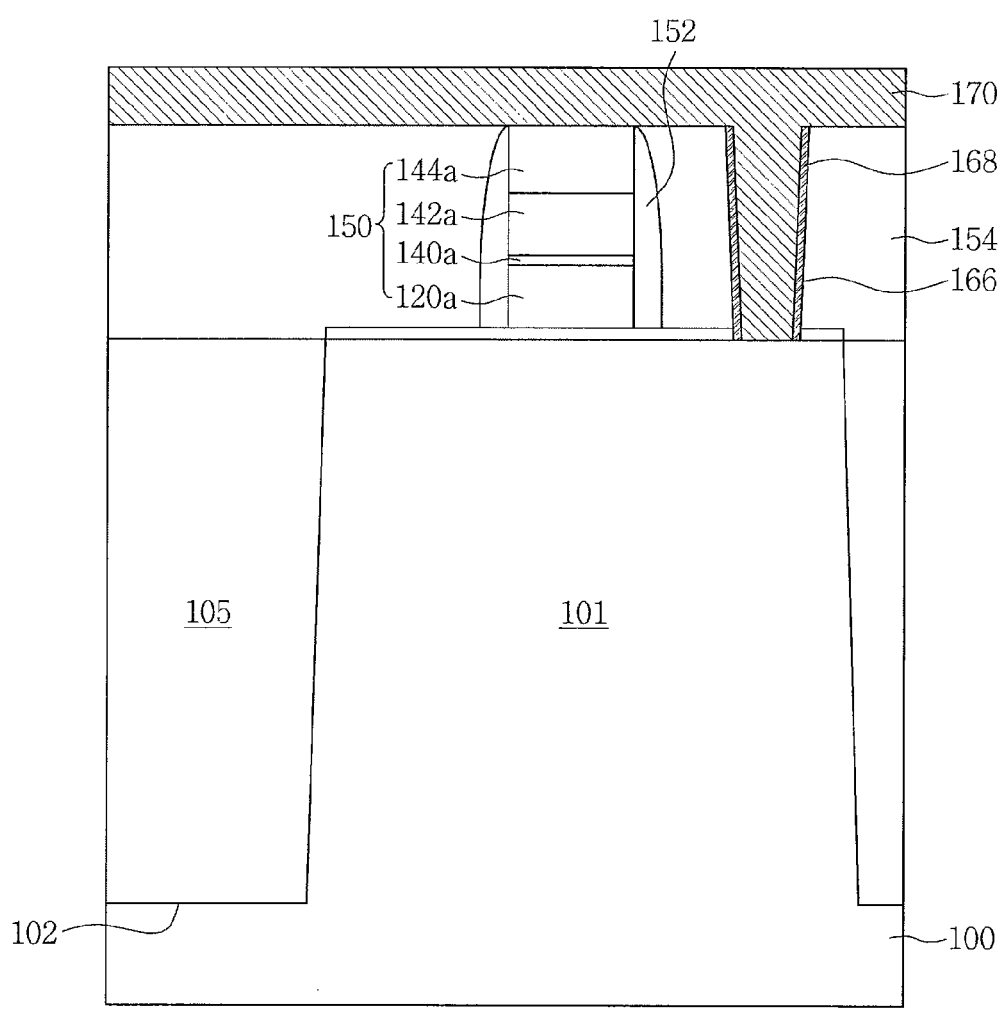
Figure 17A:
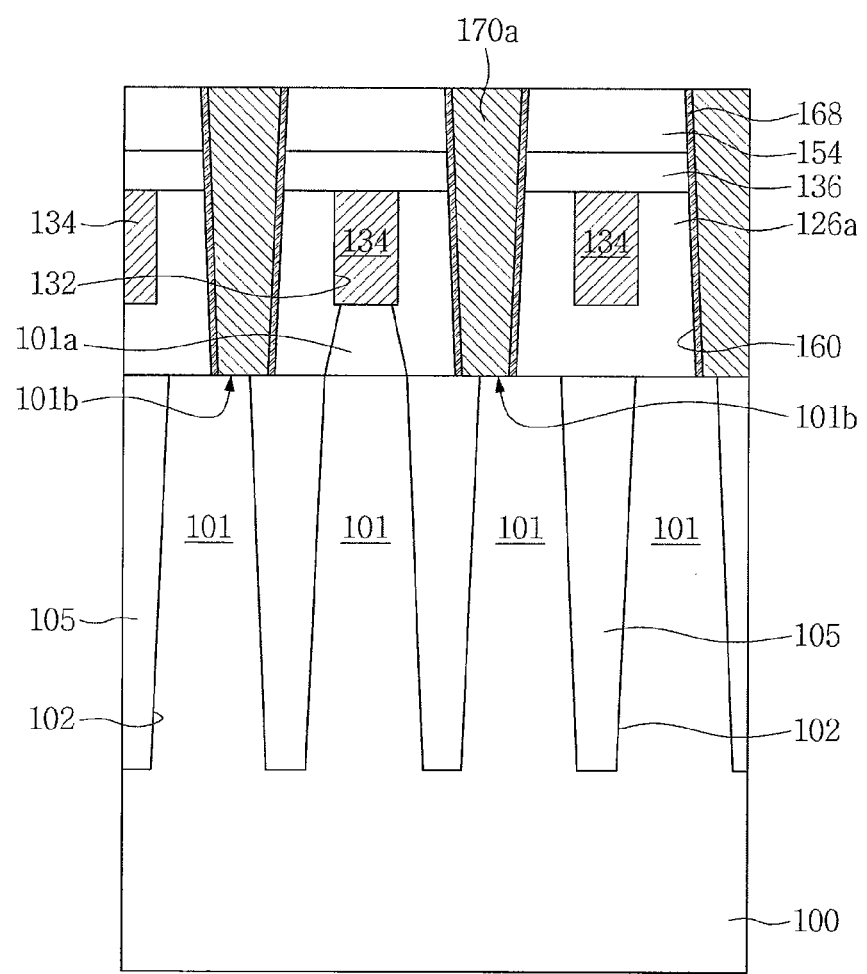
Figure 17B:
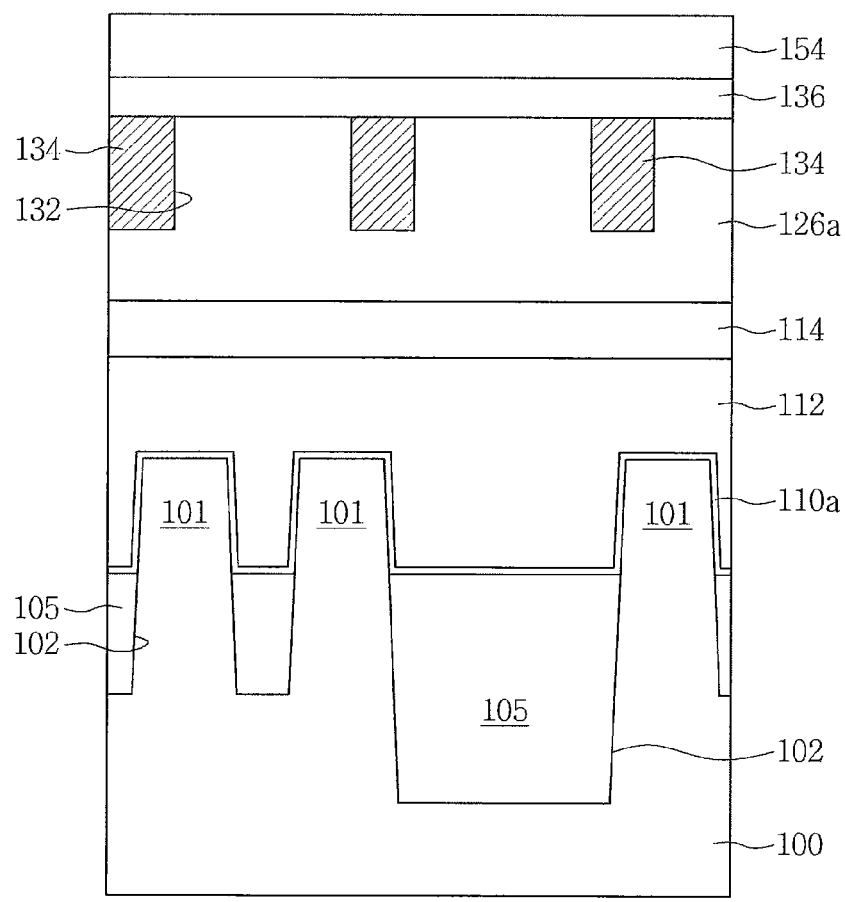
Figure 17C:
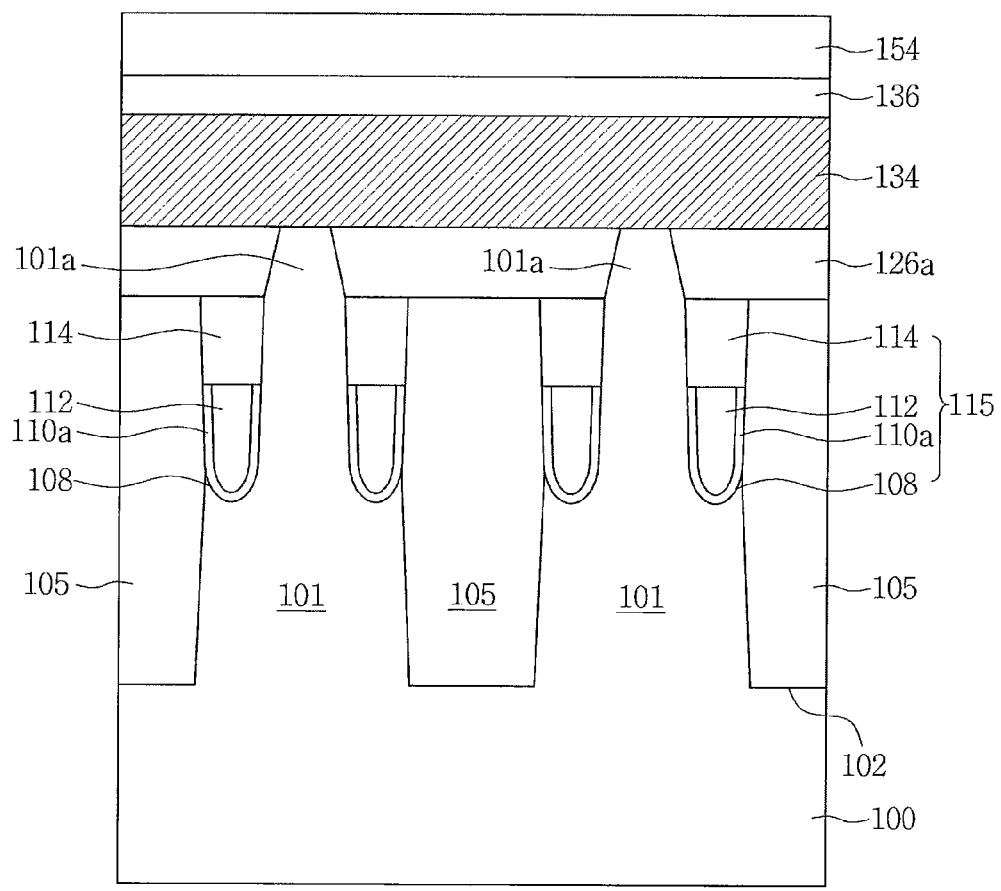
Figure 17D:
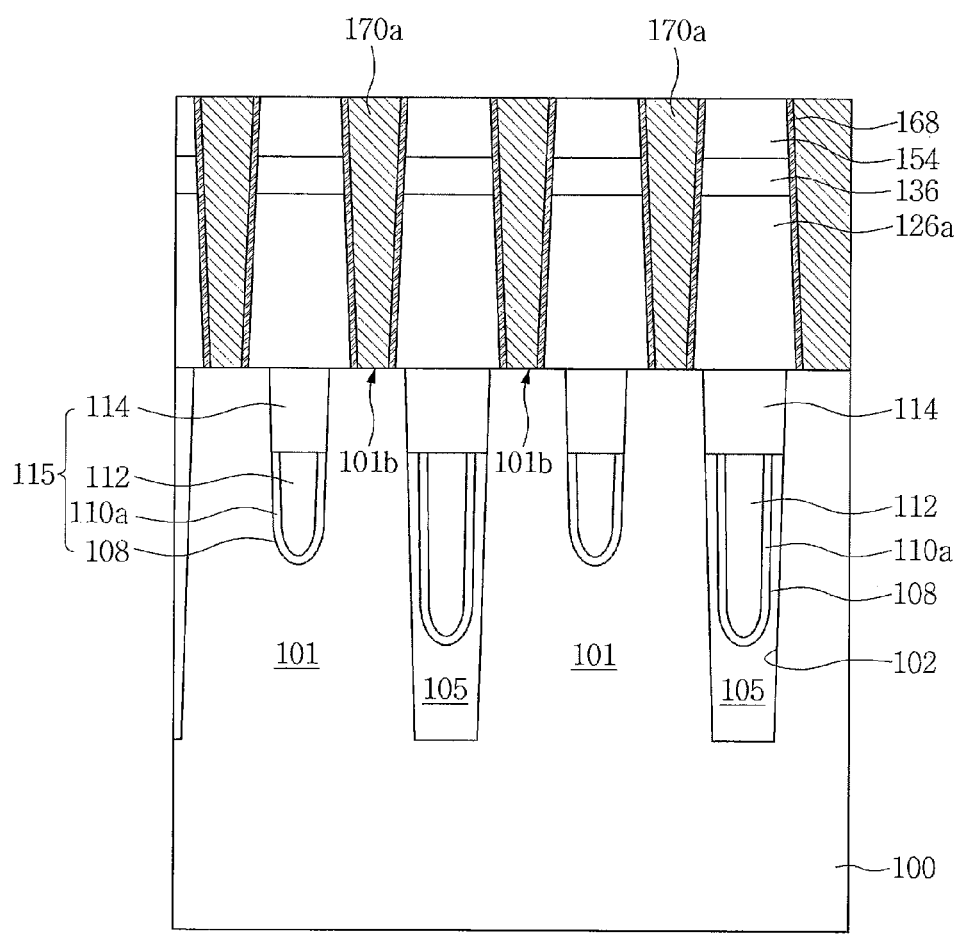
Figure 17E:
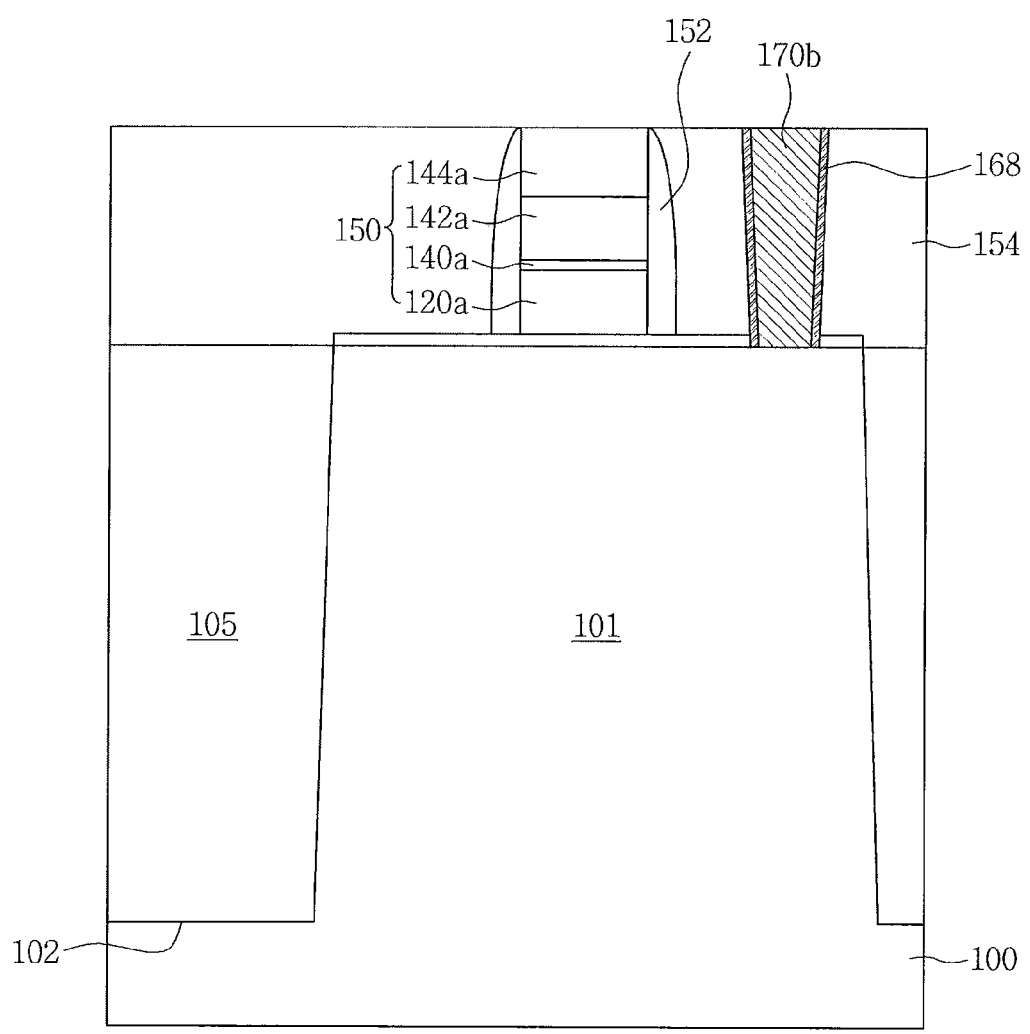

FIGS. 2A to 2D illustrate cross-sectional views showing cell regions of a semiconductor device taken along lines A-A', B-B', C-C', and D-D' shown in FIG. 1 in accordance with some embodiments, and FIG. 2E illustrates a cross-sectional view showing a core/peripheral circuit region of the semiconductor device.

Referring to FIGS. 2A to 2E, the semiconductor device in accordance with some embodiments may include a substrate 100 including cell regions and a core/peripheral circuit region, the substrate 100 having an active regions 101 defined by field region 105, first gate structures 115 formed in the cell regions of the substrate 100, a second gate structure 150 formed on the core/peripheral circuit region of the substrate 100, and bit lines 134 formed on the cell regions of the substrate 100.

The substrate 100 may include a semiconductor substrate. For example, the substrate 100 may include a silicon substrate, a germanium substrate, a silicon-germanium substrate, or the like.

The field region 105 may be formed in the substrate 100 to define active regions 101. The field region 105 may be shallow trench isolation (STI) region. For example, the field region 105 may include field trench 102 in the substrate 100 and a field insulating layer filling the field trench 102. The field insulating layer may include a single layer of silicon oxide, or a complex layer of silicon oxide and silicon nitride according to the size of the field trenches 102.

The first gate structures 115 of the cell regions may be buried in the substrate 100. Each of the first gate structures 115 may include gate trench 108 formed in the substrate 100, a first gate insulating layer 110a conformally formed on an inner wall of the gate trench 108, buried gate 112 formed in the gate trench 108, and a gate capping layer 114 formed to fill the gate trench 108 on the buried gate 112.

The gate trenches 108 may cross the active regions 101 in the cell regions and extend to the field region 105. The gate trenches 108 may have different bottom levels from each other in the active regions 101 and the field region 105. For example, the bottom of the gate trench 108 in the active region 101 may be located at a higher level than that in the field region 105. The bottom of the buried gate 112 in the field region 105 may be located at a lower level than that in the active region 101. The upper surface of the buried gates 112 may be located at substantially the same level or at similar level in the active regions 101 and the field region 105.

The active regions 101 in the cell regions may include bit line contact regions 101a connected with the bit lines 134 and storage node contact regions 101b connected with capacitors. In one active region 101, a region between the buried gate 112 and the buried gate 112 may be provided as the bit line contact region 101a, and a region between the buried gate 112 and the field region 105 may be provided as the storage node contact region 101b. The bit line contact region 101a may be formed as a pillar whose upper surface $T_2$ is located at a higher level than an upper surface $T_1$ of the field region 105. The upper surface $T_2$ of the pillar-shaped bit line contact region 101a may be located at a higher level than that of the storage node contact region 101b.

The semiconductor device in accordance with the embodiments further includes a first interlayer insulating layer pattern 126a formed on the substrate 100 in the cell region and having trenches 132 which expose the pillar-shaped bit line contact regions 101a and define bit line forming regions.

The bit line 134 may be formed to be a damascene structure in the trench 132 and connected with the pillar-shaped bit line contact region 101a. The bit line 134 may be formed in a single metal layer which includes a metal nitride such as titanium nitride (TiN) and the like.

Since the bit lines 134 may be directly connected onto the pillar-shaped bit line contact regions 101a, overlapping regions between the active regions 101 and the bit lines 134 may increase to obtain a bit line contact margin. A distance between the adjacent bit line contacts may be secured by the pillar-shaped bit line contact region 101a, thereby preventing mutual interference occurring from adjacent bit line contacts.

Figure 25A:
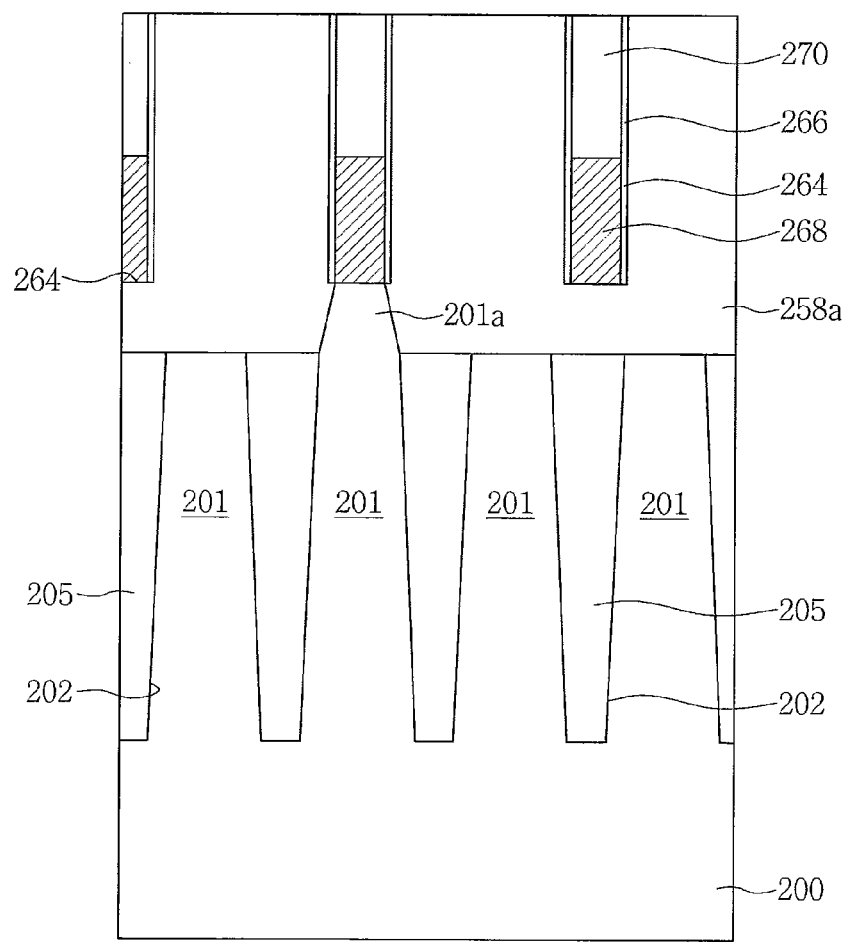
Figure 25B:
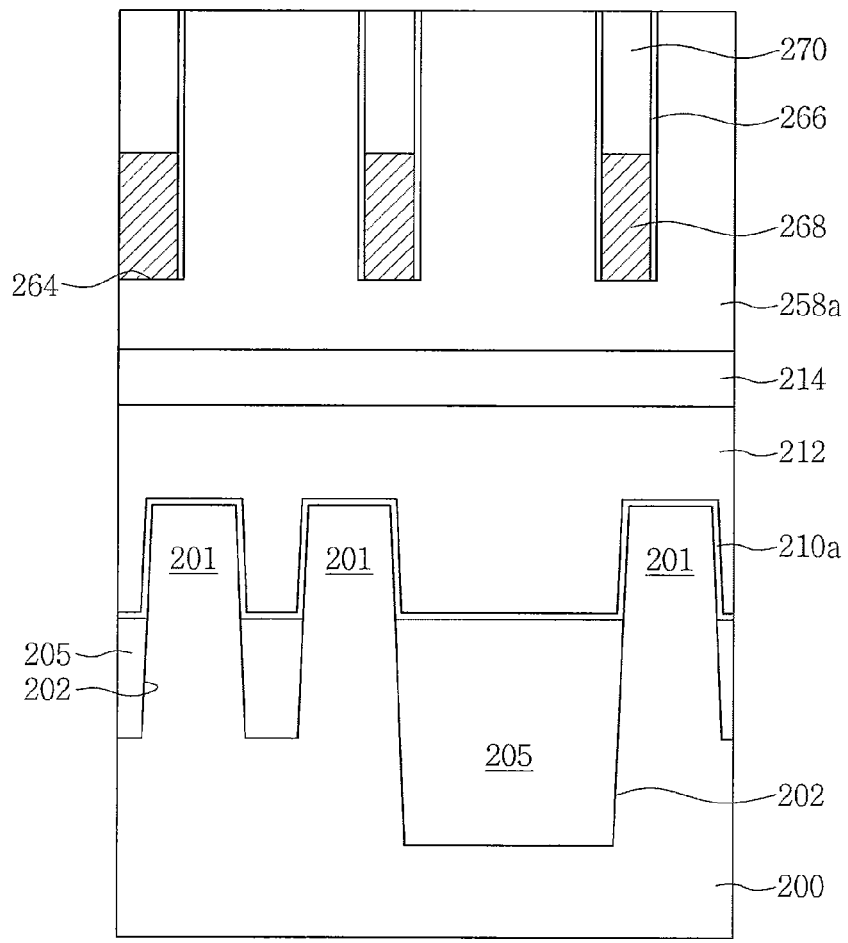
Figure 25C:
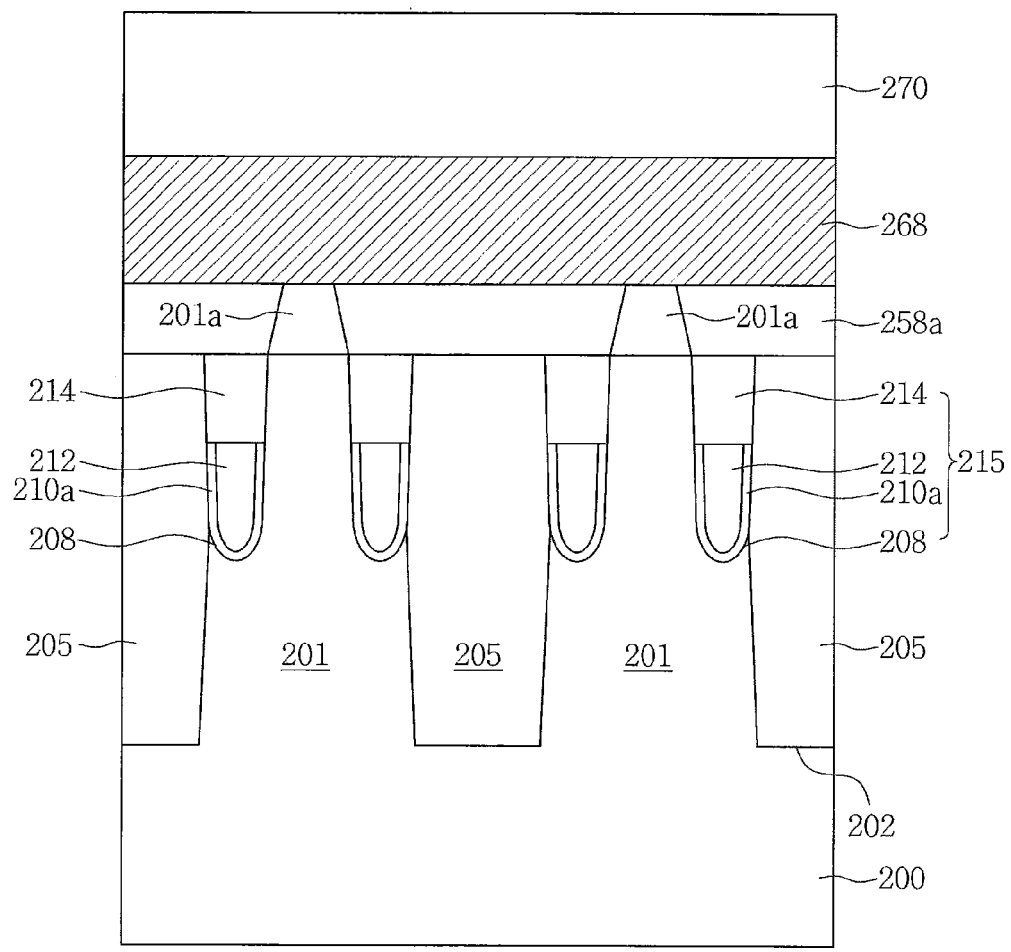
Figure 25D:
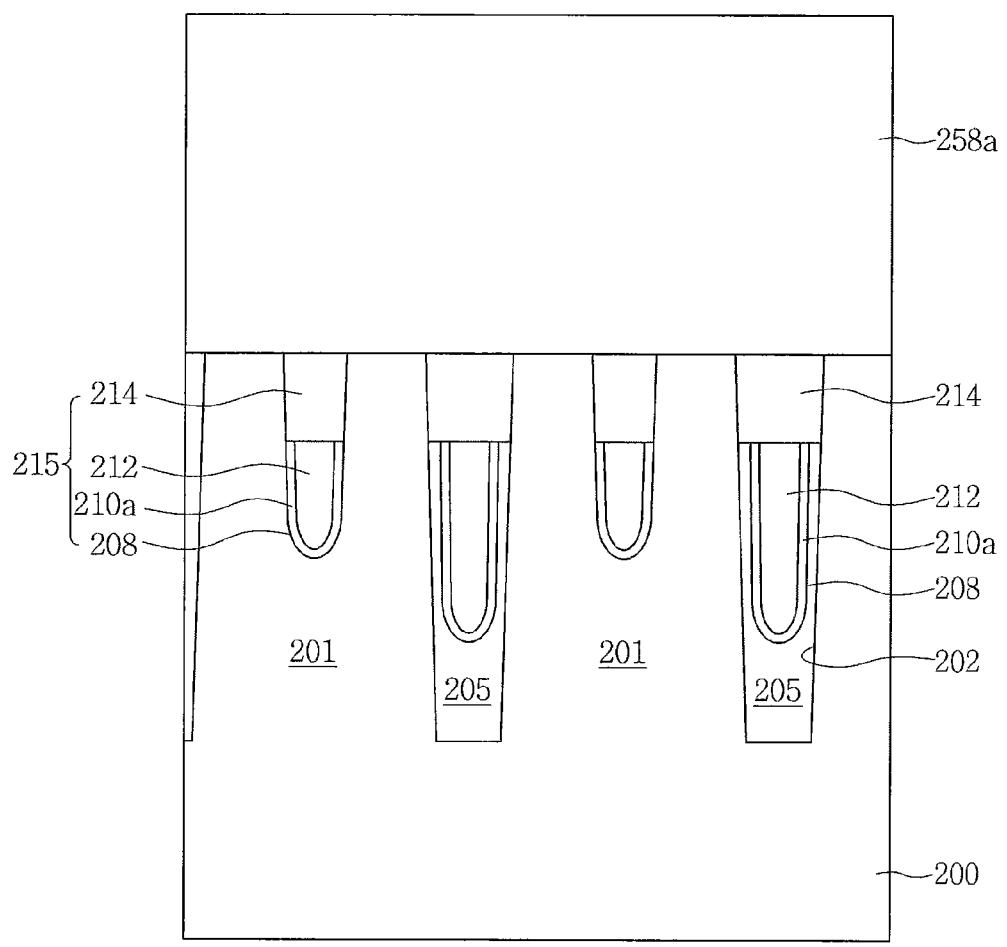
Figure 25E:
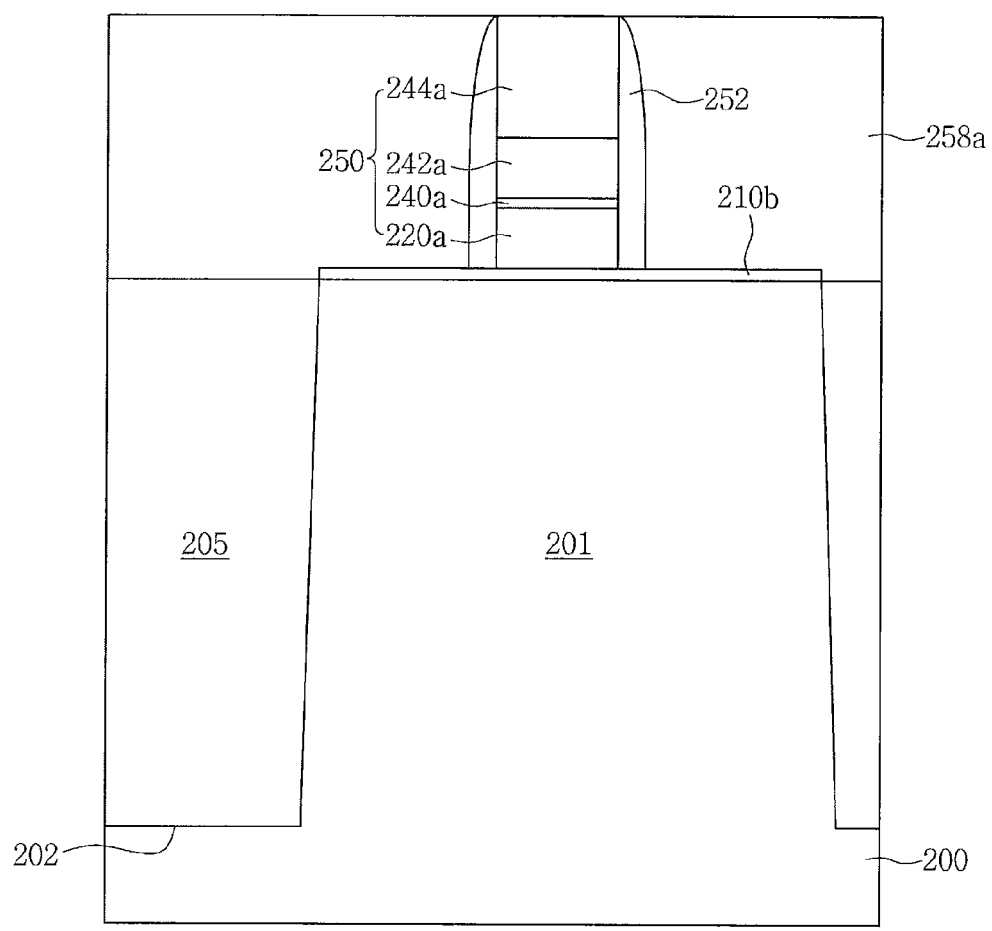
Figure 26A:
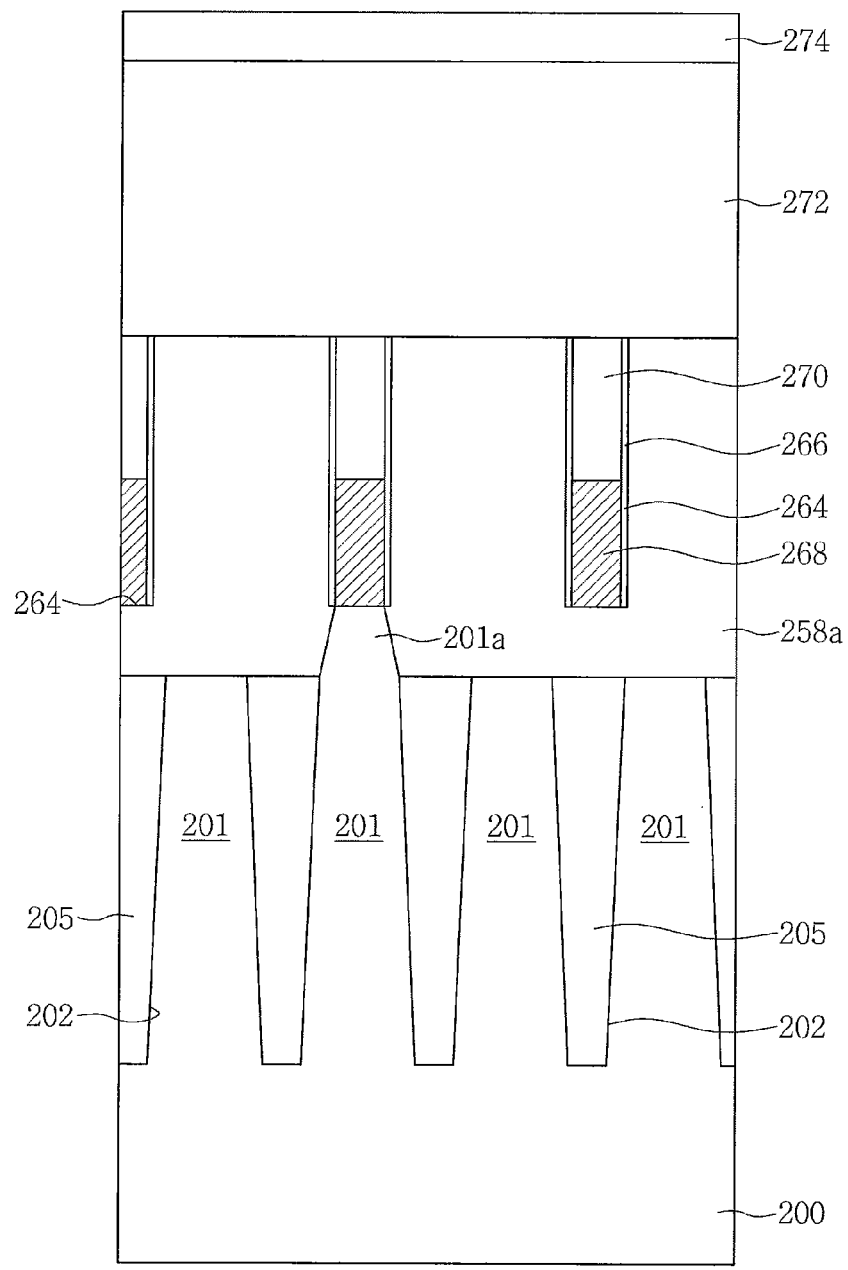
Figure 26B:
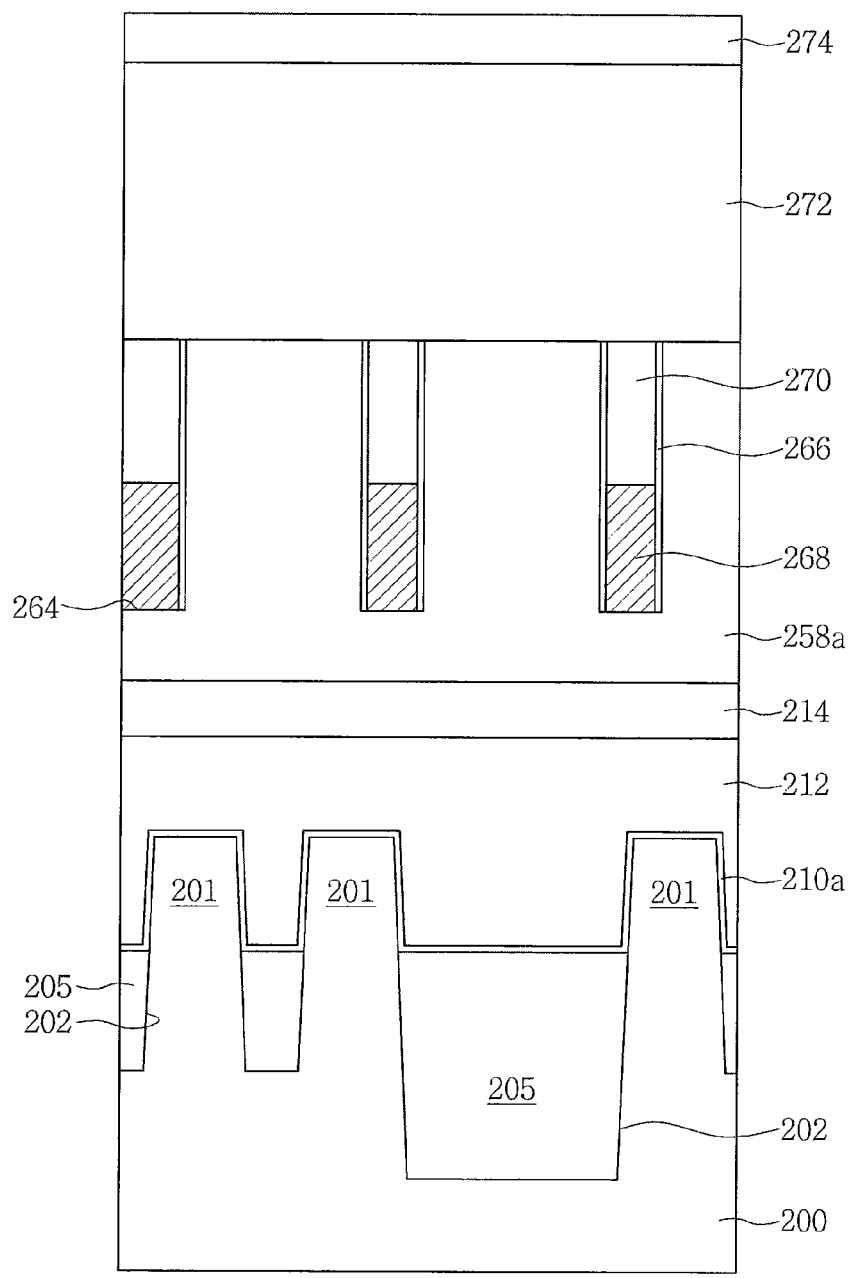
Figure 26C:
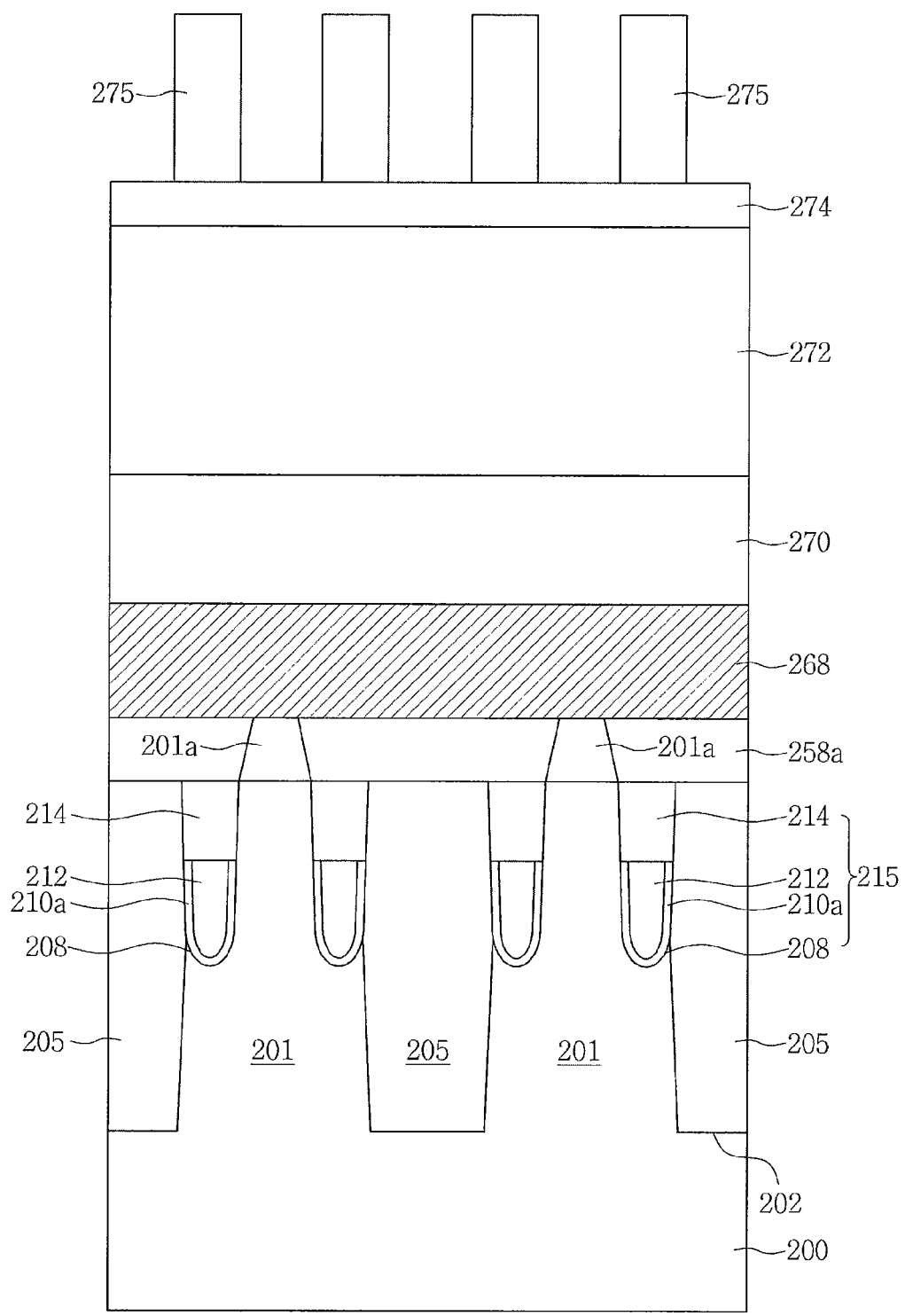
Figure 26D:
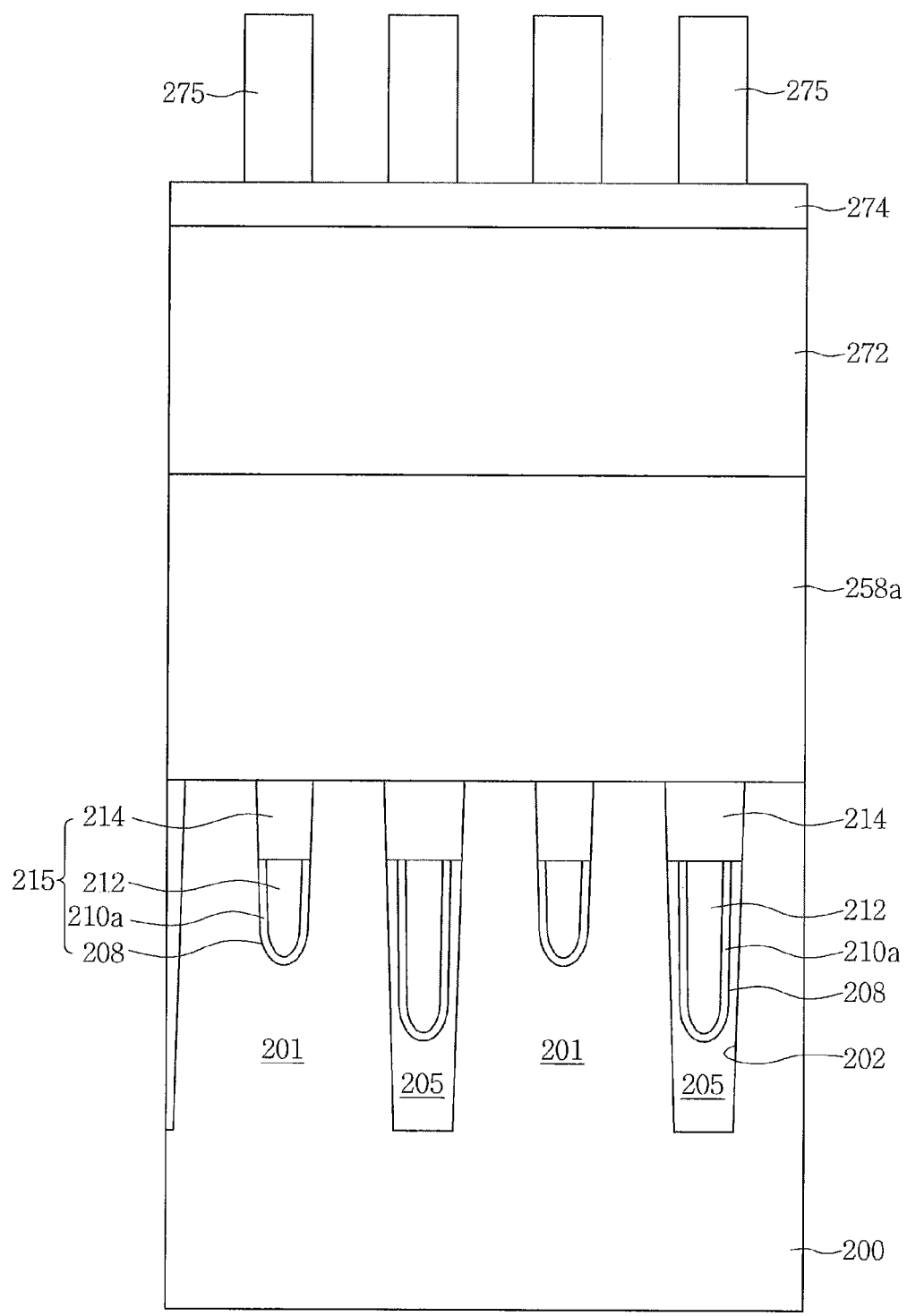
Figure 26E:
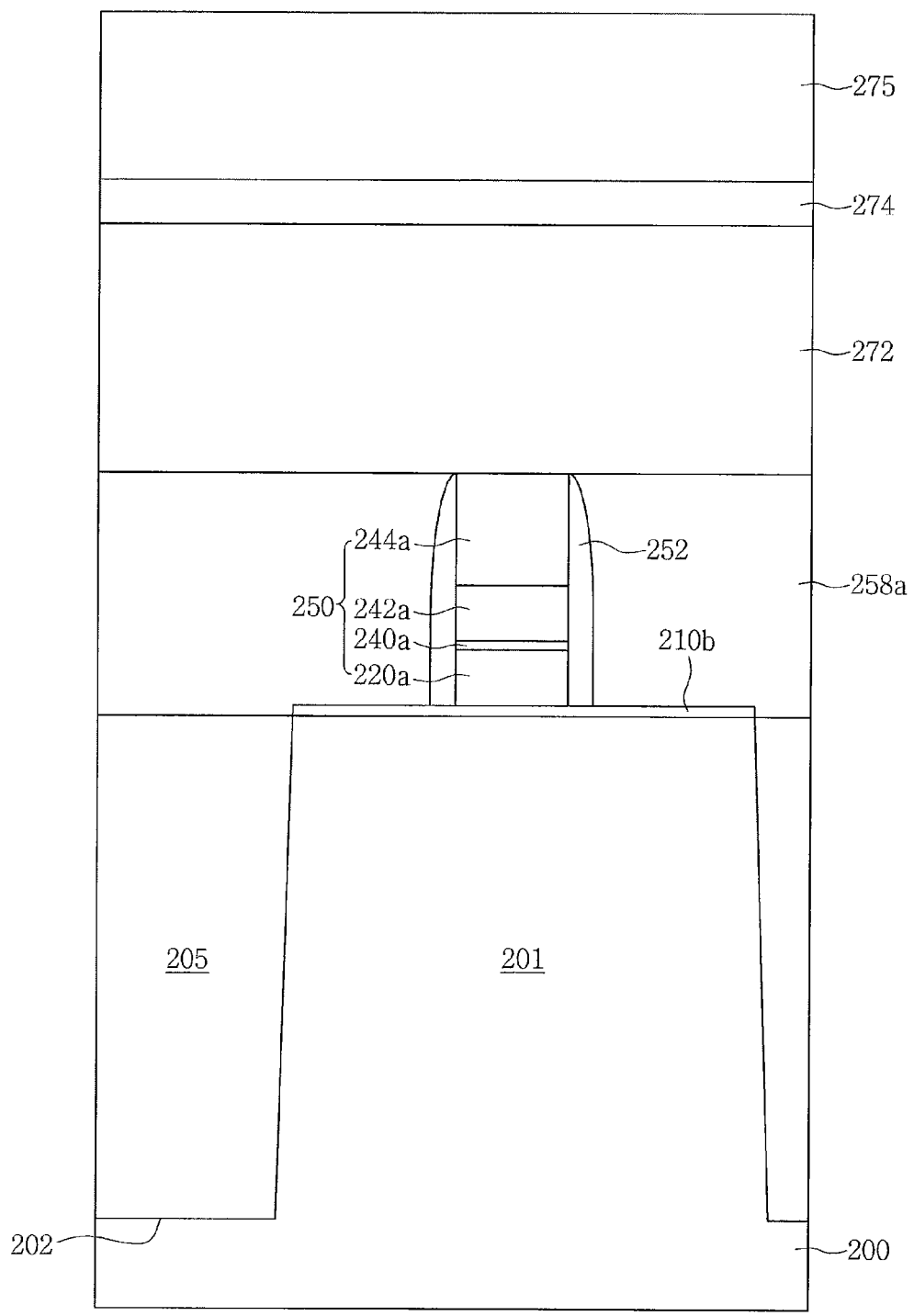
Figure 27A:
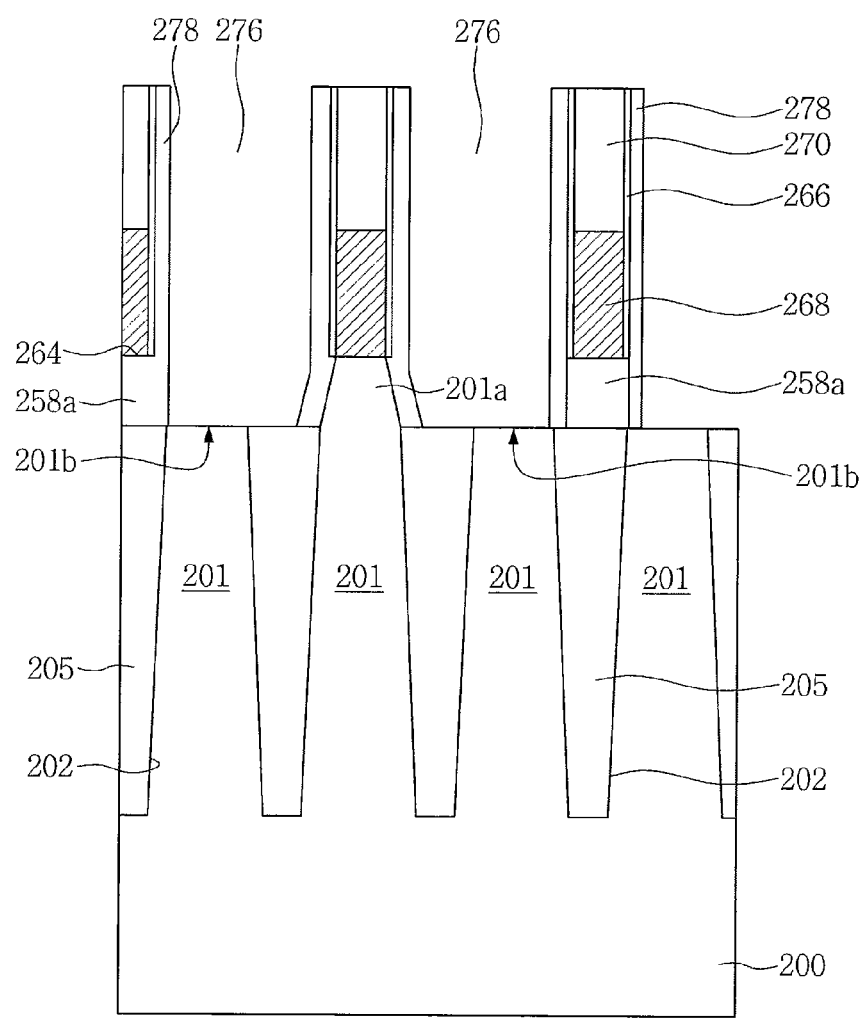
Figure 27B:
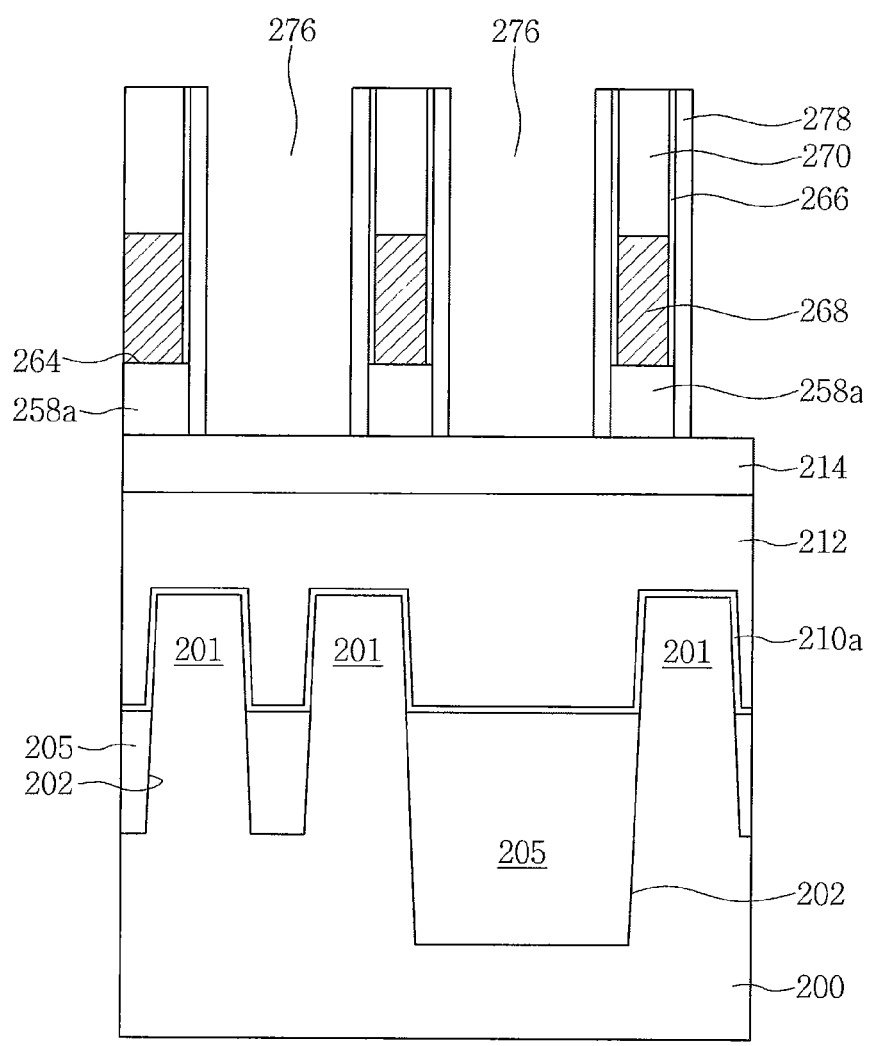
Figure 27C:
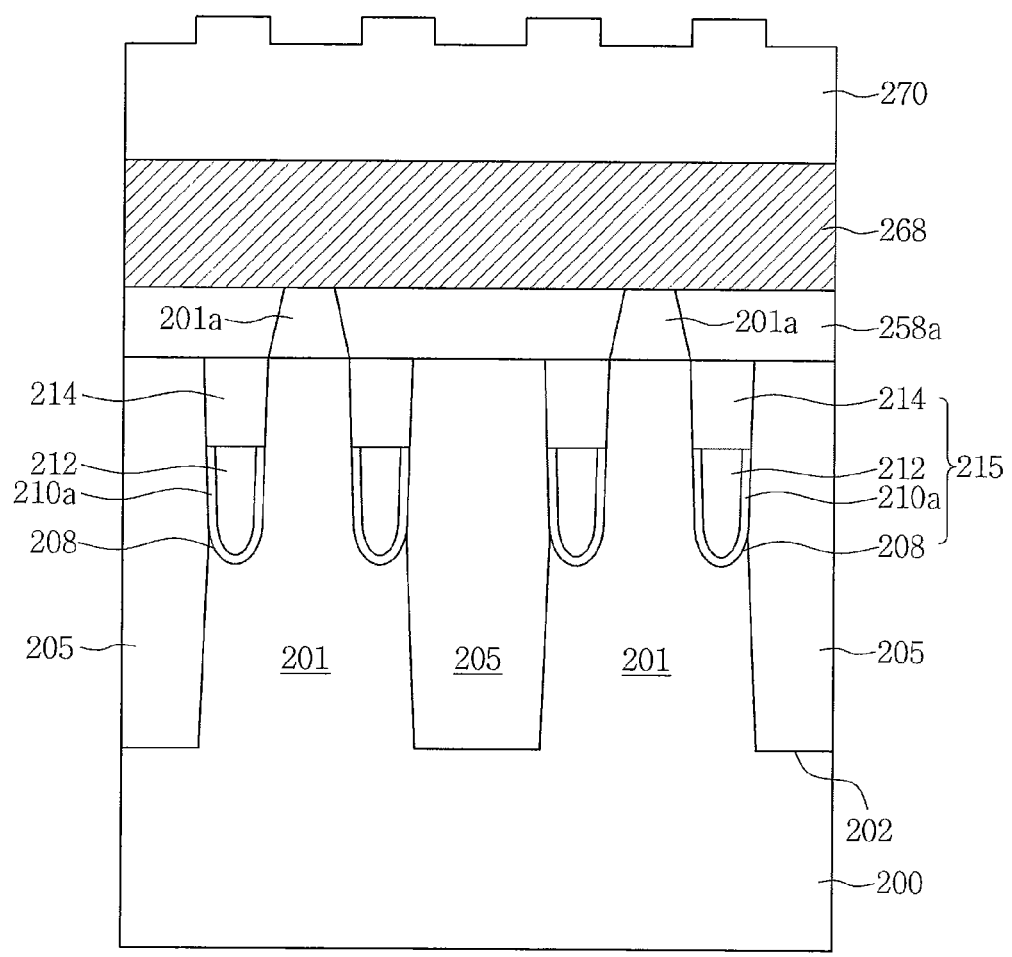
Figure 27D:
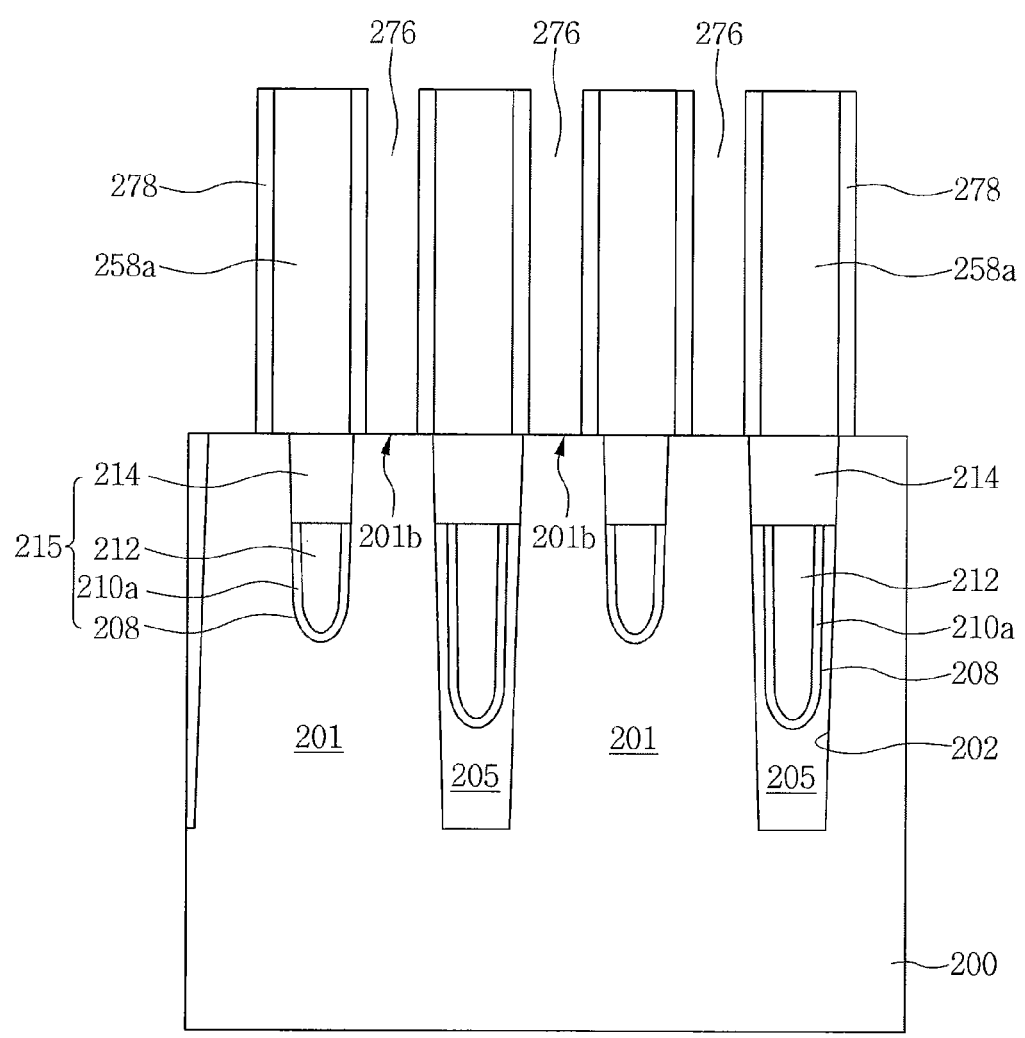
Figure 27E:
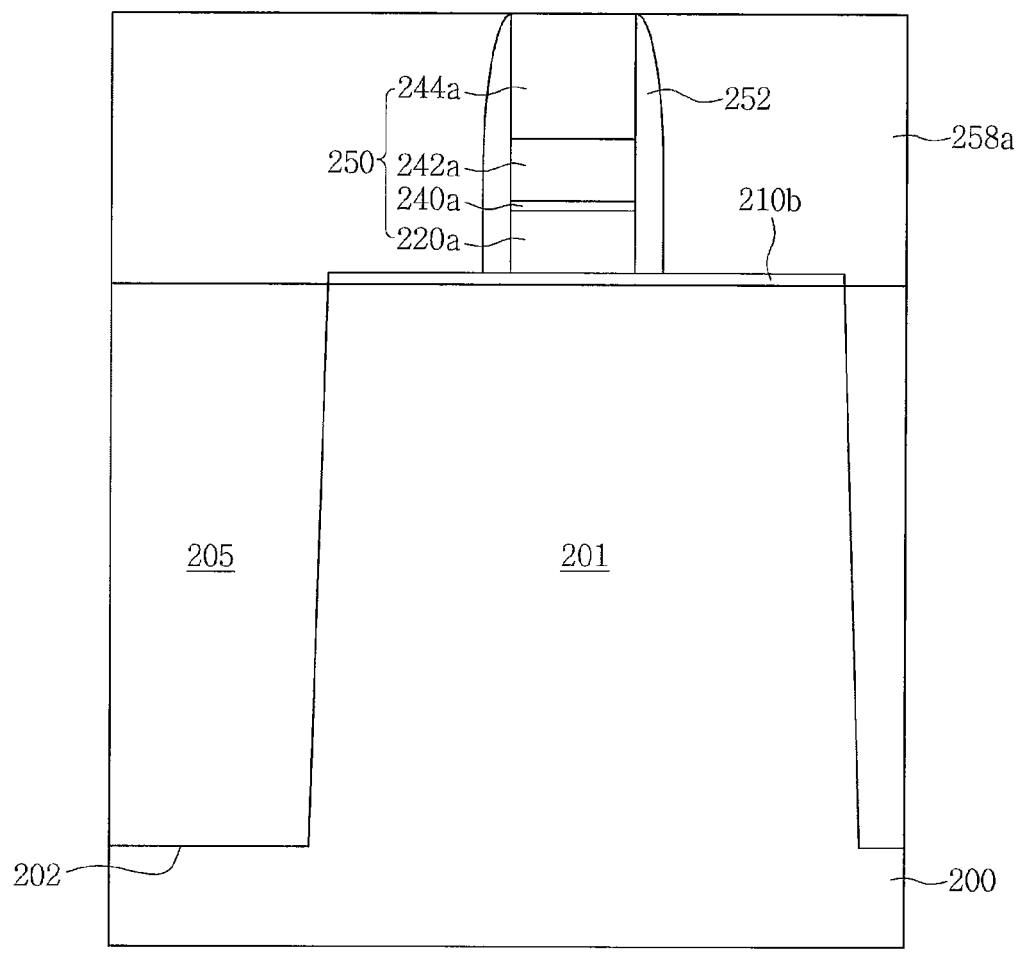
Figure 28A:
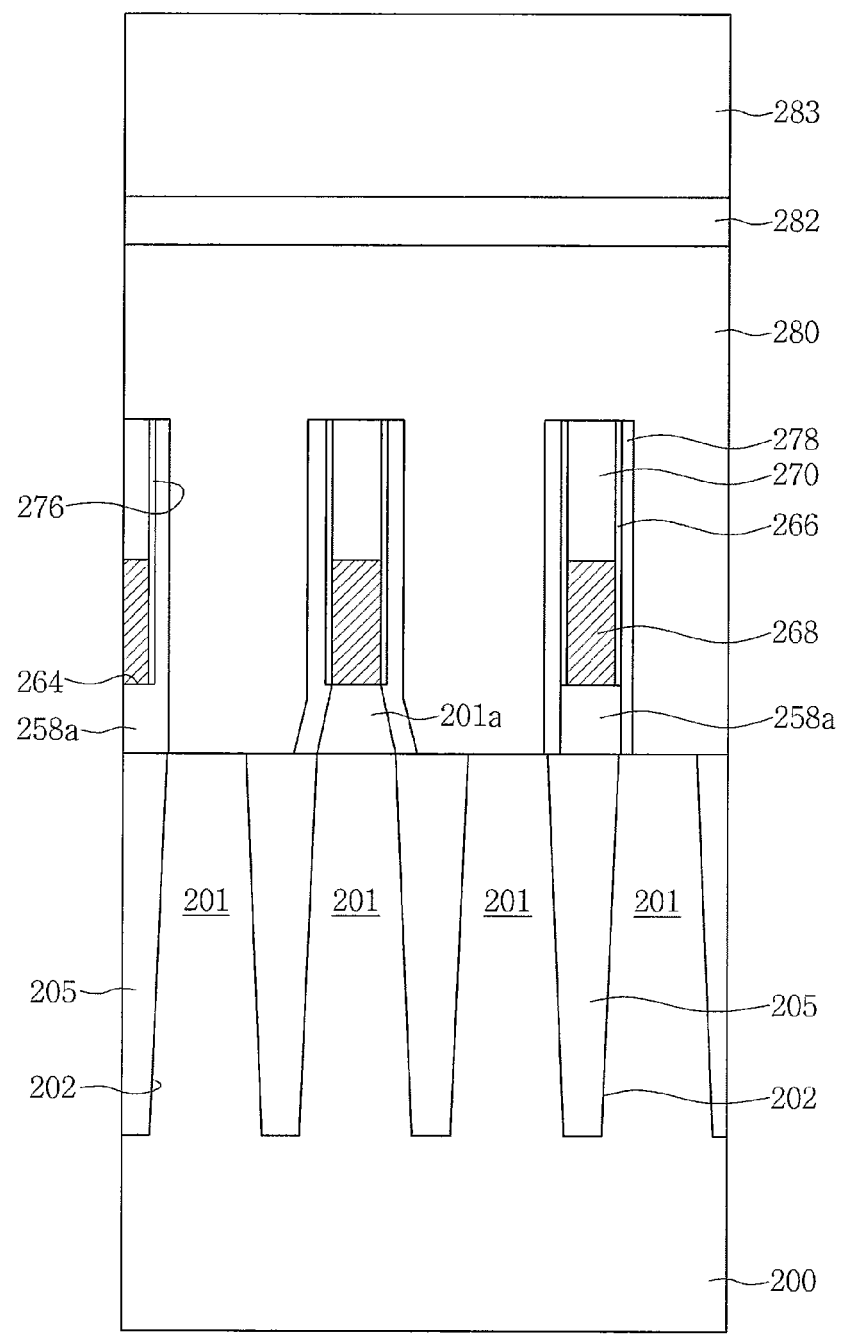
Figure 28B:
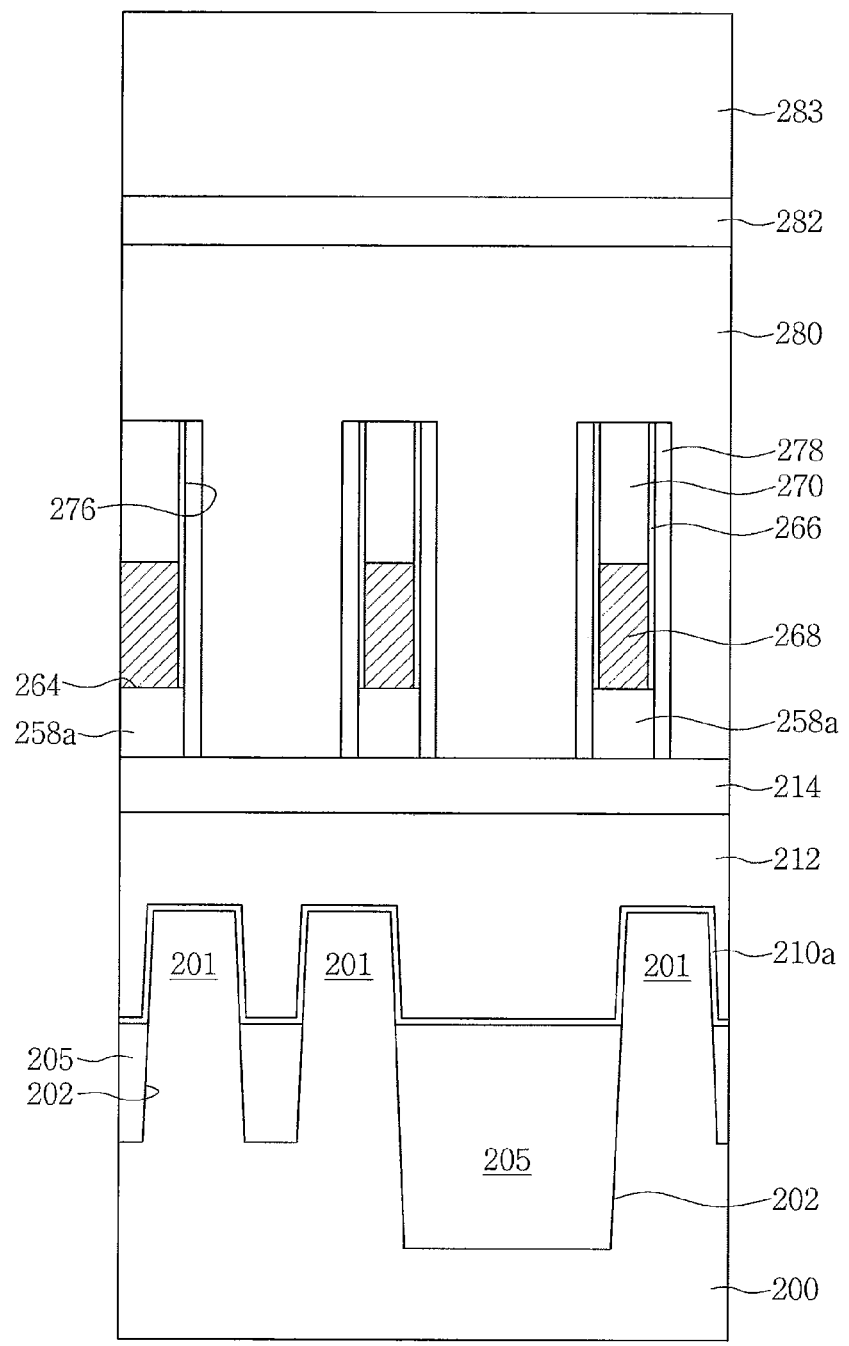
Figure 28C:
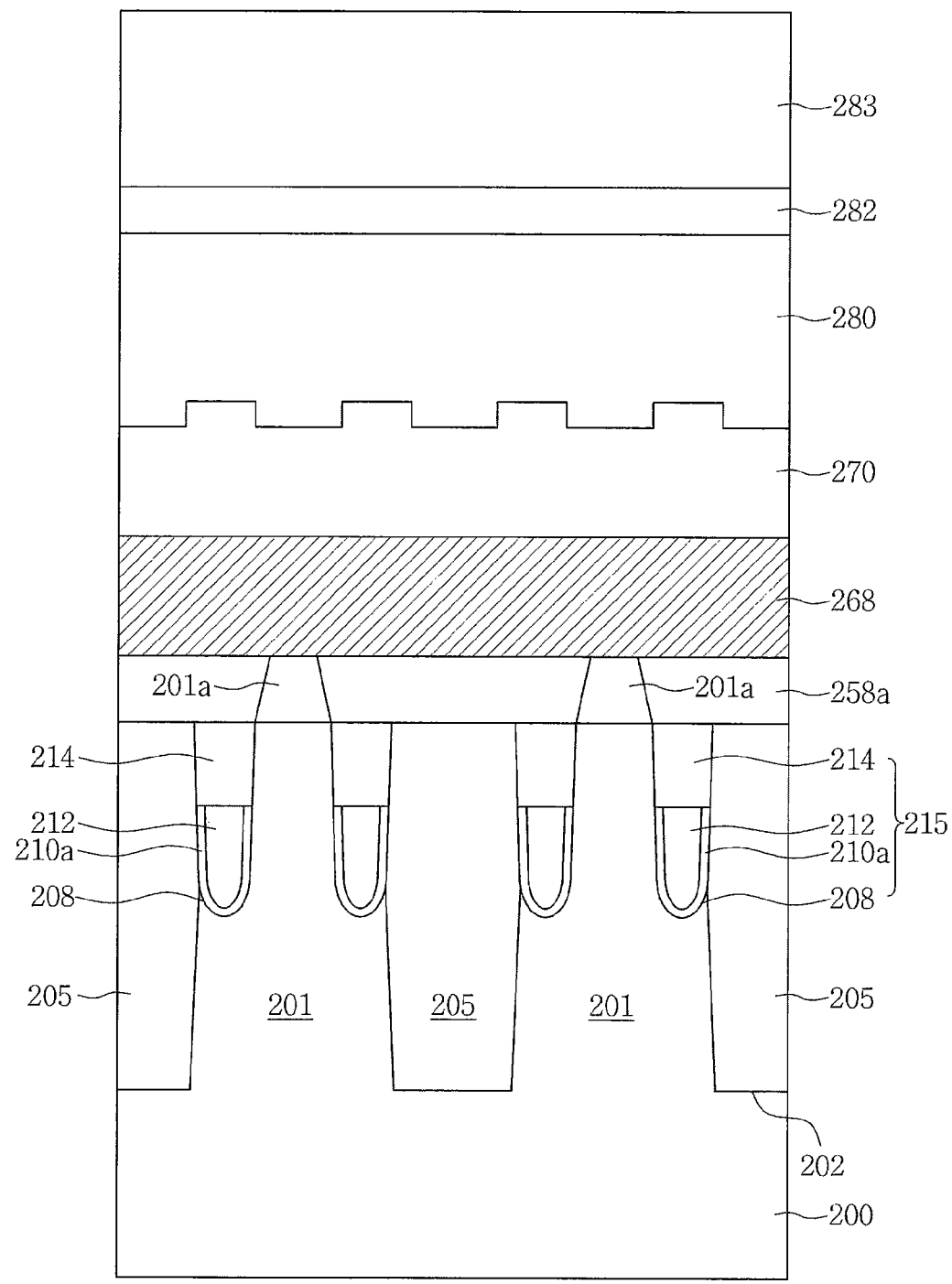
Figure 28D:
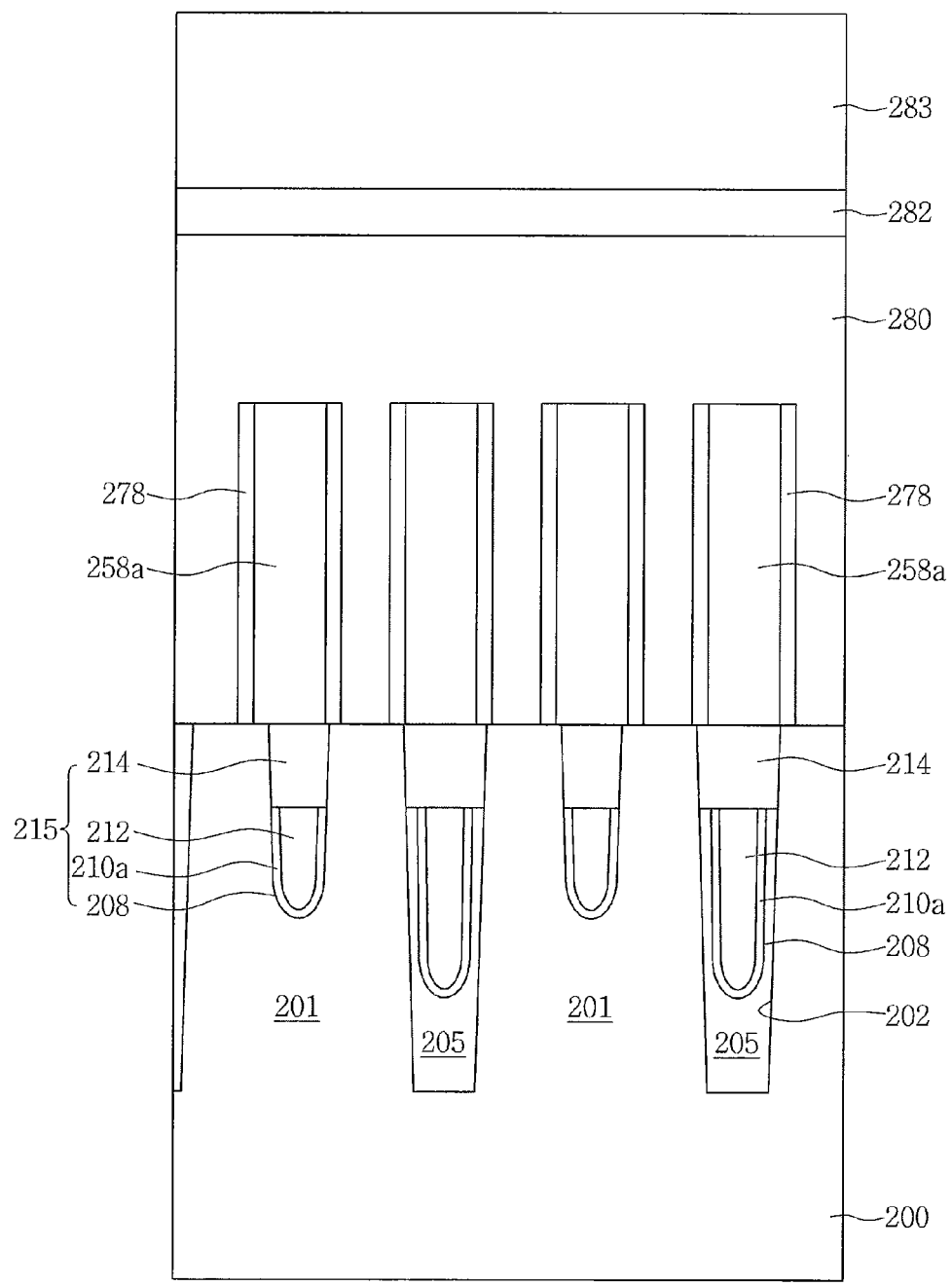
Figure 28E:
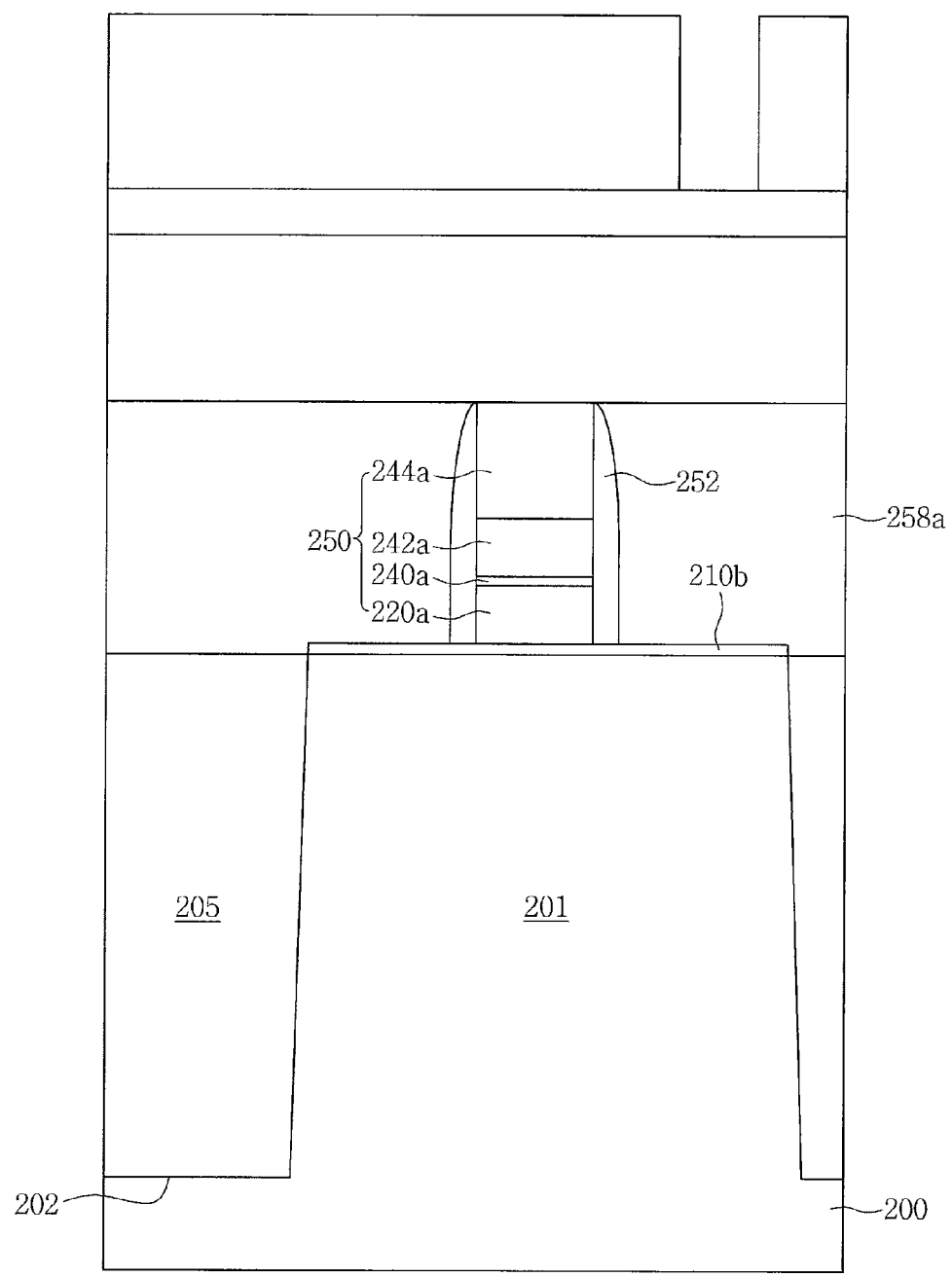
Figure 29A:
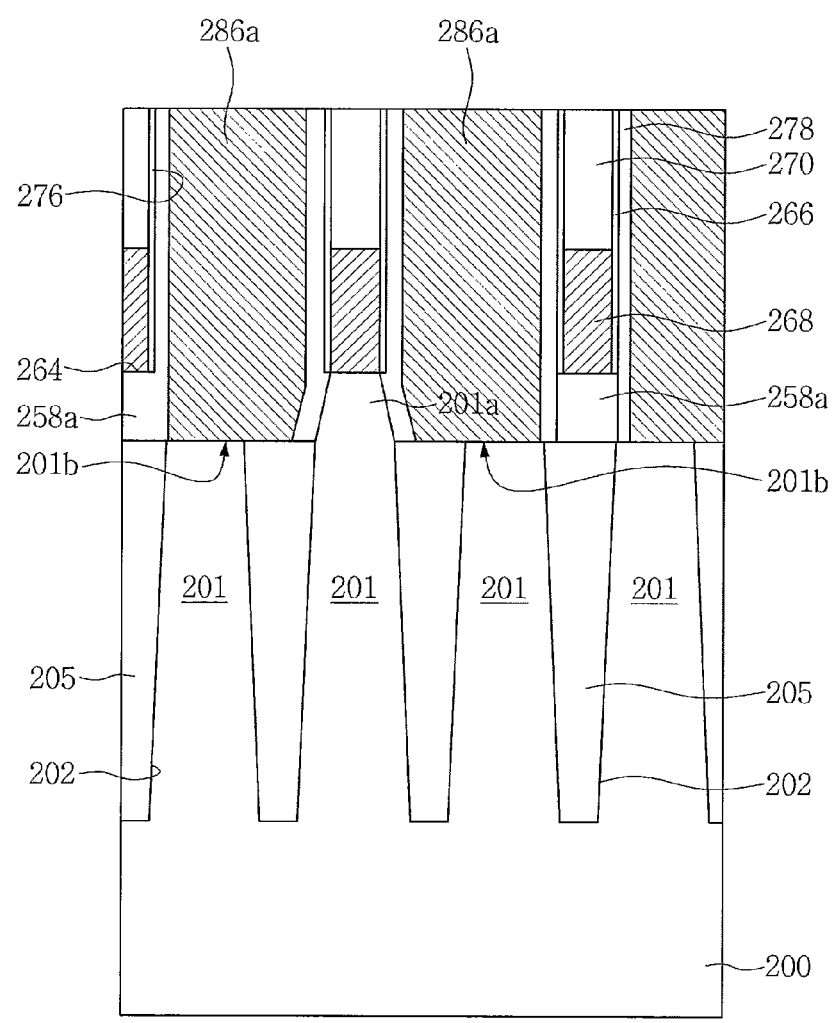
Figure 29B:
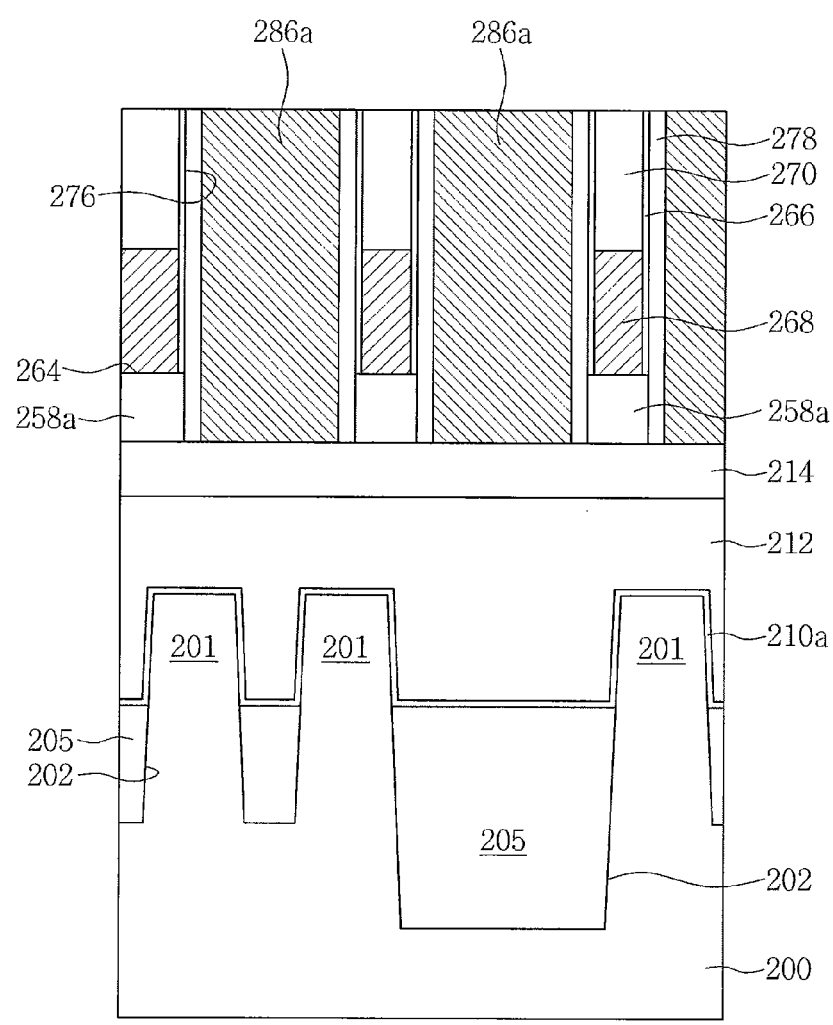
Figure 29C:
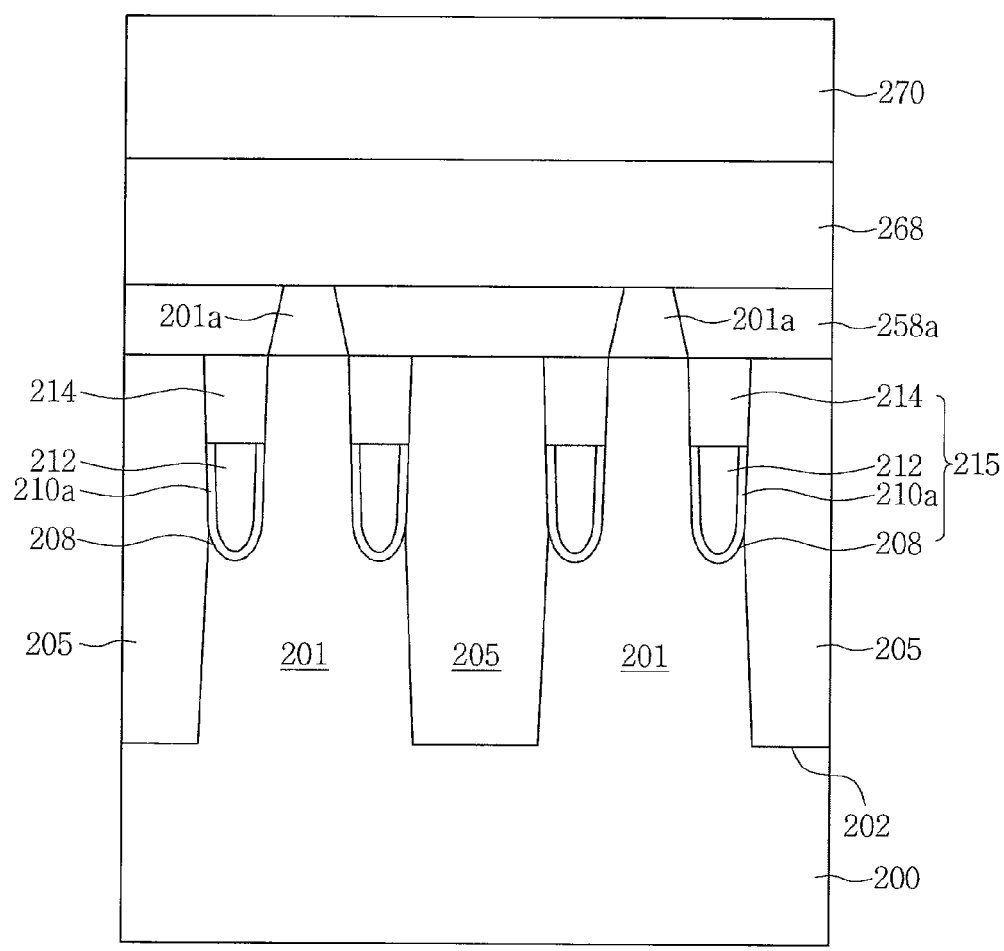
Figure 29D:
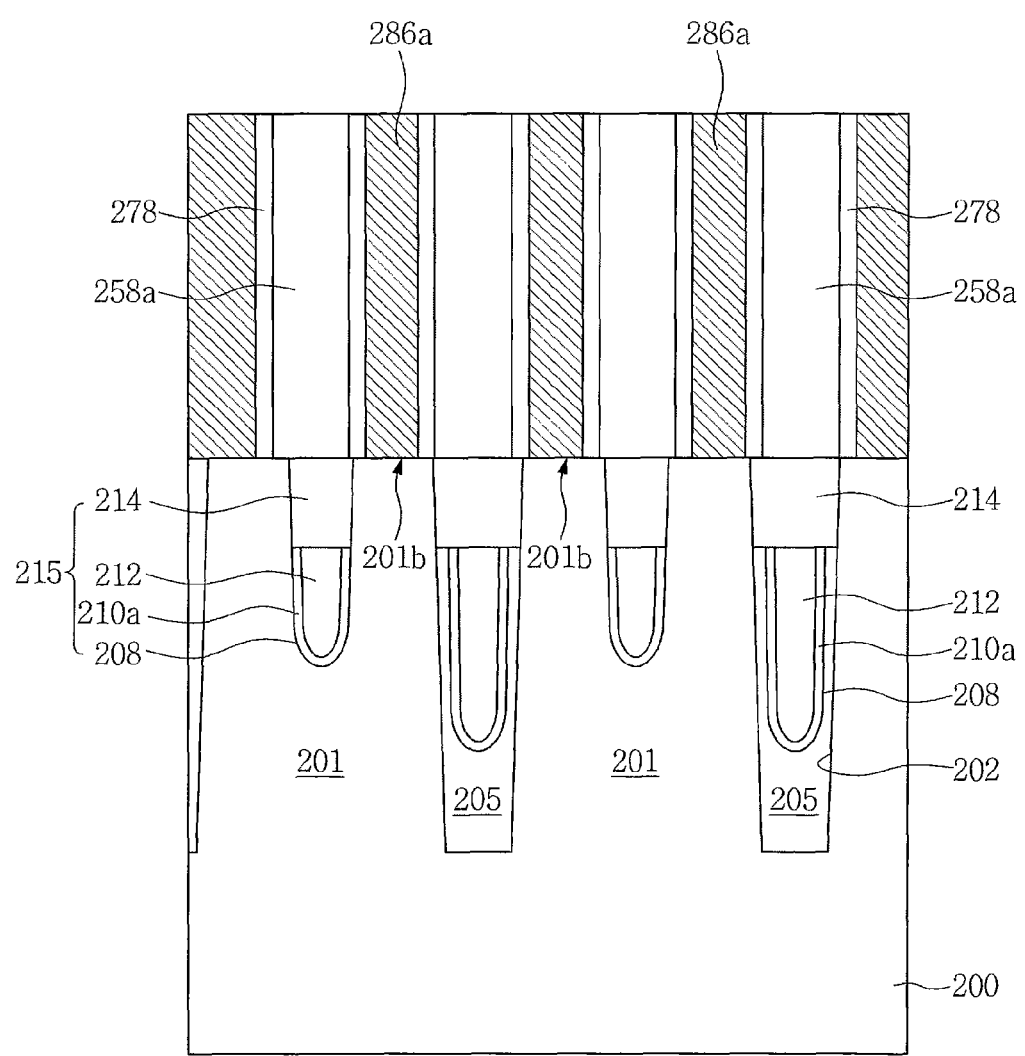
Figure 29E:
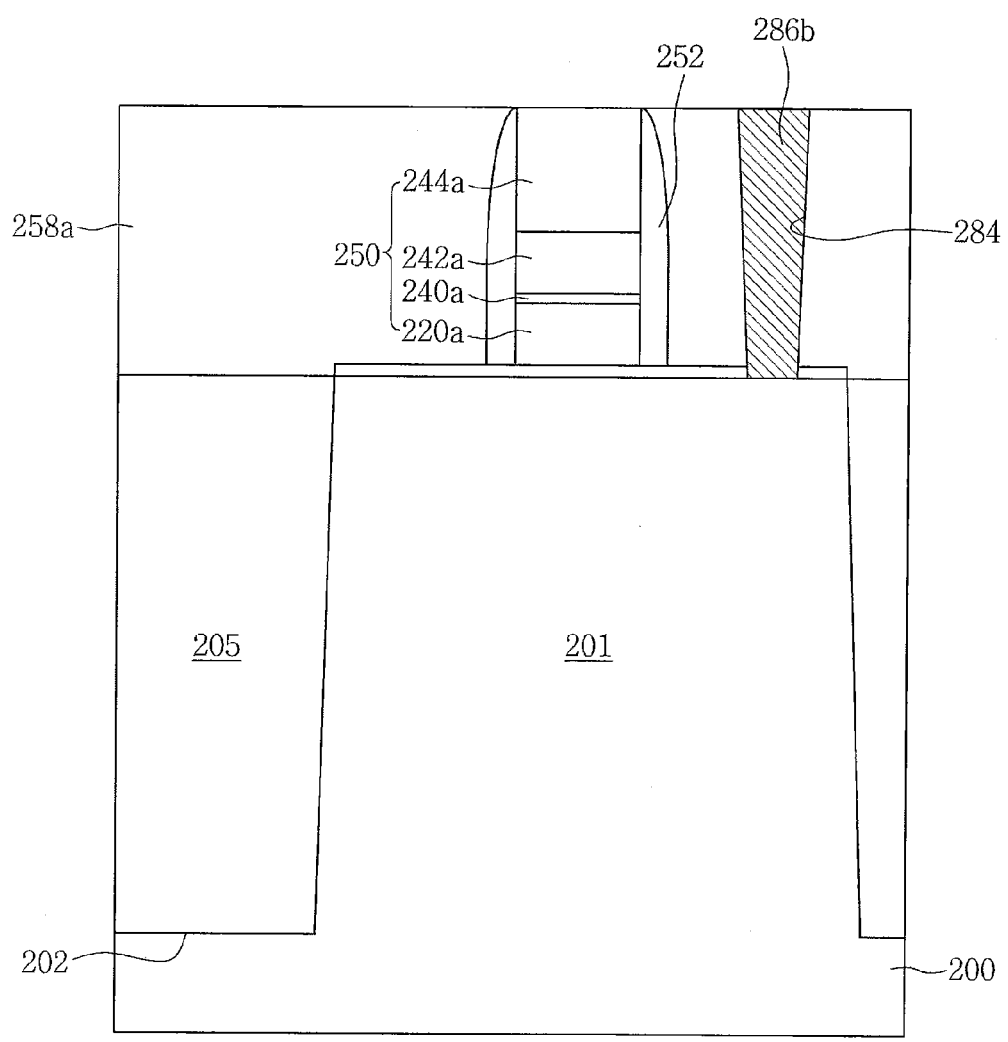

Since the bit line 134 of damascene structure may be formed in a single metal layer, a stacked height of the bit line 134 may become small to decrease parasitic capacitance. In accordance with some embodiments, the upper surface of the bit line 134 may have substantially the same upper surface as that of the first interlayer insulating layer pattern 126a. In accordance with another embodiment, the bit lines may be formed to fill lower portions of the trenches, and a bit line capping layer may be further formed to fill upper portions of the trenches on the bit lines (reference to FIG. 25A).

The second gate structure 150 in the core/peripheral circuit region may include a second gate insulating layer 110b formed on the substrate 100, and a first conductive layer pattern 120a, a barrier metal layer pattern 140a, a second conductive layer pattern 142a, and a gate mask layer pattern 144a which are sequentially stacked on the second gate insulating layer 110b. The second gate structure 150 may further include gate spacers 152 formed on both sidewalls thereof.

FIGS. 3A to 17E illustrate cross-sectional views of stages in a method of fabricating a semiconductor device in accordance with some embodiments. Here, FIGS. A, B, C, and D illustrate cross-sectional views showing cell regions of the semiconductor device taken along lines A-A', B-B', C-C', and D-D' shown in FIG. 1, respectively, and each FIG. E illustrates a cross-sectional view showing a core/peripheral circuit region of the semiconductor device.

Referring to FIGS. 3A, 3B, 3C, 3D, and 3E, a substrate 100 in which cell regions and a core/peripheral circuit region are defined may be prepared.

The substrate 100 may include a semiconductor substrate. For example, the substrate 100 may include a silicon substrate, a germanium substrate, or a silicon-germanium substrate.

A device isolation process may be performed on the substrate 100 to form field region 105 defining active regions 101. The field region 105 may be formed by an STI process. For example, the substrate 100 may be partially etched to form field trench 102, and the field region 105 may be formed by filling the field trench 102 with a field insulating layer. The field insulating layer may include a single layer of silicon oxide, or a complex layer of silicon oxide and silicon nitride according to the size of the field trench 102.

A buried gate forming process may be performed on the cell regions of the substrate 100 in which the field region 105 is formed.

First, the active regions 101 and the field region 105 in the cell regions may be partially etched to form gate trenches 108. The gate trenches 108 may be formed to cross the active regions 101 and extend to the field region 105. The gate trenches 108 may be formed to have different depths from each other in the active regions 101 and the field region 105 by a difference in etch rates. For example, the gate trenches 108 in the field region 105 may be formed to be deeper than the gate trenches 108 in the active regions 101.

A first gate insulating layer 110a may be conformally formed on inner walls of the gate trenches 108 by a thermal oxidation process or a deposition process. At the same time, a second gate insulating layer 110b may be formed on the substrate 100 of the core/peripheral circuit region.

A gate conductive layer may be deposited on the substrate 100 to fill the gate trenches 108, and etched back to form buried gates 112 in lower portions of the gate trenches 108. The bottom of the buried gate 112 in the field region 105 may be located at a lower level than that in the active region 101. The upper surfaces of the buried gates 112 may be located at substantially the same level or at similar level in the active regions 101 and the field region 105.

A gate capping layer 114 may be formed on the buried gates 112 to fill upper portions of the gate trenches 108. The gate capping layer 114 may be removed to an upper surface of the substrate 100 by a planarization process such as an etch-back or chemical mechanical polishing (CMP) process. First gate structures 115 including the first gate insulating layers 110a, the buried gates 112, and the gate capping layers 114 may be formed in the substrate 100 of the cell regions by the above processes. The first gate structures 115 may be provided as word lines in the cell regions.

The first and second gate insulating layers 110a and 110b may include silicon oxide. The buried gate 112 may include polysilicon or a metal such as tungsten (W), aluminum (Al), copper (Cu), etc. When the buried gate 112 is formed of a metal, a barrier metal layer formed of titanium (Ti), titanium nitride (TiN), tantalum (Ta), tantalum nitride (TaN), or the like may be formed in regions between the buried gate 112 and the first gate insulating layer 110a. The gate capping layer 114 may include silicon nitride.

After the first gate structures 115 are formed, a source/drain ion implantation process may be performed on both sides of each of the buried gates 112, to thereby form buried cell array transistors (BCATs). The source/drain ion implantation process may be performed before the first gate structures 115 are formed.

Subsequently, an etch stop layer 116 may be formed on the entire surface of the substrate 100. The etch stop layer 116 may include a material having an etch selectivity with respect to the substrate 100 and a first interlayer insulating layer which may be formed in a subsequent damascene process. For example, the etch stop layer 116 may be formed in either a single layer of silicon nitride, or a complex layer of silicon oxide and silicon nitride.

A first conductive layer 120 may be formed on the etch stop layer 116 to have a thickness of about 350 Å. The first conductive layer 120 is provided as a gate in the core/peripheral circuit region and, for example, may include polysilicon.

Referring to FIGS. 4A, 4B, 4C, 4D, and 4E, the first conductive layer 120 may be removed from the cell regions using a cell open mask. Then, the first conductive layer 120 may remain only on the substrate 100 of the core/peripheral circuit region.

Subsequently, a first hard mask layer 122 may be formed on the entire surface of the substrate 100. The first hard mask layer 122 may include a material having an etch selectivity with respect to the etch stop layer 116. For example, the first hard mask layer 122 may be formed of a carbon-containing layer such as a spin-on hard mask (SOH). The SOH layer may be formed of an organic compound consisting of a hydrocarbon compound including an aromatic ring such as phenyl, benzene, or naphthalene, or derivatives thereof. The SOH layer may be formed by a spin coating process.

A first anti-reflection layer 124 may be formed on the first hard mask layer 122. When an exposing process is performed to form a photoresist pattern, the first anti-reflection layer 124 may absorb light reflected from a surface of the substrate 100, or offset the light by an interference effect to improve a profile of the photoresist pattern. The first anti-reflection layer 124 may include an inorganic substance or an organic polymer such as silicon oxynitride (SiON).

A first photoresist pattern 125 may be formed on the first anti-reflection layer 124 to mask the core/peripheral circuit region of the substrate 100 and to define bit line contact regions in the cell regions. The first photoresist pattern 125 may be formed to define a region between the buried gate 112 and the buried gate 112 in one active region 101.

Referring to FIGS. 5A, 5B, 5C, 5D, and 5E, a first hard mask layer pattern 122a may be formed by sequentially etching the first anti-reflection layer 124 and the first hard mask layer 122 using the first photoresist pattern 125 as an etching mask. While the first hard mask layer 122 is etched, the first photoresist pattern 125 having similar etching characteristics to the first hard mask layer 122 may be removed.

A etch stop layer pattern 116a may be formed by etching the etch stop layer 116 using the first hard mask layer pattern 122a as an etching mask. The substrate 100 in the cell regions may be etched using the etch stop layer pattern 116a as an etching mask. That is, the active regions 101 and field region 105 in the cell regions may be partially recessed by the etching process, to thereby form each bit line contact region 101a formed as a pillar in the corresponding active region 101 between the buried gate 112 and the buried gate 112. An upper surface $T_2$ of the pillar-shaped bit line contact region 101a may be located at a higher level than an upper surface $T_1$ of the field region 105.

After the formation of pillar-shaped bit line contact regions 101a, the first hard mask layer pattern 122a may remain on the substrate 100 in the core/peripheral circuit region.

Referring to FIGS. 6A, 6B, 6C, 6D, and 6E, after removing the remaining first hard mask layer pattern 122a, a first interlayer insulating layer 126 may be formed on the entire surface of the substrate 100. The first interlayer insulating layer 126 may be a layer to prepare a pattern shape in which a damascene process is performed, and includes a material, such as silicon oxide, which may be selectively etched in a subsequent process.

A second hard mask layer 128 may be formed on the first interlayer insulating layer 126. The second hard mask layer 128 may include a material having an etch selectivity with respect to the first interlayer insulating layer 126, for example, a carbon-containing compound such as the material of an SOH. A second anti-reflection layer 130 may be formed on the second hard mask layer 128. The second anti-refection layer 130 may include silicon oxynitride (SiON).

A second photoresist pattern 131 may be formed on the second anti-reflection layer 130 to mask the core/peripheral circuit region of the substrate 100 and to define bit line forming regions in the cell regions.

Referring to FIGS. 7A, 7B, 7C, 7D, and 7E, the second anti-reflection layer 130 and the second hard mask layer 128 may be sequentially etched using the second photoresist pattern 131 as an etching mask. While the second hard mask layer 128 is etched, the second photoresist pattern 131 having similar etching characteristics to the second hard mask layer 128 may be removed.

A first interlayer insulating layer pattern 126a may be formed by etching the first interlayer insulating layer 126 using the remaining second hard mask layer 128 as an etching mask. The etching of the first interlayer insulating layer 126 may be complete at a surface of the etch stop layer pattern 116a.

The exposed etch stop layer pattern 116a may be removed to form trenches 132 in the first interlayer insulating layer pattern 126a, the trenches 132 exposing the pillar-shaped bit line contact regions 101a and defining bit line forming regions. Since the etch stop layer 116 is formed of a material having an etch selectivity with respect to the substrate 100, the etch stop layer 116 may prevent the underlying substrate 100 (i.e., the active regions 101 of the cells) from being damaged when the damascene etching process is performed to form the trenches 132. While the etch stop layer pattern 116a is removed, the first interlayer insulating layer pattern 126a may be partially etched and thus, the other trenches may be formed to be deeper than the trenches on the pillar-shaped bit line contact regions 101a.

The remaining second hard mask layer 128 on the cell regions and the core/peripheral circuit region may be removed. After the damascene etching process is performed to form the trenches 132, the first interlayer insulating layer pattern 126a may remain on the substrate 100 in the core/peripheral circuit region.

Referring to FIGS. 8A, 8B, 8C, 8D, and 8E, a conductive layer may be deposited to fill the trenches 132 on an entire surface of the substrate 100. Bit lines 134 of a damascene structure may be formed in the trenches 132 by removing the conductive layer until an upper surface of the first interlayer insulating layer pattern 126a is exposed by an etch-back process.

The bit lines 134 may be formed in a single metal layer including a metal nitride such as titanium nitride and the like. Each of the bit lines 134 may be directly connected to the pillar-shaped bit line contact region 101a through the trench 132, and formed as a line which extends in a direction perpendicular to the first gate structures 115 in the cell regions. Since the bit lines 134 are formed by a damascene process, fine patterns can be implemented by overcoming a patterning limitation of a photolithography process.

An insulating layer 136 may be formed on the bit lines 134 and the first interlayer insulating layer pattern 126a. The insulating layer 136 may serve to protect the bit lines 134 while a gate formation process is performed on the core/peripheral circuit region.

Referring to FIGS. 9A, 9B, 9C, 9D, and 9E, a third photoresist pattern 137 may be formed to mask the cell regions on the insulating layer 136 and to open the core/peripheral circuit region. Both the insulating layer 136 and the first interlayer insulating layer pattern 126a in the core/peripheral circuit region may be removed by an etching process using the third photoresist pattern 137 as an etching mask. Accordingly, a first conductive layer 120 in the core/peripheral circuit region may be exposed.

Referring to FIGS. 10A, 10B, 10C, 10D, and 10E, after removing the third photoresist pattern 137, a barrier metal layer 140, a second conductive layer 142, and a gate mask layer 144 may be sequentially stacked on an entire surface of the substrate 100. The barrier metal layer 140 may include titanium, titanium nitride, tantalum, or tantalum nitride. The second conductive layer 142 may include a metal such as tungsten, aluminum, copper, etc. The gate mask layer 144 may include silicon nitride.

A third hard mask layer 146 and a third anti-reflection layer 148 may be sequentially formed on the gate mask layer 144. The third hard mask layer 146 may include a material having an etch selectivity with respect to the gate mask layer 144, for example, a carbon-containing compound such as the material of an SOH. The third anti-reflection layer 148 may include silicon oxynitride (SiON).

A fourth photoresist pattern 149 may be formed on the third anti-reflection layer 148 to open the cell regions of the substrate 100 and to define gate formation regions in the core/peripheral circuit region.

Referring to FIGS. 11A, 11B, 11C, 11D, and 11E, the third anti-reflection layer 148 and the third hard mask layer 146 may be sequentially etched using the fourth photoresist pattern 149 as an etching mask. While the third hard mask layer 146 is etched, the fourth photoresist pattern 149 having similar etching characteristics to the third hard mask layer 146 may be removed.

A gate mask layer pattern 144a may be formed by etching the gate mask layer 144 disposed under the third hard mask layer 146 using the remaining third hard mask layer 146 as an etching mask. The second conductive layer 142, the barrier metal layer 140, and the first conductive layer 120 may be sequentially etched using the gate mask layer pattern 144a as an etching mask. Then, a second gate structure 150 including the gate mask layer pattern 144a, the second conductive layer pattern 142a, the barrier metal layer pattern 140a, the first conductive layer pattern 120a and the second gate insulating layer 110b may be formed on the substrate 100 in the core/peripheral circuit region. All of the gate mask layer 144, the second conductive layer 142, and the barrier metal layer 140 in the cell regions may be removed by a plurality of etching processes which form the second gate structure 150, and the bit lines 134 may be protected by the insulating layer 136 located thereon.

Subsequently, the remaining third hard mask layer 146 may be removed.

Referring to FIGS. 12A, 12B, 12C, 12D, and 12E, a spacer insulating layer may be deposited on the substrate 100, and etched back to form gate spacers 152 on both sidewalls of the second gate structure 150. The gate spacers 152 may include silicon nitride.

A second interlayer insulating layer 154 may be formed on an entire surface of the substrate 100, and a planarization process may be performed on the second interlayer insulating layer 154 until an upper surface of the second gate structure 150 in the core/peripheral circuit region is exposed. The second interlayer insulating layer 154 may include silicon oxide.

Referring to FIGS. 13A, 13B, 13C, 13D, and 13E, a fourth hard mask layer 156 and a fourth anti-reflection layer 158 may be sequentially formed on an entire surface of the substrate 100 having the second interlayer insulating layer 154. The fourth hard mask layer 156 may include a material having an etch selectivity with respect to the second interlayer insulating layer 154, for example, a carbon-containing compound such as the material of an SOH. The fourth anti-reflection layer 158 may include silicon oxynitride (SiON).

A fifth photoresist pattern 159 may be formed on the fourth anti-reflection layer 158 to mask the core/peripheral circuit region of the substrate 100 and to define storage node contact plug formation regions in the cell regions. The fifth photoresist pattern 159 may be formed to define a region between the buried gate 112 and the field region 105 in one active region 101.

Referring to FIGS. 14A, 14B, 14C, 14D, and 14E, the fourth anti-reflection layer 158 and the fourth hard mask layer 156 in the cell regions may be sequentially etched using the fifth photoresist pattern 159 as an etching mask. While the fourth hard mask layer 156 is etched, the fifth photoresist pattern 159 having similar etching characteristics to the fourth hard mask layer 156 may be removed.

Figure 18:
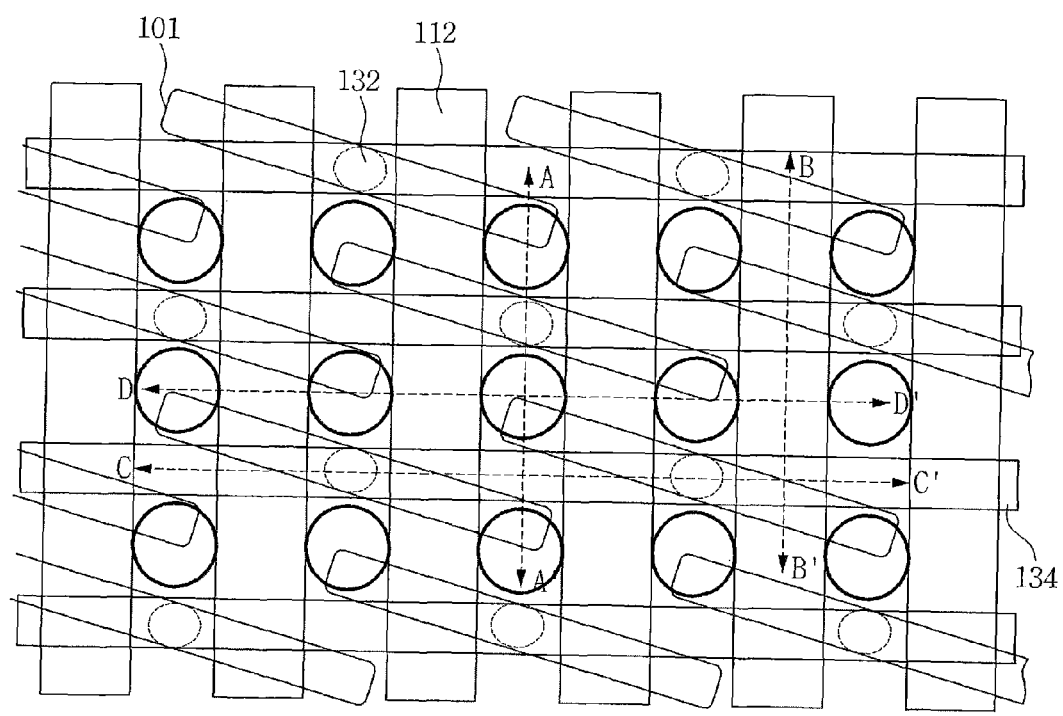
FIG. 18 illustrates a plan view showing cell regions of a semiconductor device formed by a process shown in FIG. 14.
Figure 19A:
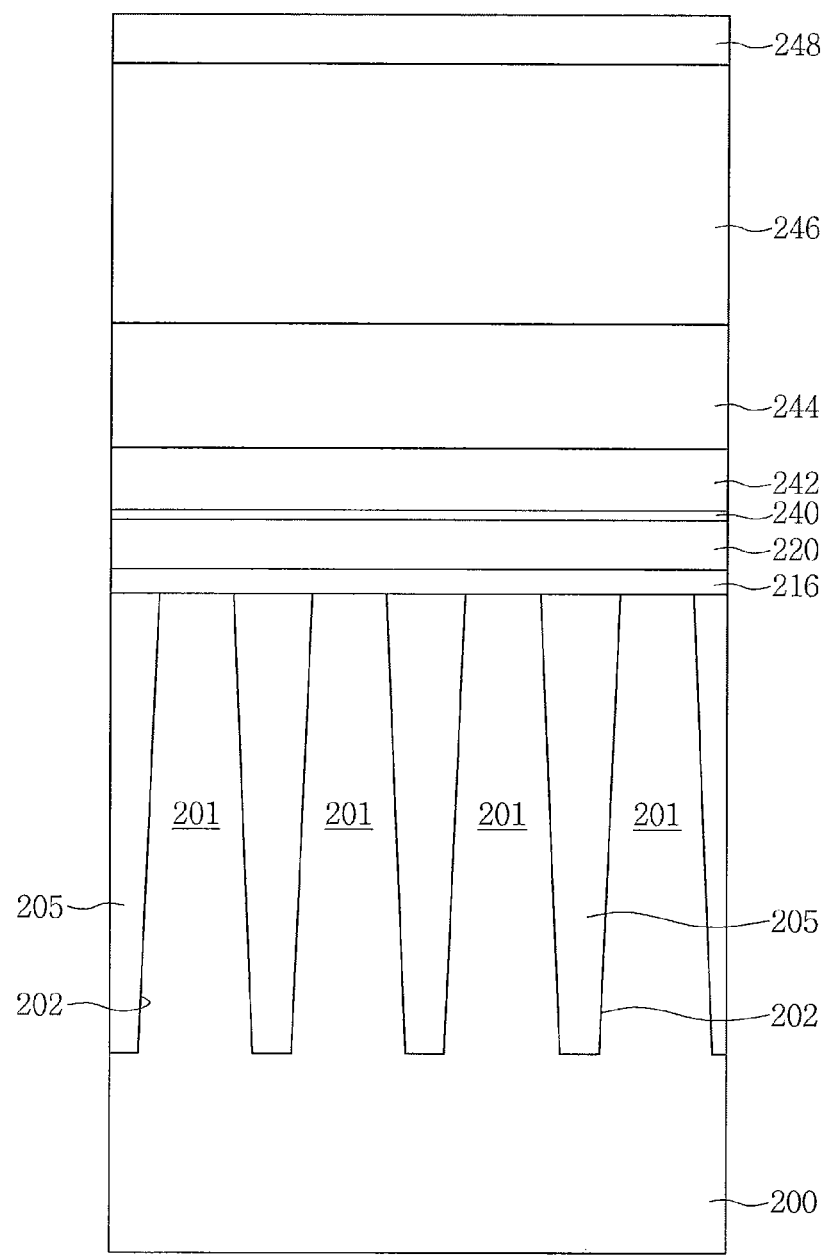
FIGS. 19A to 29E illustrate cross-sectional views of stages in a method of fabricating a semiconductor device in accordance with another embodiment.
Figure 19B:
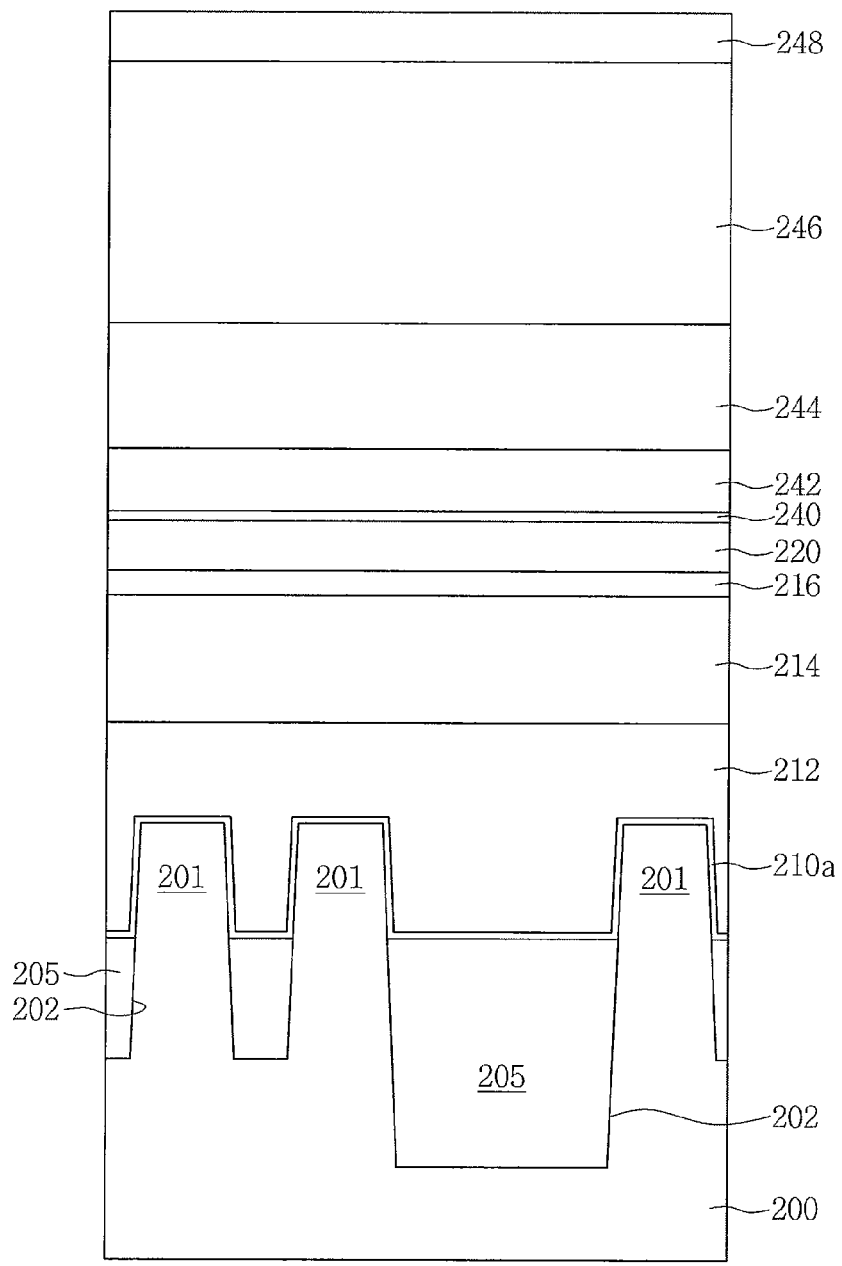
Figure 19C:
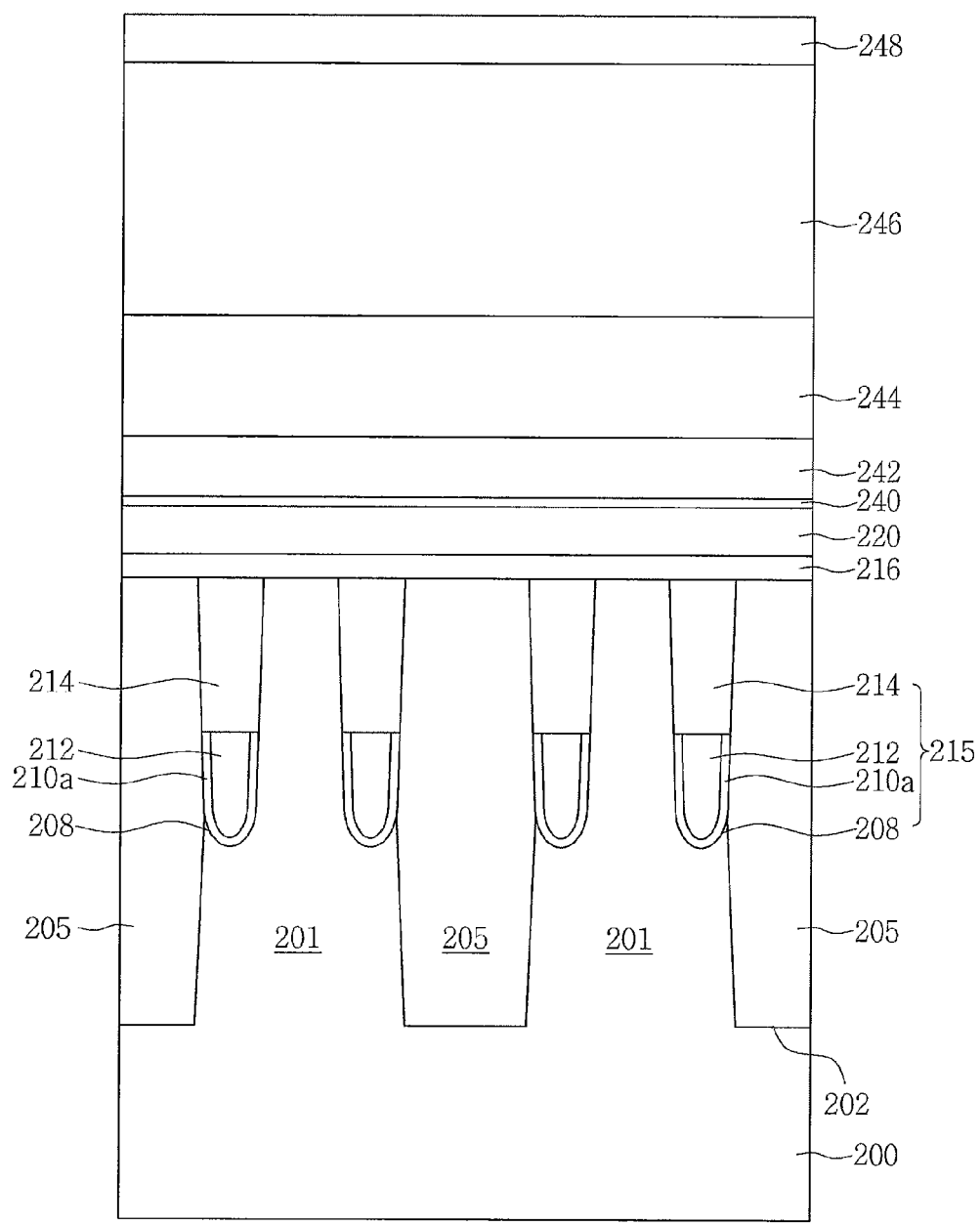
Figure 19D:
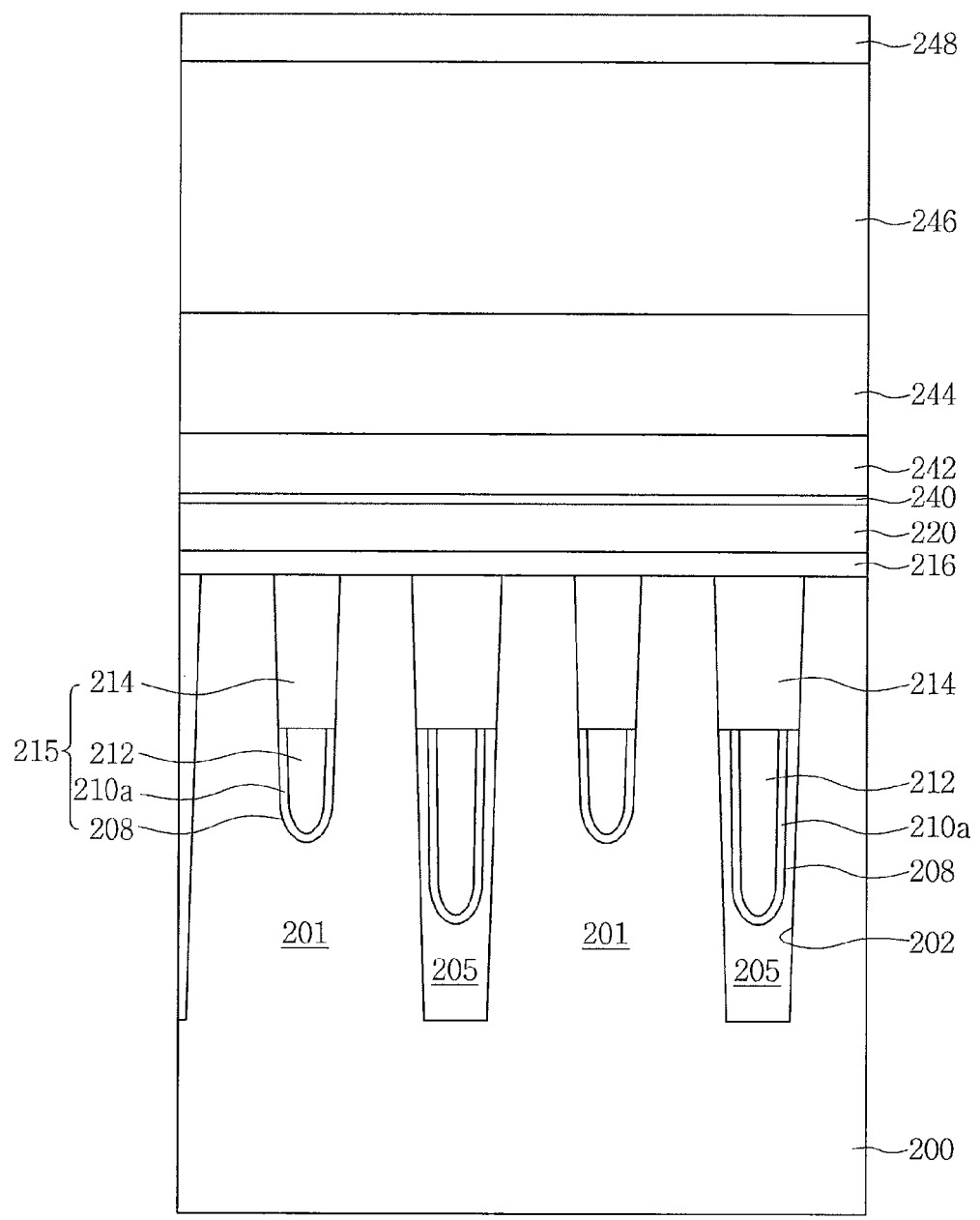
Figure 19E:
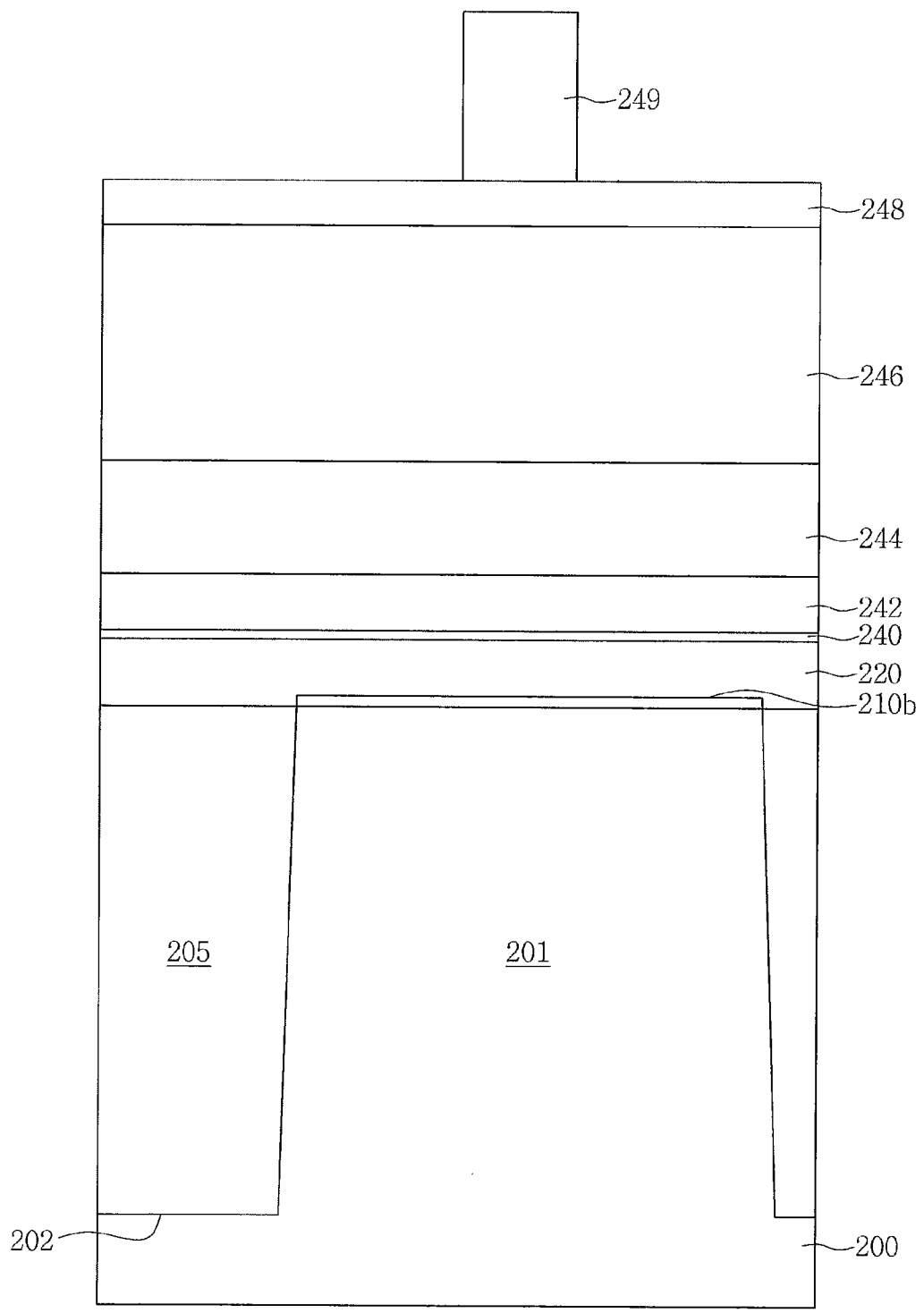
Figure 20A:
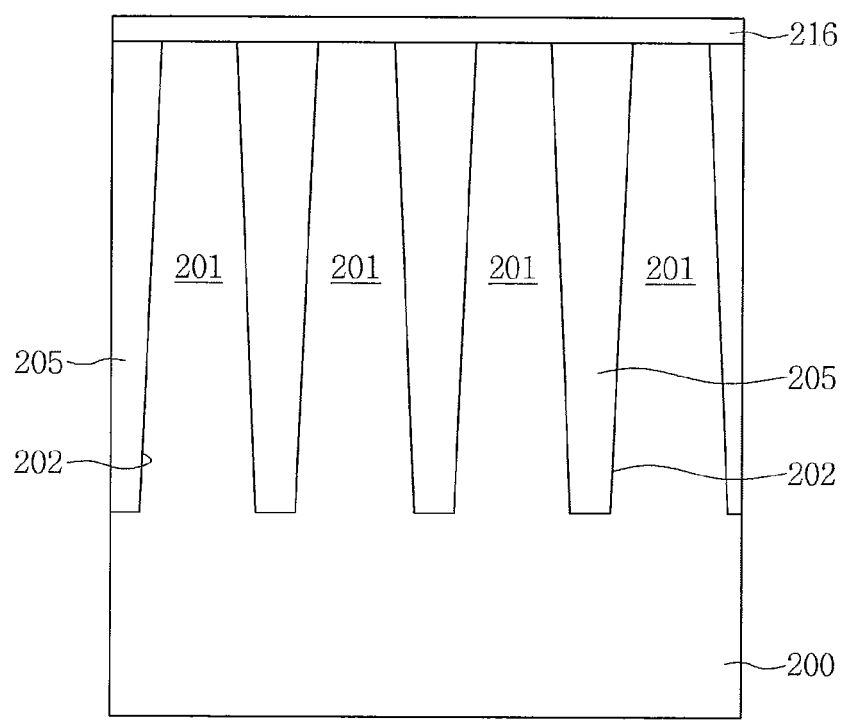
Figure 20B:
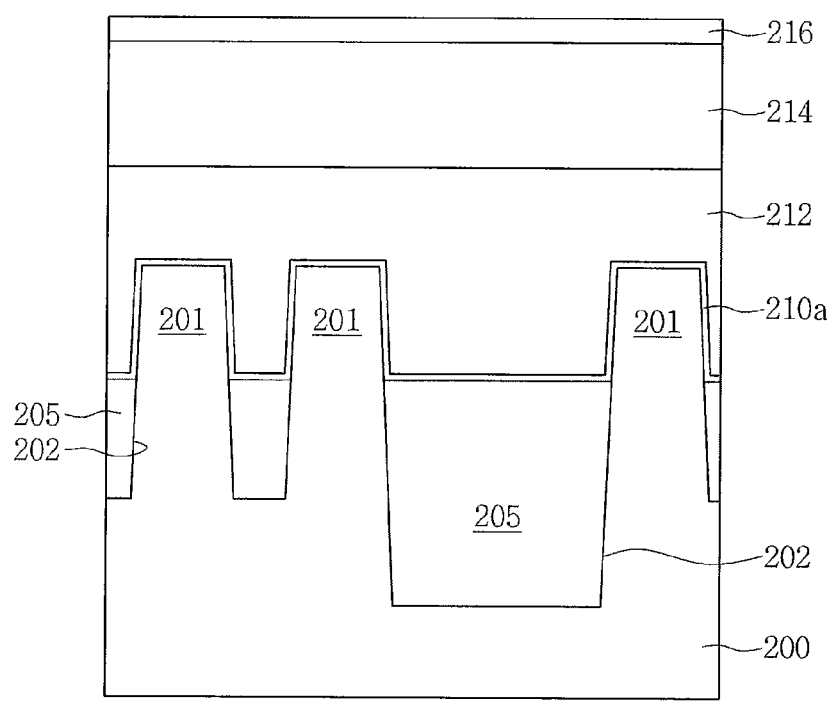
Figure 20C:
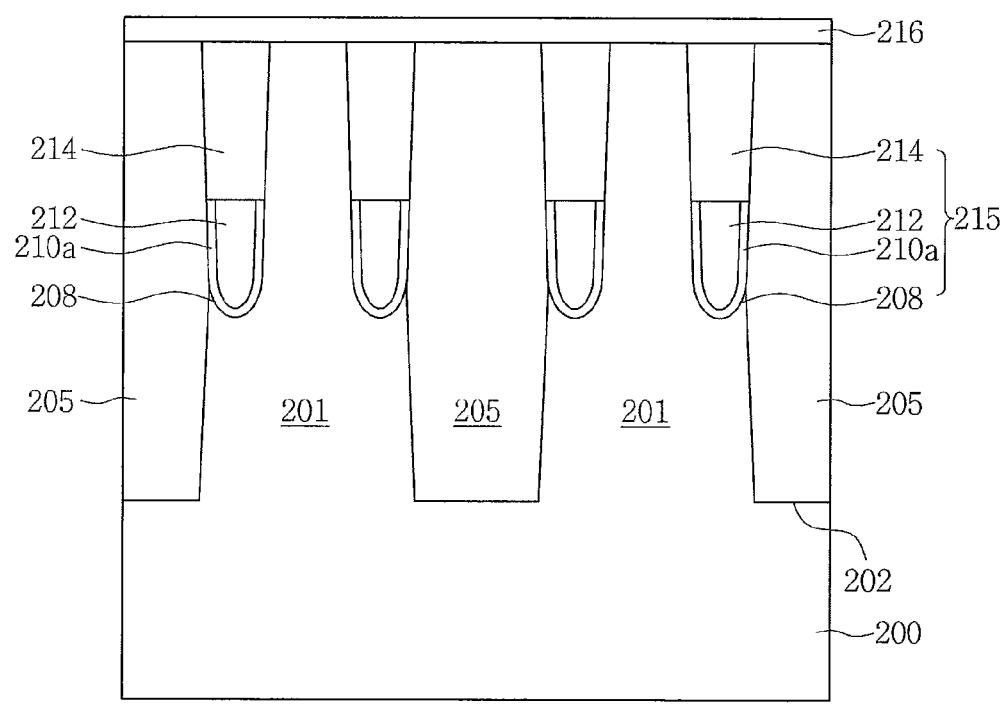
Figure 20D:
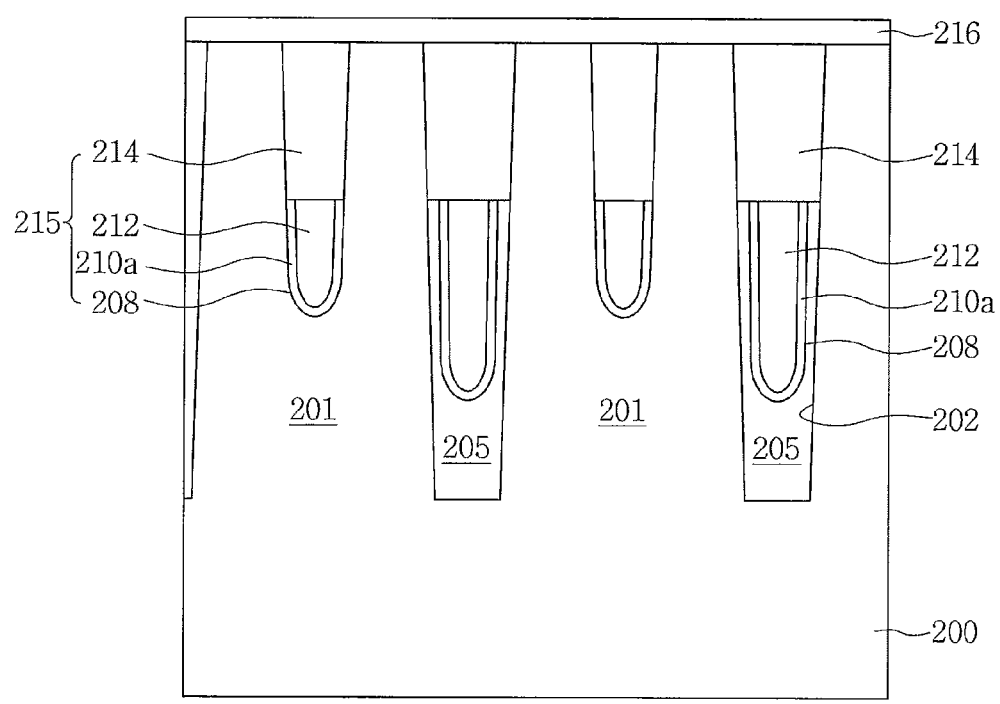
Figure 20E:
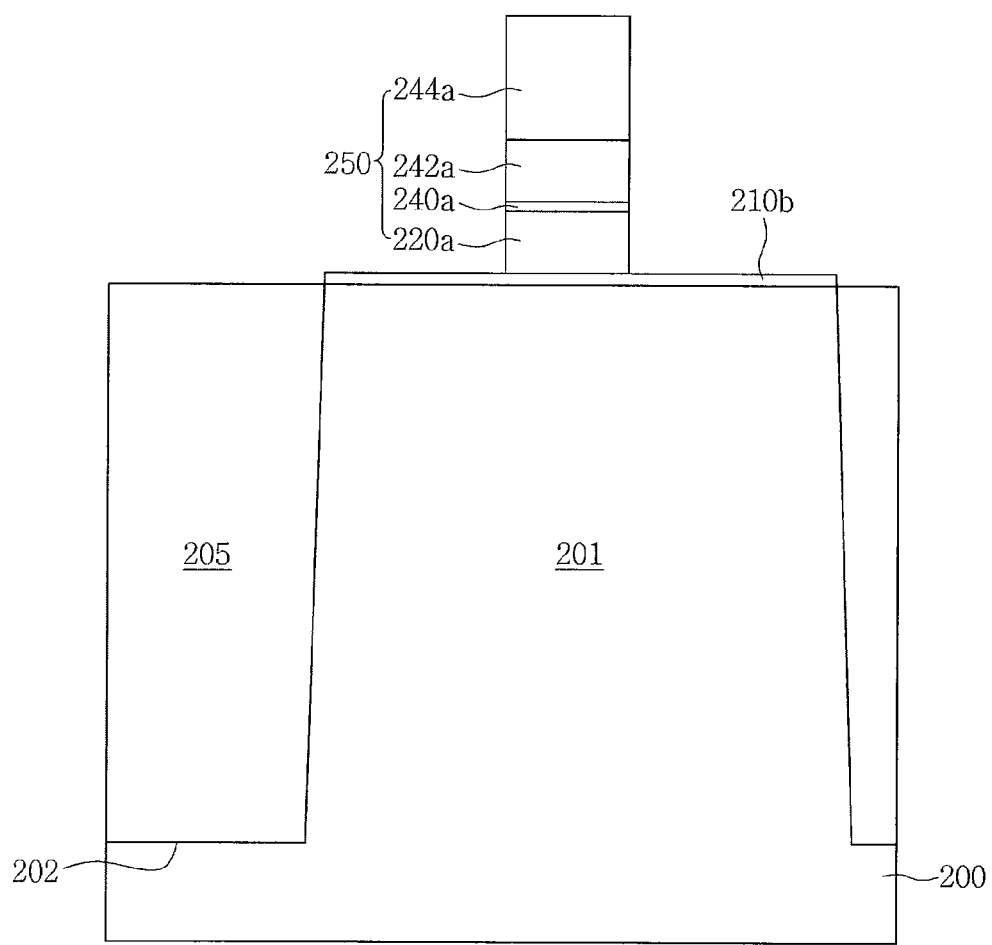
Figure 21A:
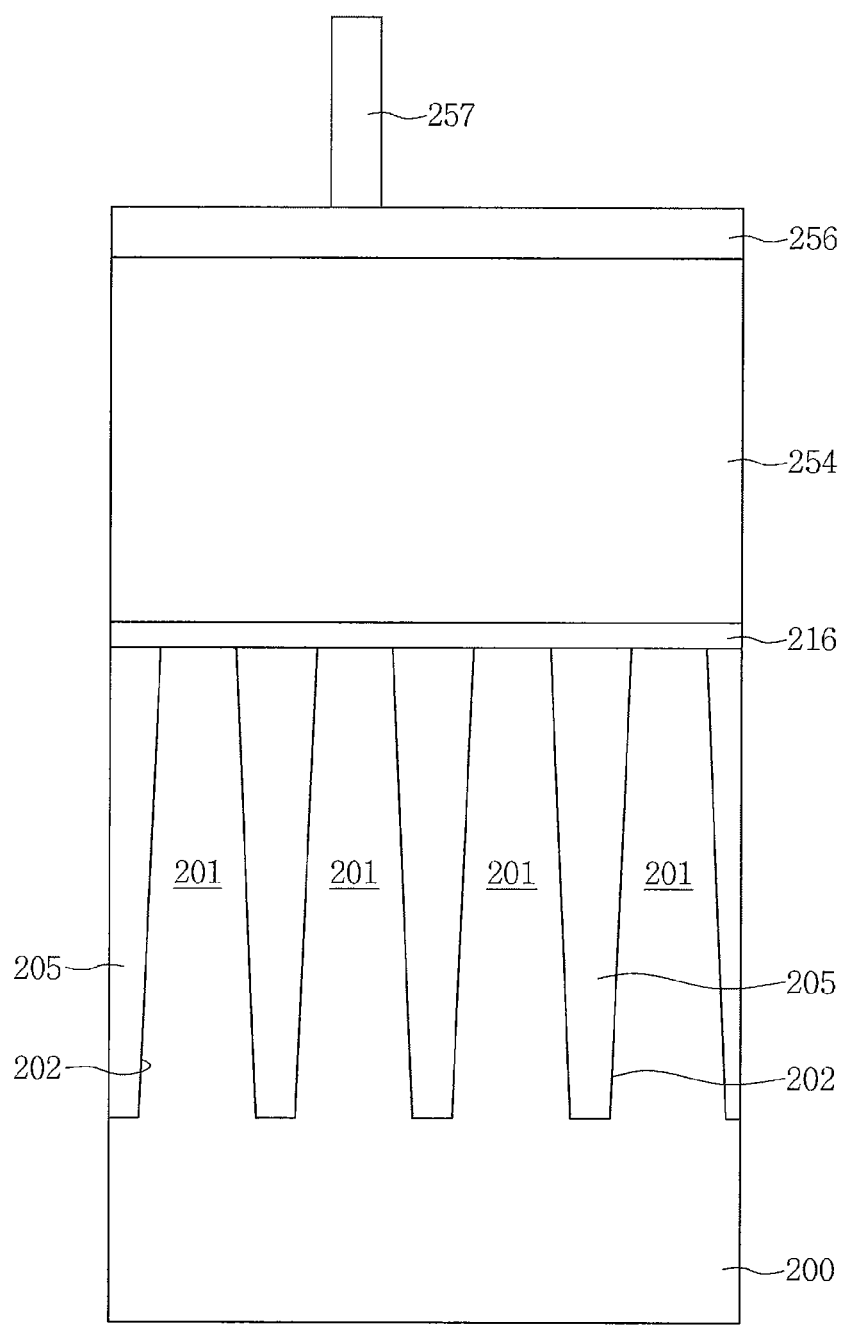
Figure 21B:
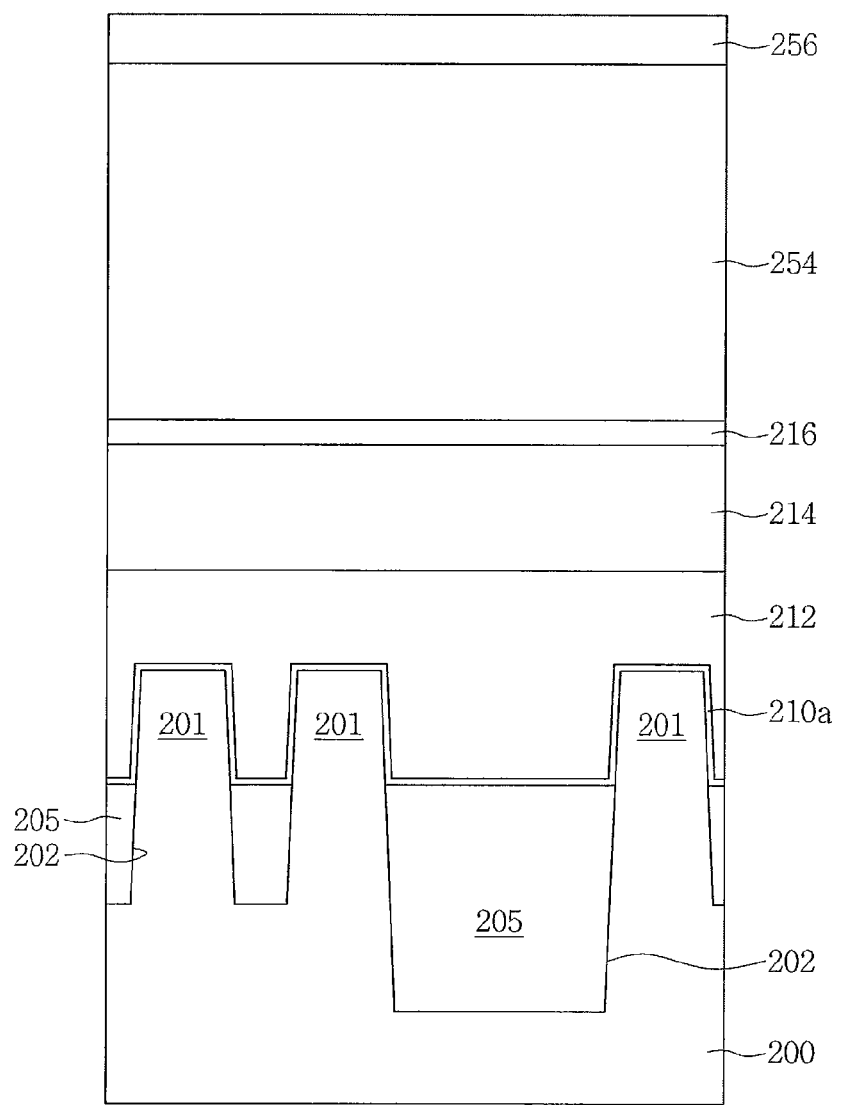
Figure 21C:
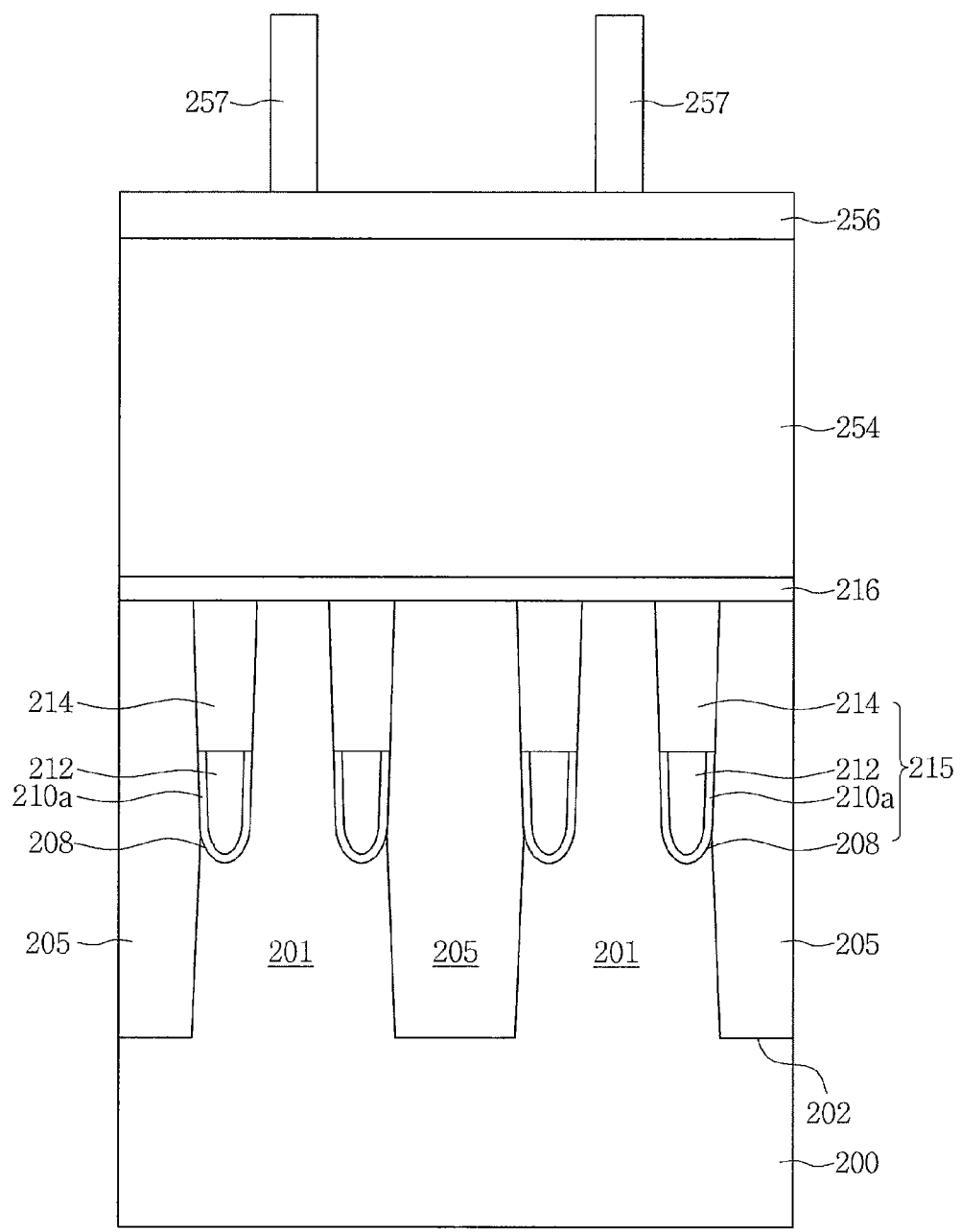
Figure 21D:
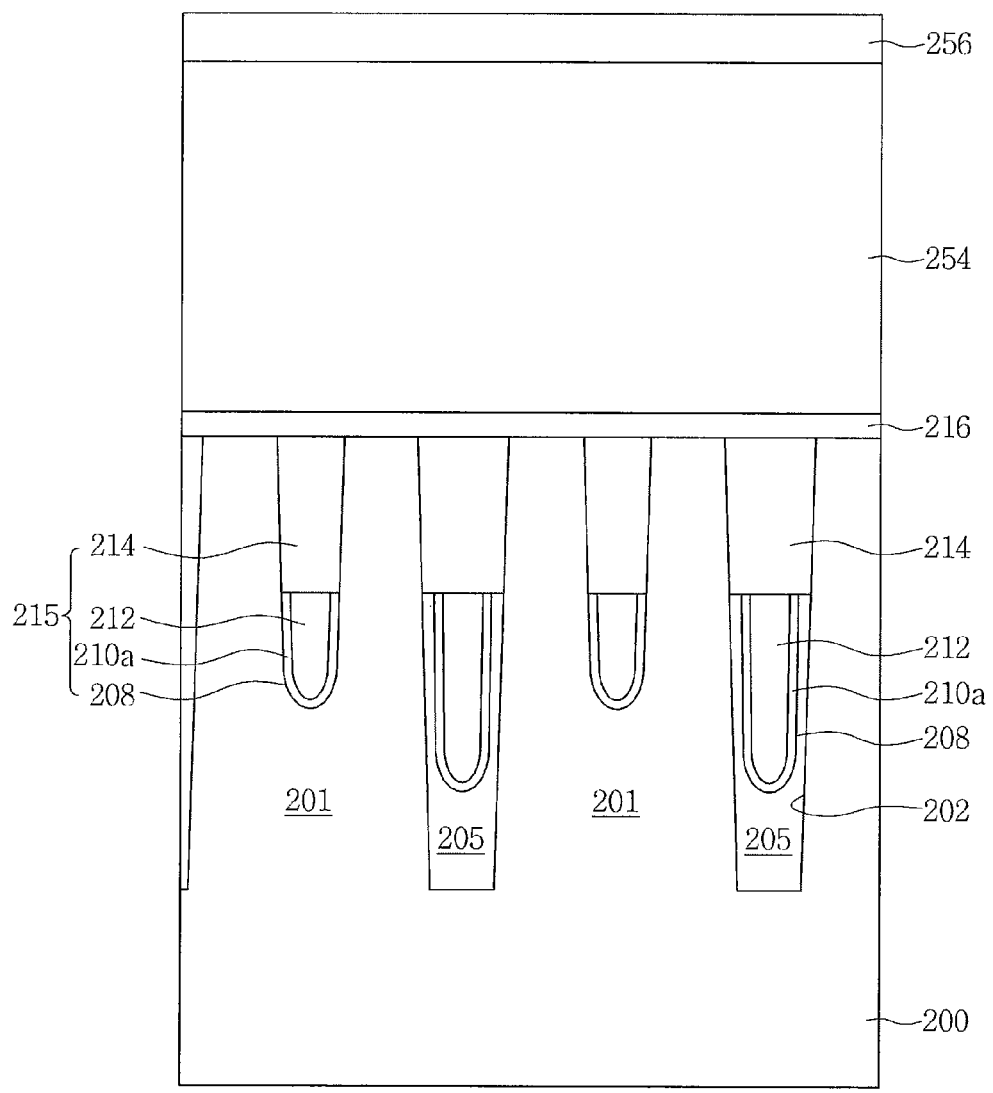
Figure 21E:
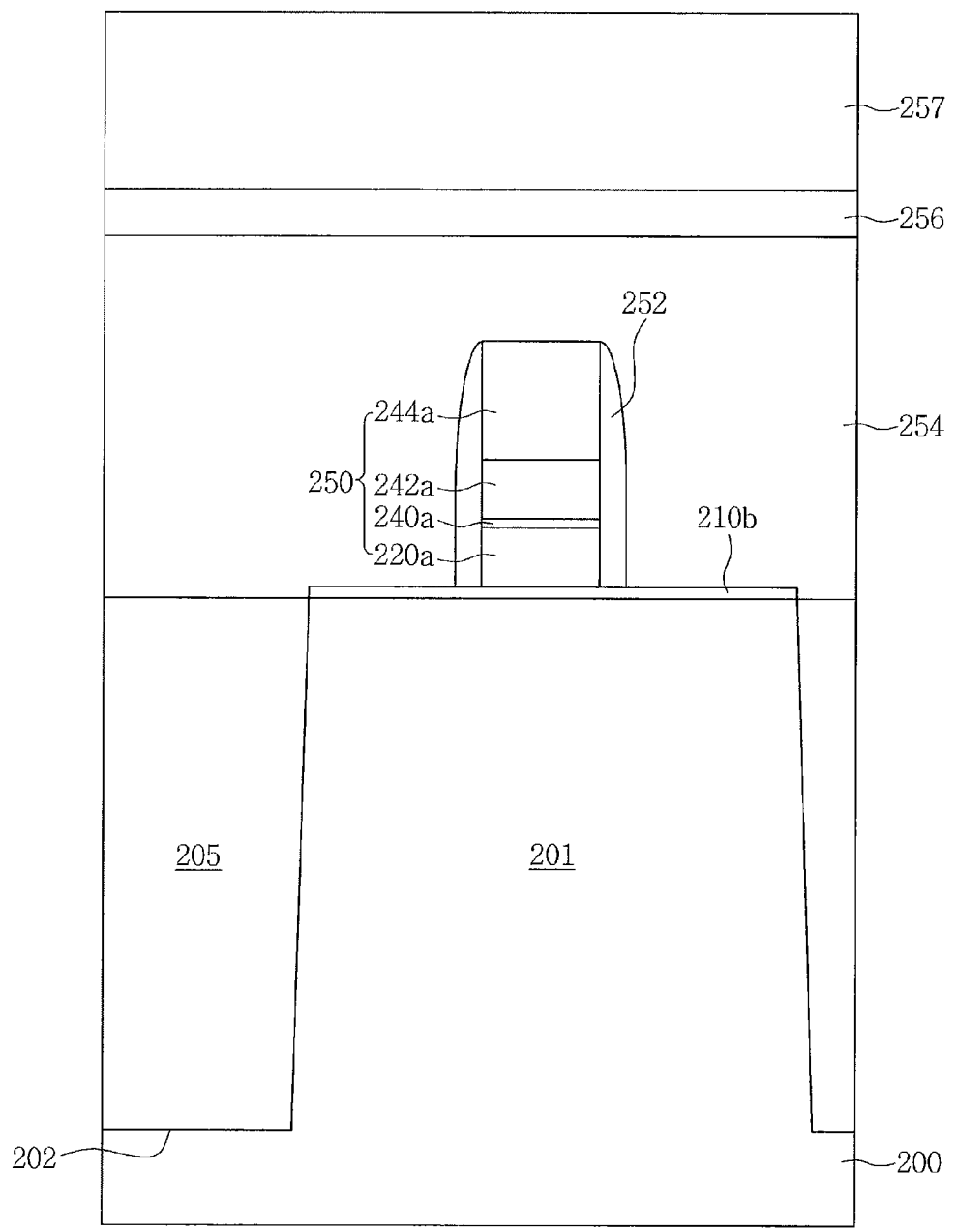
Figure 22A:
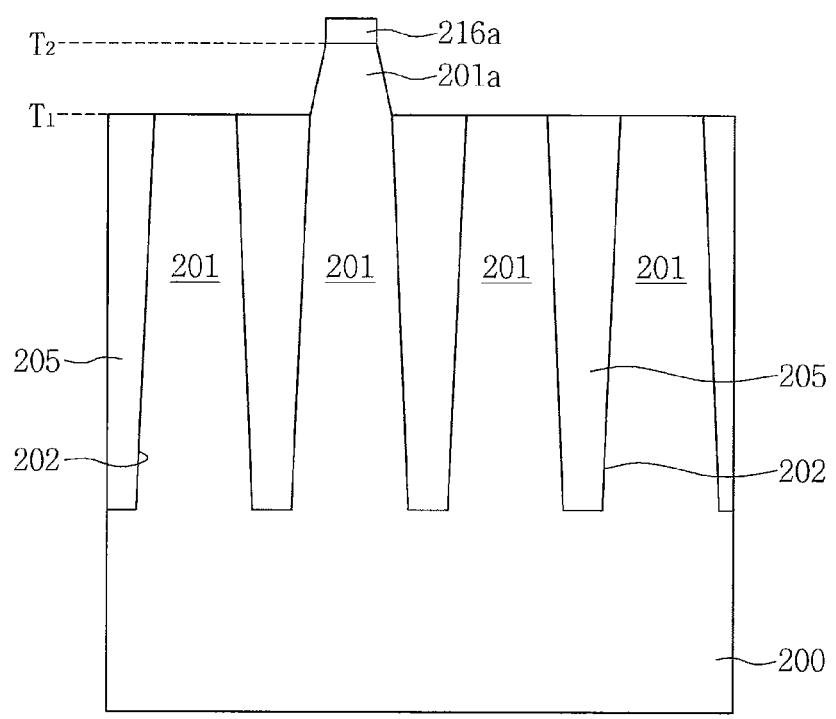
Figure 22B:
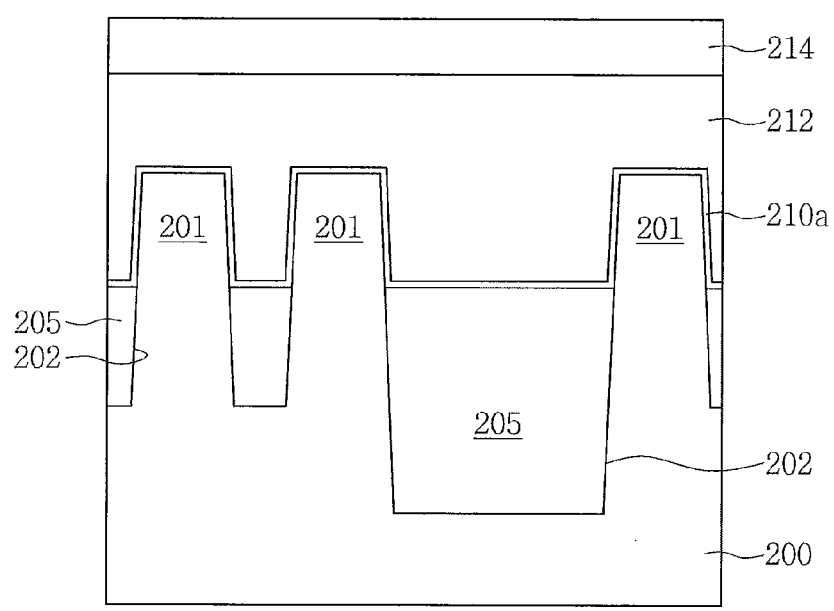
Figure 22C:
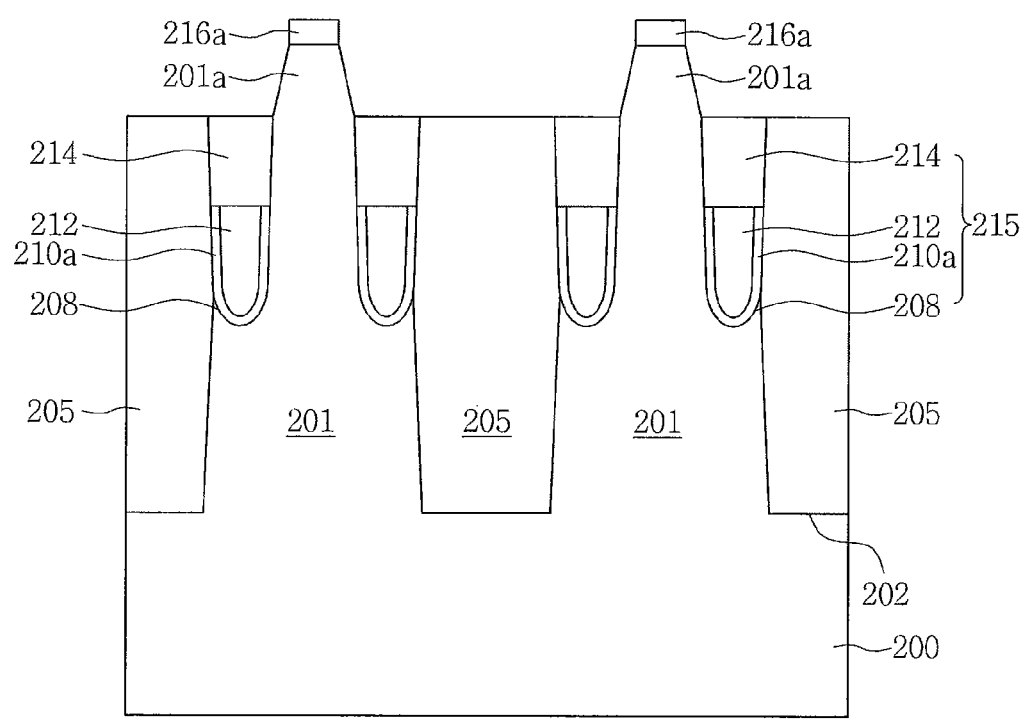
Figure 22D:
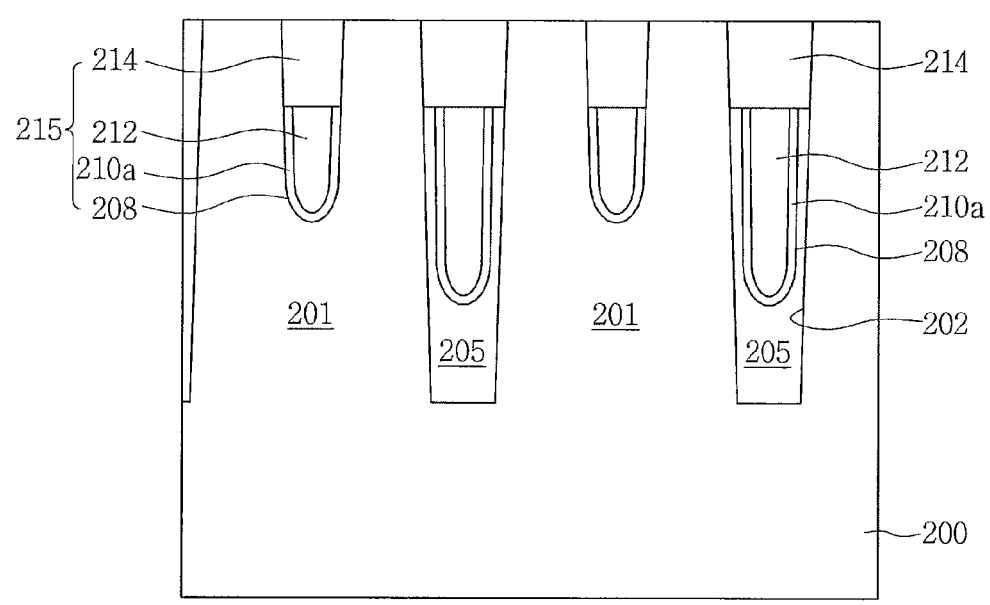
Figure 22E:
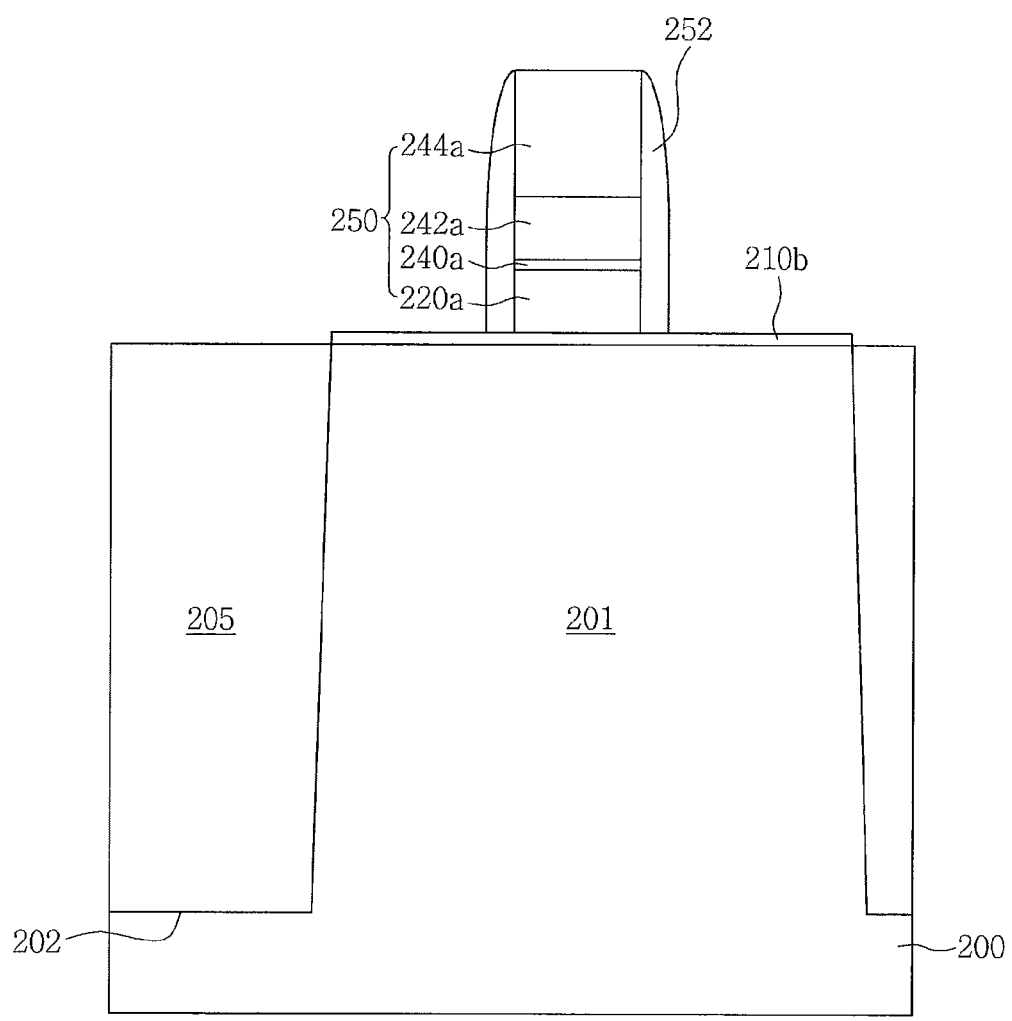
Figure 23A:
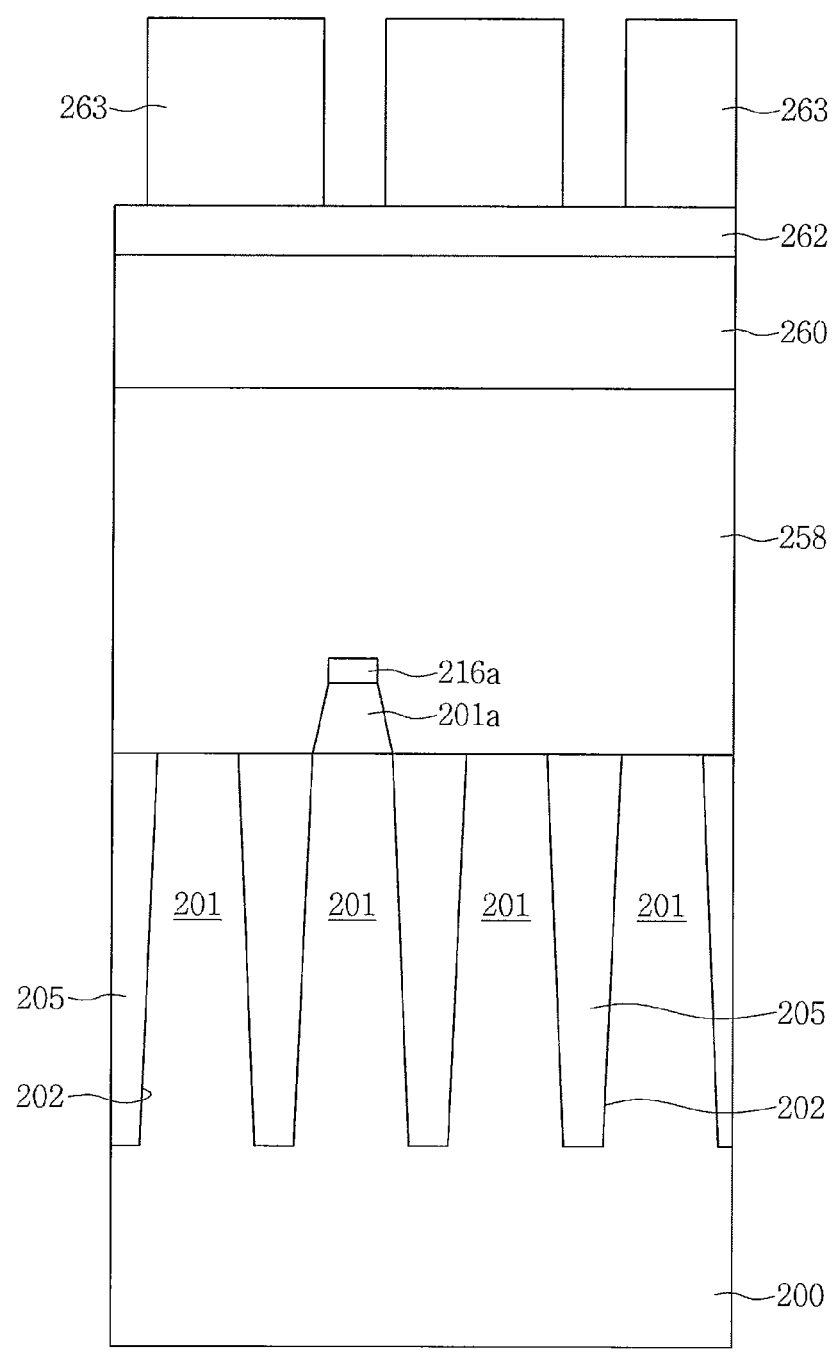
Figure 23B:
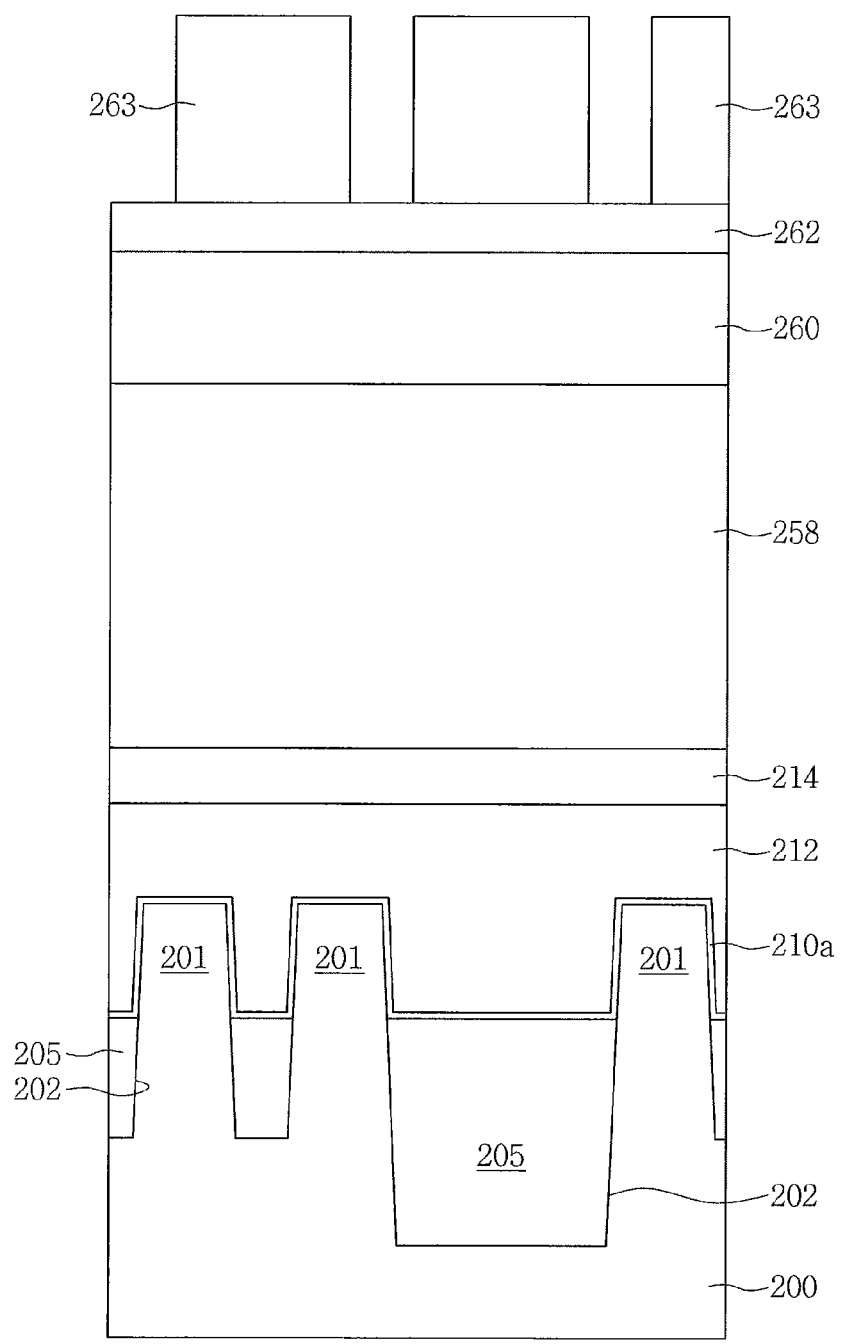
Figure 23C:
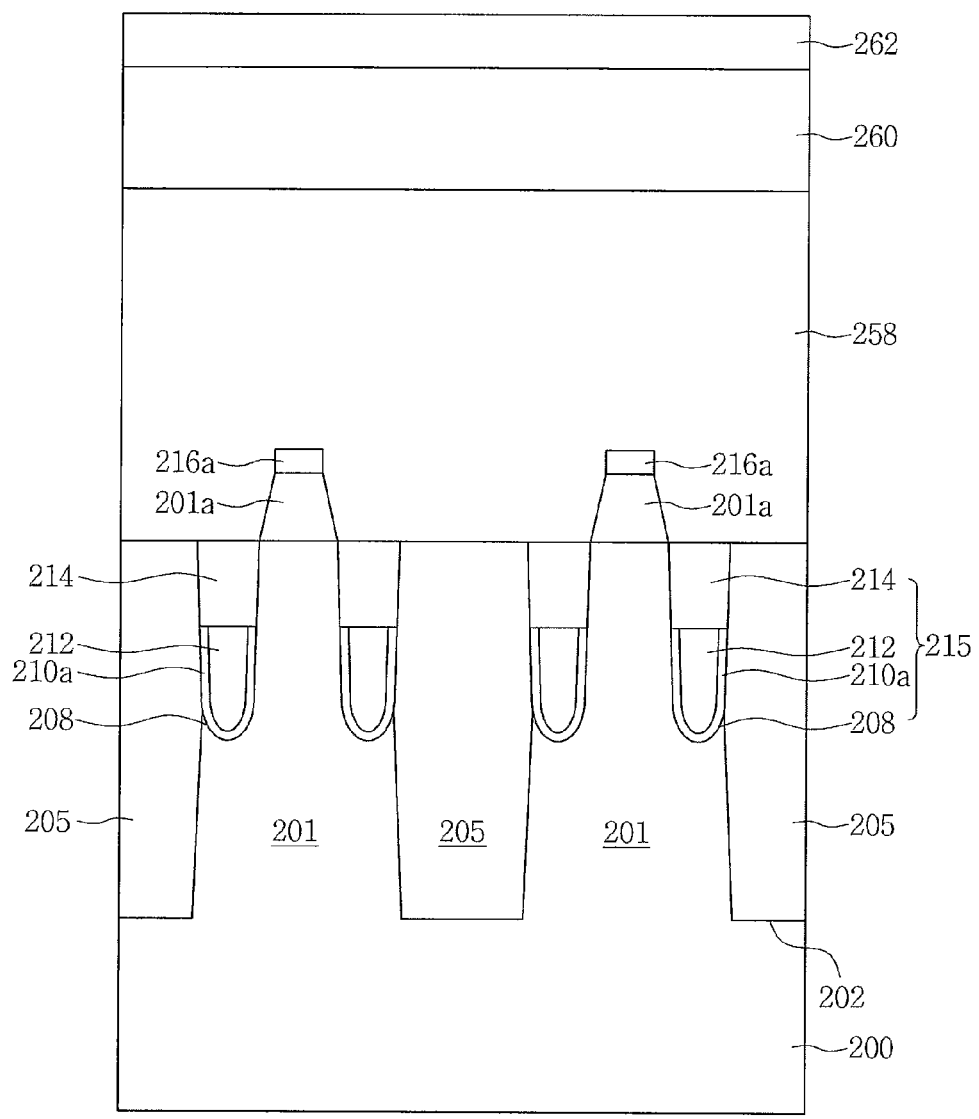
Figure 23D:
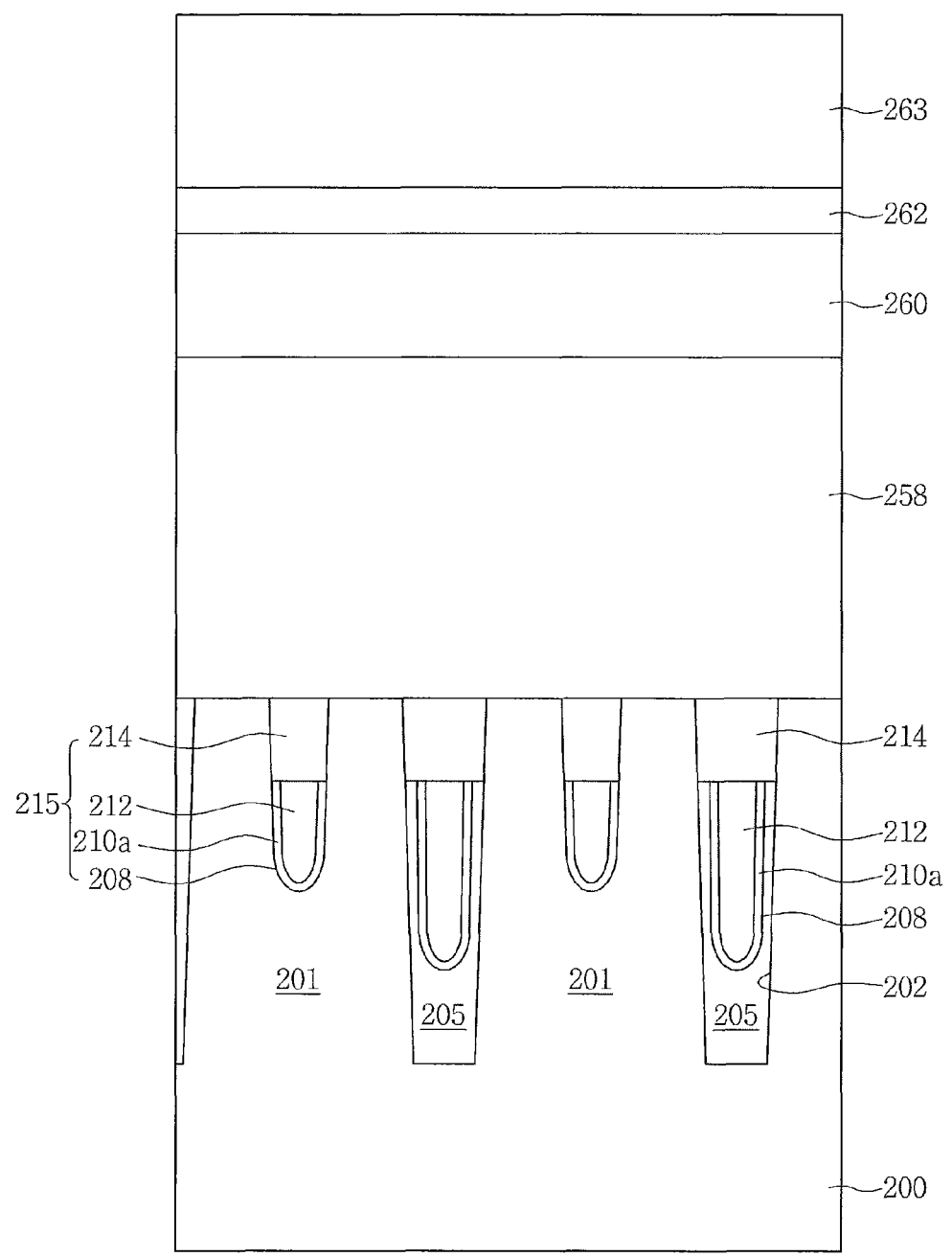
Figure 23E:
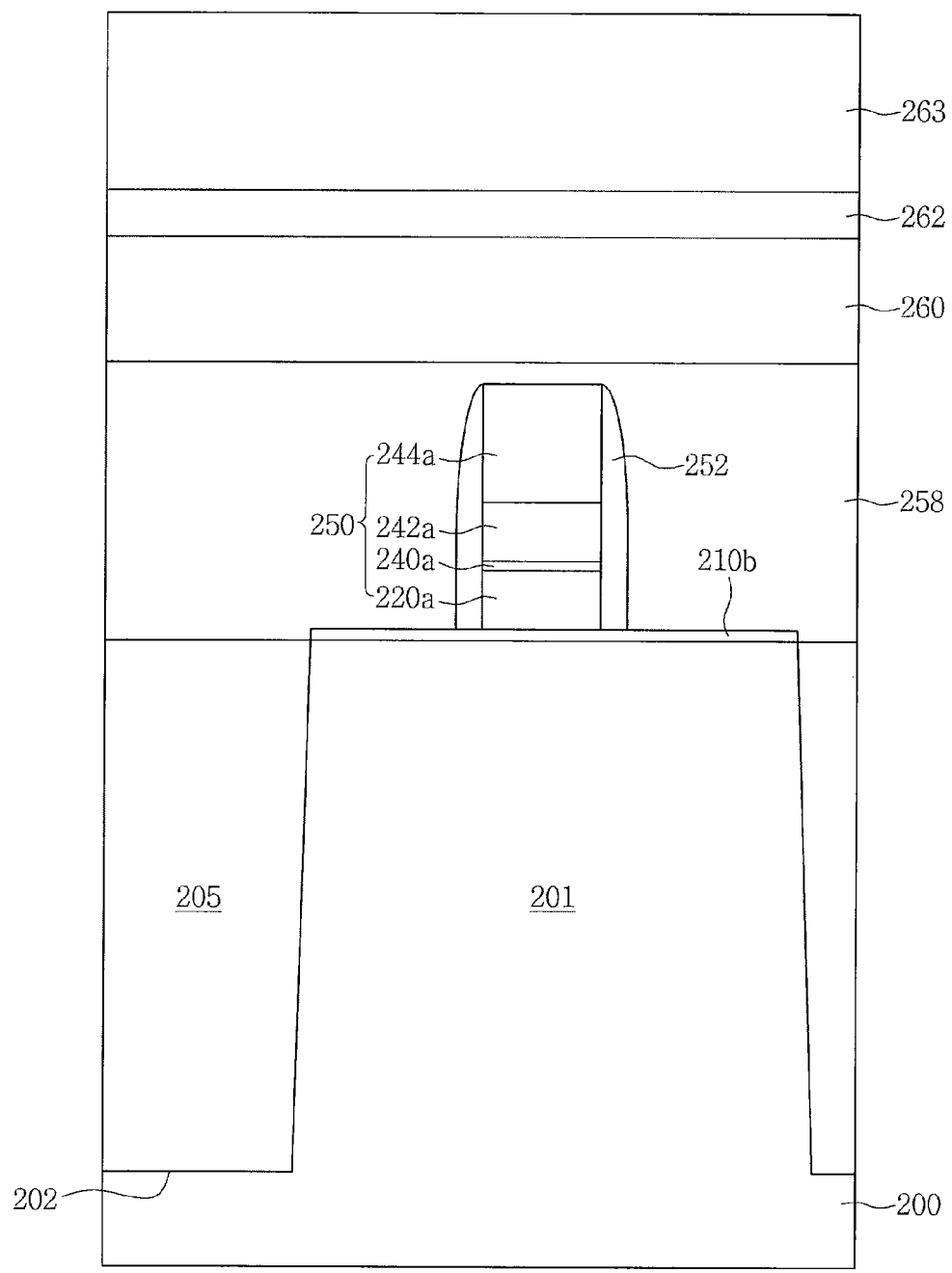
Figure 24A:
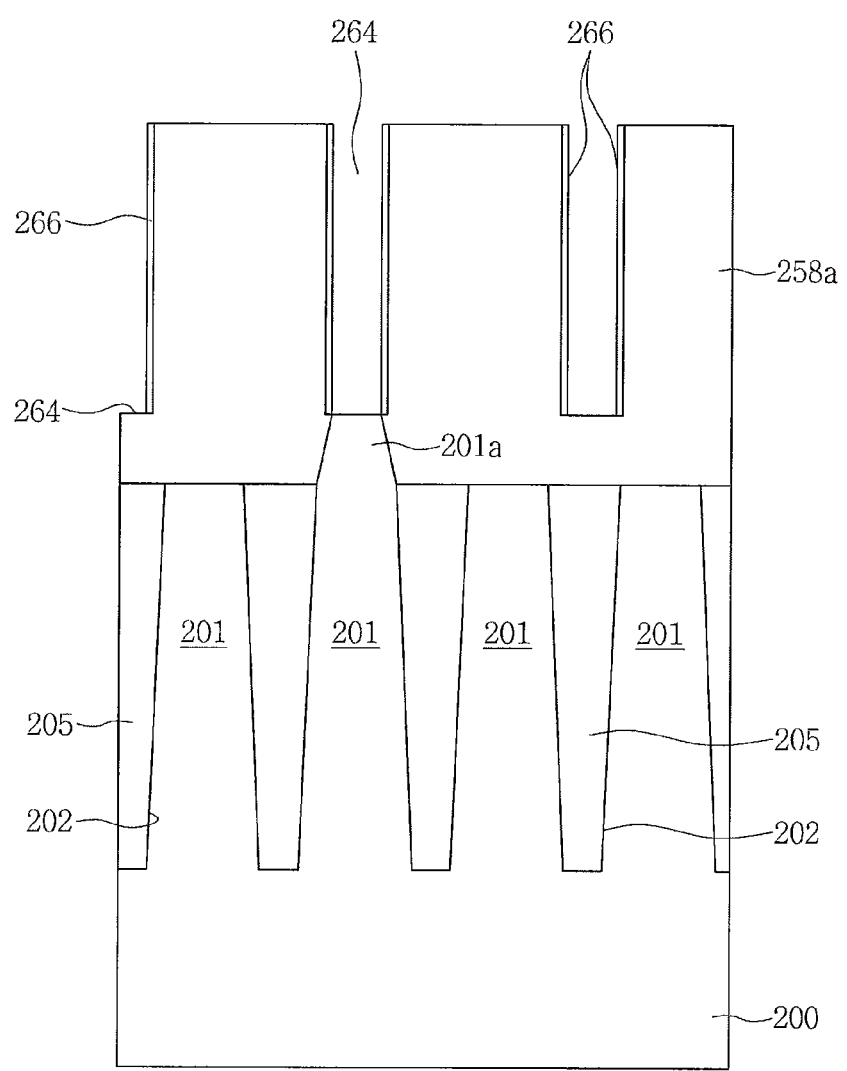
Figure 24B:
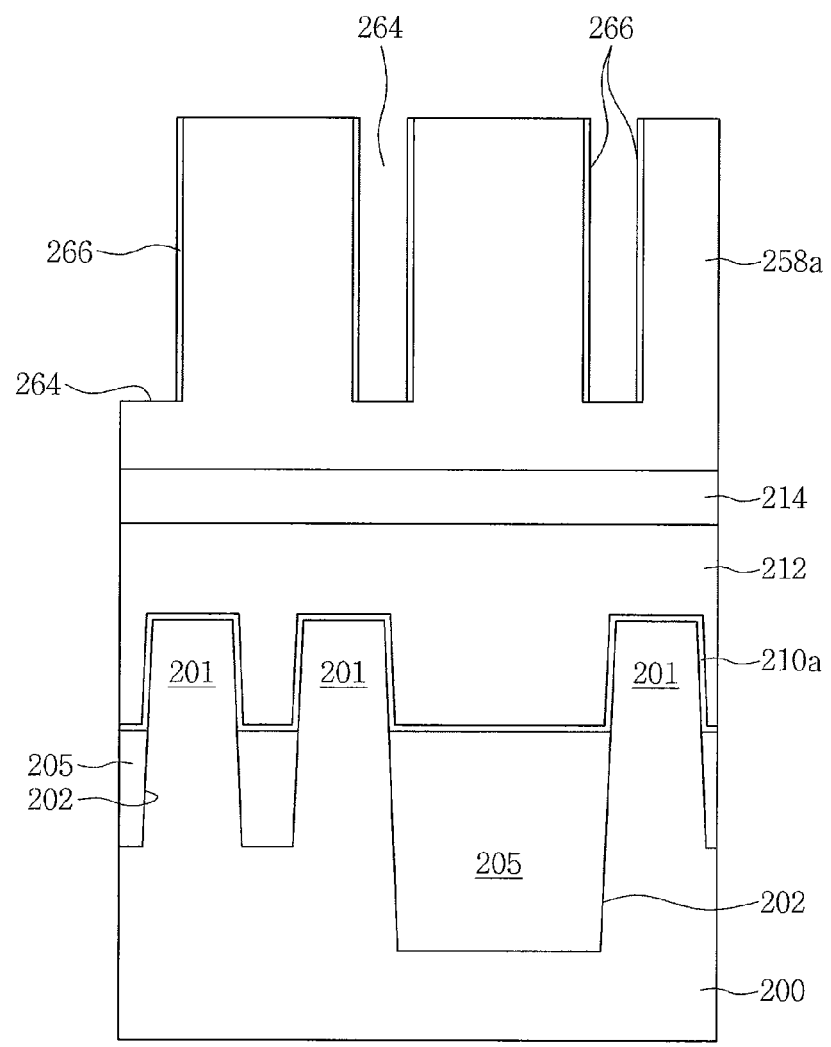
Figure 24C:
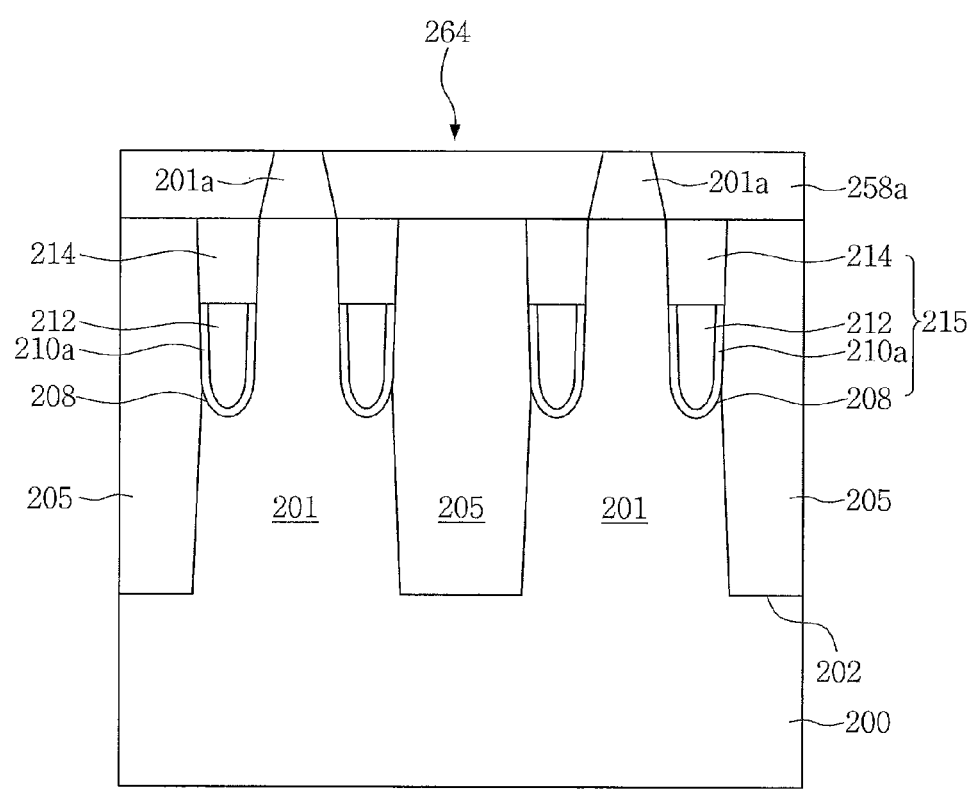
Figure 24D:
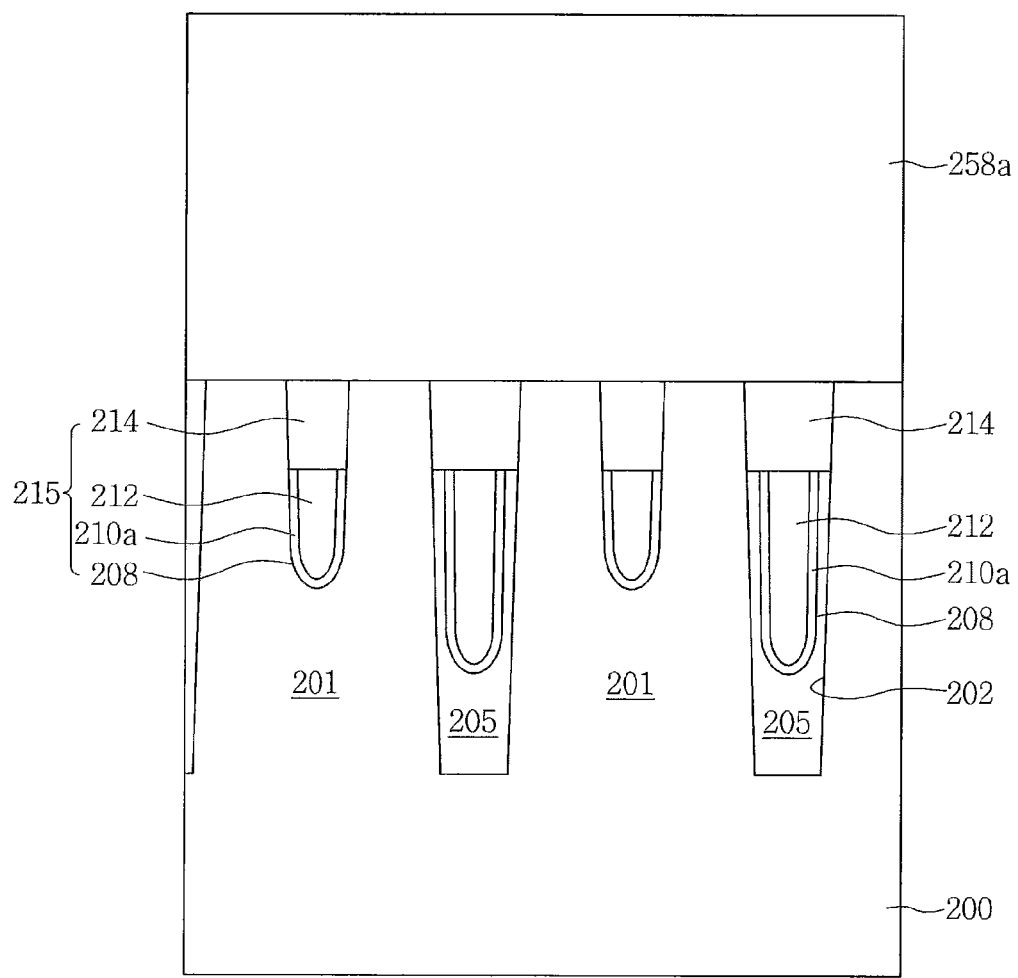
Figure 24E:
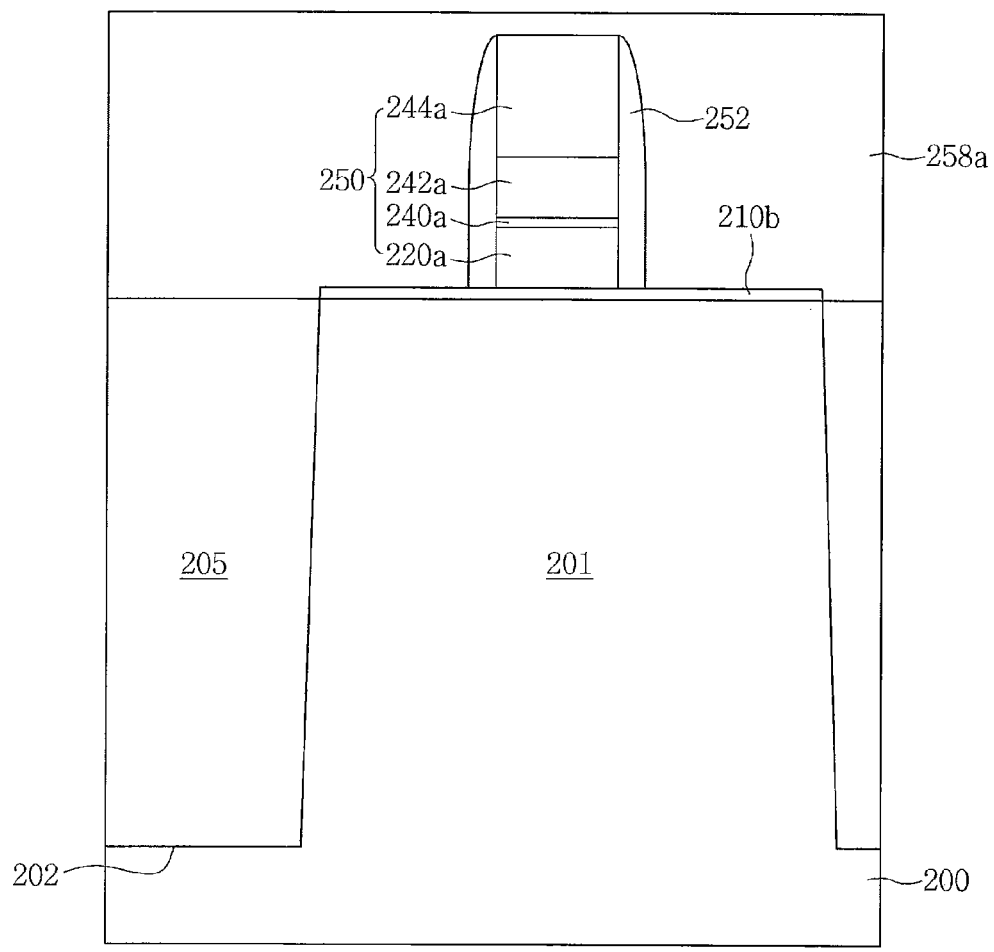

The second interlayer insulating layer 154, the insulating layer 136, and the first interlayer insulating layer pattern 126a, which are disposed under the fourth hard mask layer 156, may be sequentially etched using the remaining fourth hard mask layer 156 as an etching mask, thereby forming first contact openings 160 which define storage node plug formation regions. Storage contact regions 101b between the buried gates 112 and the field region 105 may be exposed by the first contact openings 160. According to some embodiments, the first contact opening 160 may be round as shown in FIG. 18.

Subsequently, the remaining fourth hard mask layer 156 may be removed.

Referring to FIGS. 15A, 15B, 15C, 15D, and 15E, a sacrificial layer 162 may be formed on an entire surface of the substrate 100 to fill the first contact openings 160. The sacrificial layer 162 may include a material having an etch selectivity with respect to the second interlayer insulating layer 154, for example, an amorphous carbon layer (ACL). A fifth anti-reflection layer 164 may be formed on the sacrificial layer 162. The fifth anti-reflection layer 164 may include silicon oxynitride (SiON).

A sixth photoresist pattern 165 may be formed on the fifth anti-reflection layer 164 to mask the cell regions of the substrate 100 and to define contact plug formation regions in the core/peripheral circuit region.

Referring to FIGS. 16A, 16B, 16C, 16D, and 16E, the fifth anti-reflection layer 164 and the sacrificial layer 162 in the core/peripheral circuit region may be sequentially etched using the sixth photoresist pattern 165 as an etching mask. While the sacrificial layer 162 is etched, the sixth photoresist pattern 165 having similar etching characteristics to the sacrificial layer 162 may be removed.

A second contact opening 166 which defines a contact plug formation region in the core/peripheral circuit region may be formed by etching the second interlayer insulating layer 154 disposed under the sacrificial layer 162 using the remaining sacrificial layer 162 as an etching mask. The substrate 100 in the cell regions is protected by the remaining sacrificial layer 162 while the etching process is performed to form the second contact opening 166, thereby preventing damage of the first contact openings 160 which expose the storage node contact regions 101b.

Subsequently, the first contact openings 160 in the cell regions may be exposed by removing the remaining sacrificial layer 162.

An insulating layer may be deposited on an entire surface of the substrate 100, and etched away to form contact spacers 168 on inner walls of the first contact openings 160 and the second contact opening 166. The contact spacers 168 may include a material having an etch selectivity with respect to the first interlayer insulating layer pattern 126a and the second interlayer insulating layer 154, for example, silicon nitride.

A third conductive layer 170 may be formed on an entire surface of the substrate 100 having the contact spacers 168 to fill the first and second contact openings 160 and 168. The third conductive layer 170 may include a metal such as tungsten, aluminum, copper, etc.

Referring to FIGS. 17A, 17B, 17C, 17D, and 17E, the third conductive layer 170 may be removed to an upper surface of the second interlayer insulating layer 154 by performing an etch-back process on the third conductive layer 170. Then, storage node contact plugs 170a of the cell regions may be formed in the first contact openings to be connected to the storage node contact regions 101b, and simultaneously, a contact plug 170b of the core/peripheral circuit region may be formed in the second contact opening 166. According to the embodiments, since the first contact opening 160 may be round and the storage node contact plug 170a may have a substantially cylindrical shape FIGS. 19A to 29E illustrate cross-sectional views of stages in a method of fabricating a semiconductor device in accordance with another embodiment. Here, FIGS. A, B, C, and D illustrate cross-sectional views showing cell regions of the semiconductor device taken along lines A-A', B-B', C-C', and D-D', respectively, and each FIG. E illustrates a cross-sectional view showing a core/peripheral circuit region of the semiconductor device.

Referring to FIGS. 19A to 19E, a substrate 200 in which the cell regions and the core/peripheral circuit region are defined may be prepared.

The substrate 200 may include a semiconductor substrate. For example, the substrate 200 may include a silicon substrate, a germanium substrate, or a silicon-germanium substrate.

Field region 205 which defines active regions 201 may be formed by performing a device isolation process on the substrate 200. The field region 205 may be formed by an STI process. For example, the substrate 200 may be partially etched to form field trench 202, and the field region 205 may be formed by filling the field trench 202 with a field insulating layer. The field insulating layer may include a single layer of silicon oxide, or a complex layer of silicon oxide and silicon nitride according to the size of the field trenches 202.

A buried gate formation process may be performed on cell regions of the substrate 200 in which the field region 205 are formed.

First, the active regions 201 and the field region 205 in the cell regions may be partially etched to form gate trenches 208. The gate trenches 208 may be formed to cross the active regions 201 and extend to the field region 205. The gate trenches 208 may be formed to have different depths from each other in the active regions 201 and the field region 205 by a difference in etch rates. For example, the gate trenches 208 in the field region 205 may be formed to be deeper than the gate trenches 208 in the active regions 201.

Subsequently, a first gate insulating layer 210a may be conformally formed on inner walls of the gate trenches 208 by a thermal oxidation process or a deposition process. At the same time, a second gate insulating layer 210b may be formed on substrate 200 in the core/peripheral circuit region. The first and second gate insulating layers 210a and 210b may include silicon oxide.

A gate conductive layer may be deposited on the substrate 200 to fill the gate trenches 208, and etched back to form buried gates 212 in lower portions of the gate trenches 208. The bottom of the buried gate 212 in the field region 205 may be located at a lower level than that in the active region 201. The upper surfaces of the buried gates 212 may be located at substantially the same or similar levels in the active regions 201 and field region 205. The buried gates 212 may include polysilicon or a metal such as tungsten, aluminum, copper, etc. When the buried gates 212 are formed of a metal, a barrier metal layer formed of titanium, titanium nitride, tantalum, tantalum nitride or the like may be formed in regions between the buried gates 212 and the first gate insulating layer 210a.

An insulating material, for example, a gate capping layer 214 including silicon nitride, may be formed on the buried gates 212 to fill upper portions of the gate trenches 208, and the gate capping layer 214 may be removed to an upper surface of the substrate 200 by a planarization process. First gate structures 215 including the first gate insulating layer 210a, the buried gates 212, and the gate capping layer 214 may be formed in the substrate 200 in the cell regions by the above processes.

After the first gate structures 215 are formed, a source/drain ion implantation process is performed on the substrates 200 located at both sides of the buried gates 212, thereby forming buried cell array transistors. The source/drain ion implantation process may be performed before the first gate structures 215 are formed.

Subsequently, an etch stop layer 216 may be formed on an entire surface of the substrate 200. The etch stop layer 216 may include a material having an etch selectivity with respect to the substrate 200 and a first interlayer insulating layer which may be formed by a subsequent damascene process. For example, the etch stop layer 216 may be formed in a single layer of silicon nitride, or a complex layer of silicon oxide and silicon nitride.

A first conductive layer 220 may be formed on the etch stop layer 216 to have a thickness of about 350 Å. The first conductive layer 220 may be provided as a gate in the core/peripheral circuit region and, for example, include polysilicon.

A barrier metal layer 240, a second conductive layer 242, and a gate mask layer 244 may be sequentially stacked on an entire surface of the substrate 200. The barrier metal layer 240 may include titanium, titanium nitride, tantalum, or tantalum nitride. The second conductive layer 242 may include a metal such as tungsten, aluminum, copper, etc. The gate mask layer 244 may include silicon nitride.

A first hard mask layer 246 and a first anti-reflection layer 248 may be sequentially formed on the gate mask layer 244. The first hard mask layer 246 may be formed by spin-coating a material having an etch selectivity with respect to the gate mask layer 244, for example, a carbon-containing compound such as the material of an SOH. The first anti-reflection layer 248 may absorb light reflected from a surface of the substrate 200, or offset the light by an interference effect to improve a profile of a photoresist pattern when an exposing process is performed to form the photoresist pattern. The first anti-reflection layer 248 may include an inorganic substance or an organic polymer such as silicon oxynitride (SiON).

A first photoresist pattern 249 may be formed on the first anti-reflection layer 248 to open the cell regions of the substrate 200 and to define a gate forming region in the core/peripheral circuit region.

Referring to FIGS. 20A to 20E, the first anti-reflection layer 248 and the first hard mask layer 246 may be sequentially etched using the first photoresist pattern 249 as an etching mask. While the first hard mask layer 246 is etched, the first photoresist pattern 249 having similar etching characteristics to the first hard mask layer 246 may be removed.

A gate mask layer pattern 244a may be formed by etching the gate mask layer 244 disposed under the first hard mask layer 246 using the remaining first hard mask layer 246 as an etching mask. The second conductive layer 242, the barrier metal layer 240 and the first conductive layer 220 may be sequentially etched using the gate mask layer pattern 244a as an etching mask. Then, a second gate structure 250 including a gate mask layer pattern 244a, a second conductive layer pattern 242a, a barrier metal layer pattern 240a, a first conductive layer pattern 220a and a second gate insulating layer 210b may be formed on the substrate 200 in the core/peripheral circuit region. All of the gate mask layer 244, the second conductive layer 242, the barrier metal layer 240 and the first conductive layer 220 in the cell regions may be removed by a plurality of etching processes which form the second gate structure 250.

Subsequently, the remaining first hard mask layer 246 may be removed.

Referring to FIGS. 21A to 21E, a spacer insulating layer may be deposited on the substrate 200, and etched back to form gate spacers 252 on both sidewalls of the second gate structure 250. The gate spacers 252 may be formed in a single layer of silicon nitride, or a double layer of silicon nitride and silicon oxide.

A second hard mask layer 254 may be formed on an entire surface of the substrate 200. The second hard mask layer 254 may include a material having an etch selectivity with respect to the etch stop layer 216, for example, a carbon-containing compound such as the material of an SOH. A second anti-reflection layer 256 may be formed on the second hard mask layer 254. The second anti-reflection layer 256 may include silicon oxynitride (SiON).

A second photoresist pattern 257 may be formed on the second anti-reflection layer 256 to mask the core/peripheral circuit region of the substrate 200 and to define bit line contact regions in the cell regions. The second photoresist pattern 257 may be formed to define a region between the buried gate 212 and the buried gate 212 in one active region 201.

Referring to FIGS. 22A to 22E, the second anti-reflection layer 256 and the second hard mask layer 254 may be sequentially etched using the second photoresist pattern 257 as an etching mask. While the second hard mask layer 254 is etched, the second photoresist pattern 257 having similar etching characteristics to the second hard mask layer 254 may be removed.

An etch stop layer pattern 216a may be formed by etching the etch stop layer 216 using the remaining second hard mask layer 254 as an etching mask. The substrate 200 in the cell regions may be etched using the etch stop layer pattern 216a as an etching mask. That is, the active regions 201 and field region 205 in the cell regions may be partially recessed by the etching process, to thereby form each bit line contact region 201a formed as a pillar in the corresponding active region 201 between the buried gate 212 and the buried gate 212. An upper surface $T_2$ of the pillar-shaped bit line contact region 201a may be located at a higher level than an upper surface $T_1$ of the field region 205.

Subsequently, the remaining second hard mask layer 254 may be removed.

Referring to FIGS. 23A to 23E, a first interlayer insulating layer 258 may be formed on an entire surface of the substrate 200 having the pillar-shaped bit line contact regions 201a. As the first interlayer insulating layer 258 may be a layer to prepare a pattern shape in which a damascene process is performed, the first interlayer insulating layer 258 may include a material, for example, silicon oxide, which may be selectively etched in a subsequent process.

A third hard mask layer 260 may be formed on the first interlayer insulating layer 258. The third hard mask layer 260 may include a material having an etch selectivity with respect to the first interlayer insulating layer 258, for example, a carbon-containing compound such as the material of an SOH. A third anti-reflection layer 262 may be formed on the third hard mask layer 260. The third anti-reflection layer 262 may include silicon oxynitride (SiON).

A third photoresist pattern 263 may be formed on the third anti-reflection layer 262 to mask the core/peripheral circuit region of the substrate 200 and to define bit line forming regions in the cell regions.

Referring to FIGS. 24A to 24E, the third anti-reflection layer 262 and the third hard mask layer 260 may be sequentially etched using the third photoresist pattern 263 as an etching mask. While the third hard mask layer 260 is etched, the third photoresist pattern 263 having similar etching characteristics to the third hard mask layer 260 may be removed.

A first interlayer insulating layer pattern 258a may be formed by etching the first interlayer insulating layer 258 using the remaining third hard mask layer 260 as an etching mask. The etching of the first interlayer insulating layer 258 may be complete at a surface of the etch stop layer pattern 216a. The exposed etch stop layer pattern 216a may be removed to form trenches 264 in the first interlayer insulating layer pattern 258a, the trenches 264 exposing the pillar-shaped bit line contact regions 201a and defining the bit line forming regions.

Since the etch stop layer 216 may be formed of a material having an etch selectivity with respect to the substrate 200, damage of the substrate 200 (i.e., the active regions 201 of cells) disposed under the etch stop layer 216 may be prevented when the damascene etching process is performed to form the trenches 232. While the etch stop layer pattern 216a is removed, the second interlayer insulating layer pattern 258a may be partially etched and thus, the other trenches may be formed to be deeper than the trenches on the pillar-shaped bit line contact regions 201a.

Subsequently, the remaining third hard mask layer 260 on the cell regions and the core/peripheral circuit region may be removed. After the damascene etching process is performed to form the trenches 264, the first interlayer insulating layer pattern 258a may remain on the substrate 200 in the core/peripheral circuit region.

An insulating layer is deposited on an entire surface of the substrate 200 having the trenches 264, and etched away to form bit line spacers 266 on inner walls of the trenches 264. The bit line spacers 266 may include a material having an etch selectivity with respect to the first interlayer insulating layer pattern 258a, for example, silicon nitride. The bit line capping layer 270 and the bit line spacers 266, which cover upper surfaces and side surfaces of the bit lines 268 having the damascene structure, may prevent electrical short between storage node contact plugs, which may be formed in a subsequent process, and the bit lines 268.

Referring to FIGS. 25A to 25E, a conductive layer may be deposited on an entire surface of the substrate 200 to fill the trenches 264, and etched back to form bit lines 268 having damascene structures which fill lower portions of the trenches 264. The bit lines 268 may be formed in a single metal layer including metal nitride such as titanium nitride, etc. Each of the bit lines 268 may be directly connected to the pillar-shaped bit line contact region 201a through the trench 264, and formed as a line which extends in a direction perpendicular to the first gate structures 215 in the cell regions.

An insulating layer may be deposited on the bit lines 268 and the first interlayer insulating layer pattern 258a. The insulating layer may be removed by an planarization process, such as an etch-back or CMP process, until an upper surface of the first interlayer insulating layer pattern 258a is exposed, to thereby form a bit line capping layer 270 filling upper portions of the trenches 264 on the bit lines 268. The bit line capping layer 270 may include a material having an etch selectivity with respect to the first interlayer insulating layer pattern 258a, for example, silicon nitride.

Referring to FIGS. 26A to 26E, a fourth hard mask layer 272 and a fourth anti-reflection layer 274 may be sequentially formed on the substrate 200. The fourth hard mask layer 272 may include a material having an etch selectivity with respect to the first interlayer insulating layer pattern 258a disposed under the fourth hard mask layer 272, for example, a carbon-containing compound such as the material of an SOH. The fourth anti-reflection layer 274 may include silicon oxynitride (SiON).

A fourth photoresist pattern 275 may be formed on the fourth anti-reflection layer 274 to mask the core/peripheral circuit region of the substrate 200 and to define storage node contact plug formation regions of the cell regions. The fourth photoresist pattern 275 may be formed as a line to extend in a direction perpendicular to the bit lines 268.

Referring to FIGS. 27A to 27E, the fourth anti-reflection layer 274 and the fourth hard mask layer 272 in the cell regions may be sequentially etched using the fourth photoresist pattern 275 as an etching mask. While the fourth hard mask layer 272 is etched, the fourth photoresist pattern 275 having similar etching characteristics to the fourth hard mask layer 272 may be removed.

The first interlayer insulating layer pattern 258a between the bit line 268 and the bit line 268 may be etched and removed using the remaining fourth hard mask layer 272 as an etching mask. Accordingly, first contact openings 276 may be formed to define the storage node contact plug formation regions between the remaining first interlayer insulating layer patterns 258a. The storage contact regions 201b between the buried gates 212 and the field region 205 may be exposed by the first contact openings 276. According to the embodiments, the first contact openings 276 which define the storage node contact plug formation regions may be formed as lines to orthogonally cross the bit lines 268.

Subsequently, the remaining fourth hard mask layer 272 may be removed.

An insulating layer may be deposited on an entire surface of the substrate 200, and etched away to form contact spacers 278 on inner walls of the first contact openings 276. The contact spacers 278 may include a material having an etch selectivity with respect to the first interlayer insulating layer pattern 258a, for example, silicon nitride.

Referring to FIGS. 28A to 28E, a sacrificial layer 280 may be formed on an entire surface of the substrate 200 to fill the first contact openings 276. The sacrificial layer 280 may include a material having an etch selectivity with respect to the first interlayer insulating layer pattern 258a, for example, an ACL. A fifth anti-reflection layer 282 may be formed on the sacrificial layer 280. The fifth anti-reflection layer 282 may include silicon oxynitride (SiON).

A fifth photoresist pattern 283 may be formed on the fifth anti-reflection layer 282 to mask cell regions of the substrate 200 and to define a contact plug formation region in the core/peripheral circuit region.

Referring to FIGS. 29A to 29E, the fifth anti-reflection layer 282 and the sacrificial layer 280 in the core/peripheral circuit region may be sequentially etched using the fifth photoresist pattern 283 as an etching mask. While the sacrificial layer 280 is etched, the fifth photoresist pattern 283 having similar etching characteristics to the sacrificial layer 280 may be removed.

A second contact opening 284 which defines the contact plug formation region in the core/peripheral circuit region may be formed by etching the first interlayer insulating layer pattern 258a disposed under the sacrificial layer 280 using the remaining sacrificial layer 280 as an etching mask. Since the substrate 200 in the cell regions is protected by the remaining sacrificial layer 280 while the etching process is performed to form the second contact opening 284, damage of the first contact openings 276 which expose the storage node contact regions 201b may be prevented.

Subsequently, the remaining sacrificial layer 280 may be removed to expose the first contact openings 276 in the cell regions.

A conductive layer including a metal, such as tungsten, aluminum, copper, or the like, may be deposited on an entire surface of the substrate 200 to fill the first and second contact openings 276 and 284. The conductive layer may be removed to an upper surface of the first interlayer insulating layer pattern 258a by an etch-back process. Then, storage node contact plugs 286a of the cell regions may be formed as lines in the first contact openings 276 to be connected to the storage node contact regions 201b and simultaneously, a contact plug 286b of the core/peripheral circuit region may be formed in the second contact opening 284.

Figure 30:
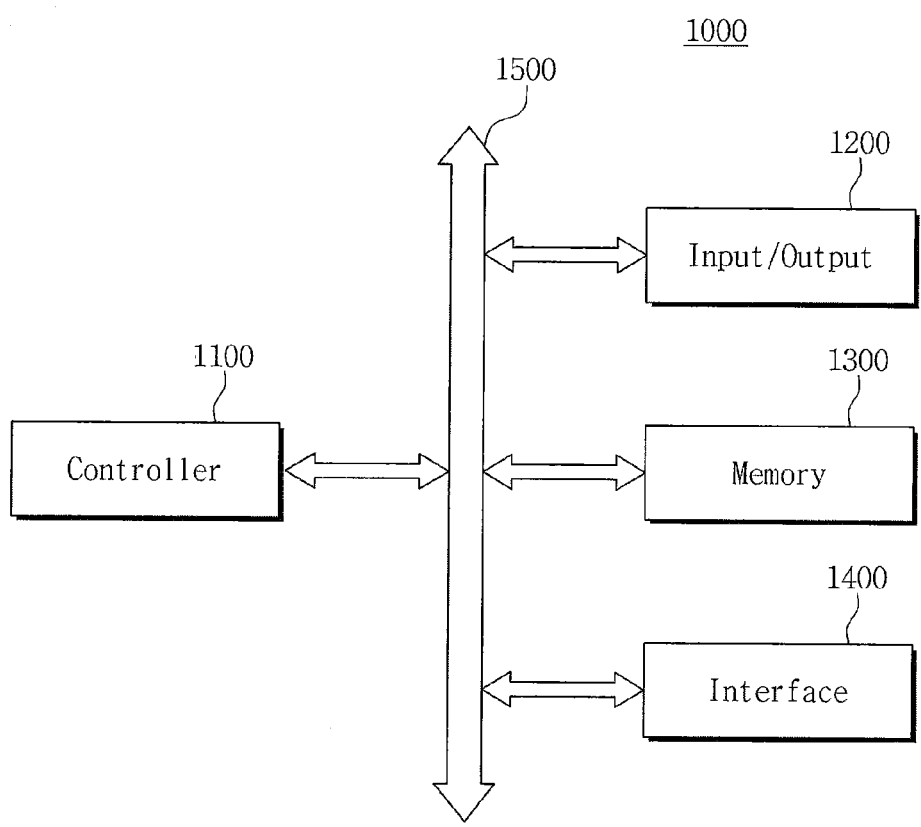
FIG. 30 illustrates a block diagram of an electronic system having semiconductor devices in accordance with various embodiments.

FIG. 30 illustrates a block diagram of an electronic system having semiconductor devices in accordance with various embodiments.

Referring to FIG. 30, semiconductor devices according to the various embodiments may be applied to an electronic system 1000.

The electronic system 1000 may include a controller 1100, an input/output (I/O) device 1200, a memory device 1300, an interface 1400, and a bus 1500.

The controller 1100, the I/O device 1200, the memory device 1300, and/or the interface 1400 may be coupled with each other through the bus 1500. The bus 1500 corresponds to a path in which data is received and/or transmitted.

The controller 1100 may include at least one of a microprocessor, a digital signal processor, a microcontroller, and logic devices capable of performing similar functions thereof. The I/O device 1200 may include a keypad, a keyboard, a display device, etc. The memory device 1300 may store data and/or instructions. The interface 1400 may perform functions of transmitting/receiving data through a communication network. The interface 1400 may include a wired or wireless form. For example, the interface 1400 may include an antenna, or a wired and wireless transceiver.

According to the embodiments, a pillar-shaped bit line contact region may be formed in an active region to have a higher upper surface level than that of a field region, thereby obtaining a bit line contact margin by increasing an overlapping region of the bit line and the active region.

Furthermore, since the bit line in a cell region and a gate structure in a core/peripheral circuit region are formed in different processes from each other and the bit line is formed in a single metal layer using a damascene process, a stacked height of the bit line becomes to be small and parasitic capacitance can be reduced.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   a substrate having a field region disposed therein that defines an active region of the substrate, the active region comprising a pillar-shaped bit line contact region having an upper surface disposed at a higher level than an upper surface of the field region;
   an interlayer insulating layer formed on the field region; and
   a bit line disposed in a trench in the interlayer insulating layer above the pillar-shaped bit line contact region and electrically connected thereto.

2. The semiconductor device of claim 1, wherein the bit line has an upper surface substantially coplanar with an upper surface of the interlayer insulating layer.

3. The semiconductor device of claim 1, further comprising a bit line capping layer on the bit line in the trench.

4. The semiconductor device of claim 1, wherein the active region further comprises a storage node contact region having an upper surface at a level lower than the upper surface of the bit line contact region, and wherein the semiconductor device further comprises a storage node contact plug passing through the interlayer insulating layer to contact the storage node contact region.

5. The semiconductor device of claim 4, wherein the storage node contact plug has a substantially cylindrical shape.

6. The semiconductor device of claim 4, wherein the storage node contact plug is line-shaped.

7. A semiconductor device, comprising:
   a substrate including an active region having a bit line contact region and a storage node contact region, an upper surface of the bit line contact region being higher than an upper surface of the storage node contact region;
   a bit line disposed directly on the upper surface of the bit line contact region; and a storage node contact plug disposed above the upper surface of the storage node contact region, and electrically connected to the storage node contact region.

8. The semiconductor device of claim 7, further comprising a contact spacer disposed between the bit line contact region and the storage node contact plug, and between the bit line and the storage node contact plug.

9. The semiconductor device of claim 8, wherein an upper surface of the contact spacer is coplanar with an upper surface of the storage node contact plug.

10. The semiconductor device of claim 8, further comprising a bit line spacer disposed between the bit line and the contact spacer,
wherein the bit line contact region directly contacts the contact spacer.

11. The semiconductor device of claim 10, wherein an upper surface of the bit line spacer is coplanar with an upper surface of the contact spacer.

12. The semiconductor device of claim 7, further comprising a bit line capping layer disposed on the bit line, wherein an upper surface of the bit line is coplanar with an upper surface of the storage node contact plug.

13. The semiconductor device of claim 7, wherein the storage node contact plug directly contacts the upper surface of the storage node contact region.

14. The semiconductor device of claim 7, wherein the substrate further includes a field region defining the active region, an upper surface of the field region being coplanar with the upper surface of the storage node contact region.

15. The semiconductor device of claim 14, further comprising an interlayer insulating layer pattern disposed between the bit line and the field region.

16. A semiconductor device, comprising:
a substrate having a field region disposed therein that defines first, second and third active regions of the substrate, the second and third active regions disposed on opposite sides of the first active region;
an interlayer insulating layer on the first, second and third active regions and the field region;
a bit line disposed in a trench in the interlayer insulating layer and directly on the first active region between the second and third active regions; and
first and second storage node contact plugs passing through the interlayer insulating layer on opposites sides of the bit line to contact respective ones of the second and third active regions, wherein the bit line contacts the first active region at a higher level than the first and second storage node contact plugs contact storage node contact regions of the second and third active regions.

17. The semiconductor device of claim 16, wherein the first active region comprises a pillar-shaped region having an upper surface that contacts the bit line.

18. The semiconductor device of claim 17, further comprising a third storage node contact plug passing through the interlayer insulating layer to contact a storage node contact region of the first active region at level below the upper surface of the pillar-shaped region.

19. The semiconductor device of claim 18, wherein the first, second and third storage node contact plugs are substantially cylindrical or line-shaped.

* * * * *